United States Patent
Sete et al.

(10) Patent No.: US 11,108,398 B2
(45) Date of Patent: Aug. 31, 2021

(54) PARAMETRICALLY ACTIVATED QUANTUM LOGIC GATES

(71) Applicant: Rigetti & Co, Inc., Berkeley, CA (US)

(72) Inventors: Eyob A. Sete, Walnut Creek, CA (US); Nicolas Didier, Berkeley, CA (US); Marcus Palmer da Silva, Lafayette, CA (US); Chad Tyler Rigetti, Walnut Creek, CA (US); Matthew J. Reagor, Corte Madera, CA (US); Shane Arthur Caldwell, Oakland, CA (US); Nikolas Anton Tezak, Oakland, CA (US); Colm Andrew Ryan, Albany, CA (US); Sabrina Sae Byul Hong, Oakland, CA (US); Prasahnt Sivarajah, Emeryville, CA (US); Alexander Papageorge, San Francisco, CA (US); Deanna Margo Abrams, Oakland, CA (US)

(73) Assignee: Rigetti & Co, Inc., Berkeley, CA (US)

( * ) Notice: Subject to any disclaimer, the term of this patent is extended or adjusted under 35 U.S.C. 154(b) by 0 days.

(21) Appl. No.: 16/663,809

(22) Filed: Oct. 25, 2019

(65) Prior Publication Data
US 2020/0204181 A1  Jun. 25, 2020

Related U.S. Application Data

(63) Continuation of application No. 16/012,551, filed on Jun. 19, 2018, now Pat. No. 10,483,980.
(Continued)

(51) Int. Cl.
*G06N 99/00* (2019.01)
*H03K 19/195* (2006.01)
*G06N 10/00* (2019.01)

(52) U.S. Cl.
CPC .......... *H03K 19/195* (2013.01); *G06N 10/00* (2019.01)

(58) Field of Classification Search
CPC .......................... G06N 99/002; H03K 19/195
See application file for complete search history.

(56) References Cited

U.S. PATENT DOCUMENTS

| 6,900,456 B2 | 5/2005 | Blais et al. |
| 7,655,850 B1 | 2/2010 | Ahn |

(Continued)

FOREIGN PATENT DOCUMENTS

| WO | 2014197001 | 12/2014 |
| WO | 2015178990 A2 | 11/2015 |

(Continued)

OTHER PUBLICATIONS

Fowler, Austin G., et al., "High threshold universal quantum computation on the surface code", arXiv:0803.0272v5, Physical Review A 80, 052312, Dec. 12, 2012, 20 pages.
(Continued)

*Primary Examiner* — Kurtis R Bahr
(74) *Attorney, Agent, or Firm* — Henry Patent Law Firm PLLC

(57) ABSTRACT

In a general aspect, a quantum logic gate is performed in a quantum computing system. In some cases, a pair of qubits are defined in a quantum processor; the pair of qubits can include a first qubit defined by a first qubit device in the quantum processor and a second qubit defined by a tunable qubit device in the quantum processor. A quantum logic gate can be applied to the pair of qubits by communicating a control signal to a control line coupled to the tunable qubit device. The control signal can be configured to modulate a transition frequency of the tunable qubit device at a modulation frequency, and the modulation frequency can be determined based on a transition frequency of the first qubit device.

27 Claims, 35 Drawing Sheets

Related U.S. Application Data

(60) Provisional application No. 62/521,943, filed on Jun. 19, 2017, provisional application No. 62/637,446, filed on Oct. 17, 2017, provisional application No. 62/637,855, filed on Mar. 2, 2018, provisional application No. 62/666,545, filed on May 3, 2018.

(56) References Cited

U.S. PATENT DOCUMENTS

| | | | |
|---|---|---|---|
| 7,932,515 | B2 | 4/2011 | Bunyk |
| 8,022,722 | B1 | 9/2011 | Pesetski et al. |
| 8,642,998 | B2 | 2/2014 | Gambetta et al. |
| 8,872,360 | B2 | 10/2014 | Chow et al. |
| 9,317,473 | B2 | 4/2016 | Yao et al. |
| 9,892,365 | B2 | 2/2018 | Rigetti et al. |
| 10,056,908 | B2 | 8/2018 | Rigetti et al. |
| 10,374,612 | B1 | 8/2019 | Sinclair et al. |
| 2004/0109631 | A1 | 6/2004 | Franson |
| 2006/0169877 | A1 | 8/2006 | Goto et al. |
| 2007/0194225 | A1 | 8/2007 | Zorn |
| 2008/0176750 | A1* | 7/2008 | Rose ............... G06N 10/00 505/170 |
| 2010/0079833 | A1 | 4/2010 | Langford et al. |
| 2010/0251049 | A1 | 9/2010 | Goto et al. |
| 2012/0319684 | A1 | 12/2012 | Gambetta et al. |
| 2014/0025926 | A1 | 1/2014 | Yao et al. |
| 2014/0264285 | A1 | 9/2014 | Chow |
| 2015/0034808 | A1 | 2/2015 | Yuan et al. |
| 2015/0325774 | A1† | 11/2015 | Abraham et al. |
| 2016/0079968 | A1* | 3/2016 | Strand ............... H03K 3/012 327/528 |
| 2016/0267032 | A1 | 9/2016 | Rigetti et al. |
| 2016/0292586 | A1* | 10/2016 | Rigetti ............... G06N 20/00 |
| 2017/0116542 | A1 | 4/2017 | Shim et al. |
| 2017/0193388 | A1* | 7/2017 | Filipp ............... G06F 15/82 |
| 2017/0230050 | A1 | 8/2017 | Rigetti et al. |
| 2017/0262765 | A1* | 9/2017 | Bourassa ............... H01L 39/223 |
| 2018/0260729 | A1* | 9/2018 | Abdo ............... H01L 39/025 |
| 2018/0331274 | A1† | 11/2018 | Abraham et al. |
| 2019/0007051 | A1 | 1/2019 | Sete et al. |
| 2019/0294991 | A1† | 9/2019 | Filipp et al. |

FOREIGN PATENT DOCUMENTS

| | | |
|---|---|---|
| WO | 2015178991 A2 | 11/2015 |
| WO | 2015178992 A2 | 11/2015 |
| WO | 2017078731 | 5/2017 |

OTHER PUBLICATIONS

Fowler, Austin G., "Surface codes: Towards practical large-scale quantum computation", Physical Review A 86, 032324, Sep. 18, 2012, 48 pages.
Ghosh, Joydip, et al., "High-fidelity controlled-σZ gate for resonator-based superconducting quantum computers", Physical Review A 87, 022309, Feb. 8, 2013, 19 pages.
Ghosh, et al., "Understanding the effects of leakage in superconducting quantum-error-detection circuits", Physical Review A 88, 062329, 2013, 7 pgs.
Havel, "Procedures for Converting among Lindblad, Kraus and Matrix Representations of Quantum Dynamical Semigroups", arXiv:quant-ph/0201127v4, Aug. 9, 2002, 32 pgs.
Havel, "Robust procedures for converting among Lindblad, Kraus and matrix representations of quantum dynamical semigroups", Journal of Mathematical Physics, vol. 44, No. 2, p. 534, Feb. 2003, 24 pgs.
Horodecki, et al., "General teleportation channel, singlet fraction and quasi-distillation", arXiv:quant-ph/9807091v2, Mar. 2, 1999, 16 pgs.
Horodecki, et al., "General teleportation channel, singlet fraction and quasi-distillation", Physical Review A 60, 1888, Sep. 1999, 11 pgs.
Hradil, et al., "Maximum-likelihood methods in quantum mechanics", Quantum State Estimation (Springer, 2004) pp. 59-112, 2004, 55 pgs.
Hutchings, et al., "Tunable Superconducting Qubits with Flux-Independent Coherence", arXiv:1702.02253v2, Feb. 21, 2017, 17 pgs.
Hutchings, et al., "Tunable Superconducting Qubits with Flux-Independent Coherence", Phys. Rev. Applied 8, 044003, Oct. 12, 2017, 17 pgs.
Ithier, et al., "Decoherence in a superconducting quantum bit circuit", Phys. Rev. B 72, 134519, 2005, 22 pgs.
Ithier, et al., "Decoherence in a superconducting quantum bit circuit", Quantronics group, Service de Physique de l'Etat Condense, Aug. 2, 2005, 66 pgs.
Jerger, et al., "In situ characterization of qubit control lines: a qubit as a vector network analyzer", arXiv:1706.05829v1 [quant-ph], Jun. 19, 2017, 5 pgs.
Kamenev, "Field Theory of Non-Equilibrium Systems", Cambridge University Press, 2011, 40 pgs.
Kandala, et al., "Hardware-efficient Variational Quantum Eigensolver for Small Molecules and Quantum Magnets", arXiv:1704.05018v2, Oct. 13, 2017, 24 pgs.
Kelly, et al., "3D integration of superconducting qubits with bump bonds: Part 2", APS Meeting, Mar. 2017, 1 pg.
Kelly, et al., "State preservation by repetitive error detection in a superconducting quantum circuit", Dept of Physics, Univ. of California, Santa Barbara, CA, US, 2015, 30 pgs.
Kelly, J., et al., "State preservation by repetitive error detection in a superconducting quantum circuit", arXiv:1411.7403v1, Nov. 26, 2014, 32 pgs.
Kerman, et al., "High-fidelity quantum operations on superconducting qubits in the presence of noise", arXiv:0801.0761v2, Mar. 19, 2008, 5 pgs.
Kerman, et al., "High-fidelity quantum operations on superconducting qubits in the presence of noise", Phys. Rev. Lett. 101, 070501, Mar. 19, 2008, 4 pgs.
Knill, et al., "Randomized benchmarking of quantum gates", Physical Review A 77, 012307, 2008, 7 pgs.
Koch, et al., "Charge insensitive qubit design derived from the Cooper pair box", arXiv:cond-mat/0703002v2 [cond-mat.mes-hall], Sep. 26, 2007, 21 pgs.
Koch, Jens, et al., "Charge-insensitive qubit design derived from the Cooper pair box", Physical Review A 76, 042319, Oct. 12, 2007, 19 pages.
Koch, et al., "Flicker (1/f) Noise in Tunnel Junction DC Squids", Journal of Low Temperature Physics 51, p. 207, 1983, 18 pgs.
Koch, et al., "Model for 1/f Flux Noise in SQUIDS and Qubits", Physical Review Letters 98, 267003, Jun. 2007, 4 pgs.
Koch, et al., "Model for 1/f Flux Noise in SQUIDS and Qubits", IBM Research Div, Thomas J. Watson Research Center, Yorktown Heights, NY; Dept. of Physics, UC-Berkeley, California; Materials Sciences Div., Lawrence Berkeley Nat'l Laboratory, Berkeley, California, May 5, 2007, 17 pgs.
Kubica, Aleksander, et al., "Unfolding the Color Code", New Journal of Physics 17, 083026, Aug. 13, 2015, 26 pages.
Kumar, et al., "Origin and Reduction of 1/f Magnetic Flux Noise in Superconducting Devices", Phys. Rev. Applied 6, 041001, 2016, 5 pgs.
Kumar, et al., "Origin and Suppression of 1/f Magnetic Flux Noise", arXiv:1604.00877v1, Apr. 4, 2016, 13 pgs.
Landahl, Andrew J., et al., "Fault-tolerant quantum computing with color codes", arXiv:1108.5738v1 [quant-ph], Aug. 29, 2011, 28 pages.
Langford, et al., "Experimentally simulating the dynamics of quantum light and matter at ultrastrong coupling", arXiv:1610.10065, Oct. 31, 2016, 26 pgs.
Lecocq, et al., "Junction fabrication by shadow evaporation without a suspended bridge", Nanotechnology 22 (2011) 315302, Jul. 8, 2011, 5 pgs.
Leek, et al., "Using Sideband Transitions for Two-Qubit Operations in Superconducting Circuits", Phys. Rev. B 79, 180511, 2009, 4 pgs.

(56) References Cited

OTHER PUBLICATIONS

Leek, et al., "Using Sideband Transitions for Two-Qubit Operations in Superconducting Circuits", arXiv:0812.2678v1, Dec. 15, 2008, 4 pgs.
Lucero, et al., "3D integration of superconducting qubits with bump bonds: Part 3", APS Meeting, Mar. 2017, 1 pg.
Magesan, et al., "Characterizing Quantum Gates via Randomized Benchmarking", arXiv:1109.6887v2 [quant-ph], Apr. 27, 2012, 21 pgs.
Magesan, Easwar, et al., "Efficient measurement of quantum gate error by interleaved randomized benchmarking", arXiv:1203.4550v2 [quant-ph], Mar. 19, 2014, 7 pages.
Magesan, et al., "Efficient measurement of quantum gate error by interleaved randomized benchmarking", Phys. Rev.Lett.109.080505, Aug. 2012, 5 pgs.
Magesan, et al., "Robust randomized benchmarking of quantum processes", arXiv:1009.3639v1, Sep. 19, 2010, 5 pgs.
Magesan, et al., "Scalable and Robust Randomized Benchmarking of Quantum Processes", Physical Review Letters 106, 180504, May 2011, 4 pgs.
Martinis, et al., "Decoherence in Josephson Qubits from Dielectric Loss", Phys. Rev. Lett. 95, 210503, Nov. 16, 2005, 4 pgs.
Martinis, et al., "Fast adiabatic qubit gates using only σz control", Physical Review A 90, 022307, 2014, 9 pgs.
McKay, David C., et al., "A universal gate for fixed-frequency qubits via a tunable bus", arXiv:1604.03076v3 [quant-ph], Dec. 19, 2016, 12 pages.
McKay, et al., "Universal Gate for Fixed-Frequency Qubits via a Tunable Bus", Phys. Rev. Applied 6, 064007, 2016, 10 pgs.
Meiboom, et al., "Modified Spin-Echo Method for Measuring Nuclear Relaxation Times", Review of Scientific Instruments 29, p. 688, 1958, 4 pgs.
Mohseni, et al., "Commercialize early quantum technologies", Nature 543, Mar. 9, 2017, 5 pgs.
Müller, et al., "Deriving Lindblad master equations with Keldysh diagrams: Correlated gain and loss in higher order perturbation theory", Phys. Rev. A 95, 013847, Jan. 27, 2017, 24 pgs.
Müller, et al., "Keldysh meets Lindblad: Correlated Gain and Loss in Higher-Order Perturbation Theory", arXiv:1608.04163v2, Jan. 30, 2017, 27 pgs.
Mutus, et al., "3D integration of superconducting qubits with bump bonds: Part 1", APS Meeting, Mar. 2017, 1 pg.
Sete, et al., "Flatsonium: Charge and flux insensitive tunable superconducting qubit", arXiv:1703.046132v2 [quant-ph], Mar. 21, 2017, 5 pgs.
Sheldon, et al., "Procedure for systematically tuning up crosstalk in the cross resonance gate", Phys. Rev. A 93, 060302, Mar. 15, 2016, 5 pgs.
Sheldon, et al., "Procedure for systematically tuning up crosstalk in the cross resonance gate", arXiv:1603.04821v1 [quant-ph], Mar. 15, 2016, 6 pgs.
Song, "10-qubit entanglement and parallel logic operations with a superconducting circuit", arXiv:1703.10302v1 [quant-ph], Mar. 30, 2017, 14 pgs.
Song, et al., "10-qubit entanglement and parallel logic operations with a superconducting circuit", arXiv:1703.10302v2, Nov. 5, 2017, 16 pgs.
Strand, J. D., et al., "First-order sideband transitions with flux-driven asymmetric transmon qubits", Physical Review. B, Condensed Matter and Materials Physics, vol. 87, No. 22, Jun. 1, 2013 (Jun. 1, 2013), XP055366364, US, ISSN: 1098-0121, DOI: 10.1103/PhysRevB.87.220505, Jun. 7, 2013, 5 pages.
Strauch, Frederick W., et al., "Quantum Logic Gates for Coupled Superconducting Phase Qubits", Physical Review Letters, vol. 91, No. 16, Oct. 16, 2003, 4 pages.
Strauch, Frederick W., "Quantum logic gates for superconducting resonator qudits", Physical Review A, 84, 052313, Nov. 2011, 9 pages.

Takita, et al., "Demonstration of Weight-Four Parity Measurements in the Surface Code Architecture", arXiv:1605.01351v3 [quant-ph], Apr. 28, 2017, 8 pgs.
Takita, et al., "Demonstration of Weight-Four Parity Measurements in the Surface Code Architecture", Phys. Rev. Lett. 117, 210505, Nov. 2016, 5 pgs.
Timmer, et al., "On generating power law noise", Astron. Astrophys. 300, 707-710, 1995, 4 pgs.
Vahidpour, et al., "Superconducting Through-Silicon vias for Quantum Integrated Circuits", arXiv:1708.02226v1 [physics.app-ph], Aug. 7, 2017, 5 pgs.
Versluis, et al., "Scalable quantum circuit and control for a superconducting surface code", arXiv:1612.08208v1, Dec. 24, 2016, 9 pgs.
Vion, et al., "Manipulating the Quantum State of an Electrical Circuit", Science 296, 886, 2002, 5 pgs.
Vion, et al., "Manipulating the Quantum State of an Electrical Circuit", arXiv:cond-mat/0205343v2, May 29, 2002, 5 pgs.
Wallraff, et al., "Circuit Quantum Electrodynamics: Coherent Coupling of a Single Photon to a Cooper Pair Box", arXiv:cond-mat/0407325v1 [cond-mat.mes-hall], Jul. 13, 2004, 8 pgs.
Wallraff, et al., "Strong coupling of a single photon to a superconducting qubit using circuit quantum electrodynamics", Nature 431, 162, Sep. 9, 2004, 6 pgs.
Wang, "Candidate Source of Flux Noise in SQUIDs: Adsorbed Oxygen Molecules", arXiv:1504.08075, Apr. 30, 2015, 24 pgs.
Wang, et al., "Candidate Source of Flux Noise in SQUIDs: Adsorbed Oxygen Molecules", Phys. Rev. Lett. 115, 077002, Aug. 2015, 5 pgs.
Wellstood, et al., "Low-frequency noise in dc superconducting quantum interference devices below 1 K", Appl. Phys. Lett. 50, 772, Mar. 1987, 4 pgs.
Wendin, "Quantum information processing with superconducting circuits: a review", arXiv:1610.02208v1 [quant-ph], Oct. 7, 2016, 94 pgs.
Wendin, "Quantum Information Processing with Superconducting Circuits: a Review", arXiv:1610.02208v2, Oct. 8, 2017, 108 pgs.
Yamamoto, et al., "Quantum process tomography of two-qubit controlled-Z and controlled-NOT gates using superconducting phase qubits", Phys. Rev. B 82, 184515 (2010), 8 pgs.
KIPO, International Search Report and Written Opinion dated Oct. 10, 2018, in PCT/US2018/038355.
USPTO, Notice of Allowance dated Mar. 21, 2019, in U.S. Appl. No. 16/151,902, 10 pgs.
USPTO, Non-Final Office Action dated Nov. 28, 2018, in U.S. Appl. No. 16/012,551, 20 pgs.
USPTO, Notice of Allowance dated Jul. 19, 2019, in U.S. Appl. No. 16/012,551, 21 pgs.
USPTO, Third Party Submission filed Jun. 13, 2019, in U.S. Appl. No. 16/012,551, 47 pgs.
USPTO, Final Office Action dated Apr. 2, 2019, in U.S. Appl. No. 16/012,551, 61 pgs.
"Quantum machines: Measurement and control of engineered quantum systems", Lecture notes of the Les Houches Summer School, vol. 96, Jul. 2011, 2014, 11 pgs.
Abramowitz, et al., "Handbook of Mathematical Functions with Formulas, Graphs, and Mathematical Tables", Dover, 1964, 470 pgs.
Aliferis, et al., "Quantum accuracy threshold for concatenated distance-3 codes", arXiv:quant-ph/0504218v3, Oct. 21, 2005, 58 pgs.
Barenco, Adriano, et al., "Elementary gates for quantum computation", Physical Review A, vol. 52, No. 5, Nov. 1, 1995, 11 pgs.
Barends, et al., "Coherent Josephson Qubit Suitable for Scalable Quantum Integrated Circuits", arXiv:1304.2322v1 [quant-ph], Apr. 8, 2013, 10 pgs.
Barends, et al., "Digitized adiabatic quantum computing with a superconducting circuit", arXiv:1511.03316, Nov. 10, 2015.
Barends, et al., "Superconducting quantum circuits at the surface code threshold for fault tolerance", Nature 508, 2014, pp. 500-503.
Beaudoin, et al., "First-order sidebands in circuit QED using qubit frequency modulation", arXiv:1208.1946v1 [quant-ph], Aug. 9, 2012, 16 pgs.

(56) References Cited

OTHER PUBLICATIONS

Bergeal, et al., "Phase preserving amplification near the quantum limit with a Josephson Ring Modulator", arXiv:0912.3407v1 [cond-mat.mes-hall], Dec. 17, 2009, 20 pgs.

Bertet, P., et al., "Parametric coupling for superconducting qubits", Physical Review B 73, 064512, Feb. 14, 2006, 6 pages.

Bertet, et al., "Parametric coupling for superconducting qubits", arXiv:cond-mat/0509799v2 [cond-mat.mes-hall], Mar. 16, 2006, 6 pgs.

Bialczak, et al., "1/f Flux Noise in Josephson Phase Qubits", arXiv:0708.2125v1 [cond-mat.supr-con], Aug. 16, 2007, 4 pgs.

Blais, Alexandre, et al., "Cavity quantum electrodynamics for superconducting electrical circuits: an architecture for quantum computation", arXiv:cond-mat/0402216v1 [cond-mat.mes-hall], Feb. 2008, 14 pages.

Blais, et al., "Quantum information processing with circuit quantum electrodynamics", arXiv:cond-mat/0612038v2, Jun. 1, 2007, 23 pgs.

Blais, Alexandre, et al., "Quantum-information processing with circuit quantum electrodynamics", Physical Review A 75, 032329 (2007), Mar. 22, 2007, 21 pgs.

Blume-Kohout, et al., "Robust, self-consistent, closed-form tomography of quantum logic gates on a trapped ion qubit", arXiv:1310.4492v1 [quant-ph], Oct. 16, 2013, 14 pgs.

Bombin, Hector, "Gauge Color Codes: Optimal Transversal Gates and Gauge Fixing in Topological Stabilizer Codes", arXiv:1311.0879v6 [quant-ph], Aug. 6, 2015, 10 pages.

Boyd, Stephen, et al., "Convex Optimization", Cambridge University Press, 2004, 730 pages.

Braumuller, Jochen, "Development of tunable transmon qubit in microstrip geometry", Karlsruhe Institute of Technology, Dec. 12, 2013, 96 pages.

Bylander, et al., "Dynamical decoupling and noise spectroscopy with a superconducting flux qubit", arXiv:1101.4707v1, Jan. 25, 2011, 21 pgs.

Caldwell, et al., "Parametrically-Activated Entangling Gates Using Transmon Qubits", arXiv:1706.06562v1, Jun. 20, 2017, 6 pgs.

Carr, et al., "Effects of Diffusion on Free Precession in Nuclear Magnetic Resonance Experiments*t", Phys. Rev. 94, 630, 1954, 13 pgs.

Chow, et al., "A simple all-microwave entangling gate for fixed-frequency superconducting qubits", arXiv:1106.0553v1, Jun. 3, 2011, 6 pgs.

Chow, et al., "Complete universal quantum gate set approaching fault-tolerant thresholds with superconducting qubits", arXiv:1202.5344v1, Feb. 23, 2012, 13 pgs.

Chow, et al., "Implementing a strand of a scalable fault-tolerant quantum computing fabric", Nature Communications 5, Jun. 24, 2014, 9 pgs.

Chow, et al., "Microwave-activated conditional-phase gate for superconducting qubits", New Journal of Physics 15, 115012, 2013, 11 pgs.

Chow, J., "Quantum Information Processing with Superconducting Qubits—Chapter 4.", Dissertation, Yale School of Engineering and Applied Sciences, May 2010, 39 pages.

Chow, et al., "Randomized Benchmarking and Process Tomography for Gate Errors in a Solid-State Qubit", Physical Review Letters 102, 090502, 2009, 4 pgs.

Chow, et al., "Universal quantum gate set approaching fault-tolerant thresholds with superconducting qubits", Phys. Rev.Lett. 109, 1-5, Aug. 2012, 5 pgs.

Chuang, et al., "Prescription for experimental determination of the dynamics of a quantum black box", Journal of Modern Optics 44, 2455, 1997, 13 pgs.

Chuang, et al., "Prescription for experimental determination of the dynamics of a quantum black box", arXiv:quant-ph/9610001v1, Oct. 1, 1996, 6 pgs.

Corcoles, et al., "Process verification of two-qubit quantum gates by randomized benchmarking", Physical Review A 87, 030301(R)(2013), Mar. 19, 2013, 4 pgs.

Cottet, "Implementation of a quantum bit in a superconducting circuit", PhD thesis, Université Paris IV, 2002, 259 pgs.

Devoret, et al., "Superconducting Circuits for Quantum Information: An Outlook", Science 339, 1169-74, Mar. 2013, 7 pgs.

Dewes, et al., "Characterization of a Two-Transmon Processor with Individual Single-Shot Qubit Readout", Physical Review Letters 108, 057002, Feb. 3, 2012, 5 pgs.

Diamond, et al., "CVXPY: A Python-Embedded Modeling Language for Convex Optimization", Journal of Machine Learning Research 17, 1, 2016, 5 pgs.

Dicarlo, L, et al., "Demonstration of two-qubit algorithms with a superconducting quantum processor", Nature, vol. 460, 240, Jul. 9, 2009, 5 pages.

Didier, et al., "Analytical modeling of parametrically-modulated transmon qubits", arXiv:1706.06566v1, Jun. 20, 2017, 10 pgs.

Didier, et al., "Fast Quantum Nondemolition Readout by Parametric Modulation of Longitudinal Qubit-Oscillator Interaction", Phys. Rev. Lett. 115, 203601, Nov. 2015, 5 pgs.

Didier, et al., "Fast quantum non-demolition readout from longitudinal qubit-oscillator interaction", arXiv:1504.04002v1, Apr. 15, 2015, 14 pgs.

Egger, D. J., et al., "Optimized controlled-Z gates for two superconducting qubits coupled through a resonator", Supercond. Sci. Technol. 27 (2014) 014001, Nov. 26, 2013, 12 pages.

Ekert, Artur, et al., "Geometric Quantum Computation", arXiv:quant-ph/004015v1, Feb. 1, 2008, 15 pages.

Flurin, "Superconducting Quantum Node for Entanglement and Storage of Microwave Radiation", arXiv:1401.5622v2, Feb. 4, 2015, 6 pgs.

Fowler, Austin G., "2D color code quantum computation", arXiv:0806.4827v3 [quant-ph], Jan. 10, 2011, 9 pages.

Naik, R. K., et al., "Random access quantum information processors", arXiv:1705.00579v1 [quant-ph], May 1, 2017, 7 pages.

Neeley, et al., "Process tomography of quantum memory in a Josephson-phase qubit coupled to a two-level state", nature physics, vol. 4, Jul. 2008, 4 pgs.

Nielsen, "A simple formula for the average gate fidelity of a quantum dynamical operation", arXiv:quant-ph/0205035v2, May 12, 2002, 3 pgs.

Nielsen, et al., "A simple formula for the average gate fidelity of a quantum dynamical operation", Physics Letters A 303, 249, May 12, 2002, 4 pgs.

Niskanen, et al., "Quantum Coherent Tunable Coupling of Superconducting Qubits", Science 316, 723, 2007, 5 pgs.

Niskanen, Antti O, et al., "Tunable coupling scheme for flux qubits at the optimal point", Physical Review B 73, 094506, Mar. 15, 2006, 8 pages.

Niskanen, et al., "Tunable coupling scheme for flux qubits at the optimal point", arXiv:cond-mat/0512238v2 [cond-mat.mes-hall], Jan. 24, 2006, 8 pgs.

Oi, "Interference of Quantum Channels", arXiv:quant-ph/0303178v2, Apr. 14, 2003, 4 pgs.

Oi, "Interference of Quantum Channels", Phys. Rev. Lett. 91, 067902, Aug. 2003, 4 pgs.

O'Malley, et al., "Qubit Metrology of Ultralow Phase Noise Using Randomized Benchmarking", Phys. Rev. Applied 3, 044009, 2015, 11 pgs.

O'Malley, et al., "Qubit Metrology of Ultralow Phase Noise Using Randomized Benchmarking", arXiv:1411.2613v3, Apr. 16, 2015, 11 pgs.

O'Malley, et al., "Scalable Quantum Simulation of Molecular Energies", Phys. Rev. X 6, 031007, 2016, 13 pgs.

O'Malley, et al., "Scalable Quantum Simulation of Molecular Energies", arXiv:1512.06860v2, Feb. 4, 2017, 13 pgs.

Paik, Hanhee, et al., "Observation of High Coherence in Josephson Junction Qubits Measured in a Three-Dimensional Circuit QED Architecture", Physical Review Letters 107, 240501, Dec. 5, 2011, 5 pages.

Poletto, et al., "Entanglement of two superconducting qubits in a waveguide cavity via monochromatic two-photon excitation", Phys. Rev.Lett. 109, 240505, Dec. 2012, 5 pgs.

(56) References Cited

OTHER PUBLICATIONS

Poletto, et al., "Entanglement of two superconducting qubits in a waveguide cavity via monochromatic two-photon excitation", arXiv:1208.1287v2, Nov. 12, 2012, 9 pgs.
Poyatos, et al., "Complete Characterization of a Quantum Process: The Two-Bit Quantum Gate", Phys. Rev. Lett. 78,390, Jan. 13, 1997, 4 pgs.
Poyatos, et al., "Complete Characterization of a Quantum Process: the Two-Bit Quantum Gate", arXiv:quant-ph/9611013v1, Nov. 10, 1996, 4 pgs.
Reagor, et al., "Demonstration of Universal Parametric Entangling Gates on a Multi-Qubit Lattice", arXiv:1706.06570v3 [quant-ph], Feb. 27, 2018, 17 pgs.
Reagor, et al., "Demonstration of Universal Parametric Entangling Gates on a Multi-Qubit Lattice", arXiv:1706.06570v2 [quant-ph], Jul. 13, 2017, 7 pgs.
Reagor, et al., "Demonstration of Universal Parametric Entangling Gates on a Multi-Qubit Lattice", arXiv:1706.06570v1 [quant-ph], Jun. 20, 2017, 7 pgs.
Reed, Matthew D., "Entanglement and Quantum Error Correction with Superconducting Qubits", arXiv:1311.6759v1, Nov. 26, 2013, 368 pgs.
Ribeiro, "Systematic Magnus-Based Approach for Suppressing Leakage and Nonadiabatic Errors in Quantum Dynamics", Physical Review X 7, 011021, Feb. 22, 2017, 24 pgs.
Richer, Susanne, "Perturbative analysis of two-qubit gates on transmon qubits", Thesis, RWTH Aachen University, Sep. 2013, 70 pages.
Rigetti, et al., "Fully microwave-tunable universal gates in superconducting qubits with linear couplings and fixed transition frequencies", PhysRevB.81.134507, Apr. 5, 2010, 7 pgs.
Rigetti, et al., "Protocol for Universal Gates in Optimally Biased Superconducting Qubits", Phys.Rev.Lett.94.240502, Jun. 22, 2005, 4 pgs.
Rigetti, Chad Tyler, "Quantum Gates for Superconducting Qubits", Section 5; Dissertation—Yale University, May 2009, 46 pages.
Rigetti, et al., "Superconducting qubit in a waveguide cavity with a coherence time approaching 0.1 ms", Physical Review B 86, 100506(R), 2012, 5 pgs.
Rigetti, et al., "Superconducting qubit in a waveguide cavity with a coherence time approaching 0.1 ms", arXiv:1202.5533v1, Feb. 24, 2012, 4 pgs.
Riste, et al., "Demonstration of quantum advantage in machine learning", Nature Partner Journals, Quantum Information, www.nature.com/npjqi, Apr. 13, 2017, 5 pgs.
Riste, et al., "Demonstration of quantum advantage in machine learning", arXiv:1512.06069v1, Dec. 18, 2015, 12 pgs.
Rosenberg, et al., "3D integrated superconducting qubits", arXiv:1706.04116v1 [quant-ph], Jun. 13, 2017, 6 pgs.
Rosenberg, et al., "3D integrated superconducting qubits", arXiv:1706.04116v2 [quant-ph], Jun. 19, 2017, 6 pgs.
Roushan, et al., "Chiral ground-state currents of interacting photons in a synthetic magnetic field", arXiv:1606.00077v3 [quant-ph], Nov. 7, 2016, 16 pgs.
Roushan, et al., "Chiral ground-state currents of interacting photons in a synthetic magnetic field", nature physics, DOI: 10.1038/NPHYS3930, Oct. 31, 2016, 6 pgs.
Roy, et al., "Implementation of Pairwise Lognitudinal Coupling in a Three-Qubit Superconducting Circuit", Phys. Rev. Applied 7, 054025, May 30, 2017, 15 pgs.
Roy, et al., "Implementation of Pairwise Lognitudinal Coupling in a Three-Qubit Superconducting Circuit", arXiv:1610.07915v1 [quant-ph], Oct. 25, 2016, 16 pgs.
Roy, et al., "Introduction to parametric amplification of quantum signals with Josephson circuits", Comptes Rendus Physique 17, 740, 2016, 16 pgs.
Royer, et al., "Fast and High-Fidelity Entangling Gate through Parametrically Modulated Logitudinal Coupling", arXiv:1603.04424v3 [quant-ph], May 9, 2017, 15 pgs.
Ryan, et al., "Randomized benchmarking of single- and multi-qubit control in liquid-state NMR quantum information processing", New Journal of Physics 11, 013034, 2009, 19 pgs.
Ryan, et al., "Tomography via correlation of noisy measurement records", Phys. Rev. A 91, 022118, 2015, 7 pgs.
Ryan, et al., "Tomography via correlation of noisy measurement records", arXiv:1310.6448v3 [quant-ph], Dec. 20, 2013, 7 pgs.
Salathe, et al., "Digital Quantum Simulation of Spin Models with Circuit Quantum Electrodynamics", Phys. Rev. X 5, 321027, 2015.
Schuch, et al., "Natural two-qubit gate for quantum computation using the XY interaction", Phys. Rev. A 67, 032301, 2003, 8 pgs.
Schuch, et al., "Natural two-qubit gate for quantum computation using the XY interaction", arXiv:quant-ph/0209035v2, Apr. 4, 2003, 8 pgs.
Schuster, David Isaac, "Circuit Quantum Electrodynamics", Dissertation presented to the faculty of the graduate school, Yale University, May 1, 2007, 255 pages.
Schutjens, et al., "Single qubit gates in frequency-crowded transmon systems", arXiv:1306.2279v1 [quant-ph], Jun. 10, 2013, 9 pgs.
Schutjens, et al., "Single-qubit gates in frequency-crowded transmon systems", Physical Review A 88, 052330, 2013, 8 pgs.
Sete, et al., "Charge- and Flux-Insensitive Tunable Superconducting Qubit", arXiv:1703.04613v3 [quant-ph], Aug. 7, 2017, 7 pgs.
Sete, et al., "Charge- and Flux-Insensitive Tunable Superconducting Qubit", Phys. Rev. Applied 8, 024004, Aug. 7, 2017, 8 pgs.
EPO, Extended European Search Report dated Dec. 23, 2020, in EP 18821224.5, 9 pgs.

\* cited by examiner
† cited by third party

PARAMETRICALLY ACTIVATED QUANTUM LOGIC GATES

CROSS-REFERENCE TO RELATED APPLICATIONS

This application is a continuation of U.S. patent application Ser. No. 16/012,551, which is entitled "Parametrically Activated Quantum Logic Gates" and was filed Jun. 19, 2018, which claims priority to U.S. Provisional Application No. 62/521,943, which is entitled "Parametrically Activated Quantum Logic Gates" and was filed Jun. 19, 2017; and to U.S. Provisional Application No. 62/573,446, which is entitled "Parametrically Activated Quantum Logic Gates" and was filed Oct. 17, 2017; and to U.S. Provisional Application No. 62/637,855, which is entitled "Hamiltonian Design for Quantum Integrated Circuits for Implementation of Parametrically Activated Quantum Logic Gates" and was filed Mar. 2, 2018; and to U.S. Provisional Application No. 62/666,545, which is entitled "Frequency Allocation for Parametrically Activated Quantum Logic Gates" and was filed May 3, 2018. All of the priority applications are hereby incorporated by reference.

BACKGROUND

The following description relates to performing quantum logic gates.

Quantum computers can perform computational tasks by executing quantum algorithms. Quantum algorithms are often expressed as a quantum circuit that operates on qubits. In some quantum computing architectures, the quantum circuits are implemented as a series of quantum logic gates, which may include single-qubit gates and two-qubit gates, for example.

DETAILED DESCRIPTION

Figure 1:
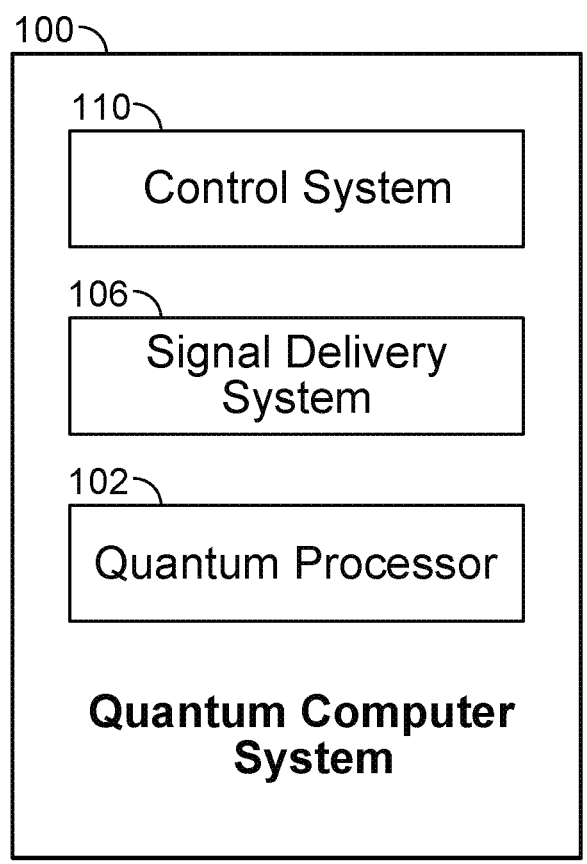
FIG. 1 is a block diagram of an example quantum computing system.

In some aspects of what is described, one or more quantum logic gates are performed by controlling a tunable qubit device. In some examples, two-qubit quantum logic gates are implemented as parametrically activated gates. The gates can be used, for instance, in quantum computing systems to perform computational tasks. In some systems, a set of parametrically activated two-qubit gates can form a subset of universal quantum logic gates, which can be used to execute quantum algorithms. In some cases, parametrically activated gates can be performed with high fidelity, short gate operation time, a large on/off ratio, easy tunability, or a combination of these features. In some instances, quantum logic gates can be implemented in a scalable architecture to achieve a scalable quantum computing system.

In some implementations, parametrically activated two-qubit gates may provide technical improvements, engineering objectives or advantages over other techniques. For example, parametrically activated gates may be applied to qubits defined by qubit devices without requiring the qubit devices to interact directly with certain other devices (e.g., an additional coupler or resonator device). Moreover, a qubit device can be selectively coupled to any individual neighboring qubit device in a device array. Accordingly, in some cases, a quantum processor may achieve a higher spatial density of qubits (e.g., with fewer devices and less spacing between neighboring qubit devices), a higher spatial density of qubit frequencies (e.g., more frequency crowding may be tolerated), and lower control overhead (e.g., fewer devices to control per operation).

In some cases, parametrically activated gates are easier to tune and characterize, and may have a higher on/off ratio, higher fidelity, and faster gate time, compared to gates that are activated in another manner. For instance, the gate time for a parametrically activated gate may be controlled by external control parameters, and therefore the gate may be made faster by adjusting the modulation amplitude and frequency of a control signal. Moreover, control signals that include a modulation frequency (e.g., a microwave tone) can be more robust to, or even immune to, certain control imperfections (e.g., errors associated with fast dc pulses, etc.). As another example, parametrically activated two-qubit gates may be produced by an interaction having an effective interaction strength that is first order in the bare frequency coupling strength, which may provide an advantage over gates where the interaction strength scales inversely to the detuning (and the detuning can be quite large).

In some cases, a number of different types or classes of two-qubit quantum logic gates can be parametrically activated in the same quantum processor or applied to the same two qubits, which can allow a larger selection of gates and a larger number of control optimization parameters. In some cases, parametrically activated two-qubit gates can be combined with single-qubit rotation gates to define a universal set of quantum logic gates for universal quantum computation. Moreover, different types or classes of two-qubit quantum logic gates can be used without having to modify the quantum processor (e.g., without modifying device design, chip layout, etc.) for a particular type or class of gates. In some examples, single-photon gates (e.g., iSWAP gates, square-root-of-iSWAP gates, controlled-Z or other controlled-phase gates, etc.) or two-photon gates (e.g., Bell-Rabi gate, square-root-of-Bell-Rabi gate, etc.) may be performed.

In some examples, a quantum processor includes an array of qubit devices that define quantum bits (qubits). Pairs of the qubit devices can be coupled to each other through a capacitor, an inductor, or another mode of coupling. In some examples, a fixed-frequency qubit device is coupled to one or more tunable-frequency qubit devices. Some example tunable qubit devices define transition frequencies that can be tuned by changing the magnetic flux that threads a circuit loop in the tunable qubit device; a control line associated with the tunable qubit device can be inductively coupled to the circuit loop to control the magnetic flux and thereby control the transition frequencies of the device. In such examples, a parametrically activated two-qubit gate can be applied by sending a radio-frequency (rf) or microwave tone to the control line. The frequency and duration of the rf or microwave tone can be selected to achieve a specified quantum logic gate based the transition frequencies and bare coupling strengths of the qubit devices.

In some examples, an iSWAP class of two-qubit gates may be actuated by modulating the magnetic flux by sending (e.g., through a flux bias line) an rf tone at a frequency equal to half of the energy difference between the states $|10\rangle$ and $|01\rangle$ of the two qubit devices when the tunable qubit device is parked at a maximum or minimum frequency, or at the difference between states $|10\rangle$ and $|01\rangle$ of the two qubit devices when the tunable frequency is parked at other frequencies. In some examples, a controlled Z (or other controlled phase) gate can be activated by modulating the tunable qubit device transition frequency at a modulation frequency equal to the difference between the $|1\rangle \rightarrow |2\rangle$ transition frequency of the tunable qubit device and the $|0\rangle \rightarrow |1\rangle$ transition frequency of the other qubit device, or at a modulation frequency equal to the difference between the $|0\rangle \rightarrow |1\rangle$ transition frequency of tunable qubit device and the $|1\rangle \rightarrow |2\rangle$ transition frequency of the other qubit device. In some examples, a Bell-Rabi gate or square-root-of-Bell-Rabi gate can be activated by modulating the tunable qubit device transition frequency at a modulation frequency equal to the sum of the $|0\rangle \rightarrow |1\rangle$ transition frequency of the qubit devices. Other types of gates may be performed in some cases.

FIG. 1 is a schematic diagram of an example quantum computing system 100. The example quantum computing system 100 shown in FIG. 1 includes a control system 110, a signal delivery system 106, and a quantum processor 102. A quantum computing system may include additional or different features, and the components of a quantum computing system may operate as described with respect to FIG. 1 or in another manner.

The example quantum computing system 100 shown in FIG. 1 can perform quantum computational tasks by executing quantum algorithms. In some implementations, the quantum computing system 100 can perform quantum computation by storing and manipulating information within individual quantum states of a composite quantum system. For example, qubits (i.e., quantum bits) can be stored in and represented by an effective two-level sub-manifold of a quantum coherent physical system. Control signals can manipulate the quantum states of individual qubits and the joint states of multiple qubits. In some instances, conditional quantum logic can be performed in a manner that allows large-scale entanglement within the quantum processor 102. In some instances, information can be read out from the composite quantum system by measuring the quantum states of the individual qubits.

In some implementations, the quantum computing system 100 can operate using gate-based models for quantum computing. According to some models, fault-tolerance can be achieved by applying a set of high-fidelity control and measurement operations to the qubits. For example, topological quantum error correction schemes can operate on a lattice of nearest-neighbor-coupled qubits. In some instances, these and other types of quantum error correcting schemes can be adapted for a two- or three-dimensional lattice of nearest-neighbor-coupled qubits, for example, to achieve fault-tolerant quantum computation. The lattice can allow each qubit to be independently controlled and measured without introducing errors on other qubits in the lattice. Adjacent pairs of qubits in the lattice can be addressed, for example, with two-qubit quantum logic gate operations that are capable of generating entanglement, independent of other pairs in the lattice.

In some implementations, the quantum computing system 100 is constructed and operated according to a scalable quantum computing architecture. For example, in some cases, the architecture can be scaled to a large number of qubits to achieve large-scale general purpose coherent quantum computer. In some instances, the architecture is adaptable and can incorporate a variety of modes for each technical component. For example, the architecture can be adapted to incorporate different types of qubit devices, coupler devices, resonator devices, readout devices, signaling devices, etc.

The example quantum processor 102 shown in FIG. 1 includes qubit devices that are used to store and process quantum information. The qubit devices in the quantum processor 102 can be implemented according to any of the examples described below (e.g., the examples shown in FIGS. 2 and 3, FIGS. 12A-12C, and others). In some instances, all or part of the quantum processor 102 functions as a quantum information processor, a quantum memory, or another type of subsystem. The quantum processor 102 shown in FIG. 1 can be implemented, for example, as the quantum processor 204 shown in FIG. 2 or in another manner.

In some implementations, the quantum processor 102 includes a superconducting circuit, and qubits can be defined in respective qubit devices that each include one or more Josephson junctions, superconducting quantum interference device (SQUID) loops, or other features. In some cases, the quantum processor 102 includes a superconducting circuit implemented according to the example circuits 1200A or 1200B shown in FIG. 12A, 12B, or another type of superconducting circuit. Some example superconducting circuit devices (e.g., transmon devices, fluxonium devices, etc.) can be operated by microwave signals, DC-bias signals, or other types of electromagnetic signals delivered in the quantum processor 102 from the control system 110.

Parametrically activated quantum logic gates may be implemented in other types of quantum processors, including other physical implementations in which a qubit can be defined on a device or subsystem having more than two quantum energy levels. In some implementations, the quantum processor 102 includes an ion trap system. For example, qubits may be defined in hyperfine states of laser-cooled atomic ions and may be controlled by optical signals delivered to the atomic ions. In some cases, the quantum processor 102 includes a spin system, and qubits are defined in the spin states of molecular, atomic or subatomic particles that are controlled by radio frequency or microwave frequency signals. In some cases, the quantum processor 102 includes a photonic system or another type of quantum system that can be used for quantum information processing applications.

In the example quantum processor 102, the qubit devices each store a single qubit (a bit of quantum information), and the qubits can collectively define the computational state of a quantum information processor or quantum memory. The quantum processor 102 may also include readout devices that selectively interact with the qubit devices to detect their quantum states. For example, readout resonators may be configured to produce readout signals that indicate a computational state of the quantum processor or quantum memory. The quantum processor 102 may also include coupler devices that selectively operate on individual qubits or pairs of qubits. For example, the coupler devices may produce entanglement or other multi-qubit states over two or more qubits in the quantum processor 102.

In some implementations, the example quantum processor 102 can process the quantum information stored in the qubits by applying control signals to the qubit devices or to other devices housed in the quantum processor. The control signals can be configured to encode information in the qubit devices, to process the information by performing logical gates or other types of operations, or to extract information from the qubit devices. In some examples, the operations can be expressed as single-qubit gates, two-qubit gates, or other types of logical gates that operate on one or more qubits. A sequence of operations can be applied to the qubits to perform a quantum algorithm. The quantum algorithm may correspond to a computational task, a quantum error correction procedure, a quantum state distillation procedure, or a combination of these and other types of operations.

In the example shown in FIG. 1, the signal delivery system 106 provides communication between the control system 110 and the quantum processor 102. For example, the signal delivery system 106 can receive control signals from the control system 110 and deliver the control signals to the quantum processor 102. In some instances, the signal delivery system 106 performs preprocessing, signal conditioning, or other operations to the control signals before delivering them to the quantum processor 102. The signal delivery system 106 may also receive readout signals or other signals from the quantum processor 102 and deliver the signals to the control system 110.

In some implementations, the signal delivery system 106 includes input and output processing hardware, input and output connections, and other components. The input and output processing hardware may include, for example, filters, attenuators, directional couplers, multiplexers, diplexers, bias components, signal channels, isolators, amplifiers, power dividers and other types of components. In some implementations, the signal delivery system 106 provides connections between different temperature and noise regimes. For example, the quantum computing system 100 may include a series of temperature stages between a higher temperature regime of the control system 110 and a lower temperature regime of the quantum processor 102.

In some implementations, the signal delivery system 106 or the control system 110 includes one or more filter devices or other components to remove at least one range of unwanted frequencies from signal lines between the control system and the tunable qubit devices in the quantum processor cell 102. For example, given a flux modulation frequency $\omega_{fl}$, the signal chain can be filtered with a low-pass filter with a cutoff frequency between $\omega_{fl}$ and $2\omega_{fl}$. In some cases, the cutoff frequency of each filter is as close as possible to the flux modulation frequency $\omega_{fl}$. The filter can improve operation of parametrically-activated quantum logic gates, for example, by increasing the dephasing time under modulation around the "sweet spot" by filtering out white flux noise. In some cases, dephasing comes from fluctuations of the flux through the superconducting circuit loop. Flux bias fluctuations can lead to transition frequency fluctuations that act as a dephasing process for the qubit. Under modulation, the transition frequencies oscillate at various harmonics of the fundamental frequency $\omega_{fl}$. Each of them is sensitive to a different component of the flux noise spectrum. This can be particularly important for white noise since it contributes at substantially all frequencies. The idea of filtering to reduce or eliminate, to the extent possible, the components of the noise that contribute to dephasing. The component at the signal frequency should not be filtered out.

Filtering other components around the signal frequency corresponds to using a band-pass filter on the signal line. In some cases, then, there is a modulation amplitude at which the contribution of the noise at the signal frequency vanishes, thereby canceling the effect of flux noise on dephasing. This point depends on the circuit parameters (e.g., $E_C$, $E_{J_1}$, $E_{J_2}$) of the tunable qubit device. In some cases, the contribution from 1/f flux noise on the amplitude of the signal also vanishes at that modulation amplitude. At the AC flux "sweet spot," the four flux noise contributions coming from electronics vanish at that point when filtering (1/f noise on the DC part of the pulse, 1/f on AC, white on DC, white on AC). If the white noise level is low enough there is no need to filter because this spot is AC flux insensitive at first order for the 1/f flux noise. This does not cancel flux noise coming from the chip itself (spins, impurities, etc.) but these processes are believed to have a 1/f noise spectrum so that insensitivity at that point is preserved (white noise is believed to come from electronic instruments).

In the example quantum computing system 100 shown in FIG. 1, the control system 110 controls operation of the quantum processor 102. The example control system 110 may include data processors, signal generators, interface components and other types of systems or subsystems. In some cases, the control system 110 includes one or more digital computers or digital computing components.

In some implementations, the control system 110 includes a digital computing system that executes software to compile instructions for the quantum processor 102. For example, the control system 110 may decompose a quantum logic circuit or quantum computing program into discrete control operations or sets of control operations that can be executed by the hardware in the quantum computing system 100. In some examples, the control system 110 applies a quantum logic circuit by generating signals that cause the qubit devices and other devices in the quantum processor 102 to execute operations. For instance, the operations may correspond to single-qubit gates, two-qubit gates, qubit measurements, etc. The control system 110 can generate control signals that are communicated to the quantum processor 102 by the signal delivery system 106, and the devices in the quantum processor 102 can execute the operations in response to the control signals.

In some cases, the control system 110 includes one or more digital computers or digital computing components that produce a control sequence, for instance, based on a quantum computer program. For example, a digital processor may convert a quantum computer program (e.g., instructions written in the Quil programming language) to an instruction set for the native gate set or architecture of the quantum processor 102. The quantum computer program may be generated locally, received from a remote system, or obtained in another manner.

In some cases, the control system 110 includes a microwave signal source (e.g., an arbitrary waveform generator), a bias signal source and other components that generate control signals to be delivered to the quantum processor 102. For example, the control signals may be configured to apply quantum logic gates by modulating transition frequencies of tunable qubit devices. For instance, the control system 110 may include one or more digital computers configured to determine a modulation frequency, total interaction time, modulation amplitude, or other parameters for a parametrically activated quantum logic gate, in accordance with the discussion below. The control signals may be generated based on a control sequence provided, for instance, by a digital processor in the control system 110. The example control system 110 may include conversion hardware that digitizes response signals received from the quantum processor 102. The digitized response signals may be provided, for example, to a digital processor in the control system 110.

In some cases, the quantum computing system 100 includes multiple quantum processors 102 that operate as respective quantum processor units (QPU). In some cases, each QPU can operate independent of the others. For instance, the quantum computing system 100 may be configured to operate according to a distributed quantum computation model, or the quantum computing system 100 may utilize multiple QPUs in another manner. In some implementations, the quantum computing system 100 includes multiple control systems, and each QPU may be controlled by a dedicated control system. In some implementations, a single control system can control multiple QPUs; for instance, the control system 110 may include multiple domains that each control a respective QPU.

Figure 2:
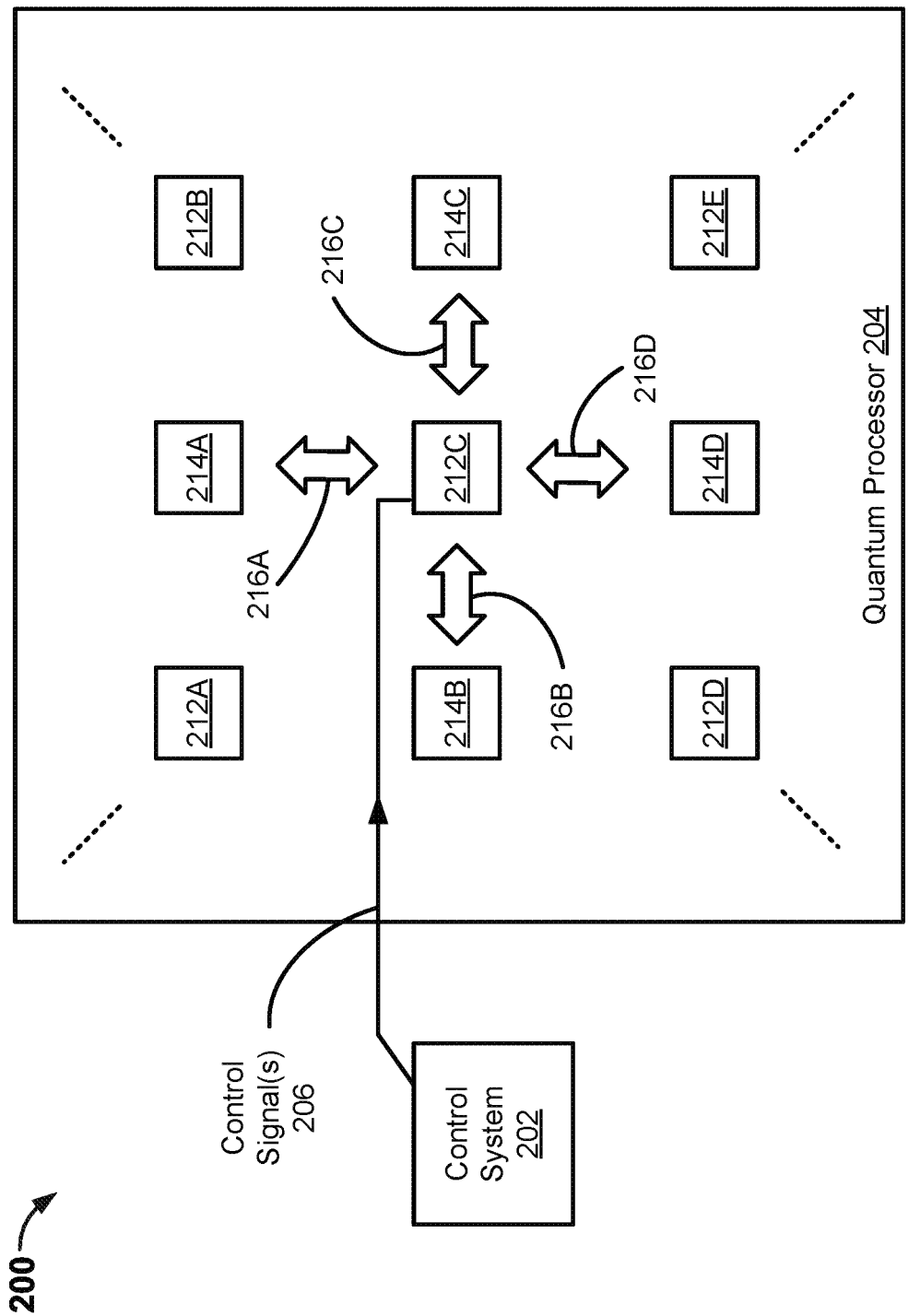
FIG. 2 is a block diagram showing devices and interactions in an example quantum computing system.

FIG. 2 is a block diagram showing devices and interactions in an example quantum computing system 200. As shown in FIG. 2, the example quantum computing system 200 includes a control system 202 and a quantum processor 204. The quantum computing system 200 may include additional or different features, and the components may be arranged in another manner.

The example quantum processor 204 includes a qubit device array, which includes qubit devices arranged in a two-dimensional or three-dimensional lattice structure. Nine of the devices in the qubit device array are shown in FIG. 2. In particular, FIG. 2 shows five tunable qubit devices 212A, 212B, 212C, 212D, 212E and four other qubit devices 214A, 214B, 214C, 214D. In some examples, the tunable qubit devices are implemented as tunable transmon qubit devices, flux qubit devices, flatsonium qubit devices, fluxonium qubit devices, or other types of tunable devices. In some examples, the other qubit devices 214A, 214B, 214C, 214D are also implemented as tunable qubit devices. In some examples, the other qubit devices 214A, 214B, 214C, 214D are implemented as fixed-frequency qubit devices. For instance, other qubit devices 214A, 214B, 214C, 214D may be implemented as fixed-frequency transmon devices or other types of fixed-frequency qubit devices. The devices shown in FIG. 2 may be implemented by other types of devices or components. For example, in some cases, one or more of the qubit devices shown in FIG. 2 may be implemented as a resonator device, a coupler device, or otherwise.

In the example shown in FIG. 2, the devices are arranged in a rectilinear (e.g., rectangular or square) array that extends in two spatial dimensions (in the plane of the page), and each qubit device has four nearest-neighbor qubit devices. In some implementations, the devices can be arranged in another type of ordered array. In some instances, the rectilinear array also extends in a third spatial dimension (in/out of the page), for example, to form a cubic array or another type of three-dimensional array. The quantum processor 204 may include additional devices, including additional qubit devices, readout resonators, etc.

In some implementations, the control system 202 interfaces with the quantum processor 204 through a signal delivery system that includes connector hardware elements. For example, the control system connector hardware can include signal lines, signal processing hardware, filters, feedthrough devices (e.g., light-tight feedthroughs, etc.), and other types of components. In some implementations, the control system connector hardware can span multiple different temperature and noise regimes. For example, the control system connector hardware can include a series of temperature stages (60 K, 3 K, 800 mK, 150 mK) that decrease between a higher temperature regime of the control system 202 and a lower temperature regime of the quantum processor 204.

The quantum processor 204, and in some cases all or part of the signal delivery system and connection hardware elements, can be maintained in a controlled cryogenic environment. The environment can be provided, for example, by shielding equipment, cryogenic equipment, and other types of environmental control systems. In some examples, the components in the quantum processor 204 operate in a cryogenic temperature regime and are subject to very low electromagnetic and thermal noise. For example, magnetic shielding can be used to shield the system components from stray magnetic fields, optical shielding can be used to shield the system components from optical noise, thermal shielding and cryogenic equipment can be used to maintain the system components at controlled temperature, etc.

The example control system 202 shown in FIG. 2 may include, for example, a signal generator system, a program interface, a signal processor system and possibly other components. In some instances, components of the control system 202 can operate in a room temperature regime, an intermediate temperature regime, or both. For example, the control system 202 can be configured to operate at much higher temperatures and be subject to much higher levels of noise than are present in the environment of the quantum processor 204.

In the example quantum processor 204 shown in FIG. 2, each of the qubit devices can be encoded with a single bit of quantum information. Each of the qubit devices has two eigenstates that are used as computational basis states ("0" and "1"), and each qubit device can transition between its computational basis states or exist in an arbitrary superposition of its computational basis states. In some examples, the two lowest energy levels (the ground state and first excited state) of each qubit device are defined as a qubit and used as computational basis states for quantum computation. In some examples, higher energy levels (e.g., a second excited state or a third excited state) are also defined by a qubit device, and may be used for quantum computation in some instances.

In some implementations, the tunable qubit devices 212A, 212B, 212C, 212D, 212E are housed between neighboring pairs of the other qubit devices 214A, 214B, 214C, 214D in a device array within the quantum processor 204. The quantum states of the respective qubit devices can be manipulated by control signals, or read by readout signals, generated by the control system 202. The qubit devices can be controlled individually, for example, by delivering control signals to the respective qubit devices. In some cases, a neighboring pair qubit devices (e.g., tunable qubit device 212C and other qubit device 214A) is control jointly by delivering control signals to the tunable qubit device. In some cases, readout devices can detect the states of the qubit devices, for example, by interacting directly with the respective qubit devices.

Figure 6:
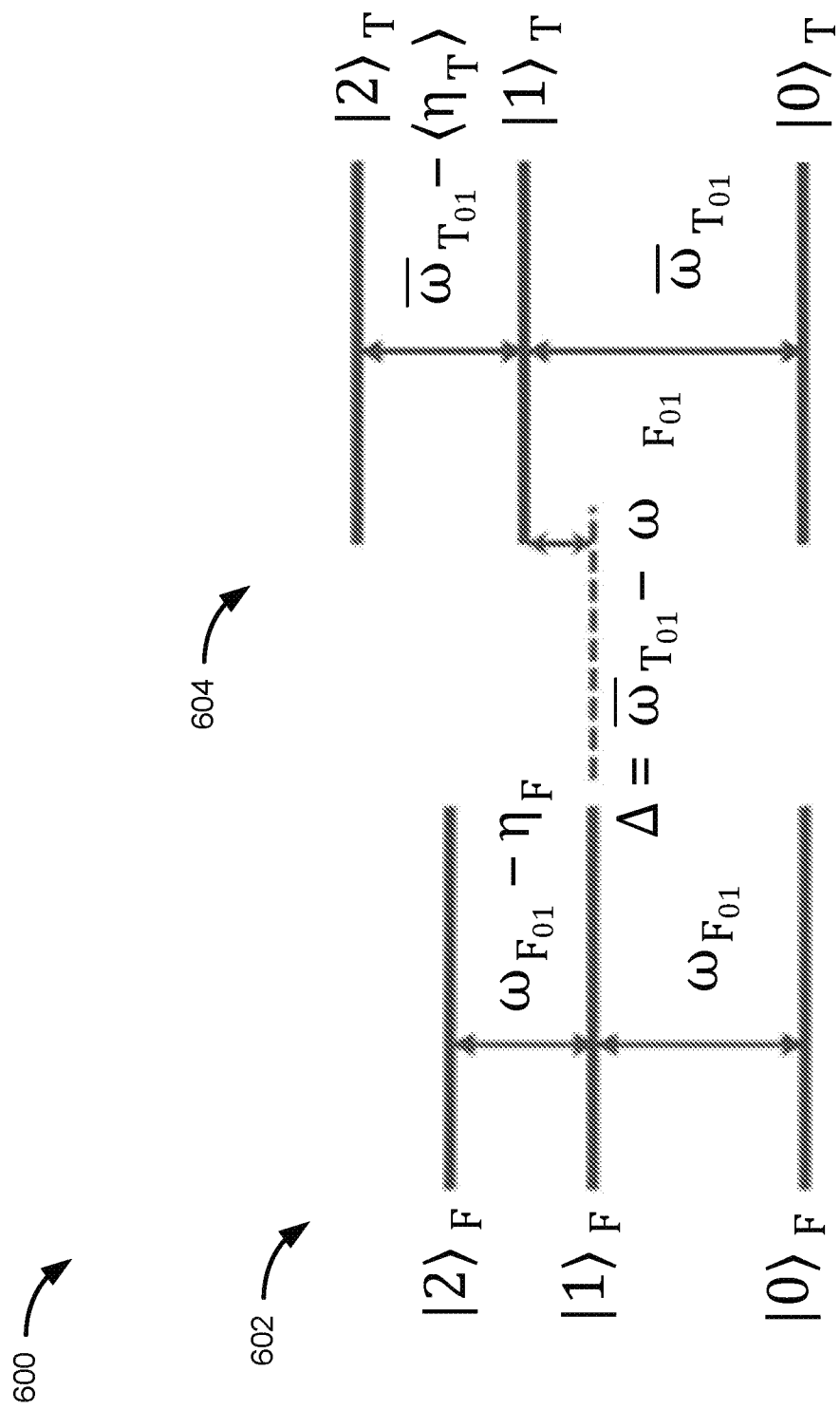
FIG. 6 is an energy level diagram showing energy levels defined by two example qubit devices.

In the example shown in FIG. 2, the energy difference E between any two adjacent energy levels in a qubit device can be represented as a transition frequency $\omega$ of the qubit device (e.g., according to $\omega=E/h$). Examples of energy levels and transition frequencies are shown in FIG. 6. In some examples, a transition frequency of a qubit device is tunable, for example, by application of an offset field. For instance, a tunable qubit device (e.g., a tunable transmon qubit device, a fluxonium qubit device, etc.) may include a superconducting loop (e.g., a SQUID loop) that is tunable by application of magnetic flux. In some examples, the transition frequency of a qubit device is not tunable by application of an offset field and is independent of magnetic flux experienced by the qubit device. For instance, a fixed-frequency qubit device may have a fixed transition frequency that is defined by an electronic circuit of the qubit device. As an example, a superconducting qubit device (e.g., a fixed-frequency transmon qubit) may be implemented without a SQUID loop.

In some examples, a tunable qubit device includes a superconducting circuit loop that receives a magnetic flux that tunes the transition frequency of the tunable qubit device. As an example, the superconducting circuit loop may include two Josephson junctions, and the tunable qubit device may also include a capacitor structure in parallel with each of the two Josephson junctions. The transition frequency of the tunable qubit device may be defined at least in part by Josephson energies of the two Josephson junctions, a capacitance of the capacitor structure and a magnetic flux threading the superconducting circuit loop. In some examples, a fixed-frequency qubit device that includes a single Josephson junction, and the transition frequency of the fixed-frequency qubit device is defined at least in part by a Josephson energy of the Josephson junction (independent of a magnetic flux experienced by the fixed-frequency qubit device).

Figure 3:
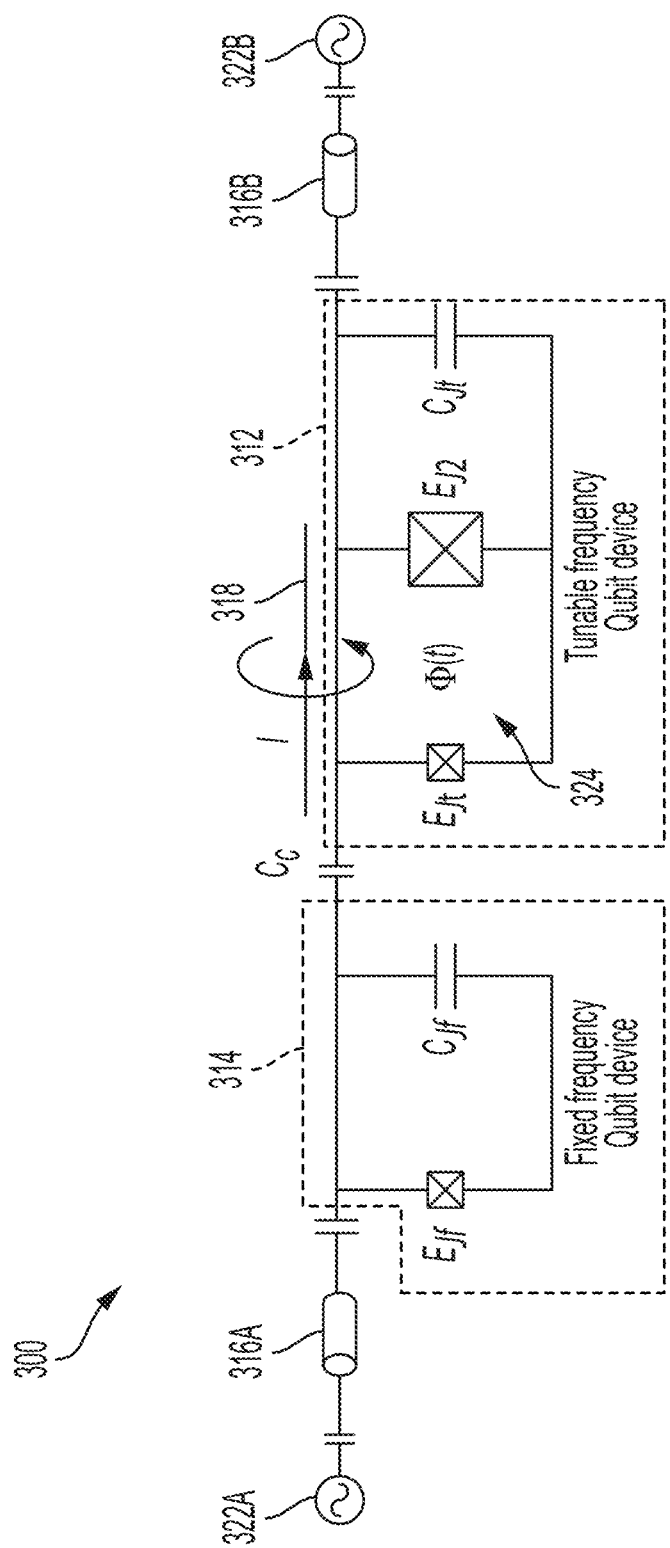
FIG. 3 shows an equivalent circuit for two example qubit devices and associated devices in a quantum computing system.

As a particular example, FIG. 3 shows an equivalent circuit of an example tunable qubit device 312, which includes a superconducting circuit loop 324 that receives a magnetic flux $\Phi(t)$ that controls the transition frequency of the tunable qubit device 312. Manipulating the magnetic flux $\Phi(t)$ through the circuit loop 324 can increase or decrease transition frequencies of the example tunable qubit device 312. In this example, the magnetic flux $\Phi(t)$ through the SQUID loop is an offset field that can be modified in order to tune the transition frequency. In some cases, an inductor or other type of flux-bias device is coupled to the SQUID loop by a mutual inductance, and the magnetic flux $\Phi(t)$ through the SQUID loop can be controlled by the current through the inductor. In some cases, a coupling strength can be controlled by both AC and DC components of the current.

In the example shown in FIG. 2, each tunable qubit device 212A, 212B, 212C, 212D, 212E has one or more tunable transition frequencies. In particular, the transition frequencies of the tunable qubit devices 212A, 212B, 212C, 212D, 212E can be tuned by applying an offset field to the tunable qubit device. The offset field can be, for example, a magnetic flux bias, a DC electrical voltage, or another type of field. In some implementations, the tunability of the tunable qubit devices 212A, 212B, 212C, 212D, 212E in the quantum processor 204 allows neighboring pairs of qubits to be selectively coupled on-demand to perform multi-qubit gates, to entangle neighboring pairs of qubits, or to perform other types of operations. The tunable qubit devices can have a high "on/off" ratio, which refers to the ratio of the effective coupling rate provided by control of the tunable qubit device.

In some implementations, the other qubit devices 214A, 214B, 214C, 214D are implemented as fixed-frequency qubit devices whose relevant transition frequencies do not respond to offset fields. In some cases, the tunable qubit devices 212A, 212B, 212C, 212D, 212E can be selectively activated by an offset field that does not directly affect the information encoded in the other qubit devices 214A, 214B, 214C, 214D. For instance, although the offset field may cause the tunable qubit device 212C to interact with one of the other qubit devices 214A, 214B, 214C, 214D, the offset field does not modify the transition frequencies of the other qubit devices 214A, 214B, 214C, 214D (even if the other qubit devices experience the offset field). In this manner, the combination of tunable qubit devices with fixed-frequency qubit devices may allow selective, on-demand coupling of qubit devices while improving performance of the qubit devices. For example, the qubit devices may have longer coherence times, may be more robust against environmental or applied offset fields, etc. In some cases, the other qubit devices 214A, 214B, 214C, 214D are implemented as other types of devices (e.g., tunable qubit devices).

In some instances, information is encoded in the qubit devices in the quantum processor 204, and the information can be processed by operation of the tunable qubit devices 212A, 212B, 212C, 212D, 212E. For instance, input information can be encoded in the computational states or computational subspaces defined by some of all of the qubit devices in the quantum processor 204. The information can be processed, for example, by applying a quantum algorithm or other operations to the input information. The quantum algorithm may be decomposed as gates or instruction sets that are performed by the qubit devices over a series of clock cycles. For instance, a quantum algorithm may be executed by a combination of single-qubit gates and two-qubit gates. In some cases, information is processed in another manner. Processing the information encoded in the qubit devices can produce output information that can be extracted from the qubit devices. The output information can be extracted, for example, by performing state tomography or individual readout operations. In some instances, the output information is extracted over multiple clock cycles or in parallel with the processing operations.

In some aspects of operation, the control system 202 sends control signals to the tunable qubit devices in the quantum processor 204. The control signals can be configured to modulate, increase, decrease, or otherwise manipulate the transition frequencies of the tunable qubit devices 212A, 212B, 212C, 212D, 212E. For example, the control signal can be a bias signal that varies a magnetic flux experienced by the tunable qubit device, and varying the magnetic flux can change the transition frequency of the tunable qubit device. In some implementations, a control signal can be a direct current (DC) signal communicated from the control system 202 to the individual tunable qubit device. In some implementations, a control signal can be an alternating current (AC) signal (which may be superposed with a direct current (DC) signal) communicated from the control system 202 to the individual tunable qubit device. Other types of control signals may be used.

In the example shown in FIG. 2, the control system 202 sends control signals 206 to the tunable qubit device 212C to generate interactions between the tunable qubit device 212C and individual nearest neighbor qubit devices. In particular, the control signals 206 can generate a first interaction 216A between the tunable qubit device 212C and the other qubit device 214A, a second interaction 216B between the tunable qubit device 212C and the other qubit device 214B, a third interaction 216C between the tunable qubit device 212C and the other qubit device 214C, a fourth interaction 216D between the tunable qubit device 212C and the other qubit device 214D, or a combination of them in series or in parallel.

In some implementations, the control signals are configured to generate interactions that perform quantum logic gates on the quantum states of one or more of the qubit devices. For example, in some cases, one or more of the control signals 206 generates an interaction that applies a parametrically activated two-qubit quantum logic gate to a pair of qubits defined by the tunable qubit device 212C and one or more of the other qubit devices 214A, 214B, 214C, 214D. The control signals 206 may activate quantum logic gates by modulating a transition frequency of the tunable qubit device 212C, for example, at a modulation frequency. For instance, the modulation of the transition frequency over a specified time period can produce the unitary evolution associated with the quantum logic gate.

In some instances, the control system 202 identifies a quantum logic gate to be applied to a pair of qubits in the quantum processor 204. The pair of qubits can be, for example, a first qubit defined by the tunable qubit device 212C and a second qubit defined by one of the other qubit devices (214A, 214B, 214C, 214D) that neighbor the tunable qubit device 212C in the qubit device array. In examples described below, two of the transition frequencies of the tunable qubit device 212C can be expressed a $\omega_{T_{01}}(t)$ and $\omega_{T_{01}}(t)-\eta_T(t)$, and the other qubit device can be a fixed-frequency qubit device with transition frequencies that can be expressed $(\omega_{F_{02}})$ and $(\omega_{F_{01}}-\eta_F)$, where $\eta_T(t)$ and $\eta_F$ are the anharmonicities of the tunable and fixed frequency qubit, respectively. The control signal 206 can be configured to apply the quantum logic gate by modulating the transition frequency $\omega_{T_{01}}(t)$ of the tunable qubit device 212C, for example, at a specified modulation frequency $\omega_m$. The control system 202 may determine the modulation frequency based on a transition frequency $(\omega_{F_{01}})$ or $(\omega_{F_{01}}-\eta_F)$ of the fixed-frequency qubit device, and possibly other information. The control system can apply the quantum logic gate by communicating the control signal 206 to a control line that is coupled to the tunable qubit device 212C in the quantum processor 204.

In some cases, the modulation frequency $\omega_m$ is determined based on a transition frequency of the tunable qubit device 212C and a transition frequency of the fixed-frequency qubit device. For example, the modulation frequency $\omega_m$ may be specified as the sum or difference of a transition frequency of the fixed-frequency qubit device $((\omega_{F_{02}})$ or $(\omega_{F_{01}}-\eta_F))$ and a reference transition frequency of the tunable qubit device $((\overline{\omega}_{F_{02}})$ or $\overline{\omega}_{F_{01}}-\overline{\eta}_T)$. The reference transition frequency can be, for example, the average transition frequency of the tunable qubit device during the modulation. Additionally or alternatively, the modulation frequency may be determined based on other combinations of one or more of the anharmonicity of either qubit device, the transition frequency between the ground state and first excited state of the fixed-frequency qubit device, the transition frequency between the first excited state and second excited state of the fixed-frequency qubit device, or other parameters. In some cases, the modulation frequency $\omega_m$, the modulation amplitude $\delta\omega$, or other parameters of the control signal for a quantum logic gate are determined based on transition frequencies, anharmonicities, the bare interaction strength g, a preselected value, data from a calibration or other test procedure, or a combination of these and other information.

The modulation frequency $\omega_m$ and other parameters of the control signal can be selected to achieve a specified quantum logic gate in some cases. In some system, the modulation frequency $\omega_m$ is a radio frequency or microwave frequency, for example, in the range of 1 MHz to 20 GHz. For instance, in some superconducting systems, a modulation frequency $\omega_m$ at or below 2 GHz may be used for single-photon gates, and a modulation frequency $\omega_m$ in the range of 6-15 GHz may be used for two-photon gates. Other frequency ranges may be used in superconducting systems or other types of systems. The duration of the interaction produced by the modulation frequency $\omega_m$ may also be selected to achieve a specified quantum logic gate in some cases. In some system, the interaction time is in the range of 1 nanoseconds to 10 microseconds. For instance, in some superconducting systems, the total interaction time for certain single-photon or two-photon gates is in the range of 10 nanoseconds to 1 microsecond. Other interaction times may be used in superconducting systems or other types of systems.

In some cases, applying the two-qubit quantum logic gate to the pair of qubits includes applying an iSWAP gate or a square-root-of-iSWAP gate to the pair of qubits. For example, the control signal 206 can be configured to modulate the transition frequency of the tunable qubit device 212C about a reference frequency $\overline{\omega}_{T_{02}}$ at the modulation frequency $\omega_m = |\overline{\omega}_{T_{01}} - \omega_{F_{02}}|$. In this example, $\omega_m = |\overline{\omega}_{T_{01}} - \omega_{F_{02}}| = |\Delta|$, and $\overline{\omega}_{T_{01}} = \omega_{F_{01}}(\Phi_p) + \delta\omega$ in the discussion below. Here, $\omega_{T_{01}}(\Phi_p)$ represents a transition frequency of the tunable qubit device when the control line applies a reference DC flux $\Phi_p$ value, and $\delta\omega$ represents a shift in the transition frequency of the tunable qubit device due to the modulation of the flux about the reference DC flux $\Phi_p$ value in the weak flux modulation regime. In some cases, the control signal is configured to modulate the transition frequency of the tunable qubit device at the modulation frequency $\omega_m$ with a modulation amplitude $\delta\omega$, and the control signal is configured to produce an interaction between the tunable qubit device and the other qubit device for a total interaction time $$t_{iSWAP}^{(1)} = \frac{\pi}{2} \frac{1}{g|J_1(\delta\omega/\Delta)|},$$

$$t_{\sqrt{iSWAP}}^{(1)} = \frac{\pi}{4} \frac{1}{g|J_1(\delta\omega/\Delta)|},$$

or another interaction time. Here, g represents a capacitive coupling strength between the tunable qubit device 312 and the fixed-frequency qubit device 314, and $J_1$ represents a first-order Bessel function of the first kind. The above equations for the iSWAP and square-root-of-iSWAP gate times are generally valid when the magnetic flux modulation amplitude is less than or similar to half a flux quantum (when $\Phi_m \lesssim \Phi_0/2$). Accordingly, in some cases, when the gate times above are used, the magnetic flux control signal is configured to maintain the magnetic flux modulation amplitude below $\Phi_0/2$.

In some cases, applying the two-qubit quantum logic gate to the pair of qubits includes applying a controlled phase gate (e.g., a controlled-Z gate) to the pair of qubits. For example, the control signal 206 can be configured to modulate the transition frequency of the tunable qubit device 212C about the reference frequency $\overline{\omega}_{T_{01}}$ at the modulation frequency $\omega_m = |\overline{\omega}_{T_{01}} - \omega_{F_{02}} - \overline{\eta}_T|$, where $\overline{\eta}_T$ is the average anharmonicity of the tunable qubit over a period. In this example, $\omega_m = |\Delta - \overline{\eta}_T|$ and $\overline{\omega}_{T_{01}} = \omega_{T_{01}}(\Phi_p) + \delta\omega$. As another example, the control signal 206 can be configured to modulate the transition frequency of the tunable qubit device 212C about the reference frequency $\overline{\omega}_{T_{01}}$ at the modulation frequency $\omega_m = |\overline{\omega}_{T_{01}} - \omega_{F_{02}} + \eta_F|$, In this example, $\omega_m = |\Delta + \eta_F|$. The control signal 206 may be configured to produce an interaction between the tunable qubit device and the other qubit device for a total interaction time $$t_{CZ}^{(1)} = \frac{\pi}{\sqrt{2}} \frac{1}{g|J_1(\delta\omega/\omega_m)|},$$

or another interaction time. The above equation for the Controlled-Z gate time is generally valid when the magnetic flux modulation amplitude is less than or similar to half a flux quantum (when $\Phi_m \lesssim \Phi_0/2$). Accordingly, in some cases, when the gate time above is used, the magnetic flux control signal is configured to maintain the magnetic flux modulation amplitude below $\Phi_0/2$.

In some cases, applying the two-qubit quantum logic gate to the pair of qubits includes applying a Bell-Rabi gate, a square-root-of-Bell-Rabi gate or another two-photon gate to the pair of qubits. For example, the control signal 206 can be configured to modulate the transition frequency of the tunable qubit device 212C about the reference frequency $\overline{\omega}_{R_{01}}$ at the modulation frequency $\omega_m = \overline{\omega}_{T_{01}} + \omega_{F_{01}}$ In this example, $\omega_m = \overline{\omega}_{T_{01}} + \omega_{F_{01}} = \Sigma$. The control signal may be configured to produce an interaction between the tunable qubit device and the fixed-frequency qubit device for a total interaction time $$t_{BR}^{(1)} = \frac{\pi}{g|J_1(\delta\omega/\Sigma)|},$$

or another interaction time. The control signal 206 may be configured to produce an interaction for another time duration, for example, as described below. The above equation for the Bell-Rabi gate time is generally valid when the magnetic flux modulation amplitude is less than or similar to half a flux quantum (when $\Phi_m \lesssim \Phi_0/2$). Accordingly, in some cases, when the gate time above is used, the magnetic flux control signal is configured to maintain the magnetic flux modulation amplitude below $\Phi_0/2$.

The total interaction time may be determined by the control system 202 based on the parameters of the quantum logic gate to be applied, based on the bare interaction strength g, based on the modulation frequency $\omega_m$, the modulation amplitude $\delta\omega$, or other parameters. In some cases, the total interaction time is selected based on a preselected value, data from a calibration or other test procedure, or a combination of these and other information.

In some cases, communicating the control signal to the control line produces, between the tunable qubit device 212C and the other qubit device, an interaction having an effective coupling strength that is based on the modulation frequency $\omega_m$. For example, the control signal may produce an effective coupling strength $$g_{10 \leftrightarrow 01}^{(n)} = g \left| J_n\left(\frac{n\delta\omega}{\Delta}\right) \right|$$

in the case of $\omega_m = |\Delta|$. As another example, the control signal may produce an effective coupling strength $$g_{11 \leftrightarrow 02}^{(n)} = \sqrt{2} \, g \left| J_n\left(\frac{n\delta\omega}{\Delta - \overline{\eta}_T}\right) \right|$$

in the case of $\omega_m = |\Delta - \overline{\eta}_T|$. As another example, the control signal may produce an effective coupling strength $$g_{11 \leftrightarrow 20}^{(n)} = \sqrt{2} \, g \left| J_n\left(\frac{n\delta\omega}{\Delta + \eta_F}\right) \right|$$

in the case of $\omega_m = |\Delta + \eta_F|$. The control signal may produce another effective coupling strength between the qubit devices, for instance, according to the examples described below. The above equations for the coupling strengths are generally valid when the magnetic flux modulation amplitude is less than or similar to half a flux quantum (when $\Phi_m \lesssim \Phi_0/2$). Accordingly, in some cases, when the coupling strengths above are used to compute control signal parameters, the magnetic flux control signal is configured to maintain the magnetic flux modulation amplitude below $\Phi_0/2$.

In some cases, the control line (which receives the control signal 206) may include a flux-bias device that is inductively coupled to the superconducting circuit loop of the tunable qubit device 212C to control the magnetic flux through a superconducting circuit loop in the tunable qubit device 212C. The control signal may cause the flux-bias device to modulate the magnetic flux at a flux modulation frequency; the flux modulation frequency may be the same as the modulation frequency $\omega_m$, or the flux modulation frequency may be a different value (e.g., half the modulation frequency $\omega_m$).

In some cases, multiple two-qubit quantum logic gates are applied in the quantum processor 204 (e.g., during execution of a quantum algorithm), and two-qubit quantum logic gates may be applied to the tunable qubit device 212C and the other qubit devices 214A, 214B, 214C, 214D. For example, a first control signal can be configured to modulate, at a first modulation frequency, the transition frequency ($\omega_{T_{01}}(t)$) of the tunable qubit device 212C, with the first modulation frequency being determined based on a transition frequency ($((\omega_{F_{01}})$ or $(\omega_{F_{01}} - \eta_F))$) of the qubit device 214A. A first two-qubit quantum logic gate can then be applied to a first pair of qubits (the qubit defined by the tunable qubit device 212C and another qubit defined by the other qubit device 214A), by communicating the first control signal to the control line coupled to the tunable qubit device 212C. In addition, a second control signal can be configured to modulate, at a second modulation frequency, the transition frequency ($\omega_{T_{01}}(t)$) of the tunable qubit device 212C, with the second modulation frequency being determined based on a transition frequency ($(\omega_3)$ or $(\omega_3 - \eta_3)$) of the qubit device 214B. A second two-qubit quantum logic gate can then be applied to a second pair of qubits (the qubit defined by the tunable qubit device 212C and another qubit defined by the other qubit device 214B), by communicating the second control signal to the control line coupled to the tunable qubit device 212C. A similar technique may be used for any set of neighboring qubits in the quantum processor 204. In this example, the tuning port for the tunable qubit device 212C can be used to apply two-qubit gates selectively to any one of four pairs of nearest neighbor qubits in the qubit device array.

In some cases, the control signal can be a simple sinusoid having the single frequency $\omega_m$ with an amplitude $\delta\omega$ around a reference frequency $\bar{\omega}_{T_{01}}$. However, such control signals may introduce higher-order harmonics in the magnetic flux and in some instances (e.g., when the magnetic flux modulation amplitude is greater than $\Phi_0/2$). Accordingly, sinusoidal modulation control signals may be used with a magnetic flux modulation amplitude less than $\Phi_0/2$ to apply parametrically activated quantum logic gates in some cases.

In some implementations, a flux modulation control signal that is configured to apply a parametrically activated quantum logic gate has a magnetic flux modulation amplitude greater than or equal to $\Phi_0/2$. For example, a control signal can be shaped or optimized (e.g., using optimal control theory techniques such as Gradient Ascent Pulse Engineering or others) to modulate the transition frequency of the tunable qubit device at a single frequency $\omega_m$ with an amplitude $\delta\omega$ around a reference frequency $\bar{\omega}_{T_{01}}$. In some cases, a complicated flux modulation pulse (e.g., obtained with optimal control) would generate only the harmonic of interest even at magnetic flux modulation amplitude greater than $\Phi_0/2$. For example, a pulse shape that substantially generates only one harmonic may be optimized by the control system. In some cases, large modulation amplitudes are used when the flux modulation control signal is not a sinusoid, but something more complicated, found to cancel higher harmonics of the transition frequency of the tunable qubit device.

In some implementations, the control system 202, or another type of system associated the quantum computing system 200, determines gate parameters for applying parametrically activated quantum logic gates in the quantum processor 204. For example, the gate parameters may be determined by a gate calibration process defined in software, firmware or hardware or a combination thereof. The gate calibration process may include one or more operations of the example process 2200 shown in FIG. 22, one or more operations of the example process 2300 shown in FIG. 23, one or more operations of the example process 2800 shown in FIG. 28, or the gate calibration process may be performed in another manner.

In some cases, the control system 202 executes a gate calibration process when the quantum processor 204 is first installed for use in the quantum computing system 200, and the gate calibration process may be repeated at other times (e.g., as needed, periodically, according to a calibration schedule, etc.). For instance, a gate calibration module may execute a calibration process that obtains qubit device parameters of the qubit devices in the quantum processor 204. The qubit device parameters may be obtained by the gate calibration process, for example, based on measurements of the quantum processor 204, based on a circuit specification of the quantum processor 204, based on analytical or numerical calculations, or otherwise. The qubit device parameters may include, for example, qubit frequencies (e.g., a tunable range) and an anharmonicity for each tunable qubit device; a qubit frequency and anharmonicity for each respective fixed-frequency qubit devices; effective coupling strengths; dispersive shifts; etc. Based on the qubit device parameters, the calibration process may select gate parameters of a two-qubit quantum logic gate for application to pairs of qubits defined by pairs of devices (e.g., for fixed-frequency qubit device 214A and tunable qubit device 212C, etc.), This may be executed for each pair of neighboring qubit devices in the quantum processor 204.

In some implementations, a calibration process executed by the control system 202 or another type of system selects parameters of the control signals 206 for delivery to the control line coupled to the tunable qubit device 212C. The gate parameters may correspond to a modulation amplitude of a flux modulation produced by the control signal 206; a modulation frequency of the flux modulation produced by the control signal 206; a modulation time (a duration) of the flux modulation produced by the control signal 206; and possibly other parameters. The modulation frequency can be determined based on the sum or the difference of a transition frequency of the tunable qubit device 212C and a transition frequency of one of the fixed-frequency qubit devices (e.g., 214A, etc.). As discussed above, the modulation frequency can be determined based on the transition frequency of the fixed-frequency qubit device and the transition frequency of the tunable qubit device; based on the transition frequency of the fixed-frequency qubit device and the anharmonicity of the tunable qubit device; based on the transition frequency between the ground state and first excited state of the fixed-frequency qubit device; based on the transition frequency between the first excited state and second excited state of the fixed-frequency qubit device; based on the transition frequency of the tunable qubit device and the anharmonicity of the fixed-frequency qubit device; based on the transition frequency between the ground state and first excited state of the tunable qubit device; based on the transition frequency between the first excited state and second excited state of the tunable qubit device; or based on any combination of these and other qubit device parameters.

FIG. 3 shows an equivalent circuit 300 for two example qubit devices and associated devices in a quantum computing system. In some examples, the devices represented in FIG. 3 may be arranged in a device array or another type of ordered structure. For instance, the equivalent circuit 300 in FIG. 3 can represent any of the tunable qubit devices and one of its nearest-neighbor qubit devices in the quantum processor 204 in FIG. 2, or the equivalent circuit 300 in FIG. 3 can represent devices in another type of system or environment.

The example equivalent circuit 300 represented in FIG. 3 includes a tunable qubit device 312, a fixed-frequency qubit device 314, and a control line 318 coupled to the tunable qubit device 312. The example equivalent circuit 300 also includes a source 322A and readout resonator 316A coupled to the fixed-frequency qubit device 314, and a source 322B and readout resonator 316B coupled to the tunable qubit device 312. The control line 318 can be a conductor, and inductor, or another type of circuit component configured to carry a current I, which generates a flux $\Phi(t)$ through a circuit loop 324 in the tunable qubit device 312. The quantum computing system may include additional or different features, and the components may be arranged as shown or in another manner.

In the example shown in FIG. 3, the fixed-frequency qubit device 314 is implemented as a transmon qubit device. As shown, the qubit device circuitry includes a Josephson junction (having Josephson energy $E_{Jf}$) and a shunt capacitance ($C_{Jf}$). In the example shown in FIG. 3, the tunable qubit device 312 is a tunable transmon qubit device. As shown, the tunable transmon device circuitry includes two Josephson junctions (having Josephson energies $E_{J1}$ and $E_{J2}$) in parallel with each other in the circuit loop 324, and a shunt capacitance ($C_{Jt}$) in parallel with the two Josephson junctions in the circuit loop 324. The example control line 318 may include an inductance loop or another type of flux bias device that is coupled (e.g., conductively, capacitively, inductively) to a control port to receive control signals, and to the tunable transmon device circuitry. The example fixed-frequency qubit device 314 is capacitively coupled to the tunable qubit device 254 by a capacitance $C_c$. Fixed-frequency qubit devices and tunable qubit devices may be implemented by other types of systems, and the features and components represented in FIG. 3 can be extended in a larger two-dimensional or three-dimensional array of devices.

In the example shown in FIG. 3, the fixed-frequency qubit device 314 is implemented as a transmon qubit device. As shown, the qubit device circuitry includes a Josephson junction (having Josephson energy $E_{Jf}$) and a shunt capacitance ($C_{Jf}$). In the example shown in FIG. 3, the tunable qubit device 312 is a tunable transmon qubit device. As shown, the tunable transmon device circuitry includes two Josephson junctions (having Josephson energies $E_{J1}$ and $E_{J2}$) in parallel with each other in the circuit loop 324, and a shunt capacitance ($C_{Jt}$) in parallel with the two Josephson junctions in the circuit loop 324. The example control line 318 may include an inductance loop or another type of flux bias device that is coupled (e.g., conductively, capacitively, inductively) to a control port to receive control signals, and to the tunable transmon device circuitry. The example fixed-frequency qubit device 314 is capacitively coupled to the tunable qubit device 312 by a capacitance $C_c$. Fixed-frequency qubit devices and tunable qubit devices may be implemented by other types of systems, and the features and components represented in FIG. 3 can be extended in a larger two-dimensional or three-dimensional array of devices.

In the example shown in FIG. 3, a parameter g can represent the capacitive coupling strength between the fixed-frequency qubit device 314 and the tunable qubit device 312. The fixed-frequency qubit device 314 has a fixed transition frequency $\omega_{F_{01}}$, while the tunable qubit device 312 has a tunable transition frequency $\omega_{T_{01}}(t)$ that changes over time. In this example, the tunability of the transition frequency can be used to generate two-qubit gates on the qubit devices 312, 314. For instance, by modulating the tunable transition frequency $\omega_{T_{01}}(t)$ at a sum or difference frequency (e.g., the sum or difference between transition frequencies of each device), an interaction can be generated between the two qubit devices 312, 314 to apply two-qubit quantum logic gates.

Figure 4:
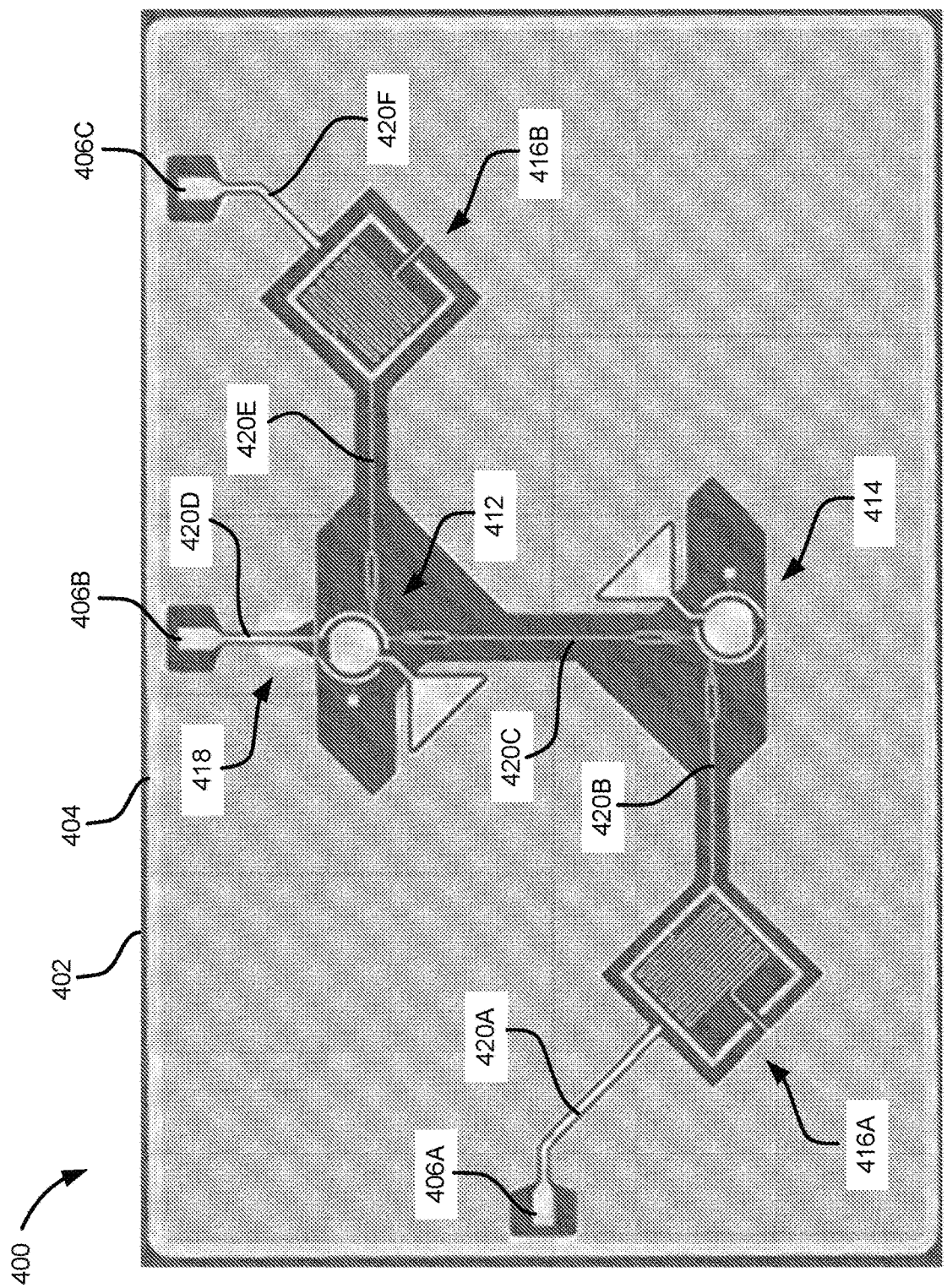
FIG. 4 shows a superconducting circuit that includes two example qubit devices.

FIG. 4 shows an example superconducting circuit 400 that can be represented by the equivalent circuit 300 shown in FIG. 3. Other superconducting circuits or other types of systems may be represented by the equivalent circuit 300 shown in FIG. 3. The example superconducting circuit 400 shown in FIG. 4 includes a substrate 402 (e.g., sapphire or silicon or another dielectric material), with circuit devices and a ground plane 404 disposed on the substrate 402. The circuit devices and the ground plane 404 can be formed by one or more metal (e.g. superconducting metal) layers or other materials on the surface of the substrate 402.

In the example shown in FIG. 4, the circuit devices include a tunable qubit device 412, a fixed-frequency qubit device 414, a flux-bias device 418, and two readout resonators 416A, 416B. The tunable qubit device 412 includes a circuit loop that has two Josephson junctions in parallel, and the circuit loop is inductively coupled to (has a mutual inductance with) the flux-bias device 418. The example superconducting circuit 400 also includes three signal ports: a signal port 406A that is connected to the readout resonator 416A by signal line 420A; a signal port 406B that is connected to the flux-bias device 418 by signal line 420D; and a signal port 406C that is connected to the readout resonator 416B by signal line 420F. The signal ports can communicate control signals between an external control system and the devices in the superconducting circuit 400. The example superconducting circuit 400 also includes capacitive couplings between the circuit devices: the readout resonator 416A is capacitively coupled to the fixed-frequency qubit device 414 through the signal line 420B; the readout resonator 416B is capacitively coupled to the tunable qubit device 412 through the signal line 420E; and the fixed-frequency qubit device 414 is capacitively coupled to the tunable qubit device 412 through the signal line 420C. The superconducting circuit 400 may include additional or different features and components, which may be configured in another manner.

The example system represented by the equivalent circuit 300 shown in FIG. 3 can be described by the Hamiltonian $$H = \omega_{F_{01}}|1\rangle\langle 1|\oplus I + (2\omega_{F_{01}} - \eta_1)|2\rangle\langle 2|\oplus I + \omega_{T_{01}}(t)I\oplus|1\rangle\langle 1| + [2\omega_{T_{01}}(t) - \eta_2(t)]I\oplus|2\rangle\langle 2|$$

$$+ g(\sigma_1\sigma_2{}' + \sigma_1{}'\sigma_2 + \sigma_1\sigma_2 + \sigma_1{}'\sigma_2{}') \quad (1)$$

where $\omega_{F_{01}}$ and $\omega_{T_{01}}(t)$ are the transition frequencies of the two qubits defined by the fixed-frequency qubit device 314 and the tunable qubit device 312, respectively, $\eta_F$ and $\eta_T(t)$ are the anharmonicities of the fixed-frequency qubit device 314 and the tunable qubit device 312, respectively, and $$\sigma_1 = \begin{pmatrix} 0 & 1 & 0 \\ 0 & 0 & \sqrt{2} \\ 0 & 0 & 0 \end{pmatrix} \otimes I$$

$$\sigma_2 = I \otimes \begin{pmatrix} 0 & 1 & 0 \\ 0 & 0 & \sqrt{2} \\ 0 & 0 & 0 \end{pmatrix}.$$

In some instances, parametrically-activated iSWAP gates are applied to the fixed-frequency qubit device 314 and the tunable qubit device 312. A class of iSWAP gates can be activated when the frequency of the tunable qubit is modulated by a microwave or rf tone through the flux bias line at difference frequency of the $|0\rangle_T \to |1\rangle_T$ transitions. Writing the frequency of modulation in a simple form $\rangle$ $$\omega_{T_{01}}(t) = \bar{\omega}_{T_{01}} + \delta\omega_m \cos(\omega_m t + \varphi_m)$$

where $\delta\omega_m$ is the modulation amplitude, $\varphi_m$ is the phase shift and transforming the Hamiltonian to a frame defined by the unitary $U = \exp[-1\int_0^t dt' H_0(t')]$ and applying the rotating wave approximation (dropping the term $g(\sigma_1\sigma_2 + \sigma_1{}'\sigma_2{}')$), we have $$H_I = U^\dagger(t)HU(t) - iU^\dagger(t)\dot{U}(t)$$

$$H_I = g_{10\leftrightarrow 01}|10\rangle\langle 01| + g_{11\leftrightarrow 02}|11\rangle\langle 02| + g_{11\leftrightarrow 20}|11\rangle\langle 20| + g_{12\leftrightarrow 21}|12\rangle\langle 21| + H.c.$$

where $$g_{10\leftrightarrow 01} = g\exp\left[i\Delta t - \frac{i\delta\omega}{\omega_m}\sin(\omega_m t + \varphi_m)\right] = g\sum_{-\infty}^{\infty}(-1)^n J_n\left(\frac{\delta\omega}{\omega_m}\right)e^{i(n\omega_m - \Delta)t}e^{i\beta_n} \quad (3)$$

$$g_{11\leftrightarrow 02} = \sqrt{2}g\sum_{-\infty}^{\infty}(-1)^n J_n\left(\frac{\delta\omega}{\omega_m}\right)e^{i(n\omega_m - (\Delta - \eta_T))t}e^{i\beta_n} \quad (4)$$

$$g_{11\leftrightarrow 20} = \sqrt{2}g\sum_{-\infty}^{\infty}(-1)^n J_n\left(\frac{\delta\omega}{\omega_m}\right)e^{i(n\omega_m - (\Delta + \eta_F))t}e^{i\beta_n} \quad (5)$$

$$g_{12\leftrightarrow 21} = 2g\sum_{-\infty}^{\infty}(-1)^n J_n\left(\frac{\delta\omega}{\omega_m}\right)e^{i(n\omega_m - (\Delta + \eta_F - \eta_T))t}e^{i\beta_n} \quad (6)$$

where $J_n$ is the Bessel function of the first kind, and $\beta_n = n\varphi_m + (\bar{\omega}_{T_{01}}/\omega_m)\sin(\varphi_m)$ and $g_{10\leftrightarrow 01}$ is the effective coupling between the qubits induced by the modulation of the tunable qubit frequency that allows execution of the iSWAP class of gates. This gate may be activated when the detuning between $|01\rangle$ and $|10\rangle$ is an integer multiples of the modulation frequency, $$\omega_m = \frac{\Delta}{n}, n = \pm 1, \pm 2, \ldots$$

The effective coupling activated by the nth harmonics is given by $$g^{(n)}_{10\leftrightarrow 01} = g\left|J_n\left(\frac{n\delta\omega}{\Delta}\right)\right|.$$

This shows that it is possible to activate the iSWAP class of gates by modulating the qubit frequency at an integer fraction of the detuning $\Delta = \bar{\omega}_{T_{01}} - \omega_{F_{01}}$. As an example implementation, for n=1, when the modulation frequency is equal to the detuning, an iSWAP gate is activated after an interaction time (or gate time)

$$t^{(1)}_{iSWAP} = \frac{\pi}{2}\frac{1}{|g^{(1)}_{10\leftrightarrow 01}|} = \frac{\pi}{2}\frac{1}{g|J_1(\delta\omega/\Delta)|}$$

The unitary for this iSWAP gate is then $$U_{iSWAP} = \begin{pmatrix} 1 & 0 & 0 & 0 \\ 0 & 0 & i & 0 \\ 0 & i & 0 & 0 \\ 0 & 0 & 0 & 1 \end{pmatrix}.$$

In the computational subspace the coupled qubits ($|00\rangle$, $|01\rangle$, $|10\rangle$, $|11\rangle$), this quantum logic gate applies the following quantum Boolean logic operations:

$$U_{iSWAP}|00\rangle = |00\rangle$$

$$U_{iSWAP}|01\rangle = i|10\rangle$$

$$U_{iSWAP}|10\rangle = i|01\rangle$$

$$U_{iSWAP}|11\rangle = |11\rangle$$

In another example implementation, for an interaction time of $$t^{(1)}_{\sqrt{iSWAP}} = \frac{\pi}{4}\frac{1}{g|J_1(\delta\omega/\Delta)|}$$

we can activate another gate form the iSWAP class of gates, which unitary is given by $$U_{\sqrt{iSWAP}} = \begin{pmatrix} 1 & 0 & 0 & 0 \\ 0 & \frac{1+i}{2} & \frac{1-i}{2} & 0 \\ 0 & \frac{1-i}{2} & \frac{1+i}{2} & 0 \\ 0 & 0 & 0 & 1 \end{pmatrix}.$$

Accordingly, a variety of gates in the iSWAP class of gates may be applied by modulating the transition frequency of the tunable qubit device at the difference frequency $\Delta$, and determining the interaction time to select a particular gate in the iSWAP class of gates. The above equations for the effective coupling and gate times are generally valid when the magnetic flux modulation amplitude is less than or similar to half a flux quantum (when $\Phi_m \lesssim \Phi_0/2$). Accordingly, in some cases, when these equations are used, the magnetic flux control signal is configured to maintain the magnetic flux modulation amplitude below $\Phi_0/2$.

In some implementations, the iSWAP interaction inherently swaps the phases of the two qubits, and the phase of the modulation-drive control signal also adds a phase to each qubit. Therefore, it is necessary, at least in certain cases, to maintain phase coherence across all qubit-drive control signals and qubit-modulation control signals.

Figure 5:
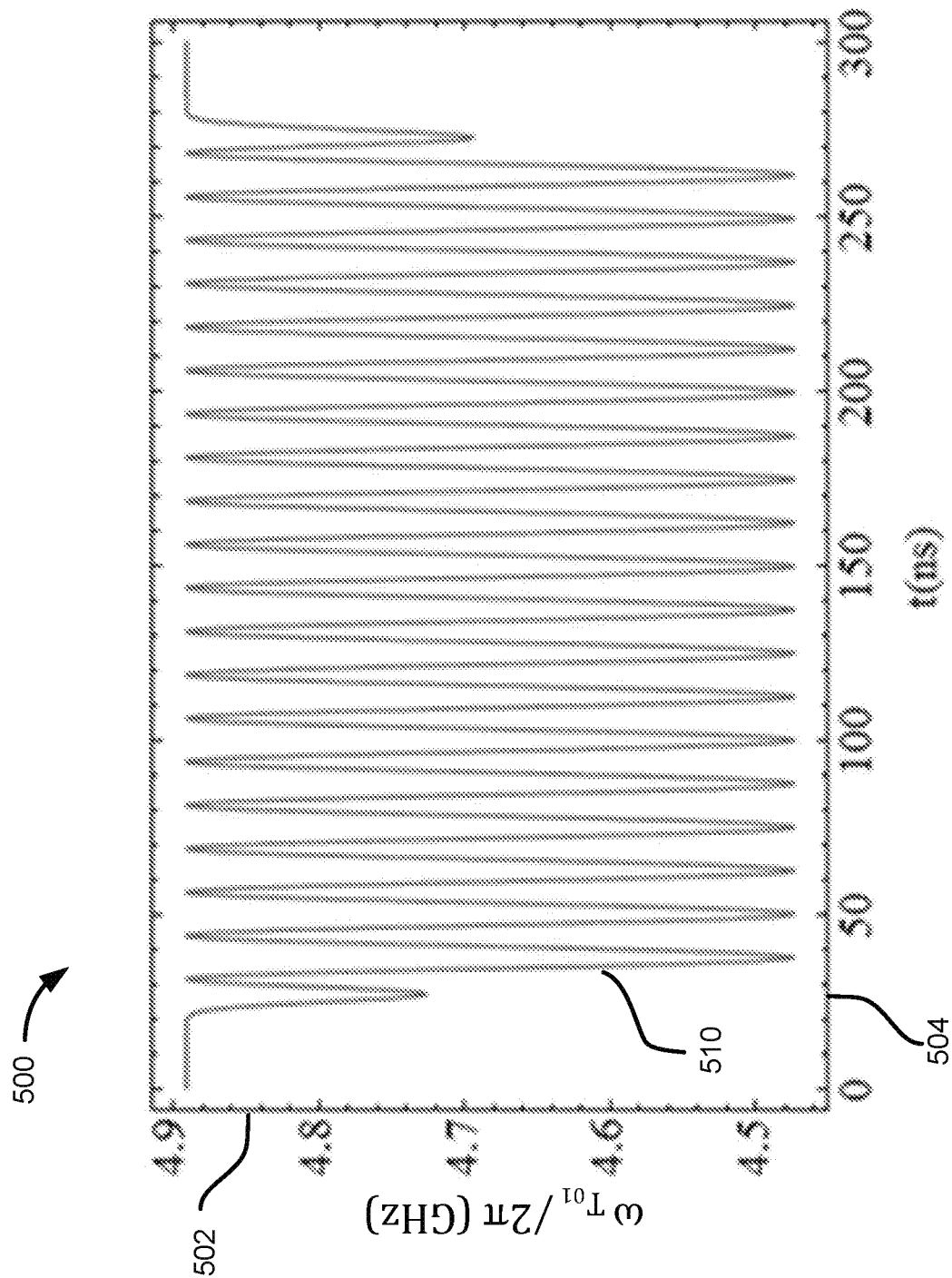
FIG. 5 is a plot of transition frequency versus time for an example qubit device.

FIG. 5 is a plot 500 of transition frequency versus time for an example qubit device. The vertical axis 502 represents a range of frequency values in units of GigaHertz (GHz), and the horizontal axis 504 represents a time domain of a control signal in units of nanoseconds (ns). The curve 510 plotted in FIG. 5 represents a $\omega_{T_{01}}(t)$, the value of the $|0\rangle \rightarrow |1\rangle$ transition frequency of the tunable qubit device over time for an example control signal. As shown, the transition frequency is modulated at the modulation frequency $\omega_m$.

FIG. 6 is an energy level diagram 600 showing energy levels defined by two example qubit devices. The example energy level diagram 600 includes energy levels 602 of the fixed-frequency qubit device 314 shown in FIG. 3: the ground state $|0\rangle_F$ of the fixed-frequency qubit device 314, the first excited state $|1\rangle_F$ of the fixed-frequency qubit device 314, and the second excited state $|2\rangle_F$ of the fixed-frequency qubit device 314. The example energy level diagram 600 also includes energy levels 604 of the tunable qubit device 312 shown in FIG. 3: the ground state $|0\rangle_T$ of the tunable qubit device 312, the first excited state $|1\rangle_T$ of the tunable qubit device 312, and the second excited state $|2\rangle_T$ of the tunable qubit device 312. The $|0\rangle \rightarrow |10\rangle$ transition frequency is separated by a frequency difference $\Delta = \overline{\omega}_{T_{01}} - \omega_{F_{01}}$. When the transition frequency of the tunable qubit device 312 is modulated at a frequency $|\Delta|$, it is possible to activate the family of iSWAP interactions between the two qubits depending of the duration of the modulating pulse.

Figure 7:
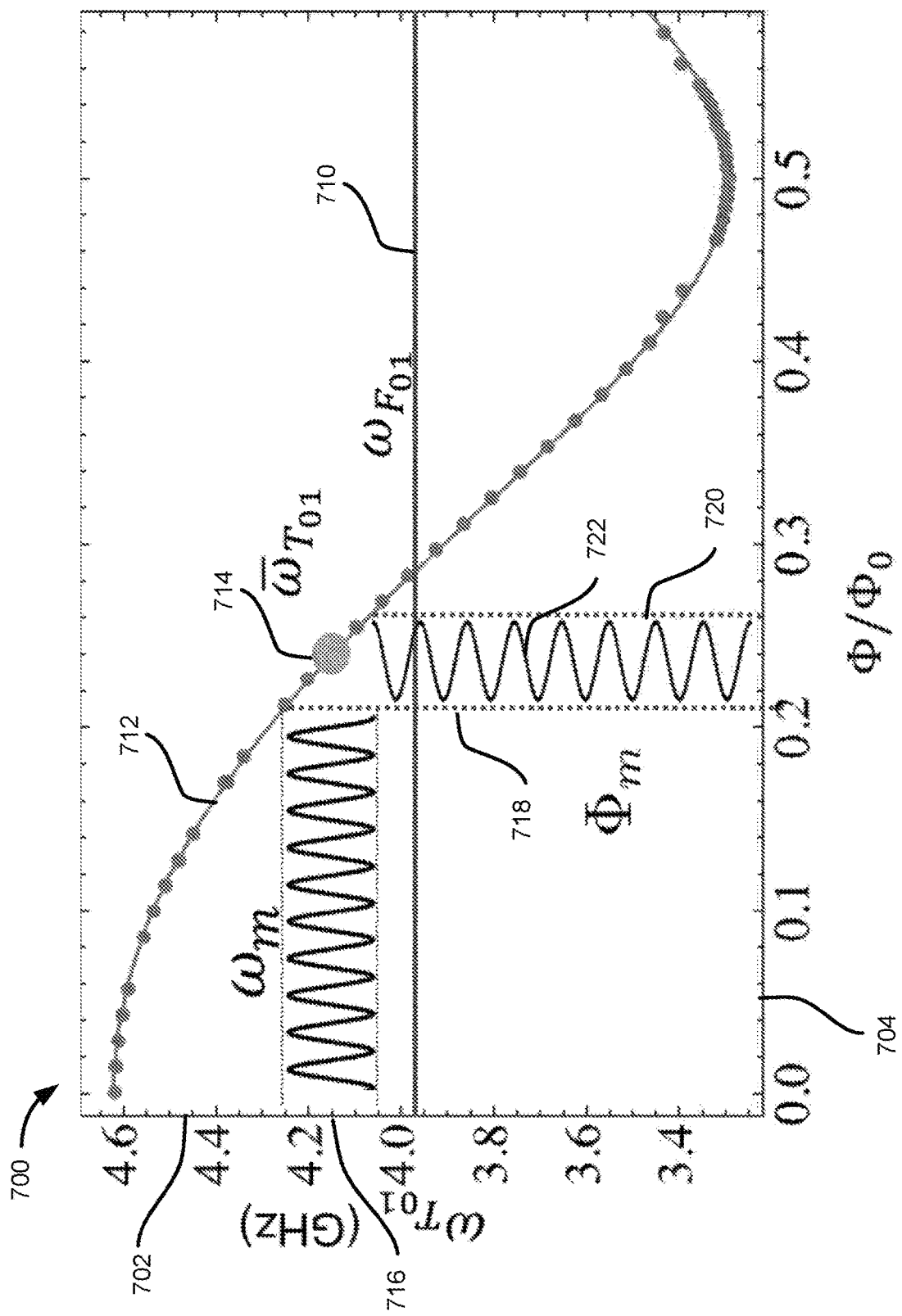
FIG. 7 is a plot of frequency parameters for two example qubit devices.

FIG. 7 is a plot 700 of frequency parameters for the two example qubit devices represented in FIG. 6. The vertical axis 702 represents a range of frequency values in units of GigaHertz (GHz), and the horizontal axis 704 represents a range of magnetic flux values in units of flux quanta. The plot 700 includes a curve 712 indicating the transition frequency of the tunable qubit device 312 as a function of magnetic flux applied to the circuit loop 324, and the plot 700 includes a point 714 indicating a reference frequency $\overline{\omega}_{T_{01}}$ that is used to construct an example parametrically activated two-qubit quantum logic gate. The plot 700 includes a horizontal line 710 at the frequency $\omega_1$ of the fixed-frequency qubit device 314, and a horizontal line 716 at the reference (or "parking") frequency $\overline{\omega}_{T_{01}}$ for the tunable qubit device 312. The horizontal lines 710, 716 show the frequency difference $\Delta = \overline{\omega}_{T_{01}} - \omega_{T_{01}}$. The plot also includes vertical lines 718, 720 showing an example range of magnetic flux applied to the tunable qubit device 312 when the transition frequency of the tunable qubit device 312 is modulated. The transition frequency of the tunable qubit device varies as function of the applied magnetic flux through the SQUID loop of the tunable qubit device. By modulating the flux through the circuit loop 324, the qubit frequency is also modulated.

The Hamiltonian in Equation (2) above also includes an effective interaction that can activate other classes of two qubit gates. In some instances, parametrically-activated controlled phase gates (e.g., controlled Z gates) are applied. For example, the effective coupling $g_{11 \leftrightarrow 01}$ describes the interaction of $|11\rangle$ state with $|02\rangle$ state and can activate a controlled Z gate when the frequency of the tunable qubit is modulated with $$\omega_m = \frac{\Delta - \overline{\eta}_T}{n}, \quad n = \pm 1, \pm 2, \ldots$$

where $\overline{\eta}_T$ is the average anharmonicity of the tunable qubit over a period. The effective coupling rate activated by the nth harmonics then becomes $$g^{(n)}_{11 \leftrightarrow 02} = \sqrt{2}\, g \left| J_n\left(\frac{n \delta \omega}{\Delta - \overline{\eta}_T}\right) \right|$$

for a gate time of $$t^{(n)}_{CZ_{02}} = \frac{\pi}{\sqrt{2}\, g |J_n[n\delta\omega/(\Delta - \overline{\eta}_T)]|}$$

to product a controlled Z gate with a unitary $$U_{CZ_{02}} = \begin{pmatrix} 1 & 0 & 0 & 0 \\ 0 & 1 & 0 & 0 \\ 0 & 0 & 1 & 0 \\ 0 & 0 & 0 & -1 \end{pmatrix}.$$

It is also possible to activate another controlled Z gate using the other effective interaction generated by the modulation. The effective coupling $g_{11 \leftrightarrow 20}$, is activated when the frequency of the tunable qubit is modulated at $$\omega_m = \frac{\Delta + \eta_F}{n}, \quad n = \pm 1, \pm 2, \pm 3, \ldots$$

and the effective coupling strength activated by the nth harmonics is given by $$g^{(n)}_{11 \leftrightarrow 20} = \sqrt{2}\, g \left| J_n\left(\frac{n \delta \omega}{\Delta + \eta_F}\right) \right|$$

which gives a controlled Z gate after an interaction time of $$t^{(n)}_{CZ_{20}} = \frac{\pi}{\sqrt{2}\, g |J_n[n\delta\omega/(\Delta + \eta_F)]|}$$

The other couplings described by $g_{12 \leftrightarrow 21}$ does not contribute to a gate as it is outside the computational subspace. The above equations for the effective coupling and gate times are generally valid when the magnetic flux is less than or similar to half a flux quantum (when $\Phi_m \lesssim \Phi_0/2$). Accordingly, in some cases, when these equations are used, the magnetic flux control signal is configured to maintain the magnetic flux modulation amplitude below $\Phi_0/2$.

Figure 11:
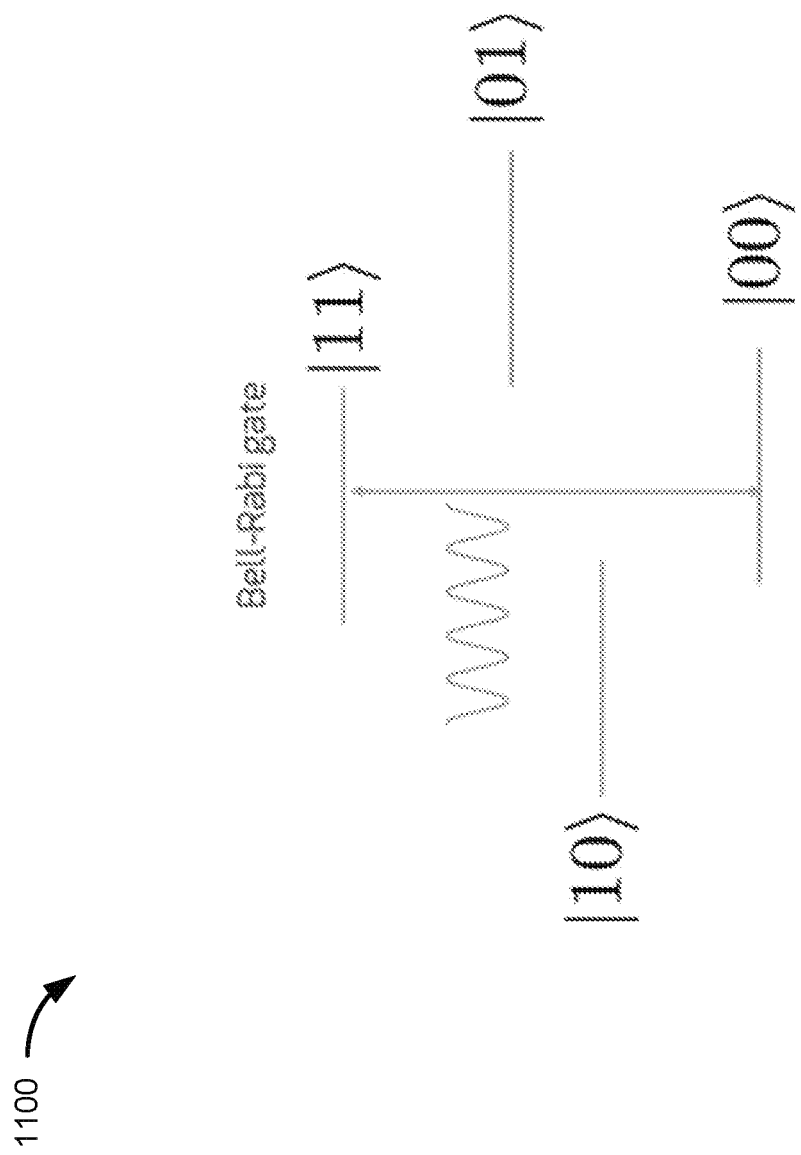
FIG. 11 is an energy level diagram showing attributes of an example Bell-Rabi gate.

In some instances, parametrically-activated Bell-Rabi gates are applied. FIG. 11 is an energy level diagram 1100 showing attributes of an example Bell-Rabi gate. Without the rotating wave approximation (keeping the Hamiltonian in Equation (1)), the terms $g(\sigma_1\sigma_2+\sigma_1'\sigma_2')$ results in a Hamiltonian $$H_I = g_{00\leftrightarrow 11}|00\rangle\langle 11| + g_{01\leftrightarrow 12}|01\rangle\langle 12| + g_{10\leftrightarrow 21}|10\rangle\langle<| + g_{11\leftrightarrow 22}|11\rangle\langle 22| + H.c$$

The four different couplings in this version of the Hamiltonian can activate a family of Bell-Rabi gates, which are two-photon gates. For example, coupling between $|00\rangle$ and $|11\rangle$ states is activated when the tunable qubit frequency is modulated at the sum of the two qubit frequencies, $\Sigma = \omega_{T_{01}} + \omega_{F_{02}}$, with a coupling strength activated by the nth harmonics $$g_{00\leftrightarrow 11}^{(n)} = g\left|J_n\left(n\frac{\delta\omega}{\Sigma}\right)\right|$$

A coupling between $|01\rangle$ and $|12\rangle$ states is activated when the tunable qubit frequency is modulated at $|\Sigma - \eta_F|$ with a coupling strength $$g_{00\leftrightarrow 12}^{(n)} = \sqrt{2}\,g\left|J_n\left(n\frac{\delta\omega}{\Sigma - \eta_F}\right)\right|$$

Similarly, the couplings between $|10\rangle$ and $|21\rangle$, and $|11\rangle$ and $|22\rangle$ states are activated when the tunable qubit frequency is modulated at $|\Sigma - \bar{\eta}_T|$ and $|\Sigma - \eta_F - \bar{\eta}_T|$, respectively with coupling strengths $$g_{10\leftrightarrow 21}^{(n)} = \sqrt{2}\,g\left|J_n\left(n\frac{\delta\omega}{\Sigma - \bar{\eta}_T}\right)\right|,$$

$$g_{11\leftrightarrow 22}^{(n)} = 2g\left|J_n\left(n\frac{\delta\omega}{\Sigma - \eta_F - \bar{\eta}_T}\right)\right|.$$

The above equations for the effective coupling and gate times are generally valid when the magnetic flux modulation amplitude is less than or similar to half a flux quantum (when $\Phi_m \lesssim \Phi_0/2$). Accordingly, in some cases, when these equations are used, the magnetic flux control signal is configured to maintain the magnetic flux modulation amplitude below $\Phi_0/2$.

In some systems, modulating the flux can affect the transition frequency of the tunable qubit device. For example, the example tunable transmon device represented in FIG. 3 is made of two Josephson junctions, and the $|0\rangle_T \to |1\rangle_T$ transition frequency and anharmonicity are given by $$\omega_{T_{01}}(\Phi(t)) \approx E_C\left[f(\Phi) - \left(1 + \frac{1}{f(\Phi)} + \frac{21}{8f^2(\Phi)} + \frac{19}{2f^3(\Phi)}\right)\right]$$

$$\eta_T(\Phi(t)) \approx E_C\left(1 + \frac{9}{4f(\Phi)} + \frac{81}{8f^2(\Phi)} + \frac{3645}{2^6 f^3(\Phi)}\right)$$

where $$f(\Phi) = \sqrt{\frac{8E_J}{E_C}\frac{1}{1+r}\sqrt{1 + r^2 + 2r\cos(2\pi(\Phi + \delta\Phi)/\Phi_0)}}$$

-continued $$r = \frac{E_{J2}}{E_{J1}},\text{ and}$$

$$E_J = E_{J1} + E_{J2}$$

with $E_{J1}$ and $E_{J2}$ being the Josephson junction energies of the two Josephson junctions in the circuit loop 324. The flux through the SQUID loop can be modulated about the parking flux $$\Phi(t) = \Phi_p + \Phi_m \cos(\omega_{fl}t + \phi_m)$$

where $\Phi_p$ is the parking flux, $\Phi_m$ is the flux modulation amplitude, $\omega_{fl}$ and $\phi_m$ are the frequency and random phase of the modulation. The frequency shift incurred by the modulation is approximately given by $$\omega_{T_{01}} = (\Phi(t)) = \omega_{T_{01}}(\Phi_p + \Phi_m\cos(\omega_{fl}t + \phi_m))$$

$$= \omega_{T_{01}}(\Phi_p) + \delta\omega + \sum_{n=1}^{\infty}\delta\omega_{m,n}\cos(n\omega_{fl}t + n\phi_m)$$

where $\omega_{T_{01}}(\Phi_p) + \delta\omega$ is the average qubit frequency during the flux modulation and $\delta\omega_{m,n}$ is the amplitude of modulation for each of the harmonics. The qubit frequency is shifted from the bare value $[\omega_{T_{01}}(\Phi_p)]$ due to the nonlinear flux dependence of the tunable frequency and is quadratic in the flux modulation amplitude. In some cases, the effective couplings and gate times provided above are valid for magnetic flux modulation amplitudes less than or similar to half a flux quantum (when $\Phi_m \lesssim \Phi_0/2$). For some systems, equations for the effective couplings and gate times that are more broadly or generally valid (e.g., equations that are valid for all values of magnetic flux modulation amplitude), and in some cases, values for the effective couplings and gate times that are more accurate, can be obtained by expanding qubit frequency and effective couplings in Fourier series. The tunable qubit transition frequency can be expressed in Fourier series as $$\omega_{T_{01}}(t) = \omega^{(0)} + \sum_{k=1}^{\infty}\omega^{(k)}\cos[k(\omega_{fl}t + \phi_m)],$$

where $$\omega^{(k)} = \sum_{n=0}^{\infty}\frac{\tilde{\lambda}^n}{n!}F^{(n)}(\tilde{\lambda})S_{k,n}$$

$$F(\lambda) \approx E_C\left[\frac{4}{\lambda^{1/4}} - \left(1 + \frac{1}{4}\lambda^{1/4} + \frac{21}{2^7}\lambda^{1/2} + \frac{19}{2^7}\lambda^{3/4}\right)\right]$$

$$S_{k,n} = (4 - 2\delta_{k,0})\sum_{j=1}^{n}s_{k,n,j} + s_{k,n,0}$$

$$s_{k,n,j} = J_k(j\Phi_m)\cos\left(\frac{k\pi}{2} + j\Phi_p\right)2^{-j}\binom{n}{j}(-\bar{c}_0)^{n-j} \times$$

$$\quad {}_2F_1\left\{j\left(\frac{n-j}{2}\right) + \frac{1}{2} - (n-j), -j\left(\frac{n-j}{2}\right), j-1, \bar{c}_0^{-2}\right\}$$

$$\bar{c}_0 = \cos(\Phi_p)J_0(\Phi_m),$$

$$\tilde{\lambda} = \lambda(c_0),\ \lambda = \xi_T^{-4}$$

$$\xi_T = \sqrt{2E_C/E_{J_{eff}}}\,,$$

-continued $$E_{jeff} = \sqrt{\frac{E_J}{1+r}\sqrt{1+r^2+2r\cos(2\pi(\Phi+\delta\Phi)/\Phi_0)}} \text{ and}$$

$$\tilde{\lambda} = E_{J_1}E_{J_2}/(2E_C^2).$$

Here $_2F_1$ is hypergeometric function, fl is a floor function, $\delta_{k0}$ is Dirac-delta function, and $\omega^{(0)}$ represents the average frequency of the qubit during the modulation $$\omega^{(0)} = \overline{\omega}_{T_{01}} = \frac{1}{2\pi/\omega_{fl}}\int_0^{2\pi/\omega_{fl}}\omega_{T_{01}}(t')dt'.$$

At the flux sweet spot where the gradient of the frequency band is zero, the contribution of the odd elements of the Fourier series vanish and the leading term for small flux modulation amplitude reads $$\omega_{T_{01}}(t) \approx \omega_{T_{01}} + \omega^{(2)}\cos(2\omega_{fl}t + 2\phi_m),$$

where $\omega^{(2)} = \delta\omega_m$ is the modulation amplitude in frequency. This shows that at the sweet spot for a flux modulation frequency of $\omega_{fl}$ the qubit frequency will be modulated at $\omega_m = 2\omega_{fl}$.

In a similar manner, the effective coupling between qubits can also be expanded in Fourier series and is given by $$g_{ij}^{(n)} = \overline{g}_{ij}\left|\sum_{\substack{\{l_k \in \mathbb{Z}\} \\ \Sigma_{k=1}^\infty kl_k=n}} \Pi_{k=1}^\infty J_{l_k}\left[\frac{\omega_{T_{j-1,j}}^{(2k)}}{2k\omega_{fl}}\right]\right|,$$

such that the couplings for different entangling gates $$g_{10\leftrightarrow01}^{(n)} = \overline{g}_{11}\left|\sum_{\substack{\{l_k \in \mathbb{Z}\} \\ \Sigma_{k=1}^\infty kl_k=n}} \Pi_{k=1}^\infty J_{l_k}\left[\frac{n\,\omega_{T_{01}}^{(2k)}}{k}\right]\right| \quad \text{(iSWAP)}$$

$$g_{11\leftrightarrow20}^{(n)} = \overline{g}_{21}\left|\sum_{\substack{\{l_k \in \mathbb{Z}\} \\ \Sigma_{k=1}^\infty kl_k=n}} \Pi_{k=1}^\infty J_{l_k}\left[\frac{n\,\omega_{T_{01}}^{(2k)}}{k(\Delta+\eta_F)}\right]\right| \quad \text{(CZ20)}$$

$$g_{11\leftrightarrow02}^{(n)} = \overline{g}_{12}\left|\sum_{\substack{\{l_k \in \mathbb{Z}\} \\ \Sigma_{k=1}^\infty kl_k=n}} \Pi_{k=1}^\infty J_{l_k}\left[\frac{n\,\omega_{T_{12}}^{(2k)}}{k(\Delta-\eta_T)}\right]\right| \quad \text{(CZ02)}$$

$$g_{00\leftrightarrow11}^{(n)} = \overline{g}_{11}\left|\sum_{\substack{\{l_k \in \mathbb{Z}\} \\ \Sigma_{k=1}^\infty kl_k=n}} \Pi_{k=1}^\infty J_{l_k}\left[\frac{n\,\omega_{T_{01}}^{(2k)}}{k\Sigma}\right]\right| \quad \text{(Bell-Rabi)}$$

where $\omega_{T_{1-2j}}^{(2k)}$ is the Fourier series expansion of the tunable qubit transition frequencies $\omega_{T_{j-1,j}}$ and $\overline{g}_{ij}$ is the average value of the coupling over a period, $2\pi/\omega_{fl}$. In the equations above, $$\overline{g}_{01} = \zeta_F\langle g(t)\zeta_T(t)\rangle,$$

$$\overline{g}_{21} = \sqrt{2}\,Z_F\langle g(t)\zeta_T(t)\rangle,$$

$$\overline{g}_{12} = \sqrt{2}\,\zeta_F\langle g(t)Z_T(t)\rangle,$$

$$\overline{g}_{22} = 2Z_F\langle g(t)Z_T(t)\rangle,$$

where $$g(t) = \frac{4e^2C_C}{C_{Jf}C_{Jt}}\frac{1}{4\sqrt{\xi_F\xi_T(t)}},$$

$$\zeta_{F/T} \approx 1 - \left(\frac{\xi_{F/T}}{2^3} + \frac{11}{2^8}\xi_{F/T}^2 + \frac{65}{2^{11}}\xi_{F/T}^3\right),$$

$$Z_{F/T} \approx 1 - \left(\frac{\xi_{F/T}}{2^2} + \frac{73}{2^9}\xi_{F/T}^2 + \frac{79}{2^9}\xi_{F/T}^3\right).$$

The gate time for each two-qubit gate activated by the nth harmonic are given by $$t_{iSWAP}^{(n)} = \frac{\pi}{2}\frac{1}{|g_{10\leftrightarrow01}^{(n)}|},$$

$$t_{\sqrt{iSWAP}}^{(n)} = \frac{\pi}{4}\frac{1}{|g_{10\leftrightarrow01}^{(n)}|},$$

$$t_{CZ20}^{(n)} = \pi\frac{1}{|g_{11\leftrightarrow20}^{(n)}|},$$

$$t_{CZ02}^{(n)} = \pi\frac{1}{|g_{11\leftrightarrow02}^{(n)}|},$$

$$t_{BR}^{(n)} = \pi\frac{1}{|g_{00\leftrightarrow11}^{(n)}|}.$$

In the equations above, n represents a non-zero integer; $g_{10\leftrightarrow01}^{(n)}$ represents the effective coupling between the $|10\rangle$ and $|01\rangle$ states of the tunable qubit device and the fixed-frequency qubit device during the interaction time activated by the n-th harmonics; $g_{11\leftrightarrow20}^{(n)}$ represents the effective coupling between the $|11\rangle$ and $|20\rangle$ states of the tunable qubit device and the fixed-frequency qubit device during the interaction time activated by the n-th harmonics; and $g_{11\leftrightarrow20}^{(n)}$ represents the effective coupling between $|11\rangle$ and $|02\rangle$ states of the tunable qubit device and the fixed-frequency qubit device during the interaction time activated by the n-th harmonics; and $g_{00\leftrightarrow11}^{(n)}$ represents the effective coupling between $|00\rangle$ and $|11\rangle$ states of the tunable qubit device and the fixed-frequency qubit device during the interaction time activated by the n-th harmonics.

Also in the equations above, $J_{l_k}$ represents an $l_k$-th order Bessel function of the first kind, n and k represent non-zero integers; $l_k$ represents integers; $\omega_{T_{01}}^{(2k)}$ represents a Fourier series expansion of the $|0\rangle_T \rightarrow |1\rangle_T$ transition frequency of the tunable-frequency qubit device; and $\Delta$ represents the difference between a reference frequency and the transition frequency of the fixed-frequency qubit device; $\overline{\eta}_T$ represents an average anharmonicity of the tunable qubit device, $\omega_{T_{01}}^{(2k)}$ represents a Fourier series expansion of the $|1\rangle_T \rightarrow |2\rangle_T$ transition frequency of the tunable-frequency qubit device; $\eta_F$ represents the anharmonicity of the fixed-frequency qubit device, and $\Sigma$ represents the sum of a reference frequency and the transition frequency of the fixed-frequency qubit device.

Figure 8:
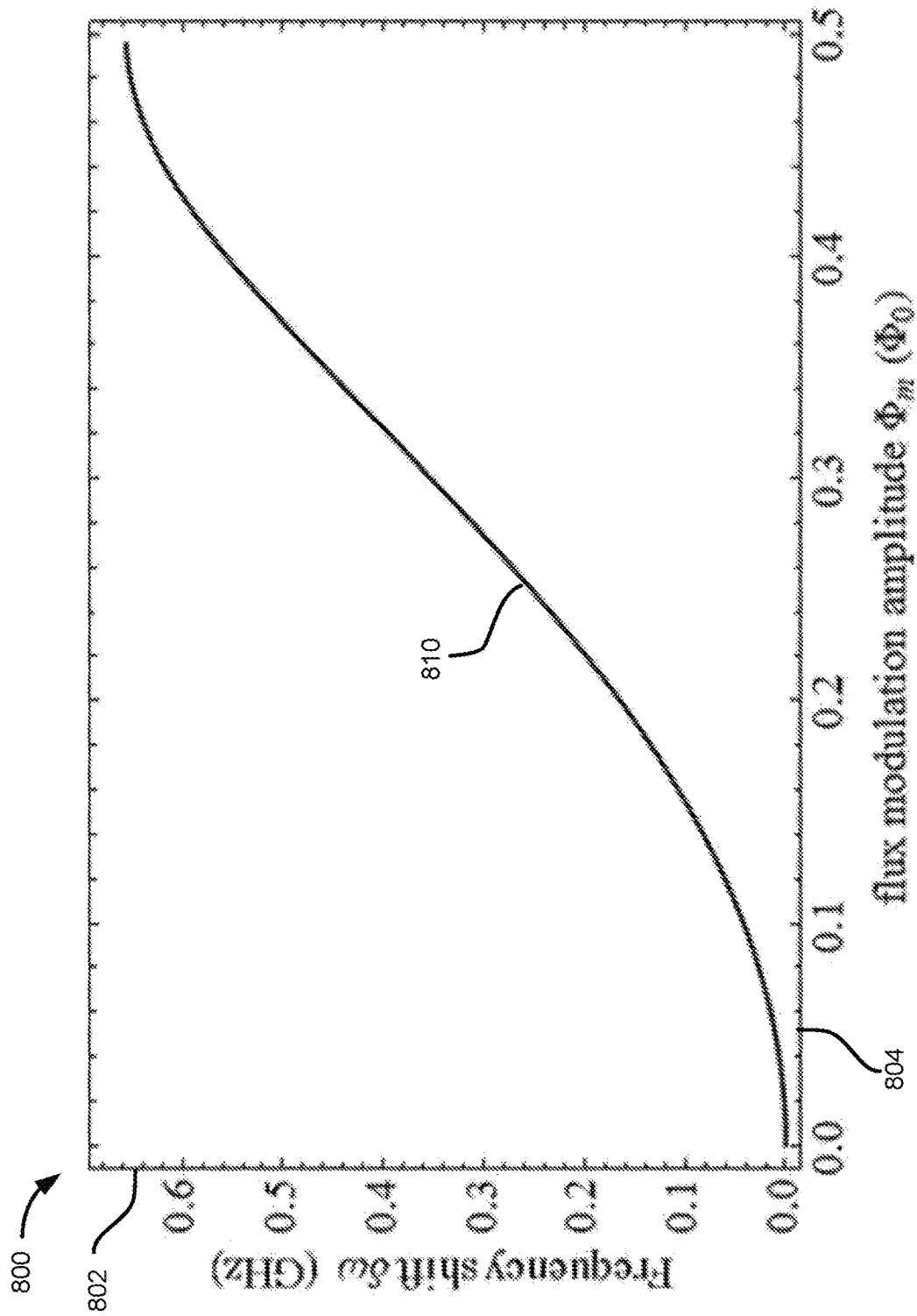
FIG. 8 is a plot of frequency shift versus flux modulation amplitude for an example qubit device.

An example for showing the frequency change as function of flux modulation amplitude is shown in FIG. 8. In general, it may be possible to park the flux at any point; however, parking the qubit at a flux bias where the qubit is insensitive to flux noise can be beneficial for achieving longer coherence time. In the example, shown in FIGS. 8, 9, 10 the qubit is parked at zero flux or at its maximum frequency.

FIG. 8 is a plot 800 of frequency shift versus flux modulation amplitude for an example qubit device. The vertical axis 802 represents a range of frequency shift values in units of GigaHertz (GHz), and the horizontal axis 804 represents a range of flux modulation amplitude values in units of flux quanta. The curve 810 plotted in FIG. 8 represents δω(t), the amount by which the |0⟩→|1⟩ transition frequency of the tunable qubit device is shifted by the flux modulation. As shown in the plot 800, the frequency shift demonstrates a quadratic dependence on flux modulation amplitude.

Figure 9:
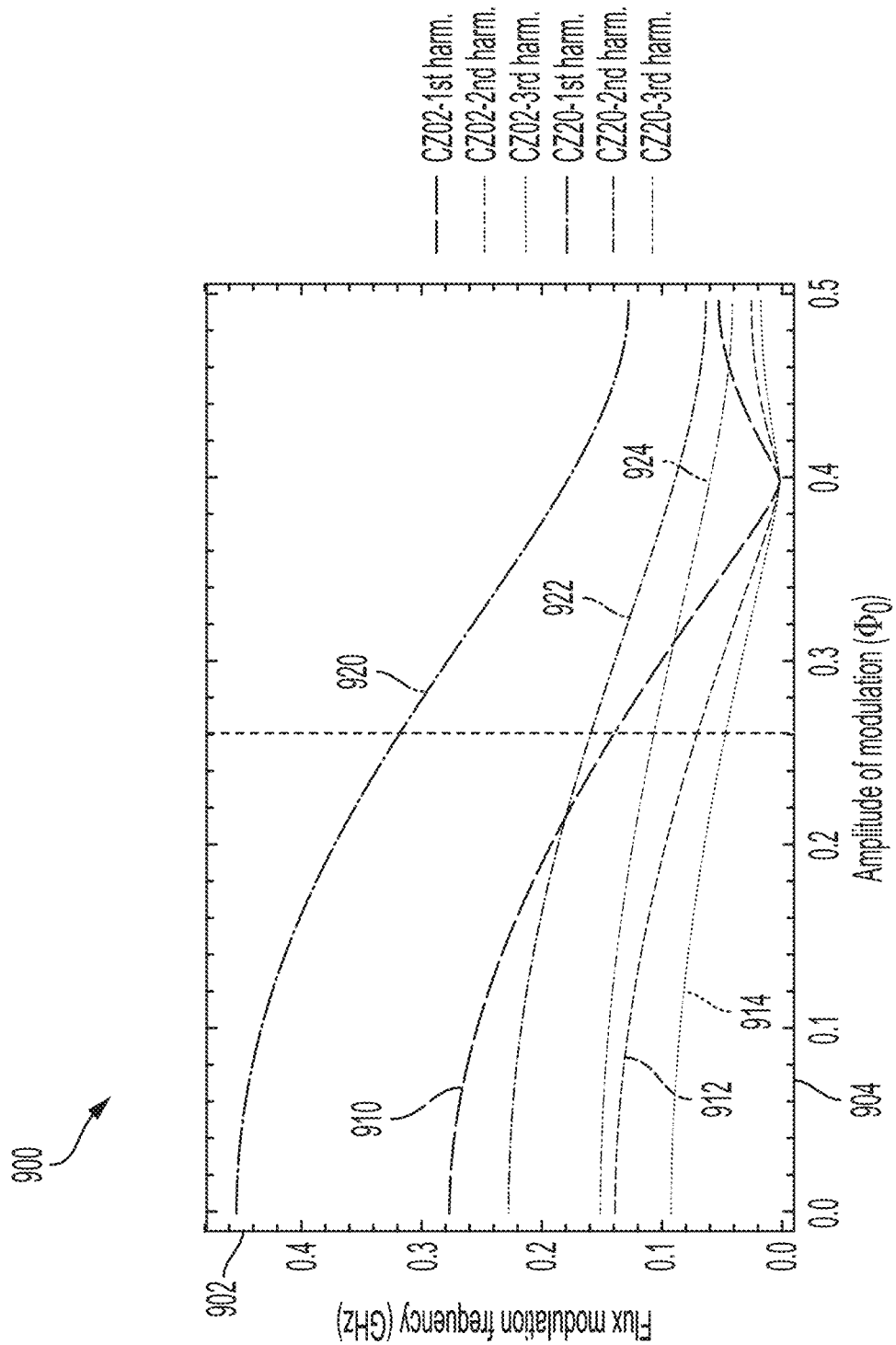
FIG. 9 is a plot of flux modulation frequency versus amplitude of modulation for an example quantum logic gate.

FIG. 9 is a plot 900 of flux modulation frequency versus amplitude of modulation for an example quantum logic gate. The vertical axis 902 represents a range of flux modulation frequency values in units of GigaHertz (GHz), and the horizontal axis 904 represents a range of flux modulation amplitude values in units of flux quanta. The curves 910, 912, 914, 920, 922, 924 plotted in FIG. 9 represent shifts in the flux modulation frequency due to the modulation of the qubit frequency. A first set of curves 910, 912, 914 show the first three harmonics (or resonances) when modulating the flux to activate the CZ02 gate, and the another set of curves 920, 922, 924 represent the first three harmonics when the qubit frequency is modulated at to activate the CZ20 gate.

Figure 10:
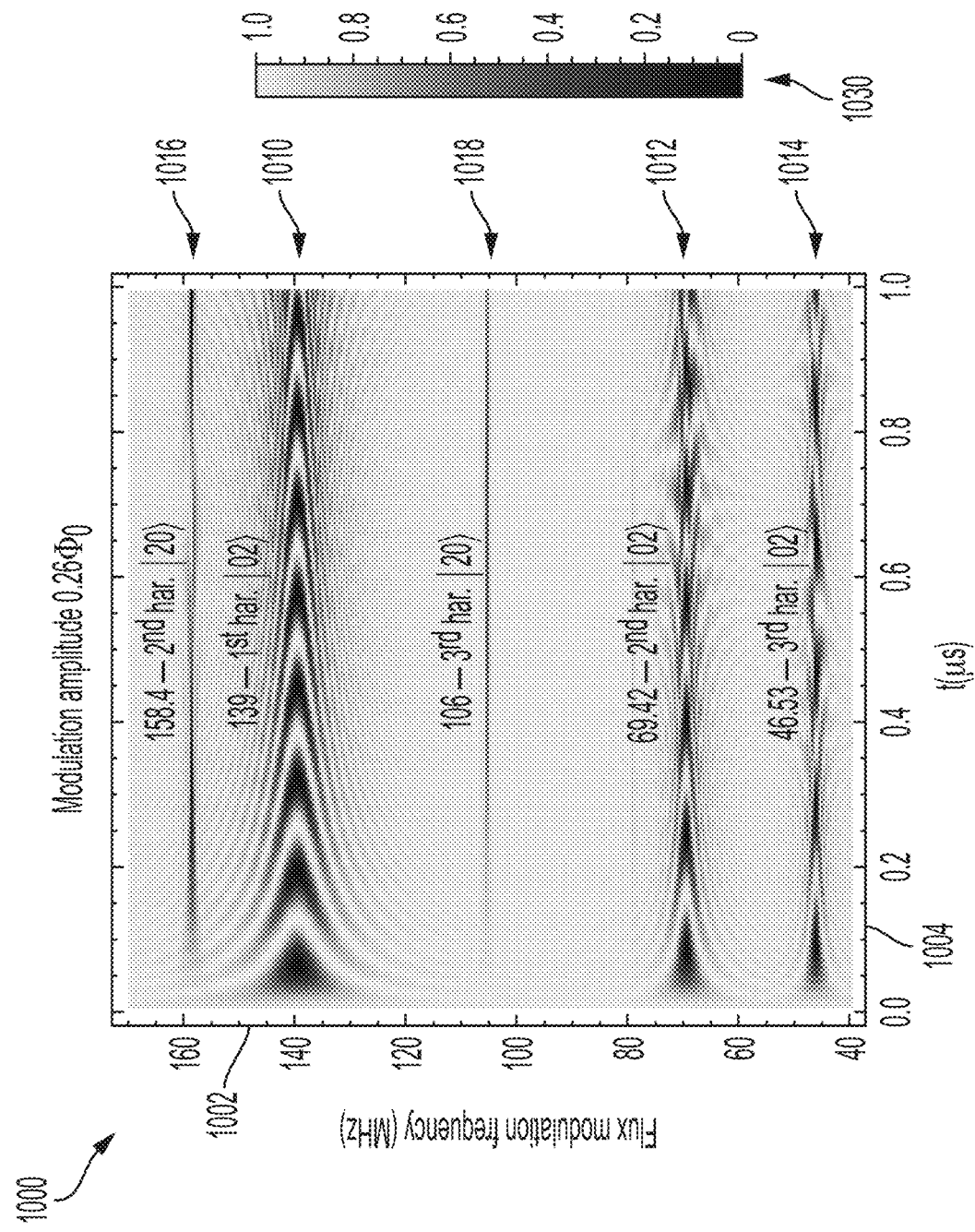
FIG. 10 is a plot of flux modulation frequency versus time for an example quantum logic gate.

FIG. 10 is a plot 1000 of flux modulation frequency versus time for an example quantum logic gate. The vertical axis 1002 represents a range of flux modulation frequency values in units of MegaHertz (MHz), and the horizontal axis 1004 represents a time duration of a control signal in units of microseconds (μs). The legend 1030 indicates the range of values shown by the surface plot. The surface plot indicates the probability of finding the coupled qubit state |11⟩ as a function of the flux modulation frequency and time. The chevron features 1010, 1012, 1014, 1016, 1018 in the surface plot represent different resonances corresponding to different harmonics.

For the example shown in FIGS. 9 and 10, the flux is parked at $0.26\varphi_0$ and the modulation imparts a frequency shift 272 MHz in the qubit frequency. That means the average qubit frequency is now lower by 272 MHz from its parking frequency. Table I shows the list of parameters used for the example data shown in FIGS. 9 and 10.

TABLE 1

| Example parameter values | | |
|---|---|---|
| Parameter | Fixed qubit | Tunable qubit |
| Frequency (GHz) | 3.8554 | $\overline{\omega}_{T_{0,1}}(\Phi=0)/2\pi = 4.58162$ |
| | | $\overline{\omega}_{T_{0,1}}(\Phi=0.5\Phi_0)/2\pi = 3.26803$ |
| Anharmonicity (GHz) | 0.1832 | $\overline{\eta}_T(\Phi=0)/2\pi = 0.172$ |
| | | $\overline{\eta}_T(\Phi=0.5\Phi_0)/2\pi = 0.204$ |

Resonance features can be activated, for example, by modulating the qubit frequency when both qubits are prepared in their excited state |11⟩. For example, the qubit frequency may shift due to the modulation. In some cases, this frequency change can be accounted for to more precisely determine the frequency at which the qubit frequency should be modulated. In some cases, to get a qubit modulation frequency $\omega_m$ one has to modulate the flux by $\omega_m/2$. For this example, considering the frequency shift and the frequency difference between the parking frequency of the tunable 4309.2 MHz and the fixed frequency is 454.22 MHz. Dividing this by 2, we get the frequency at which we modulation the flux 227.11 MHz to activate an iSWAP class of gates. If we want to activate a controlled Z gate, we should subtract the tunable quit anharmonicity or add the fixed frequency qubit anharmonicity.

In FIG. 9, we show the flux modulation frequency as function of the flux modulation amplitude in units of the flux quantum $\Phi_0$ for activating both types of controlled Z gates. The first set of curves 910, 912, 914 correspond to the flux modulation frequencies for the first three harmonics that could activate the CZ02 gate through the states |11⟩ and |02⟩ interaction. The second set of curves 920, 922, 924 represent the modulation frequencies for the first three harmonics for activating CZ20 gate through |11⟩ and |20⟩ interactions. By setting the modulation amplitude at $0.26\Phi_0$, the expected resonances corresponding to both CZ0 and CZ02 appears at frequency that crosses the black dashed line. Shown are the first three harmonics from each gate. The numerical simulation of the system shows (in the window the flux modulation scan) the expected resonances at 158.4 MHz (CZ0 due to second harmonics), 139 MHz (CZ02 first harmonics), 106 (CZ20 third harmonics), 69.42 MHz (CZ02 second harmonics), and 46.53 (CZ02 third harmonics).

The examples described above can be implemented in the context of a large array of qubit devices. In a scalable architecture, a tunable qubit device can be coupled to many qubit devices. In some cases, all qubit devices in the array can be tunable qubit devices. However, making all qubit devices tunable may have undesired effects in some cases (e.g., lowering the performance of the due to magnetic flux noise or other phase noise sources due to the extra qubit control lines, etc.). In cases where each tunable qubit device is coupled to more than one fixed-frequency qubit device, it is possible to create entangling gates by designing the frequency of the fixed-frequency qubit such that half of their frequency difference with the tunable qubit matches the tunable qubit devices resonances (e.g., such as the resonances shown in FIG. 10).

As an example, a tunable transmon qubit device can be coupled to four nearest neighbor fixed-frequency qubit devices in a qubit device array. For instance, the tunable qubit device may have a resonance frequency of 4 GHz and the four fixed-frequency qubit devices may have resonance frequencies of 4.8 GHz, 4.7 GHz, 4.6 GHz, and 4.5 GHz. If the tunable device is operated at flux insensitive bias point (e.g., $\overline{\omega}_{T_{01}}(\Phi=0), \overline{\omega}_{T_{01}}(\Phi=0.5\Phi_0)$), we can modulate the flux at frequencies equal to the detuning divided by 2 (in this example, 400, 350, 300, and 250 MHz, respectively). The frequency detunings in this example also provide that the second harmonics from each qubit are different. In some implementations, to apply parametrically activated quantum logic gates, each qubit device should have different anharmonicities and the anharmonicities should not be the same as the harmonic frequencies.

Figure 12A:
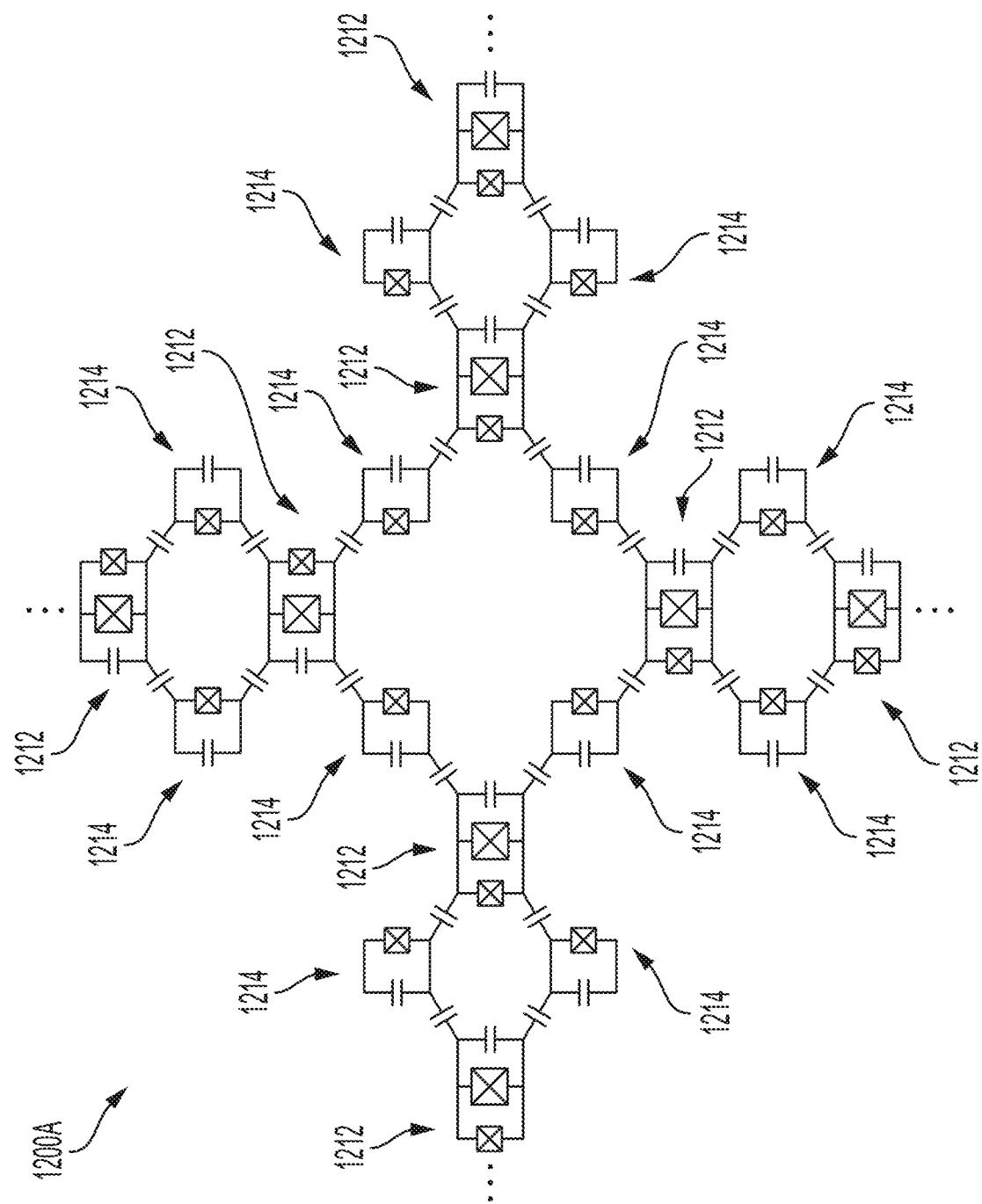
FIG. 12A shows an equivalent circuit for an example array of qubit devices in a quantum computing system.
Figure 12B:
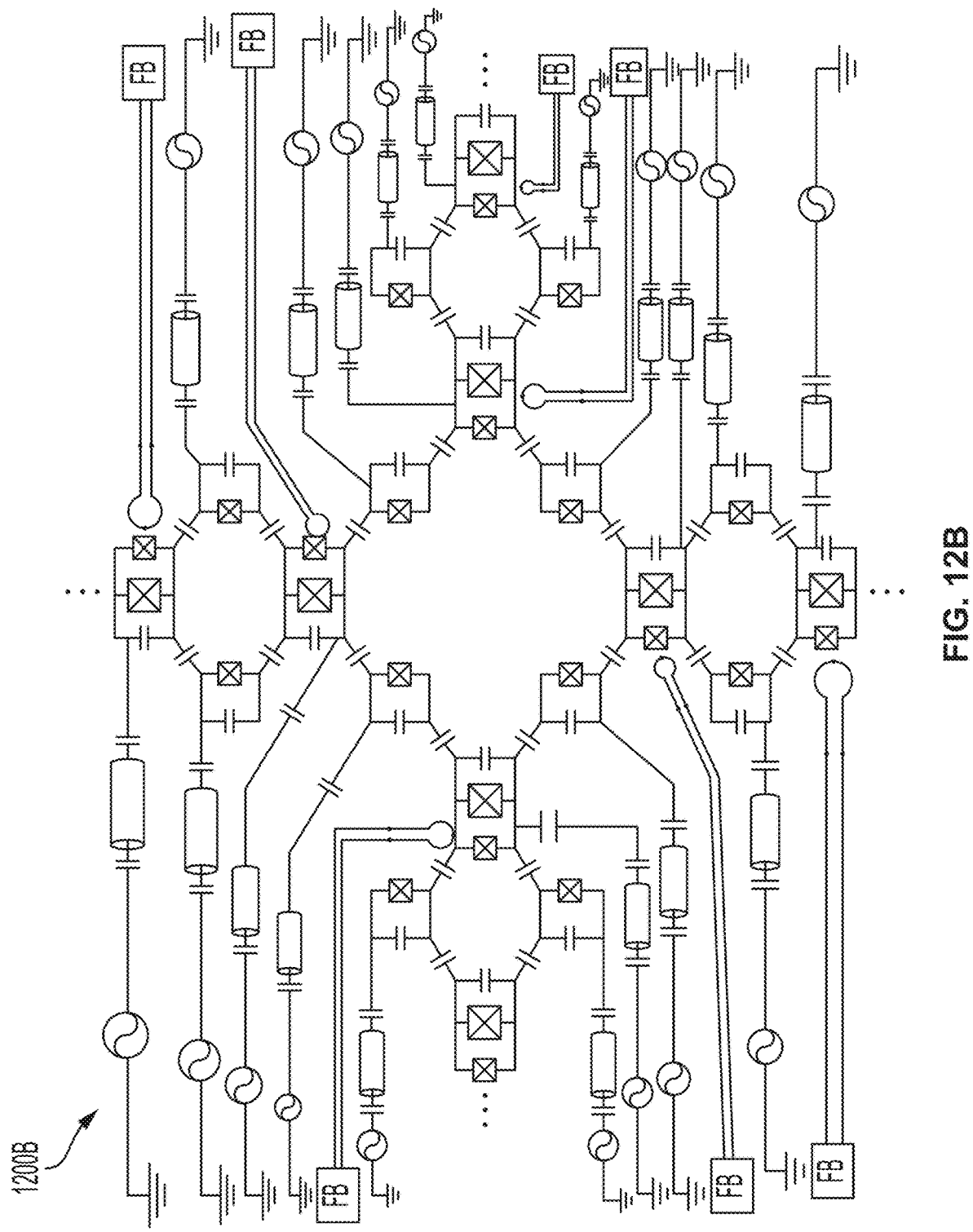
FIG. 12B shows an equivalent circuit for an example array of devices in a quantum computing system.
Figure 12C:
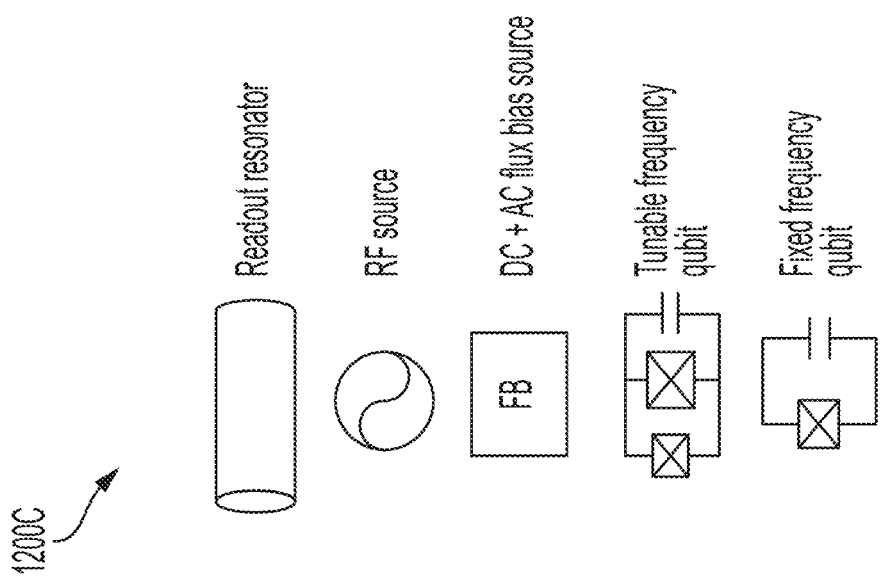
FIG. 12C is a legend indicating the types devices represented in the example equivalent circuits 1200A, 1200B shown in FIGS. 12A and 12B.

FIG. 12A shows an equivalent circuit 1200A for an example array of qubit devices in a quantum computing system. This is an example of a scalable 2D quantum processor architecture using tunable qubit devices 1212 and fixed-frequency qubit devices 1214 as building blocks. Each tunable qubit device 1212 is coupled to four fixed-frequency qubit devices 1214 in the example shown in FIG. 12A. FIG. 12B shows another equivalent circuit 1200B for an example array of devices in a quantum computing system. The equivalent circuit 1200B shown in FIG. 12B includes the equivalent circuit 1200A from FIG. 12A, in addition to readout resonators, RF sources and flux-bias sources. FIG. 12C is a legend indicating the types devices represented in the example equivalent circuits 1200A, 1200B shown in FIGS. 12A and 12B.

In some implementations, the techniques described here permit qubit devices to operate with a higher degree of frequency crowding in quantum circuits and thereby permit the scaling of the number of qubit devices (e.g., fixed-frequency transmon qubits and tunable-frequency transmon qubits) and improved integration of the qubit devices for use in quantum computation. For instance, the techniques described here may reduce or eliminate leakage state transitions that would otherwise be caused by frequency crowding, for example, in scenarios where qubit devices are coupled to each other in physical proximity and define overlapping quantum states.

In some implementations, frequency allocation schemes can reduce the effects of frequency crowding between qubits that are used to implement parametrically-activated quantum logic gates (e.g., parametrically-activated entangling gates) described above. In some cases, a specified quantum logic gates are applied to qubits defined by two qubit devices by sending a radio-frequency (rf) or microwave tone (e.g., a flux bias signal for a tunable-frequency transmon qubit device) to a control line, and the parameters (e.g., frequency, amplitude and duration) of the rf or microwave tone can be selected to achieve the specified quantum logic gate based on the transition frequencies and bare coupling strengths of the two qubit devices.

In some implementations, a quantum processor includes fixed-frequency qubit devices and tunable-frequency qubit devices that have operating frequency bands that are spectrally spaced apart (in the frequency domain) in order to reduce spectral overlap between the operational frequencies of the fixed-frequency qubit devices and the tunable-frequency qubit devices. In some implementations, the operating frequency bands and spectral spacing can be determined at least partially by the fabrication procedures associated with the manufacture of some or all of the qubit devices. In some implementations, such fabrication procedures can be determined, in part, by computational simulations of the qubit devices. In some examples, guidelines and rules can be used to determine operational parameters of the qubit devices, e.g., parasitic couplings between the fixed-frequency transmon qubit devices and the tunable-frequency transmon qubit devices, and the like. Such determinations of the parameters (e.g., the parasitic couplings) can be used to further optimize the operational frequencies and coupling strengths of the qubit devices.

In some aspects, a quantum processor that executes parametrically-activated quantum logic gates can have a wider range of operational frequency use, due at least in part to the increased selectivity that can be used to set the parameters of the quantum logic gates. For example, the parameters can include a modulation amplitude and a frequency of a control signal, and an interaction duration between the control signal and the qubits. Moreover, different types or classes of two-qubit quantum logic gates can be used without having to modify the quantum processor (e.g., without modifying device design, chip layout, and the like) for a particular type or class of gates. In some examples, single-photon gates (e.g., iSWAP gates, square-root-of-iSWAP gates, controlled-Z or other controlled-phase gates, etc.) or two-photon gates (e.g., Bell-Rabi gate, square-root-of-Bell-Rabi gate, etc.) may be performed. Accordingly, a quantum processor chip may be able to implement any two-qubit quantum logic gate using the same device design and chip layout. In some cases, operating the tunable-frequency qubit devices while they are held at a fixed parking frequency within the tunable range of the qubit can enable increased flexibility in the design and fabrication of the qubits and thereby enhance gate optimization.

In some implementations, a scalable quantum processor can be built using engineering criteria to define a frequency allocation scheme for qubit devices. For example, a frequency allocation scheme for tunable-frequency transmon qubit devices and fixed-frequency transmon qubit devices can be deployed in a quantum processor architecture that supports parametrically-activated quantum logic gates. In some architectures, tunable-frequency qubit devices can each be coupled to an integer number (e.g., two, three, four or more) of fixed-frequency qubit devices. For instance, pairs of qubit devices can be capacitively coupled, such that energy can be transferred between the qubit devices based at least in part on the electric field across one or more capacitors electrically connecting the qubit devices. In some cases, parametrically-activated quantum logic gates do not require coupler devices to be connected between the qubit devices that are operated on by the parametrically-activated quantum logic gates, thus reducing the complexity and cost of the quantum processor.

In some aspects, parametrically-activated quantum logic gates are supported in a two-dimensional or three-dimensional quantum processor architecture (e.g. an architecture where circuit devices are distributed over two or three spatial dimensions). For instance, the positions of the qubit devices within a quantum processor (e.g., fixed-frequency qubit devices and tunable-frequency qubit devices on a processor substrate) may define one or more two-dimensional spatial arrays in a plane, and readout resonators associated with the qubit devices can be positioned within another plane (e.g., on another processor substrate). In some cases, qubit devices on one substrate are electronically coupled to readout resonators on another substrate through conductive signal vias or other types of structures. Accordingly, frequency allocation schemes can be defined for two-dimensional and three-dimensional processor architectures.

Figure 13:
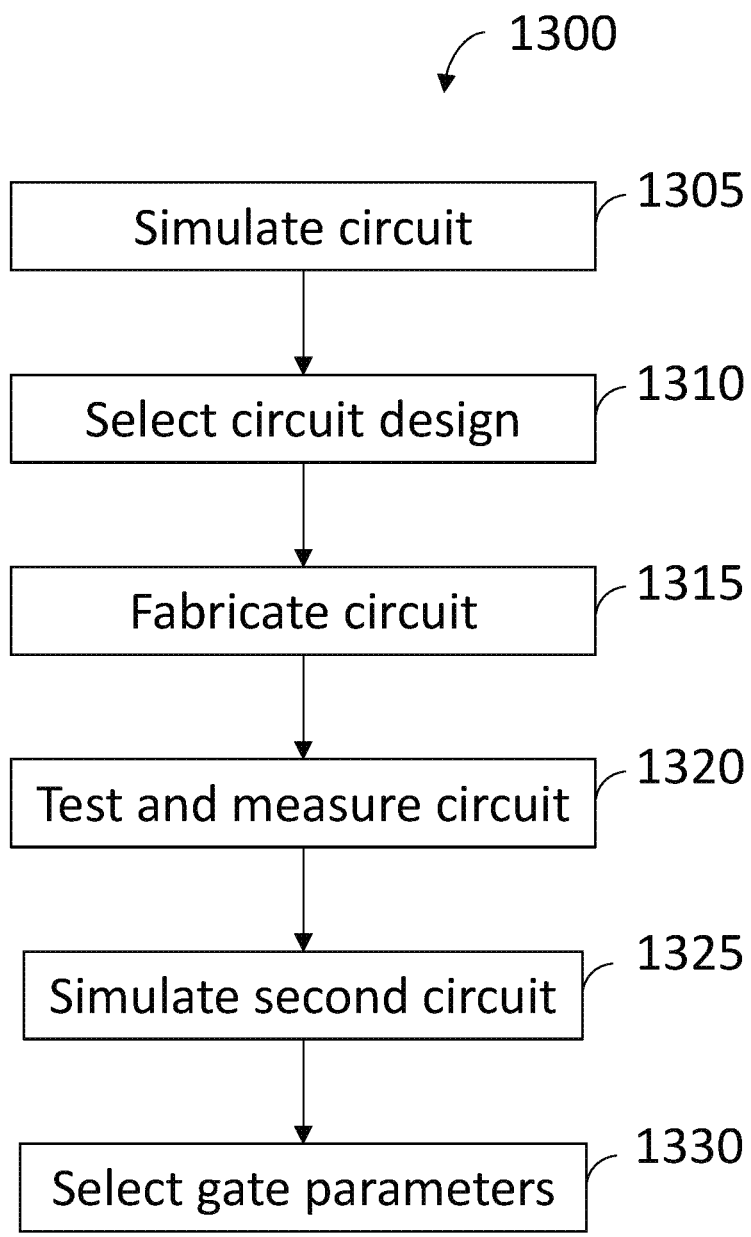
FIG. 13 is a flowchart showing an example process that can be used, for instance, in the manufacture and operation of a quantum processor.

FIG. 13 is a flowchart showing an example process 1300 that can be used, for instance, in the manufacture and operation of a quantum processor. The example process 1300 can be used, for example, to analyze, design, modify, optimize, calibrate, operate, or otherwise interact with quantum processor circuits and components thereof. The process 1300 may include additional or different operations, and the operations can be performed in the order shown or in another order.

In some implementations, the process 1300 proceeds in an iterative manner, for example, iteratively modeling quantum processor circuits, fabricating quantum processor circuits based on the results of the modeling, and measuring various parameters associated with the fabricated quantum processor circuits. In some cases, individual operations or groups of operations can be repeated multiple times, for example, in order to optimize or otherwise improve a quantum processor circuits, e.g., to obtain a closer match between a fabricated quantum processor circuits and design criteria.

At 1305, a quantum processor circuit is simulated. In some cases, the quantum processor circuit is a superconducting circuit, with qubit devices implemented as circuit devices that include Josephson junctions, e.g., in superconducting quantum interference device (SQUID) loops or other arrangements, and are controlled by radio-frequency signals, microwave signals, and bias signals delivered to the quantum processor circuit. In some cases, the quantum processor circuit may be implemented based on another physical modality for quantum information processing.

The quantum processor circuit can be a superconducting circuit that includes many circuit devices. The circuit devices may include, for example, qubit devices, readout devices, flux bias devices, control lines, connections (e.g., capacitive connections or otherwise) between pairs of devices, and other types of circuit devices. In some examples, the quantum processor circuit includes tunable-frequency qubit devices and fixed-frequency qubit devices, as well as readout devices and other types of circuit elements. For instance, a quantum processor circuit represented by the equivalent circuits 1200A, 1200B shown in FIGS. 12A, 12B may be simulated at 1305.

In some cases, the quantum processor circuit is simulated at 1305 by defining a model (e.g., in a memory of a digital computer) according to an equivalent circuit or another representation of the quantum processor circuit, and operating the model using software (e.g., executed by one or more processors of a digital computer) or other simulation tools. In some cases, the simulation can be executed by a digital computing system (e.g., a laptop or desktop computer, a server or server cluster, or another type of system) that includes, for example, digital memory and one or more digital microprocessor programmed to perform the simulation. Example techniques for simulating quantum processor circuits are described in U.S. Publication No. US 2017/0228483, entitled "Analyzing Quantum Information Processing Circuits." A quantum processor circuit may be simulated using another technique.

The simulation of the quantum processor circuit can take into account various parameters, such as an operating frequency of a fixed-frequency qubit device, an operating frequency of a tunable-frequency qubit device, a modulation frequency associated with a tunable-frequency qubit device, a capacitive or inductive coupling element between qubit devices, time constants associated with qubit devices, one or more material parameters associated with the physical fabrication of qubit devices or other elements of the quantum processor circuit, such as inductors, capacitors, filters, resonators, resonator buses, transmission lines, and the like.

In some cases, the simulation performed at 1305 uses a model of a quantum processor circuit to compute certain parameters that would be obtained from measuring a physical realization the quantum processor circuit. For example, the simulation may compute a qubit device's operating frequency or Rabi frequency, a qubit device's tunable frequency range of operation, a qubit device's anharmonicity or higher energy levels, a qubit devices' decoherence rates, a coupling strength between qubit devices, or other parameters. In some cases, the computed parameters correspond to measurements that could be obtained during a bring-up procedure or hardware test that measures, detects, diagnoses or evaluates aspects of a quantum processor circuit, its components or subsystems.

In some cases, the simulation performed at 1305 includes quantum logic gates or quantum logic algorithms that can be executed using the quantum processor circuit. For example, the simulation may include quantum logic gates available for execution by a quantum processor unit (QPU) or another quantum computing resource. The quantum logic gates may include, for example, single-qubit quantum logic gates (e.g., "NOT" gates, "PHASE" gates, "Hadamard" gates, etc.), two-qubit quantum logic gates (e.g., "Controlled-NOT" gates, "Controlled-PHASE" gates, "Bell-Rabi" gates, "SWAP" gates, etc.), and multi-qubit gates for three or more qubits. In some cases, the simulations performed at 1305 indicate a quality measure (e.g., quantum process fidelity or quantum state fidelity) for simulated execution of quantum logic gates (e.g., a full set of single-qubit and two-qubit gates) in the quantum processor circuit. The simulated quantum logic gates may include parametrically-activated quantum logic gates.

Figure 15:
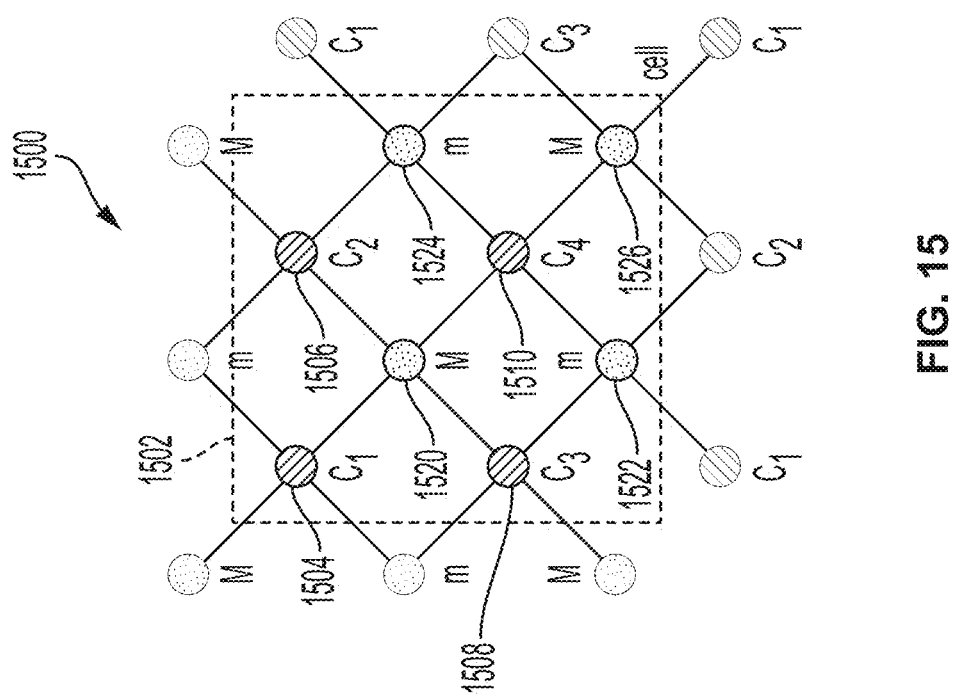
FIG. 15 is a diagram of an example frequency allocation scheme.
Figure 16:
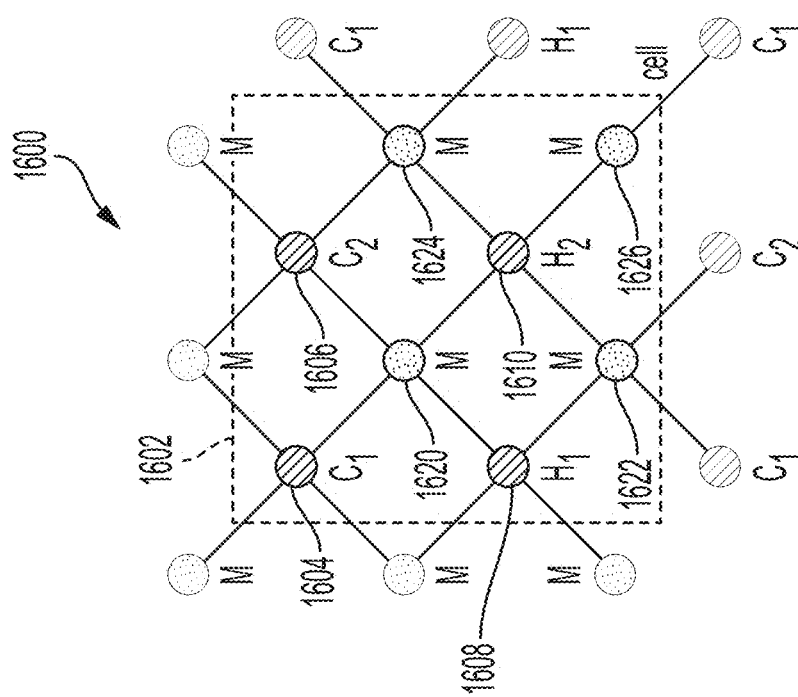
FIG. 16 is a diagram of another example frequency allocation scheme.
Figure 17:
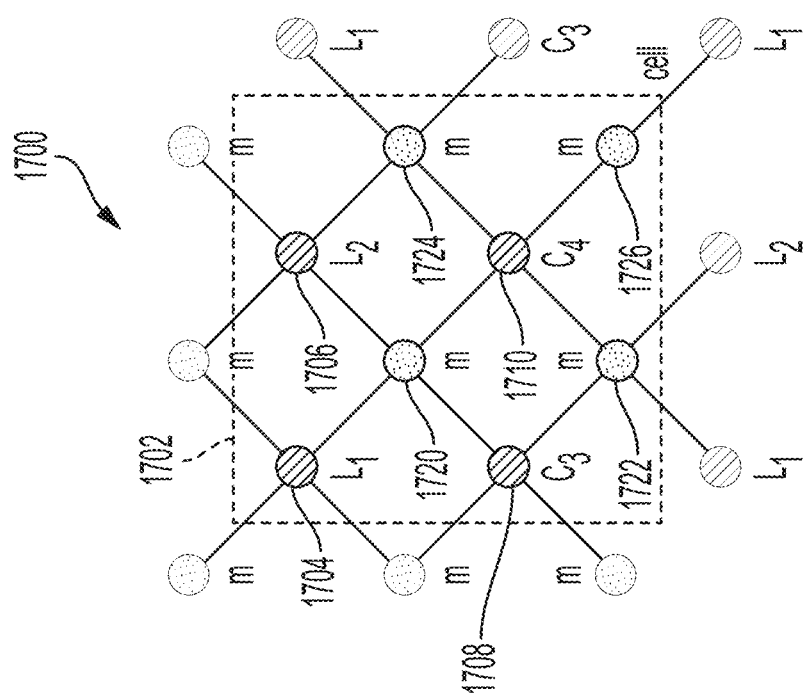
FIG. 17 is a diagram of another example frequency allocation scheme.

In some implementations, the simulation performed at 1305 includes multiple iterations, where each iteration simulates the quantum processor circuit with a distinct set of circuit parameters. For example, a number of distinct quantum processor circuit models can be defined, each with a distinct set of circuit parameters, and each circuit model can be simulated independently in order to compare the distinct circuit models under simulation. In some cases, the circuit models are associated with distinct frequency allocation schemes. For instance, each frequency allocation scheme can designate operating frequencies of fixed-frequency qubit devices, as well as operating frequency ranges and parking frequencies for tunable-frequency qubit devices. Example frequency allocation schemes are shown in FIGS. 15, 16 and 17. Other frequency allocation schemes may be used in some cases.

At 1310, a circuit design is selected based on the simulation(s) performed at 1305. In some cases, the simulation performed at 1305 indicates circuit parameters that meet certain design criteria or engineering constraints (e.g., according to the guidelines and principles discussed below), and the circuit parameters can be selected at 1310 based on the simulation. In some cases, selecting the circuit design includes selecting a frequency allocation scheme for a quantum processor circuit. For example, selecting the circuit design at 1310 may include selecting the operating frequencies of fixed-frequency qubit devices, and the operating frequency ranges and parking frequencies for tunable-frequency qubit devices, the amount of detuning that is available between neighboring qubit devices (e.g., between first-nearest neighbors and between second-nearest neighbors), as well as other parameters. For instance, selecting the circuit design may include selecting one or more of the frequencies shown in the plot 1400 in FIG. 14, or specifying one or more attributes of the example frequency allocation schemes 1500, 1600, 1700 shown in FIGS. 15, 16 and 17. In some cases, selecting the circuit design includes selecting parameters of qubit devices, junctions, inductors, capacitors, filters, resonators, resonator buses, transmission lines, and the like.

At 1315, a quantum processor circuit is fabricated according to the circuit design selected at 1310. In some implementations, the circuit can include one or more substrates (e.g., a substrate including sapphire or silicon or another dielectric material), with circuit devices and a ground plane disposed on the substrate. The circuit devices and the ground plane can be formed by one or more metal (e.g., superconducting metal) layers or other materials on the surface of the substrate. In some cases, the fabrication of the circuit can include deposition and patterning of large structures, e.g., transmission lines, capacitor elements, resonators, and the like on a substrate. For instance, deposition can include physical vapor deposition (PVD), chemical vapor deposition (CVD), atomic layer deposition (ALD), sputtering, and the like. In some cases, patterning of structures can be performed using lithography, for example, optical lithography, e-beam lithography, or other types of lithograph. In some aspects, the fabrication of the circuits can include the fabrication of qubit devices that each include one or more Josephson junctions, superconducting quantum interference device (SQUID) loops, or other features. In some cases, fabricating the circuit at 1315 includes fabricating a quantum processor circuit according to the model that was simulated at 1305 and the design that was selected at 1310.

At 1320, the quantum processor circuit fabricated at 1315 is tested and measured. For instance, circuit elements and physical properties of the quantum processor circuit may be measured using various types of probes or inspection equipment. In some cases, the quantum processor circuit can be deployed (e.g., installed, connected or otherwise deployed) and tested in a quantum computing system (e.g., of the type shown in FIG. 1). In some implementations, some or all of the testing and measuring performed at 1320 corresponds to simulations that were performed at 1305. For instance, the testing and measuring at 1320 may be used to compare the fabricated quantum processor circuit with the simulated model of the quantum processor circuit.

In some cases, the testing and measuring at 1320 includes measuring the physical properties of circuit elements and other structures in the quantum processor circuit. For example, the size (length, width, thickness, aspect ratio) and electrical properties (e.g., capacitance, inductance, resistance) of conductors, insulators, junctions, capacitors, inductors, and other structures may be measured. In some cases, the resonance frequencies and LC characteristics of resonators, filters or other structures are measured.

In some cases, the testing and measuring at 1320 includes characterizing (fully or partially characterize) each qubit device in the quantum processor circuit. For example, each qubit device may be characterized by measuring or otherwise determining the qubit device's operating frequency or Rabi frequency, tunable frequency range, anharmonicity or higher energy levels, decoherence rates, coupling strength to other qubit devices, or other parameters. In some cases, the testing and measuring at 1320 corresponds to all or part of a bring-up procedure or hardware test that measures, detects, diagnoses or evaluates aspects of a quantum processor circuit, its components or subsystems.

In some implementations, the information obtained from measuring and testing the quantum processor circuit at 1320 relates to quantum states (quantum energy levels) defined by the individual qubit devices in the quantum processor circuit. For example, the information may indicate, for each qubit device, the transition frequency between qubit states (e.g., between the ground state and the first excited state) defined by the qubit device, the transition frequency between other quantum states (e.g., between a qubit state and a second or third excited state) defined by the qubit device. In some cases, the measuring and testing may be used to characterize (fully or partially characterize) the qubit operating frequencies of a quantum processor circuit that includes fixed-frequency qubit devices and tunable-frequency qubit devices. In some cases, the information obtained includes the operating frequency of fixed-frequency qubit devices, the tunable frequency range of tunable-frequency qubit devices, the coupling strength between each neighboring fixed-frequency qubit device and tunable-frequency qubit device, and other parameters (e.g., anharmonicities, decoherence rates, transition rates, etc.).

In some cases, the testing and measuring at 1320 includes the parameterization and execution of quantum logic gates or quantum logic algorithms. For example, the testing may include determining parameters for quantum logic gates to be executed by a quantum processor unit (QPU) or another quantum computing resource. The quantum logic gates may include, for example, single-qubit quantum logic gates (e.g., "NOT" gates, "PHASE" gates, "Hadamard" gates, etc.), two-qubit quantum logic gates (e.g., "Controlled-NOT" gates, "Controlled-PHASE" gates, "Bell-Rabi" gates, "SWAP" gates, etc.), and multi-qubit gates for three or more qubits. In some cases, the testing and measuring at 1320 determine a quality measure (e.g., quantum process fidelity or quantum state fidelity) for the execution of quantum logic gates in the quantum processor circuit. The executed quantum logic gates may include parametrically-activated quantum logic gates.

At 1325, a second quantum processor circuit is simulated based on the output of the tests and measurements performed at 1320. For example, the simulation performed at 1325 can simulate aspects of the quantum processor circuit fabricated at 1315, based on the information obtained at 1320. In some cases, the simulation performed at 1325 is the same as the simulation performed at 1305, except that the circuit model is updated to include parameters obtained from the measuring and testing at 1320. For instance, the simulation performed at 1320 may include the measured operating frequency of fixed-frequency qubit devices, the measured tunable frequency range of tunable-frequency qubit devices, the measured coupling strength between each neighboring fixed-frequency qubit device and tunable-frequency qubit device, and other measured parameters (e.g., anharmonicities, decoherence rates, transition rates, etc.). In some cases, the simulation performed at 1320 includes parameters associated with the physical fabrication of qubit devices or other circuit elements of the quantum processor circuit. For example, the simulation may include measured properties of qubit devices, junctions, inductors, capacitors, filters, resonators, resonator buses, transmission lines, and the like.

At 1330, gate parameters are selected. The gate parameters can be selected based on information obtained from the simulations performed at 1305 or 1325, the circuit design selected at 1310, the fabrication process performed at 1315, the testing and measurement performed at 1320, or a combination of them.

The gate parameters selected at 1330 can include operating parameters for performing parametrically-activated quantum logic gates. For instance, the gate parameters may include the flux modulation amplitude, flux modulation frequency and flux modulation duration for a control signal to be delivered to a control line of a tunable-frequency qubit device to implement a parametrically-activated quantum logic gate. The parametrically-activated quantum logic gates can include single-photon gates (e.g., iSWAP gates, square-root-of-iSWAP gates, controlled-Z or other controlled-phase gates, etc.) or two-photon gates (e.g., Bell-Rabi gate, square-root-of-Bell-Rabi gate, etc.). The gate parameters selected at 1330 may include gate parameters for other types of quantum logic gates (e.g., single-qubit gates or two-qubit gates that are not parametrically activated).

In some cases, selecting the gate parameters at 1330 includes specifying all or part of a frequency allocation scheme for the quantum processor circuit. For instance, selecting the gate parameters at 1330 may include selecting one or more of the frequencies shown in the plot 1400 in FIG. 14, or specifying one or more attributes of the example frequency allocation schemes 1500, 1600, 1700 shown in FIGS. 15, 16 and 17. As an example, selecting the gate parameters may include specifying the nearest-neighbor and second-nearest neighbor detuning of states between qubit devices, e.g., between fixed-frequency qubit devices and tunable-frequency qubit devices, during the application of quantum logic gates. For example, the frequency allocation scheme may specify a parking frequency for each tunable-frequency qubit device during the application of a two-qubit (e.g., parametrically activated) quantum logic gate to the tunable-frequency qubit device and a neighboring fixed-frequency qubit device. In such examples, the frequencies of the fixed-frequency qubit devices in the frequency allocation scheme are specified by the design (e.g., selected at 1310) and fabrication (at 1315) and determined by measurements (at 1320) of the quantum processor circuit.

After the gate parameters are selected at 1330, the quantum processor circuit can be operated, for example, using the selected gate parameters, in a quantum computer or another type of computing environment. For instance, the quantum processor circuit can be deployed in a quantum processor (e.g., the quantum processor 102 shown in FIG. 1) and a control system (e.g., the control system 110 shown in FIG. 1) can be programmed with the selected gate parameters and other control information for operating the quantum processor circuit. As an example, the quantum processor circuit and selected gate parameters can be used to execute a quantum algorithm or to perform another type of quantum computing process.

Figure 14:
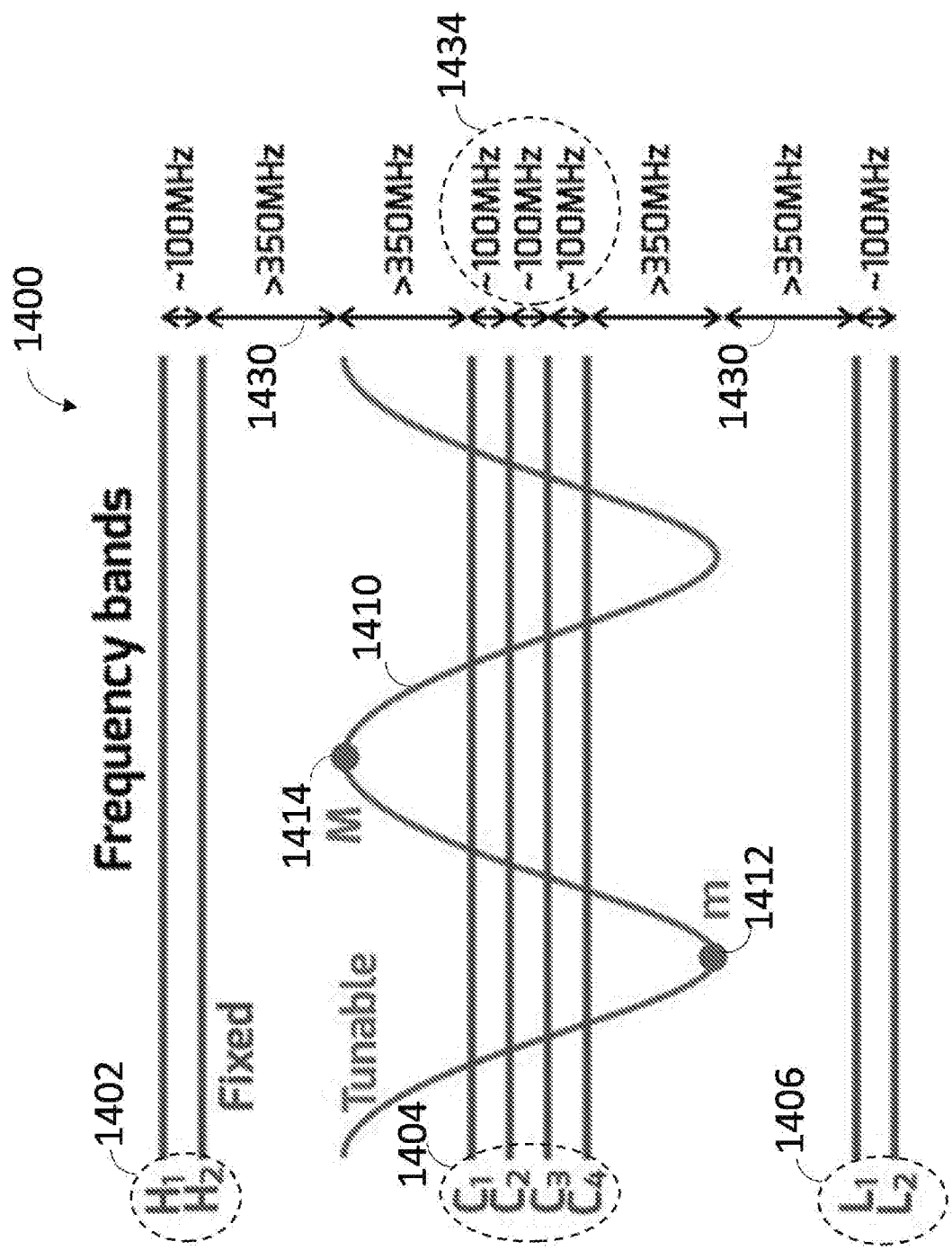
FIG. 14 is a plot showing example spectral frequency bands for fixed-frequency qubit devices and tunable-frequency qubit devices versus time.

FIG. 14 is a plot 1400 showing example spectral frequency bands for fixed-frequency qubit devices and tunable-frequency qubit devices versus time. In the example shown, the plot 1400 indicates the qubit frequencies $L_1$, $L_2$, $C_1$, $C_2$, $C_3$, $C_4$, $H_1$, $H_2$ of eight respective fixed-frequency qubit devices, as well as the tunable qubit frequency 1410 of a tunable-frequency qubit device. As shown in the plot 1400, the qubit frequencies $L_1$, $L_2$, $C_1$, $C_2$, $C_3$, $C_4$, $H_1$, $H_2$ of the fixed-frequency qubit devices are constant in time, while the qubit frequency 1410 of the tunable-frequency qubit device varies over time (e.g., in response to a bias signal applied to the qubit device). The tunable range of the tunable-frequency qubit device has a minimum (m) 1412 and a maximum (M) 1414 frequency of operation. In some instances, the tunable-frequency qubit device can be parked at the maximum 1414 or the minimum 1412, or any intermediate point, in the tunable range during operation. For instance, the tunable-frequency qubit device may be parked at the maximum 1414 of the tunable range by biasing the tunable-frequency qubit device with zero flux quantum, such that the total flux threading a SQUID loop of the tunable-frequency qubit device is equal to zero. Similarly, the tunable-frequency qubit device 1410 may be parked at the minimum 1412 of the tunable range by biasing the tunable-frequency qubit device with half a flux quantum, such that the total flux threading the SQUID loop of the tunable-frequency transmon qubit device is equal to half a flux quantum.

In some systems, the frequencies shown in the plot 1400 can be used to specify a frequency allocation scheme for a quantum processor. For instance, the eight fixed frequencies $L_1$, $L_2$, $C_1$, $C_2$, $C_3$, $C_4$, $H_1$, $H_2$ may be assigned to fixed-frequency qubit devices, and the minimum (m) and maximum (M) frequencies may be designated as the parking frequencies of tunable-frequency qubit devices during two-qubit quantum logic gate. In some instances, the frequency allocation scheme specifies frequencies in a unit cell of the quantum processor circuit (e.g., over eight qubit devices), and the unit cell may be repeated over the full domain of the quantum processor circuit. Each unit cell can include one or more tunable-frequency qubit devices each paired to four or more fixed-frequency qubit devices.

As shown in the plot 1400, two of the fixed frequencies ($H_1$, $H_2$) are in a high frequency band 1402, four of the fixed frequencies ($C_1$, $C_2$, $C_3$, $C_4$) are in a central frequency band 1404, and two of the fixed frequencies ($L_1$, $L_2$) are in a low frequency band 1406. The tunable range of the tunable qubit frequency 1410 is between the high frequency band 1402 and the low frequency band 1406; thus, the maximum (M) at 1414 is below the fixed frequencies in the high frequency band 1402 and the minimum (m) at 1412 is above the fixed frequencies in the low frequency band 1406. The central frequency band 1404 falls within the tunable range of the tunable qubit frequency 1410; thus, the maximum (M) at 1414 is above the fixed frequencies in the central frequency band 1404 and the minimum (m) at 1412 is below the fixed frequencies in the central frequency band 1404.

In the example shown in FIG. 14, the frequency bands of the fixed-frequency qubit devices are spaced apart from the maximum (M) and the minimum (m) by at least a frequency threshold 1430 amount. For instance, the maximum (M) of the range of the tunable-frequency qubit device is spaced apart from the high frequency band 1402 by at least the frequency threshold 1430, and the minimum (m) of the range of the tunable-frequency qubit device is spaced apart from the low frequency band 1406 by at least the frequency threshold 1430. Similarly, For instance, the maximum (M) of the range of the tunable-frequency qubit device is spaced apart from the central frequency band 1404 by at least the frequency threshold 1430, and the minimum (m) of the range of the tunable-frequency qubit device is spaced apart from the central frequency band 1404 by at least the frequency threshold 1430. In the example shown, the frequency threshold of at least 350 MHz is specified for each spacing, but another frequency threshold may be specified.

In the example shown in FIG. 14, within each frequency band, the fixed frequencies are spaced apart from each other by at least another frequency threshold 1434 amount. For instance, the two fixed frequencies ($H_1$, $H_2$) in the high frequency band 1402 are separated by at least the frequency threshold 1434, the four fixed frequencies ($C_1$, $C_2$, $C_3$, $C_4$) in the central frequency band 1404 are separated by at least the frequency threshold 1434, and the two fixed frequencies ($L_1$, $L_2$) in the low frequency band 1406 are separated by at least the frequency threshold 1434. In the example shown, the frequency threshold of at least 100 MHz is specified for each spacing between fixed-frequencies, but another frequency threshold may be specified.

In some implementations, the frequency thresholds (e.g., the frequency thresholds 1430 and 1434 shown in FIG. 14) can be assigned to limit the detuning between nearest-neighbor qubit devices in a frequency allocation scheme. In some aspects, the minimum amount of detuning that is available between neighboring qubit devices can be specified at least in part by the design and fabrication of the qubit devices and the quantum processor circuit (e.g., at 1310 and 1315 of the process 1300 shown in FIG. 13). By limiting the available detuning, effects of undesirable capacitive coupling between the tunable-frequency qubit devices and fixed-frequency qubit devices can be reduced or eliminated. In some instances, the degree of available detuning can be optimized within a predetermined range having a minimal and maximal degree of detuning, beyond which the performance of quantum logic gates may deteriorate.

In some example frequency allocation schemes, the degree of minimal detuning available for second-nearest neighbor qubit devices can be lower than the degree of minimal detuning available for first-nearest neighbor qubits. For instance, the smaller frequency threshold 1434 (at least 100 MHz in the example shown in FIG. 14) can be used as the minimal detuning for second-nearest neighbors in a quantum processor circuit, while the larger frequency threshold 1430 (at least 350 MHz in the example shown in FIG. 14) can be used as the minimal detuning for first-nearest neighbors in the quantum processor circuit.

In some frequency allocation schemes (e.g., in the example shown in FIG. 15), tunable-frequency qubit devices are alternatively parked at the maximum (M) or the minimum (m) of their spectral range of operation for the application of parametrically-activated quantum logic gates. In some frequency allocation schemes (e.g., in the example shown in FIG. 16), tunable-frequency qubit devices are all parked at the maximum (M) of their spectral range of operation for the application of parametrically-activated quantum logic gates. In some frequency allocation schemes (e.g., in the example shown in FIG. 17), tunable-frequency qubit devices are all parked at the minimum (m) of their spectral range of operation for the application of parametrically-activated quantum logic gates.

In the example frequency allocation schemes shown in FIGS. 15, 16 and 17, the four fixed-frequency qubit devices that are coupled to a common tunable-frequency qubit device have distinct qubit frequencies from one another. In each example, four of the eight fixed frequencies $L_1$, $L_2$, $C_1$, $C_2$, $C_3$, $C_4$, $H_1$, $H_2$ shown in FIG. 14 are selected for the four fixed-frequency qubit devices in each unit cell.

FIG. 15 is a diagram of an example frequency allocation scheme 1500. The example frequency allocation scheme 1500 specifies a physical layout and operating parameters of fixed-frequency qubit devices (e.g., fixed-frequency transmon qubit devices) and tunable-frequency qubit devices (e.g., tunable-frequency transmon qubit devices) in a quantum processor circuit. The diagram in FIG. 15 shows a portion of an example two-dimensional (2D) qubit architecture, which can be extended in the plane, e.g., by repeating the structure of the unit cell 1502. The frequency allocation scheme 1500 is shown for a square array, and can be adapted for other types of 2D arrays (e.g., other types of quadrilateral arrays such as rectangular, rhomboid arrays).

In the example shown in FIG. 15, the unit cell 1502 includes four fixed-frequency qubit devices 1504, 1506, 1508, and 1510 and four tunable-frequency qubit devices 1520, 1522, 1524, 1526. Each of the fixed-frequency qubit devices 1504, 1506, 1508, and 1510 is coupled to exactly four nearest-neighbors: the tunable-frequency qubit device 1520 and three other tunable-frequency qubit devices. Likewise, each of the tunable-frequency qubit devices 1520, 1522, 1524, 1526 is coupled to four nearest-neighbor fixed-frequency qubit devices.

In the example shown in FIG. 15, the fixed-frequency qubit devices 1504, 1506, 1508, and 1510 are assigned frequencies ($C_1$, $C_2$, $C_3$, $C_4$) from the central frequency band 1404 in the plot 1400 shown in FIG. 14; and the tunable-frequency qubit devices 1520, 1522, 1524, 1526 are assigned parking frequencies that are either the maximum (M) or the minimum (m) of the tunable range shown in the plot 1400 shown in FIG. 14. The parking frequencies and fixed frequencies shown in FIG. 15 can be used to specify the detuning (e.g., Δ) for each pair of neighboring qubit devices during the application of parametrically-activated quantum logic gates. The example frequency allocation scheme 1500 provides: (1) between all pairs of second-nearest neighbors in a quantum processor circuit, a detuning that is larger than the frequency threshold 1434 (at least 100 MHz in the example shown in FIG. 14), and (2) between all pairs of first-nearest neighbors in a quantum processor circuit, a detuning that is larger than the frequency threshold 1430 (at least 350 MHz in the example shown in FIG. 14).

FIG. 16 is a diagram of another example frequency allocation scheme 1600. The example frequency allocation scheme 1600 specifies a physical layout and operating parameters of fixed-frequency qubit devices (e.g., fixed-frequency transmon qubit devices) and tunable-frequency qubit devices (e.g., tunable-frequency transmon qubit devices) in a quantum processor circuit. The diagram in FIG. 16 shows a portion of an example two-dimensional (2D) qubit architecture, which can be extended in the plane, e.g., by repeating the structure of the unit cell 1602. The frequency allocation scheme 1600 is shown for a square array, and can be adapted for other types of 2D arrays (e.g., other types of quadrilateral arrays such as rectangular, rhomboid arrays).

In the example shown in FIG. 16, the unit cell 1602 includes four fixed-frequency qubit devices 1604, 1606, 1608, and 1610 and four tunable-frequency qubit devices 1620, 1622, 1624, 1626. Each of the fixed-frequency qubit devices 1604, 1606, 1608, and 1610 is coupled to exactly four nearest-neighbors: the tunable-frequency qubit device 1620 and three other tunable-frequency qubit devices. Likewise, each of the tunable-frequency qubit devices 1620, 1622, 1624, 1626 is coupled to four nearest-neighbor fixed-frequency qubit devices.

In the example shown in FIG. 16, two of the fixed-frequency qubit devices 1604, 1606 are assigned two of the frequencies ($C_1$, $C_2$) from the central frequency band 1404 in the plot 1400 shown in FIG. 14; the two other fixed-frequency qubit devices 1608, 1610 are assigned the frequencies ($H_1$, $H_2$) from the high frequency band 1402 in the plot 1400 shown in FIG. 14; and the tunable-frequency qubit devices 1620, 1622, 1624, 1626 are assigned parking frequencies equal to the maximum (M) of the tunable range shown in the plot 1400 shown in FIG. 14. The parking frequencies and fixed frequencies shown in FIG. 16 can be used to specify the detuning (e.g., Δ) for each pair of neighboring qubit devices during the application of parametrically-activated quantum logic gates. The example frequency allocation scheme 1600 provides: (1) between all pairs of second-nearest neighbors in a quantum processor circuit, a detuning that is larger than the frequency threshold 1434 (at least 100 MHz in the example shown in FIG. 14), and (2) between all pairs of first-nearest neighbors in a quantum processor circuit, a detuning that is larger than the frequency threshold 1430 (at least 350 MHz in the example shown in FIG. 14).

FIG. 17 is a diagram of another example frequency allocation scheme 1700. The example frequency allocation scheme 1700 specifies a physical layout and operating parameters of fixed-frequency qubit devices (e.g., fixed-frequency transmon qubit devices) and tunable-frequency qubit devices (e.g., tunable-frequency transmon qubit devices) in a quantum processor circuit. The diagram in FIG. 17 shows a portion of an example two-dimensional (2D) qubit architecture, which can be extended in the plane, e.g., by repeating the structure of the unit cell 1702. The frequency allocation scheme 1700 is shown for a square array, and can be adapted for other types of 2D arrays (e.g., other types of quadrilateral arrays such as rectangular, rhomboid arrays).

In the example shown in FIG. 17, the unit cell 1702 includes four fixed-frequency qubit devices 1704, 1706, 1708, and 1710 and four tunable-frequency qubit devices 1720, 1722, 1724, 1726. Each of the fixed-frequency qubit devices 1704, 1706, 1708, and 1710 is coupled to exactly four nearest-neighbors: the tunable-frequency qubit device 1720 and three other tunable-frequency qubit devices. Likewise, each of the tunable-frequency qubit devices 1720, 1722, 1724, 1726 is coupled to four nearest-neighbor fixed-frequency qubit devices.

In the example shown in FIG. 17, two of the fixed-frequency qubit devices 1708, 1710 are assigned two of the frequencies ($C_3$, $C_4$) from the central frequency band 1404 in the plot 1400 shown in FIG. 14; the two other fixed-frequency qubit devices 1704, 1706 are assigned the frequencies ($L_1$, $L_2$) from the low frequency band 1406 in the plot 1400 shown in FIG. 14; and the tunable-frequency qubit devices 1720, 1722, 1724, 1726 are assigned parking frequencies equal to the minimum (m) of the tunable range shown in the plot 1400 shown in FIG. 14. The parking frequencies and fixed frequencies shown in FIG. 17 can be used to specify the detuning (e.g., A) for each pair of neighboring qubit devices during the application of parametrically-activated quantum logic gates. The example frequency allocation scheme 1700 provides: (1) between all pairs of second-nearest neighbors in a quantum processor circuit, a detuning that is larger than the frequency threshold 1434 (at least 100 MHz in the example shown in FIG. 14), and (2) between all pairs of first-nearest neighbors in a quantum processor circuit, a detuning that is larger than the frequency threshold 1430 (at least 350 MHz in the example shown in FIG. 14).

The following discussion provides examples of guidelines and principles that can be used as engineering constraints or performance criteria for a frequency allocation scheme or other aspects of a quantum processor circuit. For instance, the guidelines and principles below may be used to specify parameters of unit cells (e.g., the unit cells 1502, 1602, 1702 shown in FIGS. 15, 16, 17) of operating frequencies for parametrically activated quantum logic gates.

In some instances, a first guideline can be that any two neighboring qubits should not operate at the same frequencies or anharmonicities of those frequencies. This can reduce the effects of undesirable resonant coupling (so-called "always on" coupling) between the qubits.

In some instances, a second guideline can be that the fixed-frequency qubit devices that are coupled to the a given tunable-frequency qubit device should have different detunings between the three transition frequencies (i.e., ground state, first excited state, and second excited state) corresponding to a given fixed-frequency qubit device and the three transition frequencies (i.e., ground state, first excited state, and second excited state) corresponding to a given tunable-frequency qubit device paired with the fixed-frequency qubit device. Accordingly, there will be, in such examples, nine separate detunings for each fixed-frequency qubit device, tunable-frequency qubit device pair. This can enable and improve gate selectivity, that is, the ability of the quantum computer to implement a given gate on a group of qubits that operate in the context of parametrically-activated quantum logic gates.

In some instances, a third guideline is that integer multiples of the detunings between the three transition frequencies (i.e., ground state, first excited state, and second excited state) corresponding to a given fixed-frequency qubit device and the three transition frequencies (i.e., ground state, first excited state, and second excited state) corresponding to a given tunable-frequency qubit device paired with the fixed-frequency qubit device are different. This can serve to reduce or eliminate overlaps between the states and harmonic states associated with the transition frequencies of a given qubit and the states and harmonic states associated with the transition frequencies of another qubit, and thereby enable and improve gate selectivity, that is, the ability of the quantum computer to implement a given parametrically-activated quantum logic gate.

In some instances, the frequencies of the tunable-frequency qubit devices described in connection with the guidelines discussed above, can be evaluated in two different tunable-frequency qubit device configurations: a first configuration where the tunable-frequency qubit devices operate under flux modulation, and a second configuration where the tunable-frequency qubit devices do not operate under flux modulation. The application of flux modulation to a tunable-frequency qubit device can lead to the second order effect of shifting the qubit frequency of the tunable-frequency qubit device. Accordingly, the operating qubit frequencies and harmonics of those frequencies for a given tunable-frequency qubit device may need to be determined under both first and second configurations, and all detunings based on those determined frequencies (e.g., ground state frequency, first excited state frequency, and second excited state frequency, and all harmonics thereof) of the qubits may need to be considered in the application of the guidelines described above.

In some instances, the guidelines for the operational frequencies and detunings between the states of the tunable-frequency qubit devices and the states of the fixed-frequency qubit devices described above may need to be satisfied on a bandwidth larger than the Chevron width (e.g., on the order of approximately 10 MHz in some cases). That is, the detunings may need to have a tolerance of at least 10 MHz in order to be robust against the effects of quantum fluctuations and/or noise in the system.

In some instances, engineering constraints and performance criteria for the minimization of frequency crowding effects for a given performance target of the quantum computer implementing parametrically-activated quantum logic gates can be achieved by tuning one or more of at least the following parameters: (1) The nearest-neighbor and second-nearest neighbor detuning of states between qubit devices, e.g., between fixed-frequency qubit devices and tunable-frequency qubit devices. (2) The degree of capacitive coupling between qubit devices, e.g., between fixed-frequency qubit devices and tunable-frequency qubit devices. (3) The flux modulation amplitude of the tunable-frequency qubit devices.

In some instances, design improvement or optimization involving the manipulation of the parameters described above can lead to various tradeoffs in performance target of a quantum computer implementing parametrically-activated quantum logic gates. Such design improvement or optimization can include one or more of the following considerations. (A) A relatively large degree of detuning between the states of the various qubits as described in connection with (1) above, and a comparatively small degree of capacitive coupling between the various qubits as described in connection with (2) above, can lead to a suppression of the effect of the parasitic (that is, so-called "always-on") capacitive coupling. (B) A relatively small degree of detuning between the states of the various qubits as described in connection with (1) above, and a comparatively large degree of capacitive coupling between the various qubits as described in connection with (2) above, can reduce the gate time, that is, the duration of time that it takes to implement a given gate using the parametrically-activated qubits. (C) The flux modulation amplitude of the tunable-frequency qubit devices can be tuned to modify the gate time.

In some instances, the engineering constraints and performance criteria for frequency allocation for parametrically-activated logic gates using fixed-frequency qubit devices and tunable-frequency qubit devices in a two-dimensional architecture can include the following. (1) The fixed-frequency qubit devices that are coupled to the same tunable-frequency qubit device may not have the same degree of detuning. (2) The degree of detunings between the fixed-frequency qubit devices and tunable-frequency qubit devices as described in (1) may need to be different from an integer fraction of the degree of detunings associated with other qubit devices (e.g., fixed-frequency qubit devices and tunable-frequency qubit devices on the same unit cell or a different unit cell). (3) The degree of detunings between the fixed-frequency qubit devices and tunable-frequency qubit devices as described in (1) may need to be different from the anharmonicities of the operational frequencies or detunings associated with other qubit devices (e.g., fixed-frequency qubit devices and tunable-frequency qubit devices on the same unit cell or a different unit cell). (4) The spectral range (i.e., the bandwidth) in which the tunable-frequency qubit device can be tuned can be between approximately 0.5 GHz and approximately 2 GHz. (5) The detunings between the fixed-frequency qubit devices and tunable-frequency qubit devices as described in (1) may not overlap with the detunings associated with other qubit devices (e.g., fixed-frequency qubit devices and tunable-frequency qubit devices on the same unit cell or a different unit cell), or any anharmonicities of those detunings. (6) The minimum detuning between a tunable-frequency qubit device and a fixed-frequency qubit device can be determined, in part, by the parasitic coupling, e.g., the "always-on" dispersive coupling between qubit devices. In some instances, this parasitic coupling between the qubit devices may enable the minimization of errors associated with the constructed entangling gates or single qubit gates.

In some instances, it may be required to have a degree of disorder in the above parameters as applied to the various qubit devices. In other words, the detuning between the operational frequencies for qubit devices of one unit cell to another unit cell should be slightly different, e.g., within a predetermined tolerance. For instance, if a first detuning between first and second operational frequencies of first and second fixed-frequency qubit devices of a first unit cell is approximately 100 MHz, then a corresponding detuning between similar first and second operational frequencies of first and second fixed-frequency qubit devices of a second unit cell may be approximately 102 MHz. Such a guideline with respect to the detunings between the operation frequencies of the qubit devices can be implemented to avoid, in part, the establishment of long-range collective modes in a quantum processor, such that the parametrically-activated quantum logic gates do not behave as a metamaterial. In some aspects, the disorder in the detunings between the qubit devices can be realized at the design level or can be the result of variations between qubit devices during the fabrication process.

In a general aspect, frequency allocation schemes for quantum processor circuits are described. The frequency allocation schemes can be used, for example, to implement parametrically-activated quantum logic gates.

In some aspects, frequency thresholds are specified for neighboring qubit devices (e.g., for first-nearest neighbors, second-nearest neighbors, or both) in a quantum processor circuit. The quantum processor circuit includes fixed-frequency qubit devices and tunable-frequency qubit devices, and detunings are specified for the application of quantum logic gates for each neighboring pair of qubit devices in the quantum processor circuit. Each detuning is greater than the frequency threshold specified for neighboring qubit devices.

Implementations may include one or more of the following features. The detunings can be specified for a unit cell of an array of qubit devices in the quantum processor circuit. The detunings specified for the unit cell can be repeated over the array of qubit devices. A first frequency threshold can be specified for first-nearest neighbors, and a second threshold can be specified for second-nearest neighbors.

Implementations may include one or more of the following features. The fixed-frequency qubit devices can be assigned qubit frequencies in a central frequency band that is between a maximum and minimum of the tunable range of each tunable-frequency qubit device. The central frequency band can be spaced apart from the maximum and minimum of the tunable range by at least the frequency threshold. Some of the fixed-frequency qubit devices can be assigned qubit frequencies in a high frequency band that is above a maximum of the tunable range of each tunable-frequency qubit device (e.g., spaced apart from the maximum by at least the frequency threshold). Some of the fixed-frequency qubit devices can be assigned qubit frequencies in a low frequency band that is below a minimum of the tunable range of each tunable-frequency qubit device (e.g., spaced apart from the maximum by at least the frequency threshold). Within each frequency range (e.g., the central frequency range, the maximum frequency range, the minimum frequency range) the qubit frequencies of the fixed-frequency qubit device can be spaced apart from each other by at least a second threshold amount.

In some implementations, a method of optimizing Hamiltonian design for quantum integrated circuits for implementation of parametrically activated gates may include: accessing coupled qubit parameters and desired accuracies for a quantum integrated circuit; computing effective coupling strength, always-on couplings, and gradient of the tunable qubit frequency; if calculated parameters are within desired ranges, checking the always-on coupling is within desired limit; if always-on coupling is within desired limit, generating an output of Hamiltonian parameters for the quantum integrated circuit. The Hamiltonian parameters may be used to generate a physical layout of the quantum integrated circuit, and in some embodiments the physical layout may be a set of lithographic masks. In some embodiments, the quantum integrated circuit may be fabricated using the set of lithographic masks, and the resulting circuit may be deployed for testing, characterization and/or use in a quantum computer.

The architecture of a quantum processor may rely on the type of entangling multiqubit gates sought. In some architectures entangling gates are realized on an array of tunable-frequency and fixed frequency qubits by dc tuning or parametrically modulating the tunable qubit to create resonance interaction between the fixed and tunable frequency energy levels. This architecture may benefit from a particular Hamiltonian design optimized to match the conditions set by the actuation of the entangling gates. Here, we describe a Hamiltonian design for quantum integrated circuits that in embodiments may be used to implement parametrically activated quantum logic (e.g., entangling) gates.

Consider coupled tunable- and fixed-frequency transmon qubits. The Hamiltonian of the system is described by (representing each transmon by its first three energy levels)

$$H = \omega_{T_{01}}(t)|1\rangle\langle 1| + (2\omega_{T_{01}}(t) - \eta_T(t))|2\rangle\langle 2| + \omega_{F_{01}}|1\rangle\langle 1| + (2\omega_{F_{01}} - \eta^F)|2\rangle\langle 2| + g(\Gamma_T'\sigma_F + \sigma_T\sigma_F' + \sigma_T\sigma_D + \sigma_T'\sigma_F')$$

where g is the static coupling between the $|0\rangle \rightarrow |1\rangle$ transition frequencies of the qubit, $$\omega_{T_{01}}(t) \approx \sqrt{8E_{J,\text{eff}}(\Phi)E_C} - E_C\left(1 + \frac{\xi}{4} + \frac{21\xi^2}{128} + \frac{19\xi^3}{128}\right)$$

$$E_{J,\text{eff}} = \frac{E_J}{1+r}\sqrt{1 + r^2 + 2r\cos\left(\frac{2\pi\Phi(t)}{\Phi_0}\right)},$$

$$r = \frac{E_{J1}}{E_{J2}}, \Phi(t) = \Phi_{dc} + \Phi_{ac}(t)\cos(\omega_{fl}t + \phi_m)$$

-continued $$\eta_T \approx E_C\left(1 + \frac{9\xi}{16} + \frac{81\xi^2}{128} + \frac{3645}{4096}\xi^3\right), \xi = \sqrt{2E_C/E_{J,eff}}$$

$\omega_{T_{01}}$ and $\eta_T$ are the tunable qubit $|0\rangle \rightarrow |1\rangle$ transition frequency and anharmonicity, respectively, with $\Phi$ being the external flux applied to the qubit loop, $\Phi_0 = h/2e$ is the flux quantum, $E_C = e^2/2C$ is the charging energy, $E_J = E_{J1} + E_{J2}$ is the total junction energy of the two junctions, $\Phi_{dc}$ is dc flux bias, $\Phi_{ac}$ and $\omega_{fl}$ are the ac flux modulation amplitude and frequency, and $\phi_m$ is the phase of the ac flux; and $\omega_{F_{02}}$ and $\eta_F$ are the frequency and anharmonicity of the fixed frequency qubit, respectively. Here, $\sigma_T = (|0\rangle\langle 1| + \sqrt{2}|1\rangle\langle 2|) \oplus I$ is the lowering operator for the tunable qubit, and $\sigma_F = I \oplus (|0\rangle\langle 1| + \sqrt{2}|1\rangle\langle 2|)$ is the lowering operator for the fixed-frequency qubit.

Figure 18:
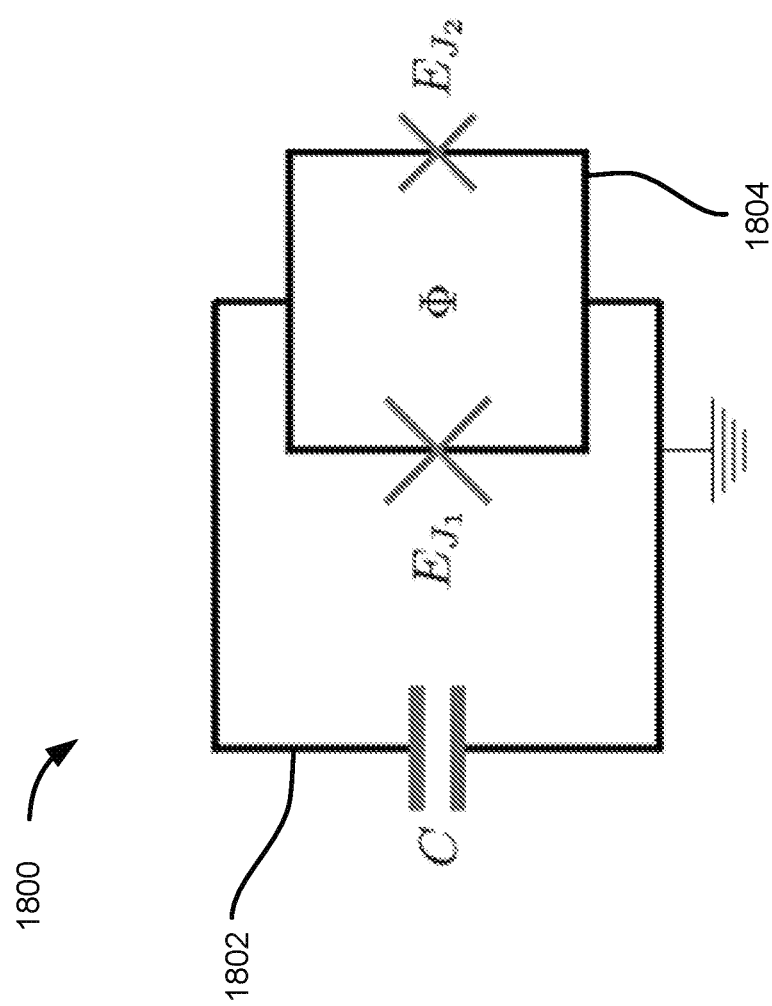
FIG. 18 shows an equivalent circuit for an example qubit device.

FIG. 18 shows an equivalent circuit 1800 for an example qubit device. The equivalent circuit 1800 represents an example of a tunable-frequency superconducting qubit device. The frequency of the qubit is tuned by threading external flux through the loop 1804 formed by the two Josephson junctions. The capacitance, C, of the other loop 1802 determines the charging energy.

Next a mode of activation of parametric gates is described. In some examples of a coupled tunable-frequency qubit and fixed-frequency qubit, three types of quantum logic gates can be activated:

(1) an iSWAP entangling gate—this gate can be activated by modulating the tunable qubit frequency at difference frequency $\omega_m^{iSWAP} = \Delta = \langle\omega_{T_{01}}\rangle - \omega_{F_{01}}$ of the state $|10\rangle$ and $|01\rangle$ (the first digit represents the state of the fixed-frequency qubit, and the second digit is for tunable-frequency energy levels), where $$<\omega_{T_{01}}> = \frac{1}{T}\int_0^T dt\, \omega_{T_{01}}$$

(t) is the average tunable-qubit frequency during modulation, $T = 2\pi/\omega_m$ is the period of oscillation.

(2) a Controlled-Z (CZ20) gate between $|11\rangle$ and $|02\rangle$—the gate can be activated by modulating the tunable-qubit frequency at $\omega_m^{CZ20} = \langle\omega_{T_{01}}\rangle - (\omega_{F_{01}} - \eta_F) = \Delta + \eta_F$ (3) a controlled-Z (CZ02) gate between $|11\rangle$ and $|20\rangle$—this gate can be activated by modulating the tunable-frequency qubit at $\omega_m^{CZ02} = \langle\omega_{T_{01}}\rangle - \langle\eta_T\rangle - \omega_{F_{01}} = \Delta - \langle\eta_T\rangle$.

Figure 19A:
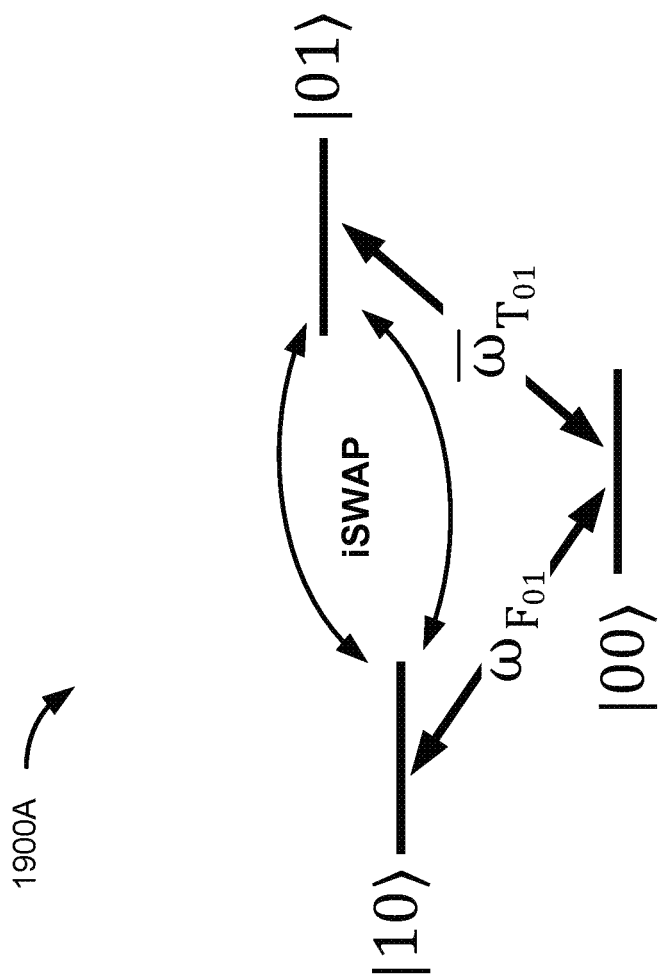
FIG. 19A is an energy level diagram showing transitions during an iSWAP gate in an example two-qubit system.
Figure 19B:
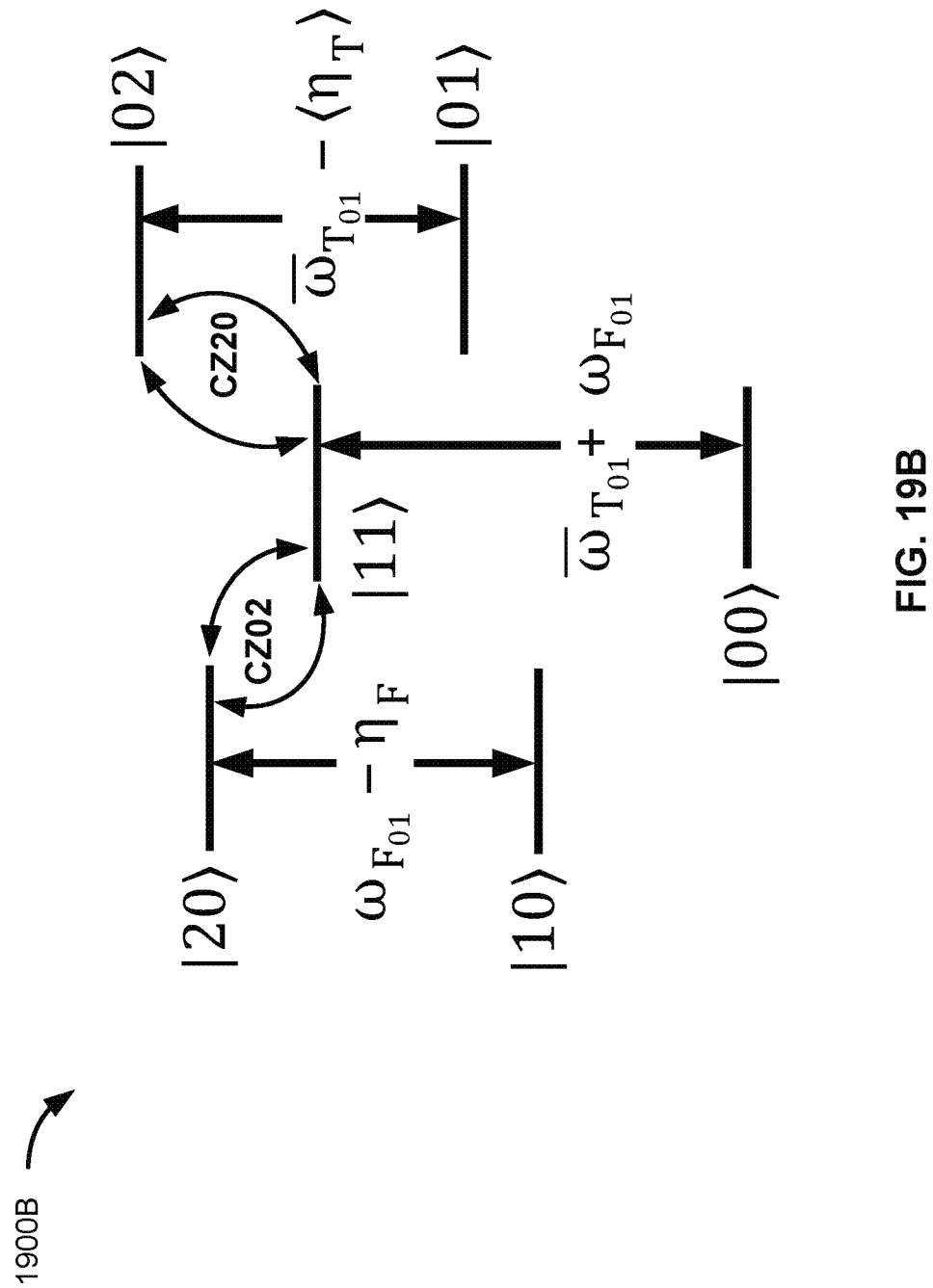
FIG. 19B is an energy level diagram showing transitions during controlled-phase (CZ) gates in an example two-qubit system.

FIG. 19A is an energy level diagram showing transitions during an iSWAP gate in an example two-qubit system. FIG. 19B is an energy level diagram showing transitions during controlled-phase (CZ) gates (CZ20 and CZ02) in an example two-qubit system.

In some cases, parametric gates may be activated by parking the tunable qubit at a flux bias that is first-order insensitive to flux noise so as to avoid degradation of the coherence time. During ideal operation, where the tunable qubit is at the parking flux, there is always, a small coupling between the tunable qubit and any fixed-frequency qubit coupled to it. This finite coupling leads to a dispersive ZZ coupling with a rate given by $$\chi_{QQ} \approx \frac{2g^2(\eta_T + \eta_F)}{(\omega_{T_{01}} - \omega_{F_{01}} + \eta_F)(\omega_{T_{01}} - \omega_{F_{01}} - \eta_T)}$$

This induces a non-trivial phase error in the two-qubit gate unitary. In particular, in high connectivity architectures, this always-on ZZ coupling from each pair of tunable- and fixed frequency qubits adds up, leading to significant error channel for two-qubit gates. In principle, one can minimize this error by increasing the detuning between the tunable qubit and fixed-frequency qubits; however, increasing the detuning has unwanted consequences: it decreases the effective coupling between qubits, thus increasing the gate time. An alternative is to decrease the static coupling g. This however also increases the gate time, making the gate susceptible to decoherence error.

Although parametric gates are operated at flux insensitive biases ($\Phi_{dc} = 0$ or $\Phi_{dc} = \Phi_0/2$), the parametric modulation itself induces an extra dephasing mechanism, thus lowering the coherence time. The dephasing rate is proportional to the gradient of the tunable frequency band, $$\Gamma_\phi \propto \left|\frac{\partial \omega_{T_{01}}}{\partial \Phi}\right|$$

Since during modulation, the qubit passes through flux sensitive flux biases (where the slope is of the frequency band is non-zero), the qubit will be susceptible to dephasing. Lowering the sensitivity is beneficial in reducing the dephasing rate. This can be done by lowering the tunability range of the tunable qubit (the difference between the maximum and minimum frequency)

$$\Delta\omega_{T_{01}} = \omega_{T_{01}}(\Phi = 0) - \omega_{T_{01}}(\Phi = \Phi_0/2)$$

This can be achieved by increasing the ratio of the two junctions, $r = E_{J1}/E_{J2} = L_{J2}/L_{J1}$ (assuming here $E_{J1} > E_{J2}$). This amounts to having two junctions with substantially different junction areas. Making the tunability range $\Delta\omega_{01,T}$ too small, will reduce the achievable effective coupling during modulation as the effective coupling approximately given by $$g_{eff} = g\left|J_1\left(\frac{\delta\omega}{\Delta}\right)\right| \text{ for iSWAP}$$

$$g_{eff} = \sqrt{2}\,g\left|J_1\left(\frac{\delta\omega}{\Delta + \eta_F}\right)\right| \text{ for CZ02}$$

$$g_{eff} = \sqrt{2}\,g\left|J_1\left(\frac{\delta\omega}{\Delta - \langle\eta_T\rangle}\right)\right| \text{ for CZ20}$$

where $J_1$ is the Bessel function of the first kind and $\delta\omega$ is the frequency shift of the tunable-frequency qubit due to the parametric modulation, which is limited by the tunability range $\Delta\omega_{T_{01}}$. If the detuning between the tunable average frequency and fixed-frequency qubit is significantly larger than $\delta\omega$, the Bessel function will be very small lowering the effective coupling $g_{eff}$ and thus increasing the gate time. The frequency shift is defined by $$\delta\omega = \omega_{T_{01}}(\Phi_{park}) - \langle\omega_{T_{01}}\rangle$$

In some implementations, conditions are considered for designing Hamiltonians for implementing parametrically activated entangling gates. For instance, one or more of the following conditions may be considered in some instances:
(1) The detuning between the gate operating frequency of a tunable qubit and any fixed operating qubit coupled to should be sufficiently large, $|\omega_{T_{01}} - \omega_{F_{01}}^{(l)}| > 1$ GHz
(2) The detuning between the average frequency of the tunable qubit and the fixed-frequency qubits should be distinct and separated by at least by the effective coupling strength for each tunable-fixed pair.

$$\Delta^{(i)} \neq \Delta^{(j)} \text{ and } \Delta^{(i)} - \Delta^{(j)} = g_{\it{eff}}^{(i)} \text{ or } g_{\it{eff}}^{(j)}$$

(3) The static coupling between the tunable and any fixed coupling coupled to it should be sufficiently small, $$\sum_l x_{QQ}^{(l)} < 100 \text{ kHz}$$

(4) The tunability of the tunable qubit frequency (the difference between the maximum and minimum frequency) is sufficiently large such that it allows maximum effective coupling between qubits, and the gradient of the frequency band (sensitivity) is not larger than 0.9 GHz per flux quantum, $$\beta \equiv \left| \frac{\partial \omega_{T_{01}}}{\partial \Phi} \right| < 2\pi * 0.9 \text{ GHz}/\Phi_0$$

This may be useful, for example, to lower the sensitivity of the tunable qubit to noise mechanisms.

Figure 20:
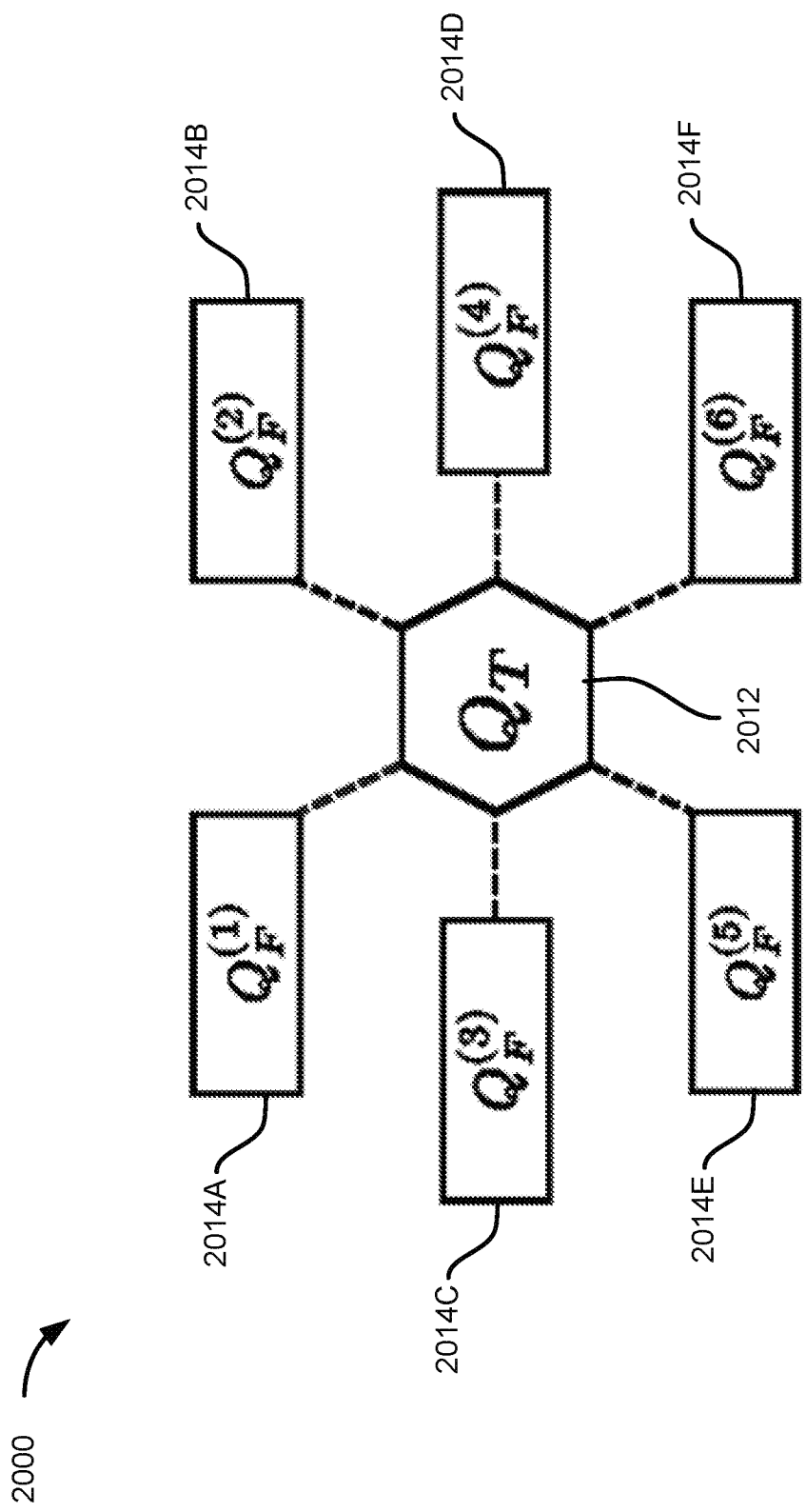
FIG. 20 is a schematic diagram of an example tunable-frequency qubit device coupled to six fixed-frequency qubit device.

FIG. 20 is a schematic diagram of an example quantum integrated circuit 2000 that includes a tunable-frequency qubit device 2012 coupled to six fixed-frequency qubit devices 2014A, 2014B, 2014C, 2014D, 2014E, 2014F. As shown, a tunable qubit device $Q_T$ is coupled to six fixed-frequency qubits $Q_F^{(l)}$ through respective static couplings $g^{(l)}$, l=1, 2, ..., 6. In each tunable-fixed pair it is possible to activate three possible entangling gates, giving rise to a total of 3*6=18 entangling gates to choose from. The tunable qubit can be a two-junction transmon, or any other frequency-tunable qubit, while the fixed-frequency qubit can be another tunable transmon, any other tunable qubit or single junction transmon.

In general, an asymmetric tunable transmon is characterized by its |0>→|1> transition frequency at zero flux $$\omega_{T_{01}}(\Phi=0) \equiv \omega_{T_{01}}^{max}$$

and half-flux quantum $$\omega_{T_{01}}\left(\Phi = \frac{\Phi_0}{2}\right) \equiv \omega_{T_{01}}^{max}$$

anharmonicity at zero flux $$\eta_T(\Phi=0) \equiv \eta_T^{max}$$

and the applied flux, i.e, $$Q_T = Q_T(\omega_{T_{01}}^{max}, \omega_{T_{01}}^{min}, \eta_T^{max}, \Phi)$$

A fixed frequency qubit can be fully described by its |0>→|1> transition frequency, anharmonicity, i.e., $Q_F = Q_F(\omega_{F_{01}}, \eta_F)$. Higher energy levels can approximately be described by a combination of these parameters.

In the following we describe the process by which the Hamiltonian parameters are chosen under the above constraints/conditions. In some cases, the Hamiltonian parameters of the circuit shown in FIG. 20 can be improved or optimized, for instance, according to the process 2100 shown in FIG. 21 or another process.

Figure 21:
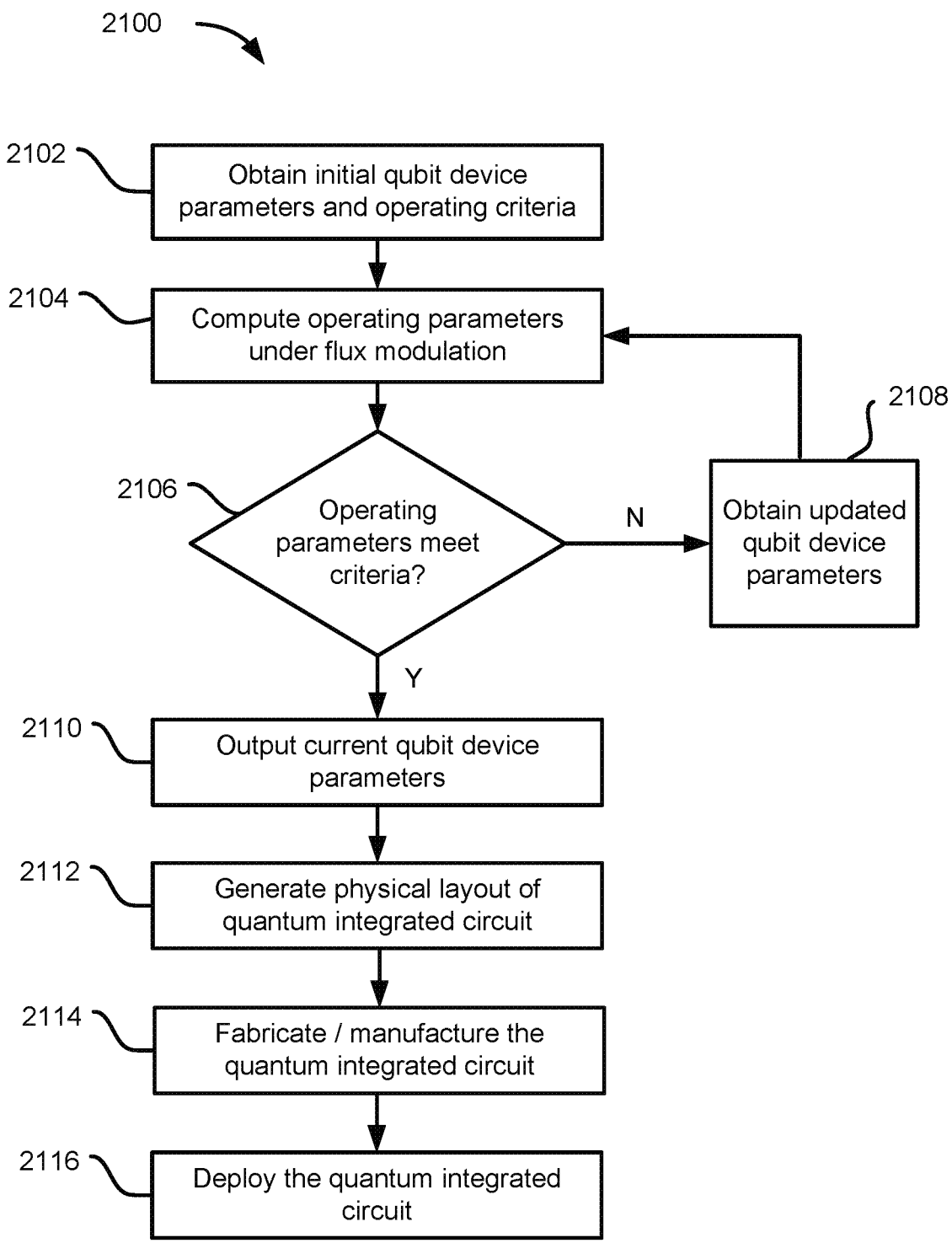
FIG. 21 is a flowchart showing an example process that can be used, for instance, in the design and manufacture of a quantum processor.

FIG. 21 is a flowchart showing an example process 2100 that can be used, for instance, in the design and manufacture of a quantum processor. The example process 2100 can be used, for example, to analyze, design, modify, optimize, calibrate, operate, or otherwise interact with quantum processor circuits and components thereof. The process 2100 may include additional or different operations, and the operations can be performed in the order shown or in another order. In some cases, one or more operations of the process 2100 can be performed by a computer system, for instance, by a digital computer system executing instructions (e.g., instructions stored on a digital memory or other computer-readable medium) on a microprocessor, or by another type of computer system.

In some implementations, the process 2100 proceeds in an iterative manner, for example, iteratively modeling quantum processor circuits and modifying and computing parameters. In some cases, individual operations or groups of operations can be repeated multiple times, for example, in order to optimize or otherwise improve Hamiltonian parameters for parametrically-activated quantum logic gates. As an example, the process 2100 is described with reference to the circuit 2000 shown in FIG. 20, but the process 2100 can be used in connection with another type of circuit.

At 2102, initial qubit device parameters and operating criteria are obtained. The initial qubit device parameters can be design parameters, for example, for a quantum processor circuit specification. The qubit device design parameters can include, for example, the qubit operating frequency and anharmonicity of one or more fixed-frequency qubit devices, a range of qubit operating frequencies and anharmonicity of a tunable qubit device, a reference magnetic flux value of a tunable qubit device, or a combination of these or others.

In some implementations, obtaining the qubit device design parameters includes specifying the qubit device design parameters such that the fixed-frequency qubit devices that are all coupled to the same tunable qubit device each have a distinct qubit frequency. For example, the qubit frequencies may be spaced apart (in frequency space) by at least some minimum frequency difference (e.g., 100 MHz or another threshold amount). In some implementations, obtaining the qubit device design parameters includes specifying the qubit device design parameters such that a specified qubit frequency of the tunable qubit device (e.g., its maximum or minimum qubit frequency, or an intermediate qubit frequency between the maximum and minimum) is distinct from the qubit frequencies of the respective fixed-frequency qubit devices. For example, the fixed-frequency device qubit frequencies may be spaced apart from the specified tunable device qubit frequency (in frequency space) by some minimum frequency difference (e.g., 300 MHz or another threshold amount).

The operating criteria obtained at 2102 can be quantum processor circuit design criteria associated with a two-qubit quantum logic gate. For instance, the operating criteria can be target values related to application of parametrically-activated quantum logic gates or other types of quantum processor circuit design criteria. In some cases, the quantum processor circuit design criteria include a minimum effective coupling strength, a maximum value for the flux sensitivity of the tunable qubit frequency (gradient of tunable qubit frequency versus magnetic flux), a maximum value for one or more dispersive shifts (e.g., a sum of dispersive shifts coupled to the tunable qubit device), etc.

Considering the example circuit 2000 shown in FIG. 20, at 2102 the process 2100 may choose 1 number of fixed-frequency qubits connected to a single tunable-frequency qubit and initialize their frequencies and anharmonicities, that is, $Q_F^{(l)}(\omega_{F_{01}}^{(l)}, \eta_F^{(l)})$. Also, choose parameters of a tunable-frequency qubit: $Q_T = Q_T(\omega_{T_{01}}^{max}, \omega_{T_{01}}^{min}, \eta_T^{max}, \varphi)$, for example, such that the initial detunings between the tunable and fixed frequency qubits are larger than some threshold value (e.g., 1 GHz). Next, set initial values for static couplings between the tunable qubit device and all fixed-frequency qubit devices, and choose the corresponding target values. For instance, choose target values for the maximum gradient of the tunable frequency band $\beta_{targ}$ and dispersive coupling $\chi_{targ}$.

In some implementations, the operating criteria account for the existence of a "sweet spot" in the flux modulation amplitude. For instance, in some cases a tunable qubit device may demonstrate improved performance over a certain range of flux modulation amplitude, and the Hamiltonian design process may account for this.

In some systems, the "sweet spot" in the flux modulation amplitude correlates with a significant increase in coherence time of a qubit defined by the tunable qubit device. For instance, the transverse coherence time ($T_2$) of a qubit tunable qubit device may be limited by several noise mechanisms associated with the electronic devices used to generate the voltage or current signal that biases the qubit and or noise mechanism intrinsic to the device itself. In general, these noise mechanisms can be broadly classified as low-frequency 1/f noise and high-frequency white noise. In some implementations, flux tunable devices are susceptible to low-frequency 1/f flux noise and high-frequency flux noise.

During the application of parametrically activated quantum logic gates, the tunable qubit is modulated by magnetic flux generated by a control signal from an AC voltage source through the flux bias line, which is generated by an additional electronic device. The AC voltage source or additional electronic devices can introduce noise mechanism to the qubit. During the activation of the gate, the tunable qubit is susceptible to high-frequency dc white flux noise (additive), low-frequency ac 1/f flux noise (additive), high-frequency ac white flux noise (multiplicative).

In some cases, when the high-frequency white noise (additive and multiplicative) are sufficiently low, there exists a flux modulation amplitude (the "sweet spot") that is insensitive to low-frequency 1/f ac flux noise; this generally occurs at the AC flux bias modulation amplitude where the gradient of the average frequency of the tunable qubit device is zero under flux modulation. For appropriate Hamiltonian design, this flux bias point may yield an optimal or otherwise improved two-qubit quantum logic gate operating point. For instance, this point (the "sweet spot") can provide the longest transverse coherence time, the shortest gate time, a more stable point to operate the gate, or a combination of some or all of these advantages that form a recipe for high-fidelity two-qubit quantum logic gates.

At 2104, operating parameters under flux modulation are computed. Based on the qubit device design parameters obtained at 2102, operating parameters of the qubit devices are computed under an operating condition of the quantum processor circuit. In this example, the operating condition includes a flux modulation applied to the tunable qubit device. For example, the flux modulation can be the type of flux modulation that is applied by a flux modulation control signal delivered to a flux bias control line associated with the tunable qubit device. In some cases, the flux modulation is specified at a modulation frequency applied to a superconducting circuit loop that defines a flux quantum $\Phi_0$ of the tunable qubit device. In some cases, the flux modulation is the type that applies a parametrically-activated quantum logic gate (e.g., a two-qubit entangling gate).

Considering the example circuit 2000 shown in FIG. 20, at 2104 the process 2100 may compute the effective coupling during modulation, $g_{eff}^{(k,l)}$ for each candidate quantum logic gate k (iSWAP, CZ02, CZ20), always-on dispersive coupling $\chi_{QQ}^{(l)}$ between the tunable qubit and any fixed qubit coupled to it. Also compute the gradient of the tunable frequency with respect to flux, $|d\omega_{T_{01}}/d(\phi/\phi_0)|$ for a range of one-flux quantum.

At 2106, it is determined whether operating parameters (computed at 2104) meet the operating criteria (obtained at 2102). In some instances or iterations, it is determined that one or more operating parameters meet the quantum processor circuit design criterion associated with a two-qubit quantum logic gate. In some instances or iterations, it is determined that one or more operating parameters does not meet the quantum processor circuit design criterion associated with a two-qubit quantum logic gate. In some cases, the operating parameters are evaluated against a single operating criteria at 2106, or the operating parameters are evaluated against multiple independent operating criteria.

In some implementations, the operating parameters computed at 2104 include an effective coupling strength between a fixed-frequency qubit device and the tunable qubit device under the flux modulation; and determining whether the operating parameter meets the criteria at 2106 includes determining that the computed effective coupling strength is greater than a minimum effective coupling strength.

In some implementations, the operating parameters computed at 2104 includes a sensitivity of the qubit frequency of the tunable qubit device (under the flux modulation) to changes in the flux modulation amplitude; and determining whether the operating parameter meets the criteria at 2106 includes determining that the sensitivity is less than a maximum sensitivity value. For example, the sensitivity may be computed as a maximum gradient of tunable qubit frequency versus flux modulation amplitude.

In some implementations, the operating parameters computed at 2104 include dispersive shifts; and determining whether the operating parameter meets the criteria at 2106 includes determining that one or more dispersive shifts (e.g., a sum of multiple dispersive shifts) are less than some maximum value.

If it is determined at 2106 that the operating parameters do meet the operating criteria, the process 2100 proceeds to 2110. If it is determined at 2106 that the operating parameters do not meet the operating criteria, the process 2100 proceeds to 2108 to obtain updated qubit device parameters, and then the process 2100 returns to 2104 for another iteration. The operations 2104, 2106, 2108 may be iterated for several iterations, for example, until the process 2100 proceeds to 2110 or until another terminating condition is reached.

Considering the example circuit 2000 shown in FIG. 20, at 2106 the process 2100 may check that the maximum effective coupling during modulation is larger than the target $g_{targ}^{(l)}$ set at 2102 and the maximum of the sensitivity (max $|d\omega_{T_{01}}/d(\phi/\phi_0)|$) is less than the target value (for example, 0.9 GHz/per one flux quantum), that is, max $|d\omega_{T_{01}}/d(\phi/\phi_0)| < \beta^{targ}$. If the condition is not met, at 2108 the process 2100 may change the tunability range $\Delta\omega_{01}$ by small amount $\delta T$ and change the fixed-frequency qubit by small amount $\delta F$ and repeat 2104, 2106.

Considering the example circuit 2000 shown in FIG. 20, at 2106 the process 2100 may further check the condition that the sum of all dispersive coupling to a tunable qubit due to coupling to 1 fixed-frequency qubits is less than the target value (for example 100 kHz), $$\sum_l X_{QQ}^{(l)} < X_{targ}$$

If the condition is not met, at 2108 the process 2100 may change the static coupling $g^{(l)} \to g^{(l)} + \delta g^{(l)}$ and repeat 2104, 2106.

In some cases, operations 2104, 2106, 2108 (and possibly other operations) are executed as an iterative process, wherein each iteration includes obtaining a current set of qubit device design parameters for the qubit devices (at 2108); determining, based on the current set of qubit device design parameters, current operating parameters for the qubit devices under the flux modulation operating condition (at 2104); and evaluating (at 2106) whether the current operating parameter meets the quantum processor circuit design criterion associated with the two-qubit quantum logic gate. If the current operating parameter does not meet the quantum processor circuit design criterion, an updated set of qubit device design parameters for the next iteration is then computed (at 2108); and if the current operating parameter does meet all mandatory quantum processor circuit design criteria the iterative process can terminate (e.g., and the process 2100 can then proceed to 2110). Each iteration of the iterative process may include additional operations and parameter evaluations, for example, computing detunings between a qubit frequency of the tunable qubit device and respective qubit frequencies of the fixed-frequency qubit devices; and evaluating whether the detunings are distinct from one another. Each iteration of the iterative process may include additional operations and parameter evaluations, for example, computing the difference between the detunings for distinct first and second fixed-frequency qubit devices; obtaining a first target (e.g., minimum) effective coupling strength for an interaction between the first fixed-frequency qubit device and the tunable qubit device; obtaining a second target (e.g., minimum) effective coupling strength for an interaction between the second fixed-frequency qubit device and the tunable qubit device; and evaluating whether the difference between the detunings is greater than the first and second target effective coupling strengths.

At 2110, the current qubit device parameters are provided as output. In other words, the output provided at 2110 may include one, some or all of the qubit device parameters that were used at 2104 to compute the operating parameters that were determined (at 2106) to meet the operating criteria. The output may include additional or different information. In some cases, qubit device design parameters that meet the quantum processor design criterion associated with a two-qubit quantum logic gate are provided as output, for example, for a quantum processor circuit specification.

At 2112, a physical layout of a quantum integrated circuit is generated. The physical layout may include qubit devices having the qubit device parameters that were provided as output at 2110. In some cases, the physical layout is generated, for instance, using a layout editor, HFSS ANSYS, or another type of software system.

At 2114, the quantum integrated circuit can be fabricated or manufactured. At 2116, the quantum integrated circuit can be deployed, for instance, in a quantum computer system.

Figure 22:
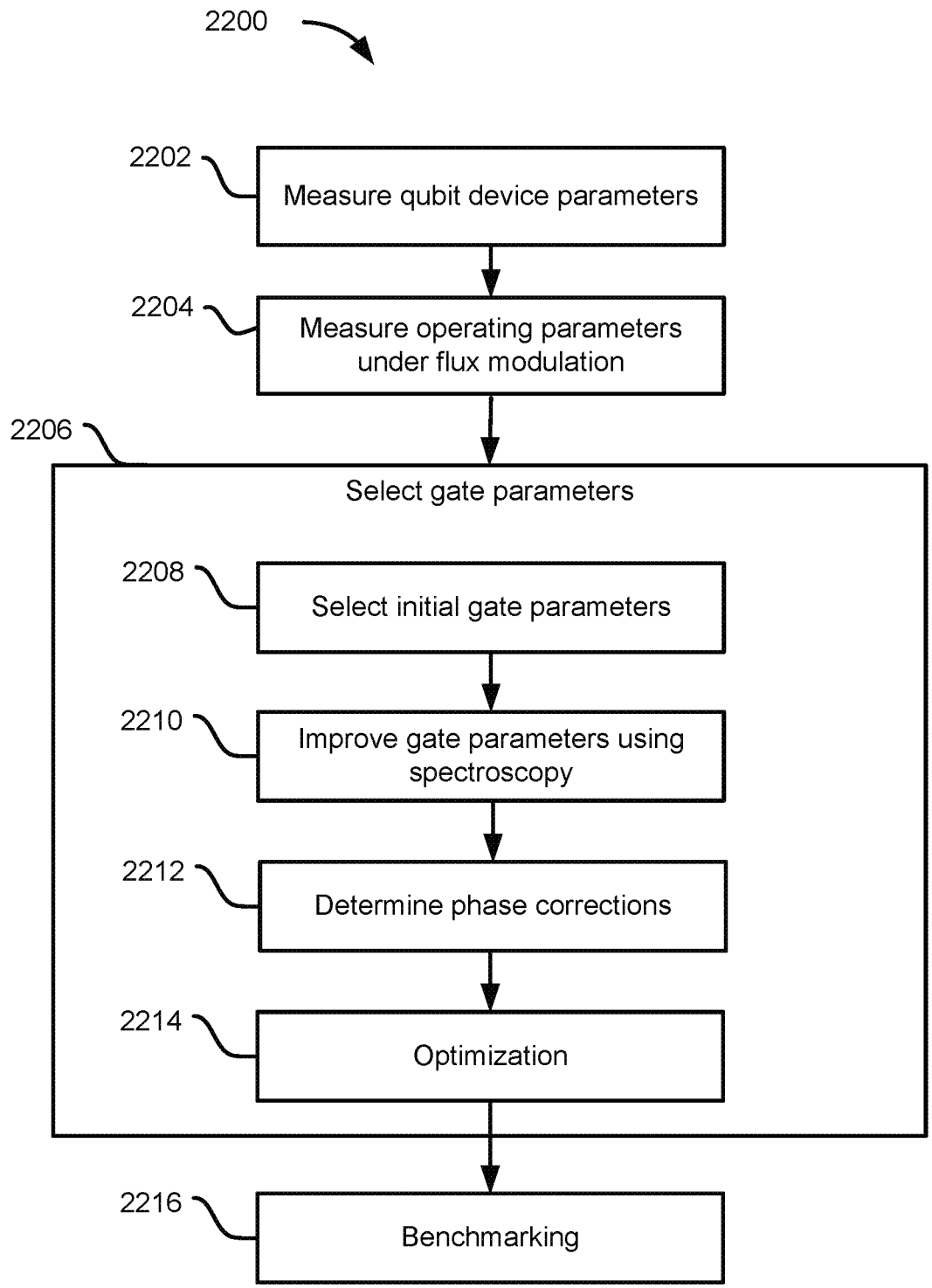
FIG. 22 is a flowchart showing an example process for determining gate parameters for a parametrically-activated quantum logic gate.

FIG. 22 is a flowchart showing an example process 2200 for determining gate parameters for a parametrically-activated quantum logic gate. The example process 2200 can be used, for example, to design, calibrate, improve, optimize, or otherwise manage parametrically activated quantum logic gates for a physical quantum processor circuit. The process 2200 may include additional or different operations, and the operations can be performed in the order shown or in another order.

The quantum processor circuit can be a superconducting circuit that includes many circuit devices. The circuit devices may include, for example, qubit devices, readout devices, flux bias devices, control lines, connections (e.g., capacitive connections or otherwise) between pairs of devices, and other types of circuit devices. In some examples, the quantum processor circuit includes tunable-frequency qubit devices and fixed-frequency qubit devices, as well as readout devices and other types of circuit elements. For instance, the process 2200 shown in FIG. 22 may be used to manage parametrically activated quantum logic gates for a quantum processor circuit of the type represented by the equivalent circuits 1200A, 1200B shown in FIGS. 12A, 12B, by the circuit 2000 shown in FIG. 20, or another type of quantum processor circuit.

In some implementations, one or more operations in the example process 2200 can be performed by a computer system, for instance, by a digital computer system having one or more digital processors (e.g., a microprocessor or other data processing apparatus) that execute instructions (e.g., instructions stored in a digital memory or other computer-readable medium) to perform the process 2200, or by another type of digital, quantum or hybrid computer system. As an example, in some cases the quantum processor circuit can be deployed as the quantum processor 102 shown in FIG. 1, and operations in the process 2200 shown in FIG. 22 can be controlled, executed or initiated by one or more components of the control system 110 shown in FIG. 1.

At 2202, qubit device parameters are measured. The qubit device parameters represent qubit devices in a physical quantum processor circuit. In some cases, one or more of the qubit device parameters represent qubit devices in a quantum processor circuit specification. In some cases, the qubit device parameters can be measured as described with respect to operation 2302 in FIG. 23, operation 2802 in FIG. 28, or in another manner.

At 2204, operating parameters of the quantum processor circuit are measured under flux modulation. In some cases, the operating parameters can be measured under modulation as described with respect to operation 2304A, 2304B in FIG. 23, operations 2804A, 2804B in FIG. 28, or in another manner.

At 2206, gate parameters are selected. The gate parameters selected at 2206 represent a parametrically activated quantum logic gate, for instance, an entangling two-qubit quantum logic gate to be applied to qubits defined in the quantum processor circuit. Selecting gate parameters at 2206 can include the example sub-process shown in FIG. 22, or the gate parameters may be selected in another manner.

In some cases, operation 2206 considers multiple different types of quantum logic gates, or the operation 2206 may consider a single type of quantum logic gate. For instance, operation 2206 may determine gate parameters for one or more quantum logic gates in the family of iSWAP gates, in the family of controlled-Z gates (e.g., CZ02 or CZ20), or in the family of Bell-Rabi gates. In some implementations, multiple types of gates are considered, and an optimal quantum logic gate is selected, or multiple acceptable quantum logic gates are selected.

In some cases, operation 2206 can be executed as a gate calibration process, e.g., performed by a control system in a quantum computing system. For instance, the gate calibration process may select parameters of control signals that are delivered to the tunable qubit device to activate two-qubit quantum logic gates. The gate calibration process may determine gate parameters for parametrically activated quantum logic gates, for example, control parameters that correspond to a flux modulation amplitude; a flux modulation frequency; a flux modulation time (a duration); and possibly other parameters.

In some implementations, a gate calibration process for parametrically activated quantum logic gates can include obtaining (e.g., from memory, by measurement, or otherwise) operating parameters for a tunable qubit device and one or more fixed-frequency qubit devices that are coupled (e.g., capacitively coupled through a control line in the quantum processor circuit) to the tunable qubit device. The operating parameters obtained by the gate calibration process can include qubit device parameters (e.g., qubit frequencies and anharmonicities) and quantum processor circuit parameters, and one or more of the operating parameters can be determined based on measurements of the quantum processor circuit under a flux modulation applied to the tunable qubit device. The operating parameters may include an effective coupling strength between qubit devices during the flux modulation, a transition frequency shift (or average transition frequency) of the tunable qubit device under the flux modulation, a sensitivity of the transition frequency of the tunable qubit device to changes in the flux modulation amplitude, or a combination of these and others. And each of the operating parameters may be obtained for multiple values of flux modulation amplitude, for example, over a range of modulation amplitude of the flux modulation.

The gate calibration process may then determine gate parameters of a two-qubit quantum logic gate for application to pairs of qubits defined by the qubit devices (e.g., the pairs of qubits defined by the tunable qubit device and respective neighboring fixed-frequency qubit devices). In some cases, the gate calibration process selects initial gate parameters (e.g., at 2208), and then generates refined gate parameters (e.g., at 2210 or 2214 or otherwise) from the initial gate parameters. The refined gate parameters can be generated based on spectroscopic measurements of the two-qubit quantum logic gate applied to the quantum processor circuit, based on iterating the calibration process (e.g., with filtering in place), based on fine-tuning criteria, or a combination of these and other types of processes. In some cases, the gate calibration process includes selecting a filter for a flux modulation control line based on a flux modulation frequency.

At 2208, initial gate parameters are selected. In some cases, one or more of the initial gate parameters can be selected as described with respect to operation 2308 in FIG. 23, operation 2808 in FIG. 28, or in another manner.

At 2210, the gate parameters are improved using spectroscopy. In some cases, spectroscopy can be performed as described with respect to operation 2310 in FIG. 23, operation 2810 in FIG. 28, or in another manner.

At 2212, phase corrections are determined. In some cases, phase corrections can be determined as described with respect to operation 2312 in FIG. 23, operation 2812 in FIG. 28, or in another manner.

At 2214, gate parameters may be optimized. In some cases, one or more of the gate parameters can be optimized as described with respect to operation 2814 in FIG. 28, or in another manner.

At 2216, benchmarking is performed. For example, a benchmarking process can be used to determine properties (e.g., fidelity, etc.) of the quantum logic gate characterized by the gate parameters. In some cases, benchmarking may be performed as described with respect to operation 2308 in FIG. 23, operation 2816 in FIG. 28, or in another manner.

Figure 23:
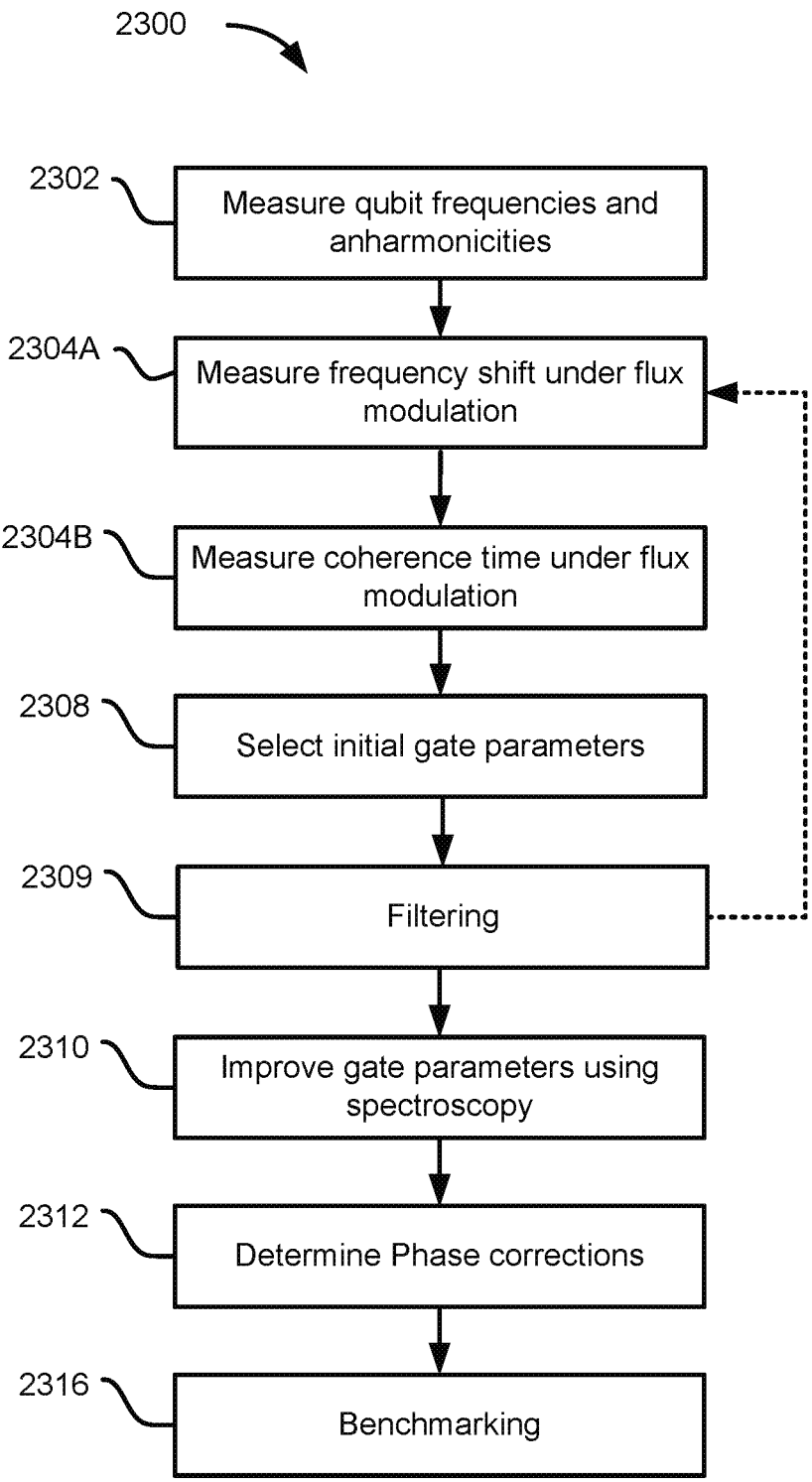
FIG. 23 is a flowchart showing another example process for determining gate parameters for a parametrically-activated quantum logic gate.

FIG. 23 is a flowchart showing an example process 2300 for determining gate parameters for a parametrically-activated quantum logic gate. The example process 2300 can be used, for example, to design, calibrate, improve, optimize, or otherwise manage parametrically activated quantum logic gates for a physical quantum processor circuit. For instance, the process 2300 may determine gate parameters for one or more quantum logic gates in the family of iSWAP gates, in the family of controlled-Z gates (e.g., CZ02 or CZ20), or in the family of Bell-Rabi gates. The process 2300 may include additional or different operations, and the operations can be performed in the order shown or in another order.

The quantum processor circuit can be a superconducting circuit that includes many circuit devices. The circuit devices may include, for example, qubit devices, readout devices, flux bias devices, control lines, connections (e.g., capacitive connections or otherwise) between pairs of devices, and other types of circuit devices. In some examples, the quantum processor circuit includes tunable-frequency qubit devices and fixed-frequency qubit devices, as well as readout devices and other types of circuit elements. For instance, the process 2300 shown in FIG. 23 may be used to manage parametrically activated quantum logic gates for a quantum processor circuit of the type represented by the equivalent circuits 1200A, 1200B shown in FIGS. 12A, 12B, by the circuit 2000 shown in FIG. 20, or another type of quantum processor circuit.

In some implementations, one or more operations in the example process 2300 can be performed by a computer system, for instance, by a digital computer system having one or more digital processors (e.g., a microprocessor or other data processing apparatus) that execute instructions (e.g., instructions stored in a digital memory or other computer-readable medium) to perform the process 2300, or by another type of digital, quantum or hybrid computer system. As an example, in some cases the quantum processor circuit can be deployed as the quantum processor 102 shown in FIG. 1, and operations in the process 2300 shown in FIG. 23 can be controlled, executed or initiated by one or more components of the control system 110 shown in FIG. 1.

The initial set of operations (2302, 2304A, 2304B) in the process 2300 can be used to characterize qubit devices in the quantum processor circuit.

At 2302, qubit frequencies and anharmonicities are measured. For example, a calibration process can be executed in a quantum computing system to obtain qubit device parameters for each of the physical qubit devices in the quantum processor circuit. The qubit device parameters may include, for example, the qubit operating frequency and anharmonicity of one or more fixed-frequency qubit devices, a range of qubit operating frequencies and anharmonicity of one or more tunable qubit devices, a reference magnetic flux value of one or more tunable qubit devices, or a combination of these or others.

In some examples, the qubit frequencies are measured by using qubit spectroscopy to measure the transition frequency from the ground state (qubit level $|0\rangle$) to the first excited state (qubit level $|1\rangle$) of each qubit device. Ramsey interferometry can then be used to fine tune the values of the qubit frequency obtained from the spectroscopic measurements. For tunable qubit devices, the qubit frequency can be measured at one or more reference values of applied magnetic flux. For example, the qubit frequency of each tunable qubit device can be measured at zero flux and one-half flux quantum; the tunable qubit devices may be measured under other flux conditions.

In some examples, after the qubit frequencies of each fixed-frequency qubit device and each tunable qubit device have been obtained, qubit spectroscopy can be used to measure the transition frequency from the ground state (qubit level $|0\rangle$) to the first second state (energy level 2$\rangle$) of each qubit device, which can be used to calculate the anharmonicity of each qubit device. For instance, the anharmonicity of a qubit device may be computed as $=2\omega_{01}-\omega_{02}$, where $\omega_{01}$ represents the transition frequency from the ground state to the first excited state of the qubit device, and $\omega_{02}$ represents the transition frequency from the ground state to the second excited state of the qubit device.

At 2304A, the frequency shift of a tunable qubit device is measured under flux modulation applied to the tunable qubit device. Driving the magnetic flux applied to the tunable qubit device with a flux modulation pulse will shift the average qubit frequency of the tunable qubit device away from the "parking" frequency with a frequency shift (e.g., $\delta\omega$). The magnitude of the frequency shift is a function of the voltage amplitude V of the flux modulation pulse. The frequency shift measurements may correspond to a range of modulation amplitudes of the flux modulation. For example, the frequency shift $\delta\omega$ (or equivalently, the average transition frequency $\overline{\omega}_{T_{01}}$) may be a function of the voltage amplitude V of the flux modulation pulse, and the frequency shift $\delta\omega$ (or equivalently, the average transition frequency $\overline{\omega}_{T_{01}}$) may be measured for multiple distinct values of the voltage amplitude T, which correspond to multiple distinct values over a range of flux modulation amplitude.

Figure 24A:
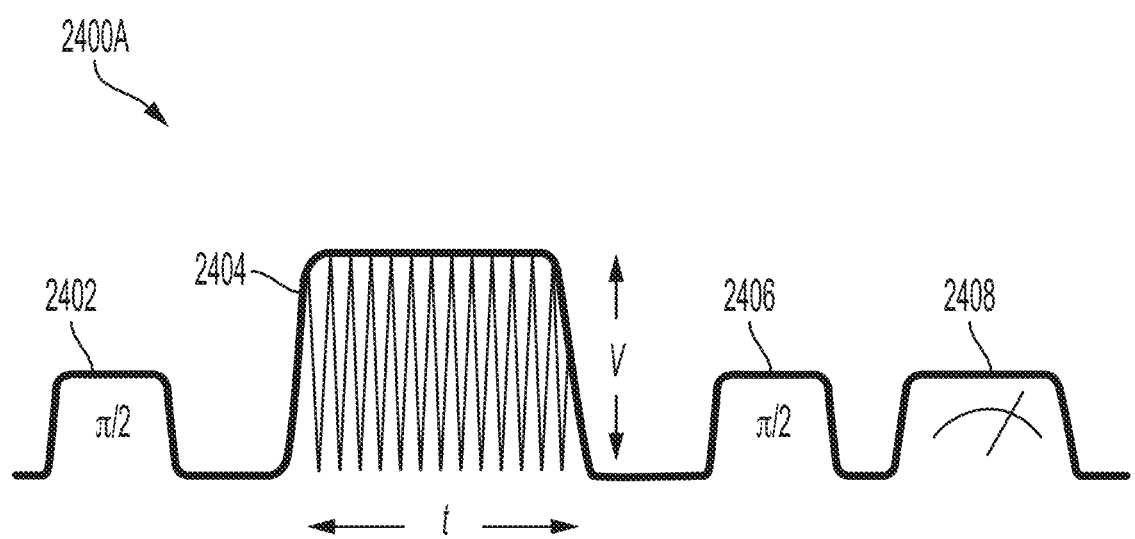
FIG. 24A is a diagram of an example pulse sequence for determining operating parameters of a qubit device under flux bias modulation.

In some examples, the frequency shift (e.g., $\delta\omega$) can be measured by performing a Ramsey interferometry measurement, with a voltage amplitude V applied during the wait time t, for instance, according to the example pulse sequence 2400A shown in FIG. 24A. The Ramsey interferometry measurement can be repeated for a range of voltage amplitudes V of the flux modulation pulse to obtain the frequency shift (e.g., $\delta\omega$). The frequency shift data may be of the type shown in the plot 2400B shown in FIG. 24B.

At 2304B, the coherence time of a qubit defined by the tunable qubit device is measured under flux modulation applied to the tunable qubit device. The coherence time (e.g., the transverse coherence time $T_2$) of the qubit defined by the tunable qubit device is generally altered when the tunable qubit device is driven with a flux modulation pulse. The coherence time measurements may correspond to a range of modulation amplitudes of the flux modulation. For example, the coherence time $T_2$ may be a function of the voltage amplitude V of the flux modulation pulse, and the coherence time $T_2$ may be measured for multiple distinct values of the voltage amplitude V, which correspond to multiple distinct values over a range of flux modulation amplitude.

In some examples, the coherence time $T_2$ of a tunable qubit device can be measured by performing a Ramsey interferometry measurement, with a voltage amplitude V applied during the wait time t, for instance, according to the example pulse sequence 2400A shown in FIG. 24A. The Ramsey interferometry measurement can be repeated for a range of voltage amplitudes V of the flux modulation pulse to obtain the coherence time. The coherence time data may be of the type shown in the plot 2500 shown in FIG. 25.

The next set of operations (2308, 2309, 2310, 2312) in the process 2300 can be used to select and fine tune gate parameters for parametrically activated quantum logic gates.

At 2308, initial gate parameters are selected. The gate parameters may include one or more parameters that define a flux modulation pulse of a parametrically activated quantum logic gate (e.g., a two-qubit entangling gate) for a pair of qubits defined by a tunable qubit device and a fixed-frequency qubit device in the quantum processor circuit. In some cases, the gate parameters that define the parametrically activated quantum logic gate include values for a voltage amplitude V of the flux modulation pulse, a modulation frequency $f_m$ ($=\omega_{fl}/2\pi$) of the flux modulation pulse, and a duration $\tau$ of the flux modulation pulse. The gate parameters may include additional or different types of parameters.

In some implementations, selecting the initial gate parameters at 2308 includes identifying a modulation amplitude control value (e.g., a value of the voltage amplitude V of the flux modulation pulse) associated with the maximum coherence time of the qubit (e.g., $V_{T_2,max}$ described below). In some cases, the modulation amplitude control value corresponds to a flux modulation amplitude between $0.45\Phi_0$ and $0.65\Phi_0$, where the tunable qubit device includes a superconducting circuit loop that defines the flux quantum $\Phi_0$. In some cases, the identified modulation amplitude control value is selected as one of the initial gate parameters. In some cases, another value near the identified modulation amplitude control value is selected as one of the initial gate parameters. For example, the identified modulation amplitude control value may be a first modulation amplitude control value that corresponds to a first flux modulation amplitude; and the initial gate parameters may include a second modulation amplitude control value that corresponds to a second flux modulation amplitude. In some cases, the magnitude of difference between the first flux modulation amplitude and the second flux modulation amplitude is less than $0.10\Phi_0$ or less than $0.05\Phi_0$.

In some cases, the initial gate parameters may be selected as follows. From the coherence time measurements obtained at 2304B (e.g., as represented in the plot 2500 in FIG. 25 or otherwise), a voltage amplitude $V_{\tau_2,max}$ where the coherence time is largest is selected. (This value $V_{\tau_2,max}$ may correspond to a "sweet spot," in some cases.) The type of quantum logic gate to be activated is also selected. For instance, the CZ02 Controlled-Z gate, the CZ20 Controlled-Z gate, the iSWAP gate, or another two-qubit entangling gate may be selected. The effective coupling strength between the qubits can then be determined, for example, by performing a two-qubit Rabi oscillation measurement. The Rabi oscillation measurement may proceed, for example, by starting with appropriate initial state and measuring the Rabi frequency, and the measured Rabi frequency may correspond to the effective coupling. The measurement can be repeated over a range of flux bias amplitude, for instance, to generate an effective coupling versus flux amplitude curve. In some cases, the flux pulse amplitude that gives maximum effective coupling may be identified. Given the voltage amplitude $V_{\tau_2,max}$, the corresponding average frequency shift of the qubit $\delta\omega(V_{\tau_2,max})$ can be determined, for example, from the data obtained at 2304A. Given the average frequency shift $\delta\omega(V_{\tau_2,max})$ and the qubit device parameters (e.g., measured at 2302), the modulation frequency $f_m$ of the flux modulation pulse, and the duration $\tau$ of the flux modulation pulse can be computed, for example, using appropriate energy conservation formulas. For example, the gate time may be calculated based on the equations above (e.g., for $t_{iSWAP}^{(1)}$, $t_{\overline{iSWAP}}^{(1)}$, $t_{iSWAP}^{(n)}$, $t_{\overline{iSWAP}}^{(n)}$, $t_{CZ_{20}}^{(n)}$, $t_{CZ02}^{(n)}$, $t_{BR}^{(n)}$, etc.) or similar equations;

and the modulation frequency $f_m$ can be calculated based on the equations above (e.g., for $\omega_m$, etc.) or similar equations.

At 2309, filtering is applied. For example, given the modulation frequency $f_m$, the signal chain can be filtered with a low-pass filter with a cutoff frequency between $f_m$ and $2f_m$. In some cases, this filter is as close as possible to $f_m$. (Or equivalently, given the modulation frequency $f_m$, the signal chain can be filtered with a low-pass filter with a cutoff frequency between $f_m$ and $2f_m$. In some cases, this filter is as close as possible to $f_m$). The filter can improve operation of the parametrically-activated quantum logic gate, for example, by increasing the dephasing time under modulation around the "sweet spot" by filtering out white flux noise. In some cases, one or more filter devices or other components can be installed in the control system or signal delivery system of the quantum computing system, to remove at least one range of unwanted frequencies between the control system and the tunable qubit device. As shown in FIG. 23, after the filter has been applied, the process may return to 2304A in some instance and repeat one or more of the earlier operations (e.g., 2304A, 2304B, 2308) with the filter in place.

At 2310, the gate parameters are improved using spectroscopy. For example, spectroscopic measurements of the quantum processor circuit can be used to adjust the gate parameters in a way that improves performance of the parametrically activated quantum logic gate. For instance, the modulation frequency $f_m$ of the flux modulation pulse, and the duration $\tau$ of the flux modulation pulse can be adjusted based on spectroscopic measurements at the voltage amplitude $V_{\tau_2,max}$ where the coherence time is largest.

In some implementations, the initial gate parameters selected at 2308 include a modulation amplitude control value that corresponds to a maximum coherence time of the tunable qubit under flux modulation, and at 2310, spectroscopy can be used to refine the modulation amplitude control value selected at 2308. For instance, a first modulation amplitude control value that corresponds to a first flux modulation amplitude may be selected at 2308; and a second modulation amplitude control value that corresponds to a second flux modulation amplitude may be identified at 2310.

In some cases, the spectroscopic measurements measure characteristic coherent oscillations that are produced as the modulation frequency and gate time of the flux pulse applied to the tunable qubit device are scanned through resonance. As an example, the spectroscopic measurements may produce data of the type shown in the plot 2600 shown in FIG. 26. Such data can be fit to a model of the interaction to determine adjusted values for the modulation frequency $f_m$ and the duration $\tau$ of the flux modulation pulse for the quantum logic gate.

At 2312, phase corrections are determined. In some examples, having determined the flux modulation pulse parameters (e.g., shape, duration, frequency, and amplitude), additional gate parameters for the parametrically activated quantum logic gate of interest may include single qubit phase corrections for the qubits. The phase corrections may include a first phase correction $\theta_T$ for the qubit defined by the tunable qubit device, and second phase correction $\theta_F$ for the qubit defined by the fixed-frequency qubit device.

Figure 27A:
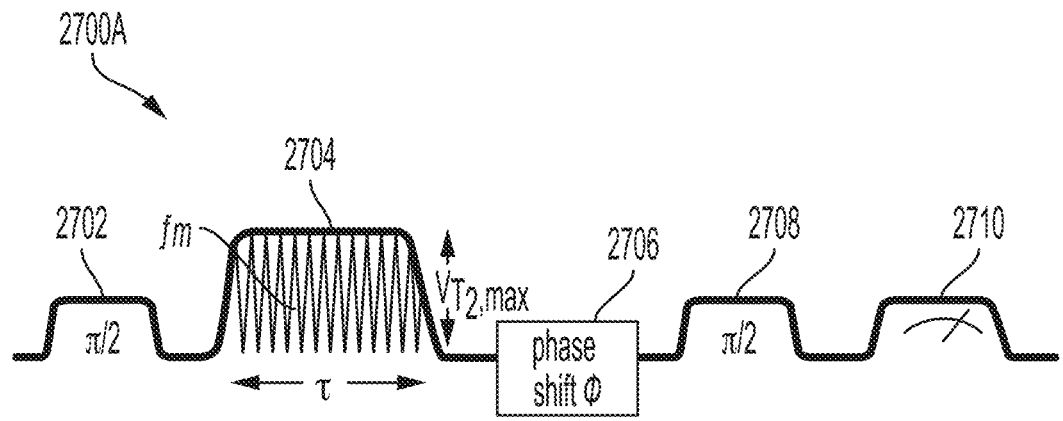
FIG. 27A is a diagram of an example pulse sequence for determining a phase shift under flux bias modulation.
Figure 27B:
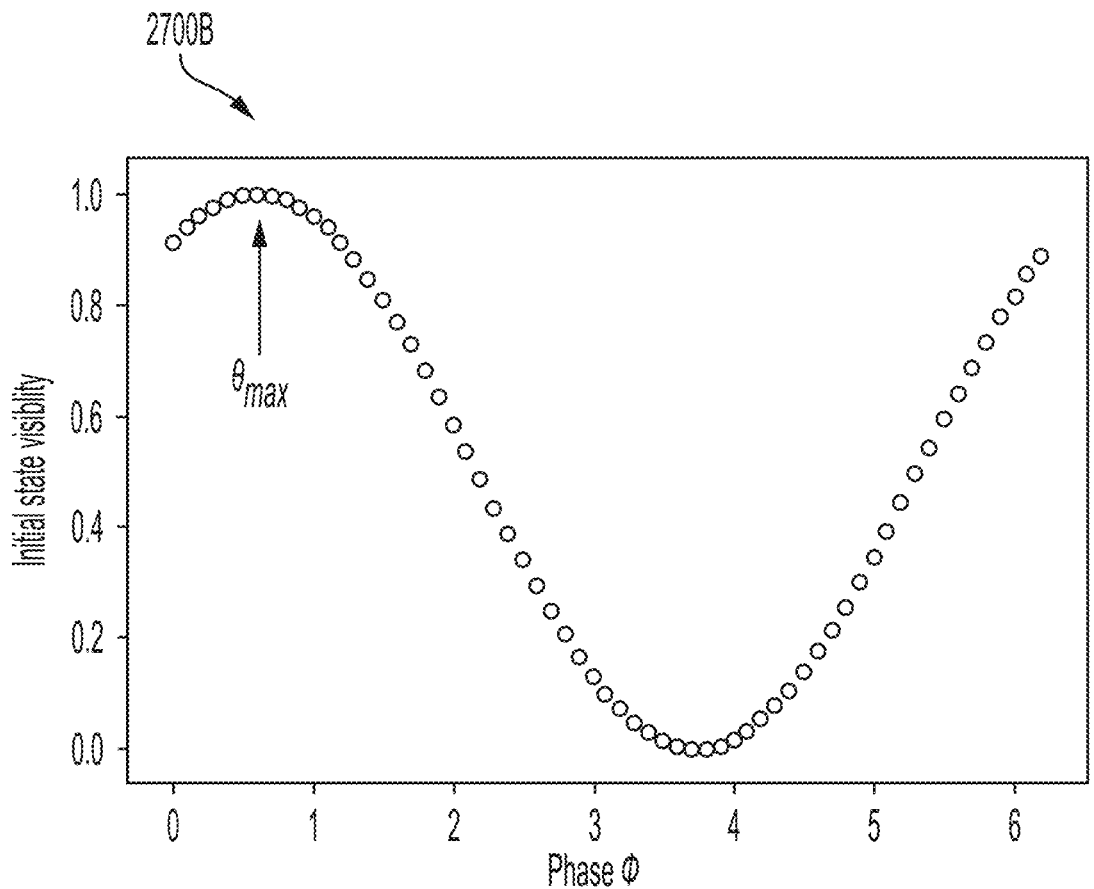
FIG. 27B is a plot showing example data from the pulse sequence 2700A shown in FIG. 27A.

In some examples, the phase corrections can be determined by a modified Ramsey measurement, for instance, using the example pulse sequence 2700A shown in FIG. 27 or another type of pulse sequence. In the Ramsey measurement, the wait time between the two $\pi/2$ pulses is given by the flux modulation pulse duration $\tau$, and during this wait time a flux modulation pulse having the voltage amplitude $V_{\tau_2,max}$, modulation frequency $f_m$ and duration $\tau$ is applied to the tunable qubit device. The visibility of the initial state is measured as a function of the phase $\phi$ applied to the second $\pi/2$ pulse. The phase correction (e.g., the first phase correction $\theta_T$ for the qubit defined by the tunable qubit device, or the second phase correction $\theta_F$ for the qubit defined by the fixed-frequency qubit device) can be identified as the phase at which the initial state is maximized (e.g., as indicated in the plot 2700B in FIG. 27B). With no flux modulation pulse applied, this phase correction would typically be zero, but with a flux modulation pulse it will generally be non-zero (e.g., as in the example shown in FIG. 27B).

At 2316, benchmarking is performed. Standard benchmarking techniques may be used in some cases. Benchmarking may include, for example, two-qubit Clifford sequence randomized benchmarking, gate set tomography, quantum process tomography, or other types of standard benchmarking techniques. The benchmarking process can be used to characterize performance of the parametrically activated quantum logic gate.

The gate parameters now include a voltage amplitude V of the flux modulation pulse, a modulation frequency $f_m$, of the flux modulation pulse, and a duration $\tau$ of the flux modulation pulse, as well as the first phase correction $\theta_T$ for the qubit defined by the tunable qubit device, or the second phase correction $\theta_F$ for the qubit defined by the fixed-frequency qubit device, a total gate time, and gate performance metrics (e.g., quantum process fidelity, randomized benchmarking error rates, etc.).

FIG. 24A is a diagram of an example pulse sequence 2400A for determining operating parameters of a qubit device under flux bias modulation. The example pulse sequence 2400A can be applied to a tunable qubit device in a quantum processor circuit. Data obtained from the pulse sequence 2400A can be used, for example, to measure the frequency shift of a tunable qubit device under flux modulation.

The example pulse sequence 2400A shown in FIG. 24A applies a first $\pi/2$ pulse 2402 to the tunable qubit device; the $\pi/2$ pulse 2402 is calibrated to rotate a qubit by $\pi/2$ radians (e.g., a rotation on the Bloch sphere about the x- or y-axis). Typically, the qubit device begins in the ground state, and the first $\pi/2$ pulse 2402 prepares the qubit device in a superposition state. The pulse sequence 2400A then applies a flux modulation pulse 2404 to the tunable qubit device; the flux modulation pulse 2404 has a modulation frequency and an amplitude V and is applied for a duration $\tau$. The flux modulation pulse 2404 can be applied, for example, by delivering a pulse on a flux bias line coupled to the tunable qubit device. The pulse sequence 2400A then applies a second $\pi/2$ pulse 2406 to the tunable qubit device; the $\pi/2$ pulse 2406 is calibrated to rotate the qubit by $\pi/2$ radian (e.g., a rotation on the Bloch sphere about the x- or y-axis). The pulse sequence 2400A then performs a measurement 2408 of the qubit device. The measurement 2408 can be a projective measurement that returns one of two computational basis states of the qubit. For example, the measurement 2408 may indicate the qubit device in a ground state (e.g., computational state $|0\rangle$) or a first excited state (e.g., computational state $|1\rangle$) or another quantum state. In some cases, the pulse sequence 2400A can be calibrated and executed (e.g., in an iterative manner) to determine a frequency shift of the tunable qubit under the flux modulation pulse 2404.

Figure 24B:
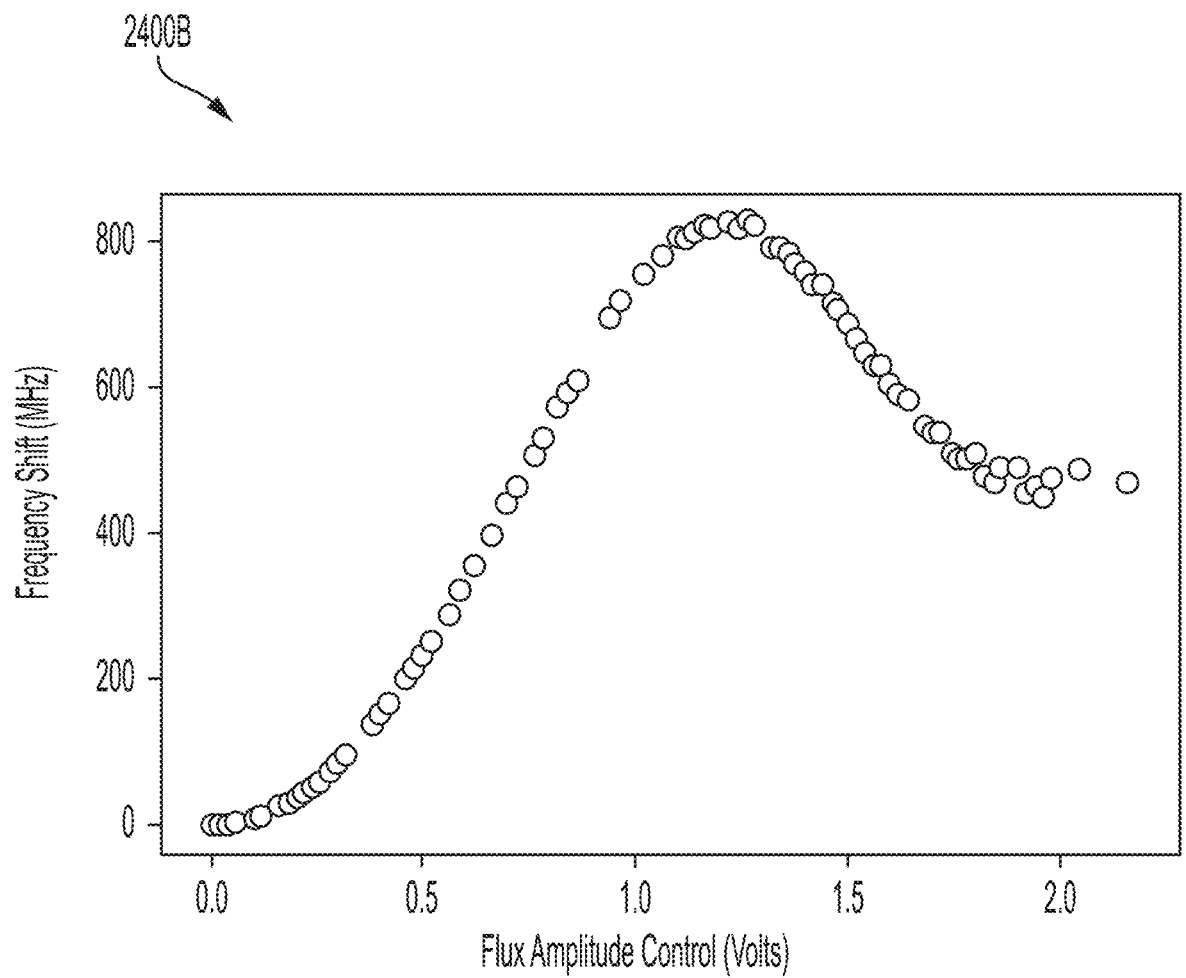
FIG. 24B is a plot showing example data from the pulse sequence 2400A shown in FIG. 24A.

FIG. 24B is a plot 2400B showing example data from the pulse sequence 2400A shown in FIG. 24A. The plot 2400B includes a horizontal axis representing the voltage amplitude V of the flux modulation pulse 2404, and a vertical axis representing the frequency shift (in units of MegaHertz) as indicated by the measurements 2408. The plot 2400B includes data points for a series of values for the voltage amplitude V of the flux modulation pulse 2404. The data show that the frequency shift generally increases as the voltage amplitude V increases from 0.0 Volts to approximately 1.2 Volts, then reaches an inflection point where the gradient approaches zero, and then generally decreases as the voltage amplitude V increases from approximately 1.2 Volts to 2.0 Volts.

Figure 25:
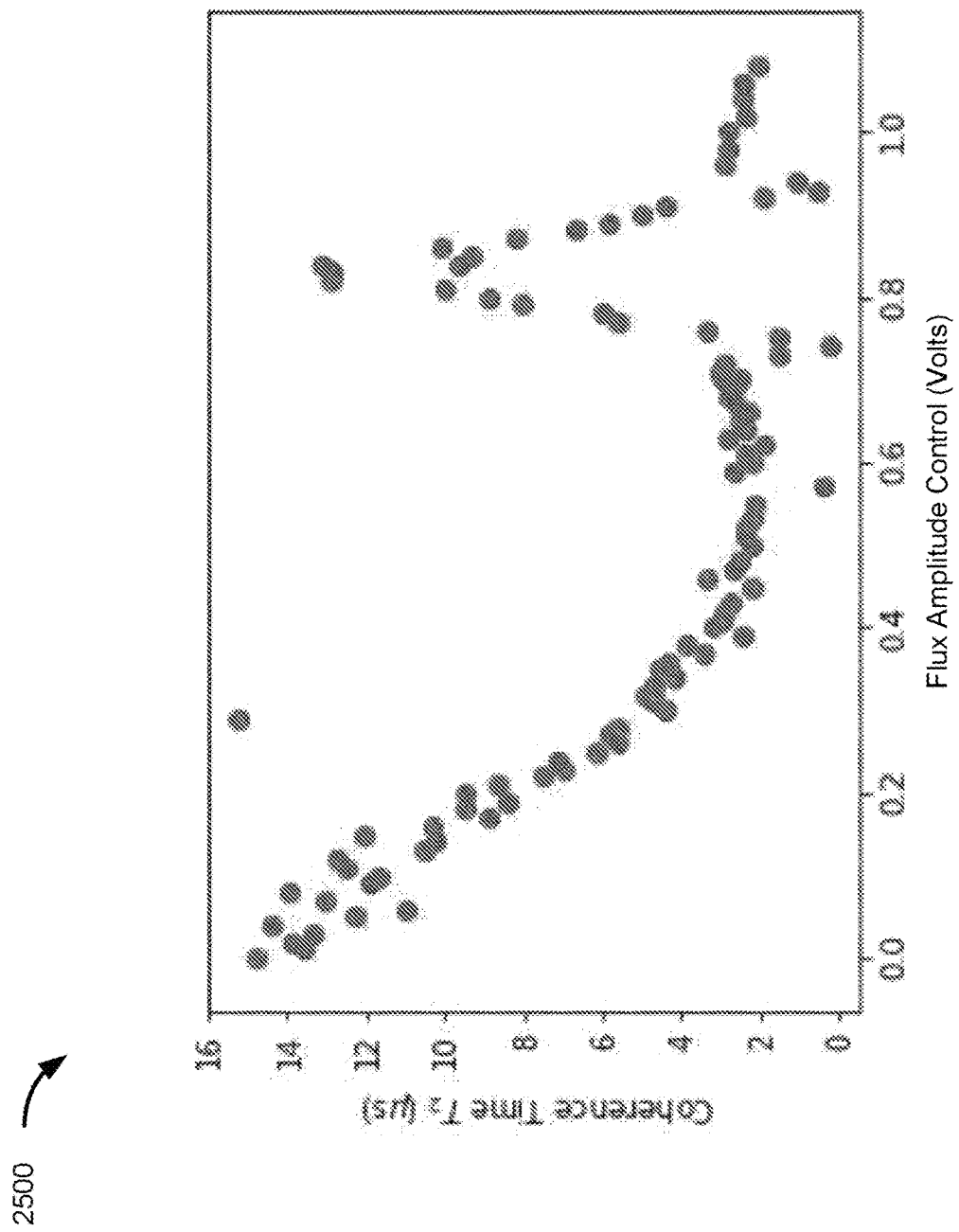
FIG. 25 is a plot of example coherence time measurements versus flux amplitude control.

FIG. 25 is a plot of example coherence time measurements versus flux amplitude control. The plot 2500 includes a horizontal axis representing the voltage amplitude V of a flux modulation pulse applied to a tunable qubit device, and a vertical axis representing the characteristic coherence time $T_2$ (in units of microseconds) of a qubit (defined by the ground state and first excited state of the tunable qubit device) under the flux modulation pulse. The plot 2500 includes data points for a series of values for the voltage amplitude V of the flux modulation pulse. The data show that the coherence time generally decreases as the voltage amplitude V increases from 0.0 Volts to approximately 0.5 Volts, then levels off at minimum value of approximately 2 microseconds, then spikes, and then returns the minimum value of approximately 2 microseconds. Notably, the spike in the coherence time indicates a significant increase of the coherence time between 0.7 and 0.9 Volts; in particular, the maximum coherence time of the qubit in the spike is approximately 13 microseconds, which is significantly longer than the 2 microsecond coherence time on either side of the spike.

Figure 26:
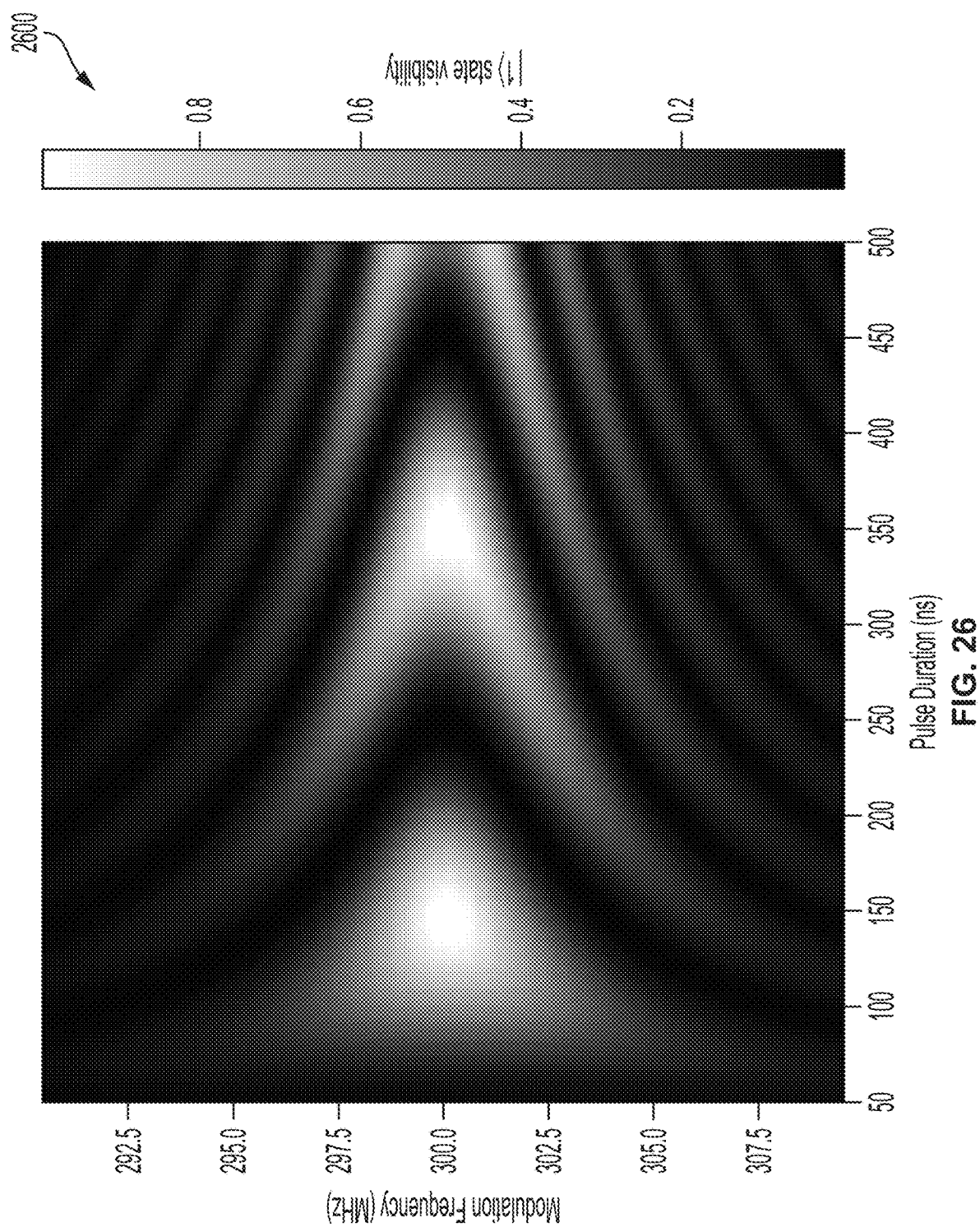
FIG. 26 is a plot of example spectroscopy data from a qubit device.

FIG. 26 is a plot 2600 of example spectroscopy data from a qubit device. The plot 2600 includes a horizontal axis representing the pulse duration (units of nanoseconds) of a flux modulation pulse applied to a tunable qubit device that is coupled to a fixed-frequency qubit device, and a vertical axis representing the modulation frequency (units of MegaHertz) of the flux modulation pulse. The shading in the plot 2600 represents the visibility of the first excited state (the |1⟩ state visibility) of the qubit defined by the tunable qubit device after the flux modulation pulse. Before the flux modulation pulse is applied, the qubit is in the ground state (the |0⟩ state), and therefore, the |1⟩ State visibility shown in the plot 2600 represents the population transfer under the flux modulation pulse. The example spectroscopy data in the plot 2600 shows coherent oscillations between the tunable qubit device and the fixed-frequency qubit device; the population of the first excited state (the |1⟩, state visibility) of the tunable qubit device oscillates due to coherent interactions with the fixed-frequency qubit device. The chevron characteristic of the plot 2600 is centered around a modulation frequency of approximately 300.0 MegaHertz, and the peak-to-peak distance at the center of the chevron feature is approximately 225 nanoseconds. The spectroscopy data can be fit to a model to obtain precise values, which can be used as gate parameters for a parametrically-activated quantum logic gate.

FIG. 27A is a diagram of an example pulse sequence for determining a phase shift under flux bias modulation. The example pulse sequence 2700A shown in FIG. 27A applies a first π/2 pulse 2702 to the tunable qubit device; the π/2 pulse 2702 is calibrated to rotate a qubit by π/2 radians (e.g., a rotation on the Bloch sphere about the x- or y-axis). The pulse sequence 2700A then applies a flux modulation pulse 2704 to the tunable qubit device; the flux modulation pulse 2704 has a modulation frequency $\omega_{fl}$ and an amplitude $V_{\tau_2,max}$ and is applied for a duration t. The flux modulation pulse 2704 can be applied, for example, by delivering a pulse on a flux bias line coupled to the tunable qubit device. The pulse sequence 2700A then applies a phase shift 2706 to the qubit; the phase shift is calibrated to rotate the qubit by ϕ radians (e.g., a rotation on the Bloch sphere about the z-axis). The pulse sequence 2700A then applies a second π/2 pulse 2708 to the tunable qubit device; the π/2 pulse 2708 is calibrated to rotate the qubit by π/2 radians (e.g., a rotation on the Bloch sphere about the x- or y-axis). The pulse sequence 2700A then performs a measurement 2710 of the qubit device. The measurement 2710 can be a projective measurement that returns one of two computational basis states of the qubit. For example, the measurement 2710 may indicate the qubit device in a ground state (e.g., computational state |0⟩) or a first excited state (e.g., computational state |1⟩) or another quantum state. In some cases, the pulse sequence 2700A can be calibrated and executed (e.g., in an iterative manner) to determine a phase shift of the tunable qubit under the flux modulation pulse 2704.

FIG. 27B is a plot 2700B showing example data from the pulse sequence 2700A shown in FIG. 27A. The plot 2700B includes a horizontal axis representing the phase ϕ applied by the phase shift 2706, and a vertical axis representing the initial state visibility as indicated by the measurement 2710. The plot 2700B includes data point for a series of values for the phase ϕ, and the data point representing the maximum state visibility $\theta_{max}$ is labeled in the plot 2700B.

In some cases, the data shown in the plot 2700B can be used to determine a phase correction for a parametrically activated quantum logic gate. For example, the value of the phase corresponding to the maximum state visibility $\theta_{max}$ may be identified as the phase correction (e.g., the phase correction $\theta_T$ for the qubit defined by the tunable qubit device, or the phase correction $\theta_F$ for the qubit defined by the fixed-frequency qubit device) as described with respect to operation 2312 in FIG. 23.

Figure 28:
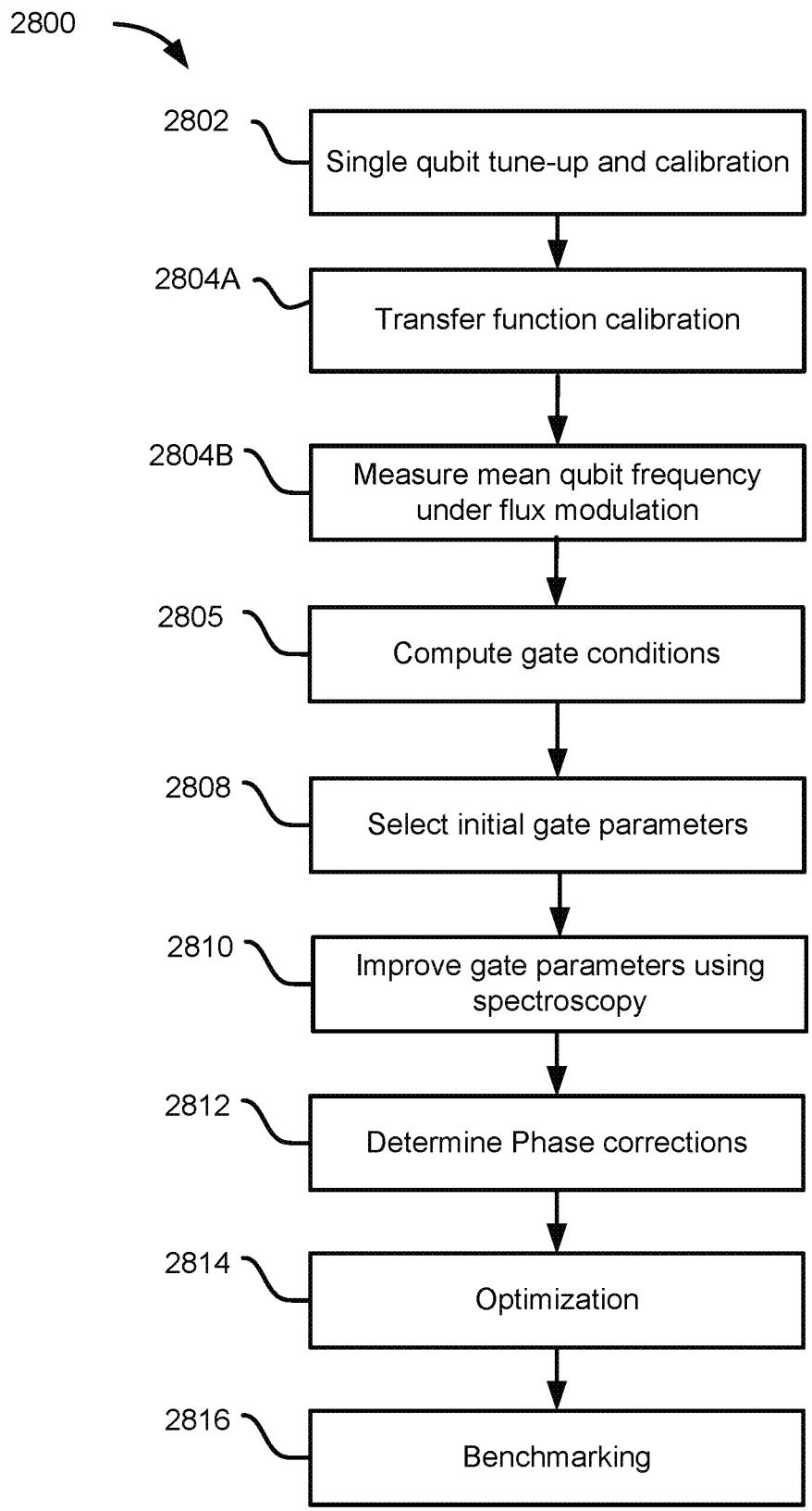
FIG. 28 is a flowchart showing an example process for determining gate parameters for a parametrically-activated quantum logic gate.

FIG. 28 is a flowchart showing an example process 2800 for determining gate parameters for a parametrically-activated quantum logic gate. The example process 2800 can be used, for example, to design, calibrate, improve, optimize, or otherwise manage parametrically activated quantum logic gates for a physical quantum processor circuit. For instance, the process 2800 may determine gate parameters for one or more quantum logic gates in the family of iSWAP gates, in the family of controlled-Z gates (e.g., CZ02 or CZ20), or in the family of Bell-Rabi gates. The process 2800 may include additional or different operations, and the operations can be performed in the order shown or in another order.

The quantum processor circuit can be a superconducting circuit that includes many circuit devices. The circuit devices may include, for example, qubit devices, readout devices, flux bias devices, control lines, connections (e.g., capacitive connections or otherwise) between pairs of devices, and other types of circuit devices. In some examples, the quantum processor circuit includes tunable-frequency qubit devices and fixed-frequency qubit devices, as well as readout devices and other types of circuit elements. For instance, the process 2800 shown in FIG. 28 may be used to manage parametrically activated quantum logic gates for a quantum processor circuit of the type represented by the equivalent circuits 1200A, 1200B shown in FIGS. 12A, 12B, by the circuit 2000 shown in FIG. 20, or another type of quantum processor circuit.

In some implementations, one or more operations in the example process 2800 can be performed by a computer system, for instance, by a digital computer system having one or more digital processors (e.g., a microprocessor or other data processing apparatus) that execute instructions (e.g., instructions stored in a digital memory or other computer-readable medium) to perform the process 2800, or by another type of digital, quantum or hybrid computer system. As an example, in some cases the quantum processor circuit can be deployed as the quantum processor 102 shown in FIG. 1, and operations in the process 2800 shown in FIG. 28 can be controlled, executed or initiated by one or more components of the control system 110 shown in FIG. 1.

In some implementations, the process 2800 can be executed in an automated manner, for example, by defining objective criteria and standardized parameters for moving from one operation to the next. An automated process may be executed without user supervision or user input to tune-up a gate that depends on non-linear parameters. The example process 2800 can be used, for example, in a quantum computing system, to automate the procedure of discovering and bringing up parametrically-activated quantum logic gates, for example, a family of iSWAP gates, a family of controlled-Z gates (e.g., CZ02 or CZ20), or a family of Bell-Rabi gates. For instance, the process 2800 may be used to bring-up these gates with a reliable and repeatable procedure that provides a high fidelity two-qubit entangling gate. Having an automated procedure to tune-up quantum logic gates can improve their scalability for large systems. For example, parametrically activated quantum logic gates may depend non-linearly on the pulse parameters, and the process 2800 may handle this non-linearity or other complexities better than conventional techniques in some cases. In addition, an automated process can be used to reduce or minimize the downtime of a quantum processor when performing gate calibration. In some cases, the process 2800 can identify values for important parameters in a high-dimensional parameter space and optimize or otherwise improve them in a way that reduces the time necessary for calibration and provides repeatability. The process 2800 may be extended to other species of two-qubit gates, as well as to procedures for creating gates between larger numbers of qubits, e.g., three-qubit gates or four-qubit gates of which two-qubit gates are a component.

In some cases, the process 2800 may begin with theory-defined starting points to provide improved or optimal gate parameters. The process 2800 can include the transfer function calibration of flux pulses using a qubit to measure the exact response, and the use of coherent amplification errors as a means to tune-up the gate parameters, in some cases.

At 2802, a single-qubit tune-up and calibration is performed. For example, the single-qubit tune-up and calibration process can tune and characterize the qubits that the parametrically activated quantum logic gate is to be applied to. In some cases, the single-qubit tune-up and calibration can also tune and characterize neighboring qubits in the quantum processor circuit (e.g., qubits defined by other nearby qubit devices that are coupled to either of the target qubit devices). The a single-qubit tune-up and calibration is one example technique for obtaining measurements of a quantum processor circuit.

In some implementations, operation 2802 provides one or more of the following parameters, for example, as an output value that can be fed forward to another operation in the process 2800. Operation 2802 can provide the drive frequency of each qubit involved in the interaction. For tunable qubits, a parking flux bias voltage is used to determine the correct drive frequency. In some cases, frequencies of neighboring qubits that are coupled to the tunable qubit that is intended to be driven during the interaction are also provided. Operation 2802 can provide the anharmonicities of each qubit, and in some cases, of each of the neighboring qubits. Operation 2802 can provide the qubit-qubit coupling between the pair of qubits, and in some cases, between pairs of neighboring qubits. Operation 2802 can provide the calibrated gate pulses for each single qubit, including, for example, parameters for a π pulse and a π/2 pulse to rotate a qubit by π/2 radians (e.g., a rotation on the Bloch sphere about the x- or y-axis).

At 2804A, a transfer function calibration is performed. In some implementations, the flux drive line transfer function is measured by performing modified Ramsey experiments that measure the mean qubit frequency shift under modulation as a function of drive frequency for a fixed drive amplitude. For instance, the modified Ramsey experiment can replace the free evolution time between the X/2 pulses with a time varying modulated flux pulse of fixed frequency and amplitude (e.g., as shown in FIG. 24A or otherwise). The mean qubit frequency shift can serve as a proxy for the applied voltage on chip, providing a transfer function curve that can be corrected for (e.g., to ensure the applied voltage is constant as a function of frequency). In implementations where operation 2804A is performed, the results may be used later in the process 2800 (e.g., at 2810) and generally may improve the accuracy of the initial values for optimal gate parameters calculated at 2808.

In some implementations, operation 2804A provides a transfer function of output amplitude vs output frequency, for example, as an output value that can be fed forward to another operation in the process 2800.

At 2804B, the mean qubit frequency of a tunable qubit device is measured under flux modulation applied to the tunable qubit device. The mean qubit frequency measurements may correspond to a range of modulation amplitudes of the flux modulation. For example, the average transition frequency $\overline{\omega}_{T_{01}}$, (or mean qubit frequency) may be a function of the voltage amplitude V of the flux modulation pulse, and the average transition frequency $\overline{\omega}_m$, may be measured for multiple distinct values of the voltage amplitude V, which correspond to multiple distinct values over a range of flux modulation amplitude.

The modulation frequency of a parametrically activated quantum logic gate generally depends on the detuning between the fixed qubit and the tunable qubit's mean frequency under modulation. Thus, the mean frequency of the tunable frequency qubit device is measured to enable a calculation of the modulation frequency for the two qubit gate. In some implementations, at 2804B the mean qubit frequency of the tunable qubit device can be measured using the same modified Ramsey experiments described with respect to operation 2804A, but with fixed frequency and varying amplitude.

In some implementations, operation 2804B provides a mean qubit frequency vs flux pulse amplitude (e.g., as shown in the upper pane 2902 in FIGS. 29A, 29B, 29C), for example, as an output value that can be fed forward to another operation in the process 2800.

At 2805, gate conditions are computed. Here, multiple distinct gate conditions for applying a two-qubit quantum logic gate to a pair of qubits defined by the fixed-frequency qubit device and the tunable qubit device are computed, and each distinct gate condition has a different set of gate parameters. In some cases, the multiple distinct gate conditions are computed for a range of flux modulation amplitudes, and each distinct gate condition includes a flux modulation amplitude of a flux modulation; a flux modulation frequency; and a flux modulation time (a duration of the flux modulation).

In some implementations, using the qubit frequencies, anharmonicities, qubit-qubit couplings, and mean qubit frequency under modulation as a function of amplitude, resonant conditions can be calculated for multiple parametric gates at 2805. Example gate conditions for two example quantum logic gates are shown in the middle and lower panes of FIGS. 29A, 29B, and 29C, which include the resonant frequencies to enact parametric entangling gates as a function of amplitude (middle pane), and the associated gate times (lower pane).

At 2808, initial gate parameters are selected. The initial gate parameters can be (or can be based on) one of the gate conditions included in the multiple distinct gate conditions computed at 2805. For example, one or more gate criteria can be used to identify operating points (e.g., modulation frequency, modulation amplitude, gate time) for one or more quantum logic gates, and the identified operating points can be used to select the initial gate parameters.

In some implementations, the initial gate parameters are selected at 2808 based on one or more operating criteria associated with a two-qubit quantum logic gate. The operating criteria may include a criterion to minimize the gate time (e.g., discussed with respect to FIG. 29A), and selecting the initial gate parameters may include selecting the gate condition that has the shortest duration of flux modulation. The operating criteria may include a criterion to minimize sensitivity to the amplitude of the flux modulation pulse (e.g., to minimize the gradient of the tunable qubit frequency versus magnetic flux amplitude, discussed with respect to FIG. 29B). The operating criteria may include a criterion to avoid resonant conditions for unwanted transitions (e.g., transitions to be suppressed in the quantum processor circuit during application of the parametrically activated quantum logic gate, discussed with respect to FIG. 29C). The operating criteria may include a combination of these, and may include additional or different types of criteria. In some cases, the initial gate parameters are required to satisfy multiple operating criteria associated with a two-qubit quantum logic gate; or the initial gate parameters may be optimized under multiple criteria associated with a two-qubit quantum logic gate.

Figure 29A:
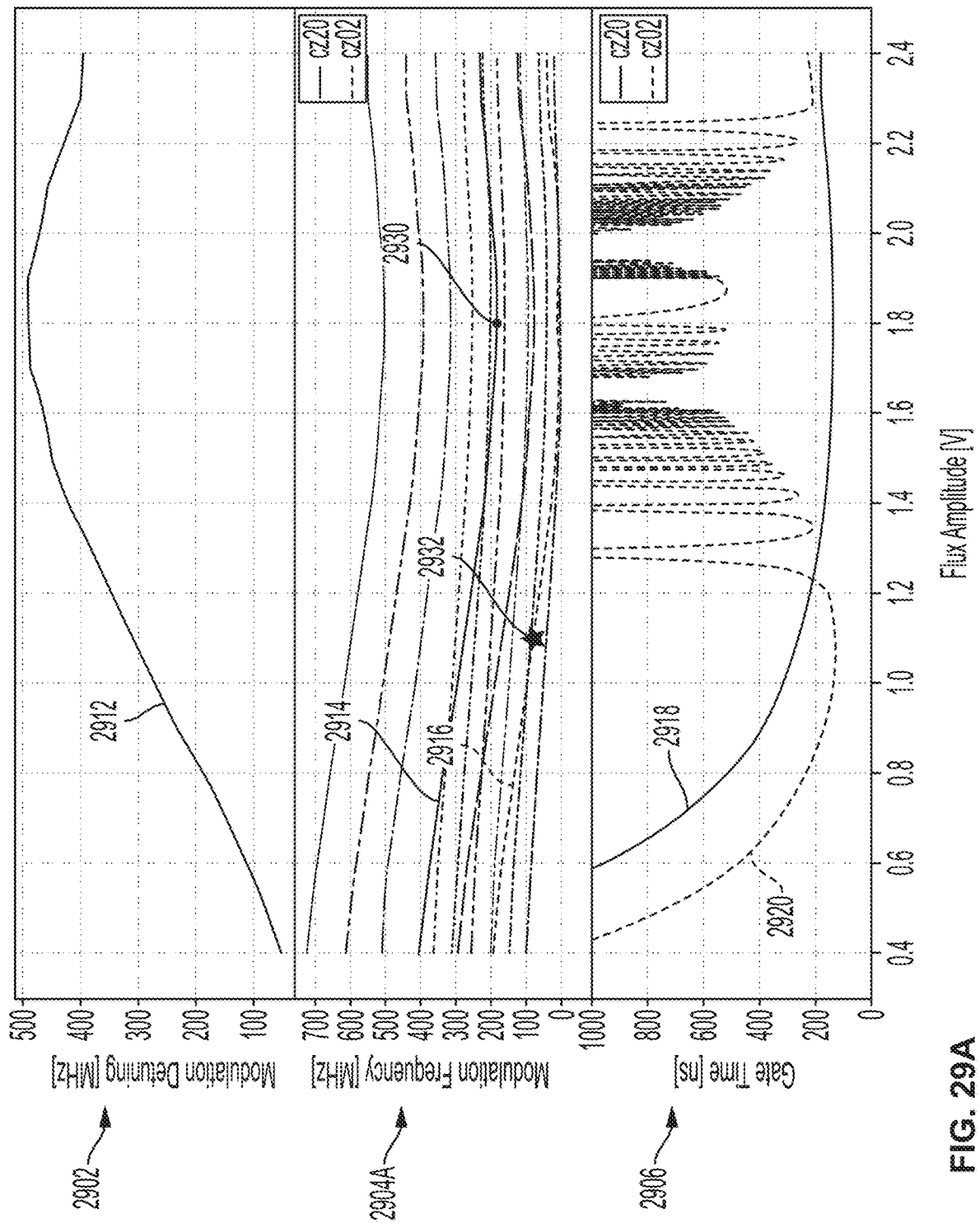
FIGS. 29A, 29B, 29C and 29D are plots showing example data that can be used for determining gate parameters for parametrically-activated quantum logic gates.
Figure 29B:
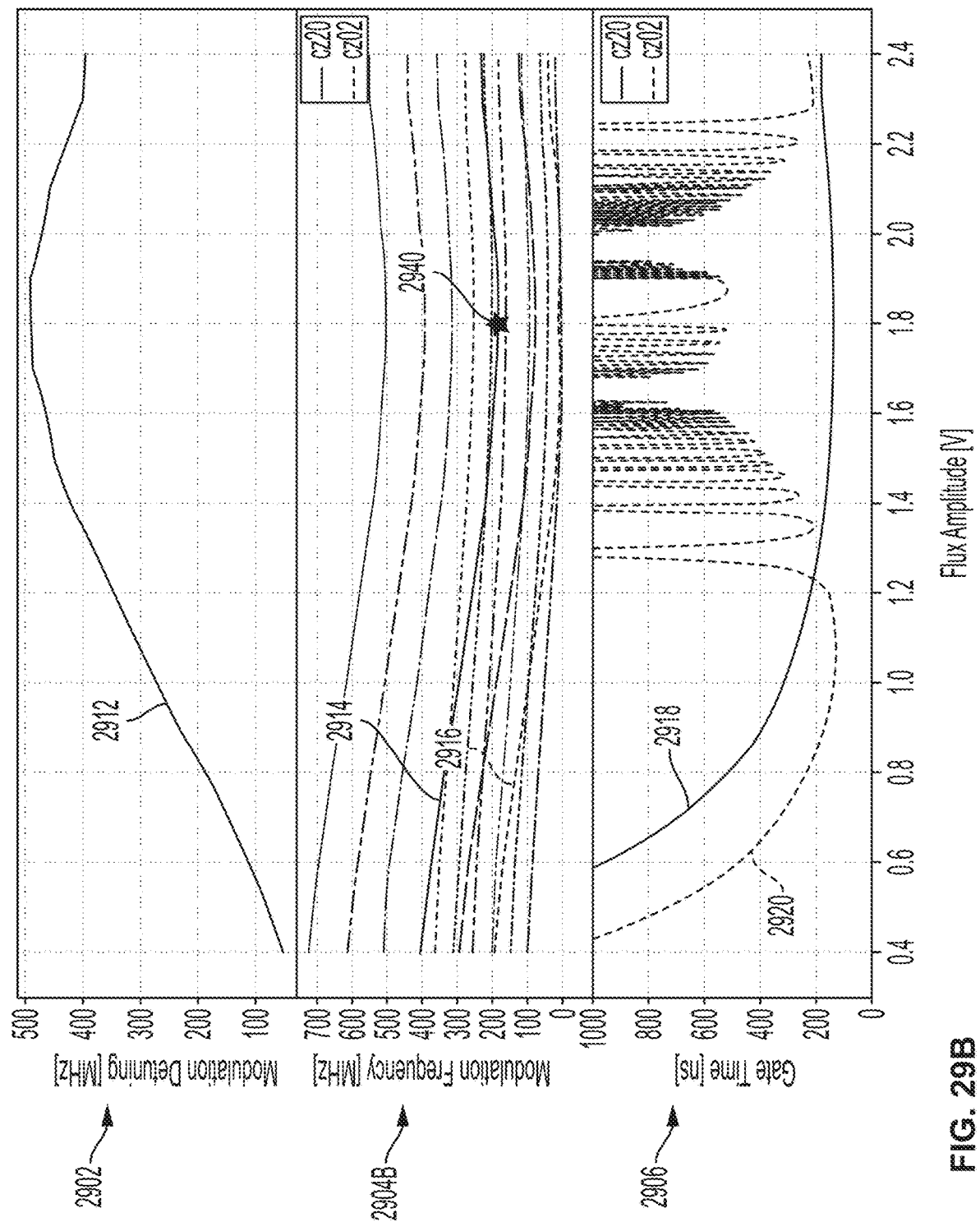
Figure 29C:
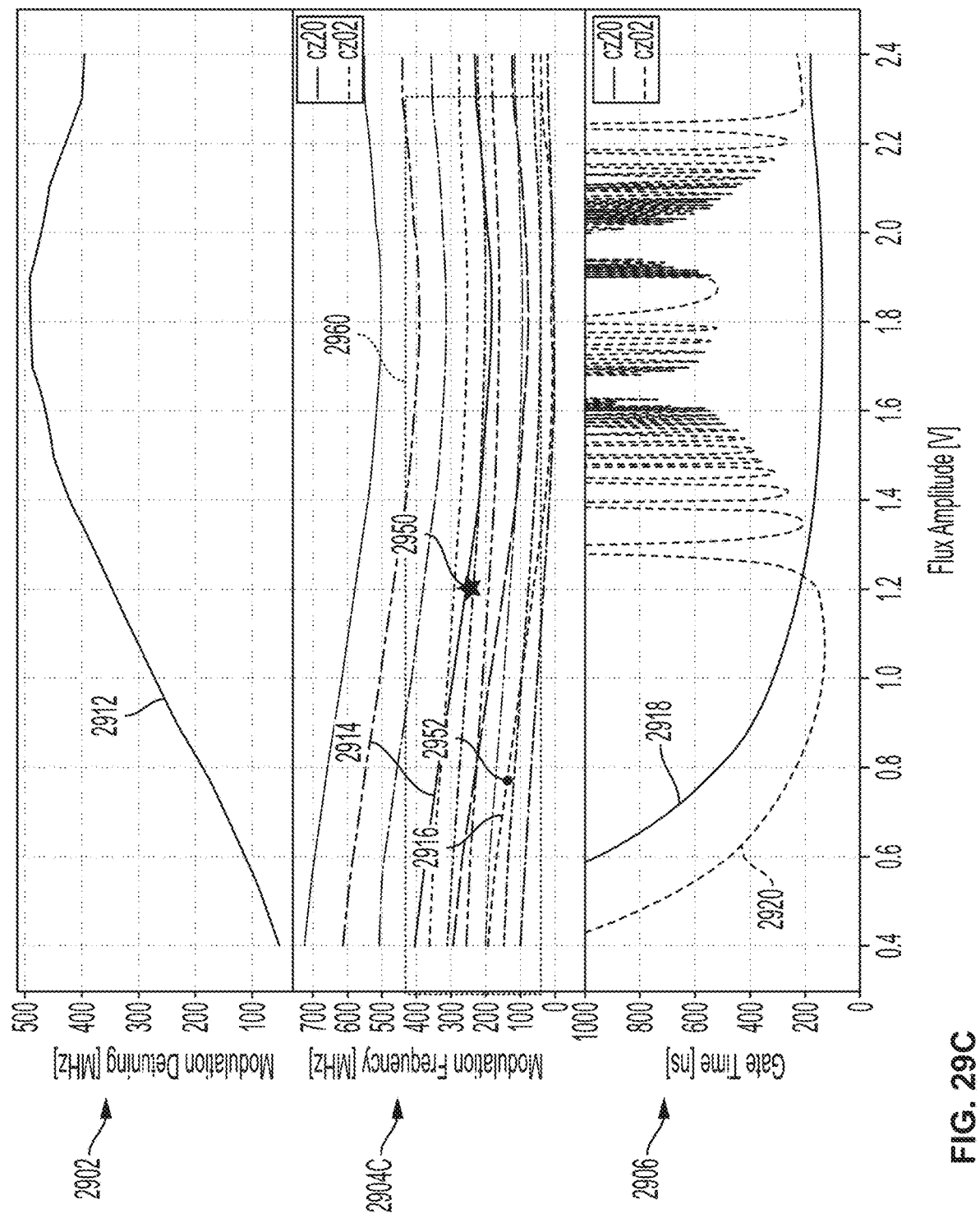

In some implementations, the initial gate conditions are selected from gate conditions calculated for multiple different types of quantum logic gates. For example, a first set of distinct gate conditions can be calculated for a first type of two-qubit quantum logic gate (e.g., CZ20 Controlled Phase gate); and a second set of distinct gate conditions can be calculated for a second type of two-qubit quantum logic gate (e.g., CZ02 Controlled Phase gate). Then, one or more of the first set of distinct gate conditions that satisfy an operating criterion associated with the first type of two-qubit quantum logic gate can be identified; and one or more of the second set of distinct gate conditions that satisfy an operating criterion associated with the second type of two-qubit quantum logic gate can be identified. Then, either the first type of two-qubit quantum logic gate or the second type of two-qubit quantum logic gate can be selected based on the gate conditions that satisfy the operating criteria, and gate parameters for the selected type of two-qubit quantum logic gate can be specified. An example of this is shown in FIGS. 29A, 29B, and 29C. In FIG. 29A, the CZ02 gate is selected with the gate parameters corresponding to point 2930; in FIGS. 29B and 29C, the CZ20 gate is selected with the gate parameters corresponding to point 2940 and 2950, respectively.

In some implementations, resonant conditions for a plurality of transitions to be suppressed in the quantum processor circuit during application of the two-qubit quantum logic gate are identified, and the initial gate conditions are identified in a manner that avoids such resonant conditions. For instance, gate conditions can be analyzed in a modulation frequency and modulation amplitude domain, as shown for example in FIG. 29D. One or more minimum frequency distances can be defined for selecting the initial gate condition. For instance, the process 2800 may select a gate condition that is at least a minimum distance (e.g., at least 10 MHz, at least 20 MHz, etc.), in the modulation frequency and modulation amplitude domain, from resonant conditions of transitions to be suppressed in the quantum processor circuit during application of the two-qubit quantum logic gate.

In some implementations, operation 2808 provides one or more of the following parameters, for example, as an output value that can be fed forward to another operation in the process 2800. Operation 2808 can provide an initial resonant frequency, an initial modulation amplitude, and an initial gate time. The initial values of these parameters may be provided as approximate gate parameters, in some cases.

At 2810, the gate parameters are improved using spectroscopy. In some implementations, a multidimensional modulated flux pulse measurement is obtained, for example, by scanning the frequency and time of the flux modulation pulse around the previously determined value of frequency, using the previously determined value of amplitude. If the transfer function calibration step was not performed previously (at 2804A), the flux modulation amplitude may also be varied in the spectroscopy measurement.

In some implementations, instead of doing a large multidimensional search, one or more parameters can be fixed. First, the modulation amplitude can be determined by fixing the modulation frequency and time (e.g., where these parameters were determined at 2808). Once the modulation amplitude is found (e.g., the point of maximum contrast from the background), another scan can be performed where the modulation amplitude and time are fixed to center on the modulation frequency. Next, a scan with fixed modulation amplitude and frequency can be performed to measure the gate time. Depending on which parametric gate is being investigated, Rabi oscillations will be visible from particular initial states, indicative of population exchange between states. For the iSWAP family of quantum logic gates, the spectroscopic data may indicate population exchange between the $|01\rangle$ and $|10\rangle$ states. For the Controlled-Z family of quantum logic gates, the spectroscopic data may indicate population exchange between the $|11\rangle$ and $|20\rangle$ states. For the Bell-Rabi quantum logic gate, the spectroscopic data may indicate population exchange between the $|00\rangle$ and $|11\rangle$ states. For measuring oscillations to $|02\rangle$ or $|20\rangle$, the readout parameters can be chosen to ensure visibility of the $|2\rangle$ state (the second excited state of the qubit device). For example, the readout pulse frequency can be placed at the cavity frequency when the qubit is in the $|1\rangle$ state (the first excited state of the qubit device). This can be generalized to more than two entangled qubits. In addition, the presence of clean chevrons in the spectroscopy data can confirm the absence of unwanted other resonances or imperfections in the flux delivery.

In some implementations, operation 2810 provides one or more of the following parameters, for example, as an output value that can be fed forward to another operation in the process 2800. Operation 2810 can provide a resonant frequency, a modulation amplitude, and a gate time. The values provided at 2810 may constitute a full or partial set of values for a final set of gate parameters, an intermediate set of gate parameters (e.g., that can be further improved or otherwise refined), an optimized set of gate parameters, etc. For instance, the values provided at 2810 may represent a version of the quantum logic gate that has been improved, relative to the initial values provided at 2808.

At 2812, phase corrections are determined. In some implementations, because the qubits are dynamically detuned during the flux pulse, each qubit acquires a phase (a local Z rotation) with respect to the fixed frequency microwave drive reference frame. The phase can be corrected with local frame changes. To measure this accumulated phase, phase Ramsey measurements on both qubits are performed with a modulated flux pulse using the parameters found in spectroscopy to measure the accumulated phase (which manifests as a phase offset from 0). These accumulated phases are implemented as RZ corrections to enact the gate. This measurement can be performed using an increasing number of applied gates to fine tune these single qubit phases (e.g., using the pulse sequence shown in FIG. 27A or otherwise). This can also be performed on neighboring qubits that are not the target of the quantum logic gate, for example, in the presence of crosstalk.

In some implementations, operation 2812 provides one or more of the following parameters, for example, as an output value that can be fed forward to another operation in the process 2800. Operation 2812 may provide a tunable qubit RZ correction and a single qubit RZ correction. In some instances, operation 2812 may also provide other neighboring qubit RZ corrections.

At 2814, the gate parameters can be optimized. In some implementations, one or more of the gate parameters (e.g., modulation frequency, modulation amplitude, modulation time) can be improved or optimized over one or more other parameters. For instance, using phase Ramsey measurements (e.g., the same phase Ramsey measurements described above to calculate the accumulated RZs at 2812), the tunable qubit can be measured with the fixed qubit in both the ground and excited state where the difference in phase between the two measurements is the entangling phase. An optimization method can be used to more finely tune the gate parameters where the objective function is getting the phase difference between these two configurations to be $\pi$ for a CZ. This procedure can optimize for the entangling phase. The rotation angle and axis of the gate (e.g., $2\pi$ for CZ and $\pi$ for iSWAP) can be further optimized, for example, by amplifying coherent errors (e.g., in a manner similar to a single qubit tune-up sequence). For instance, starting with a half-rotation to maximize sensitivity, an exponentially increasing numbers of gates are applied, and the accumulated rotation angle error is used to correct the pulse duration. For rotation axis correction for the iSWAP, flip-flop experiments can be used. For rotation axis correction for the CZ gate, partial tomography observing XI↔XZ and IX↔ZX oscillations under repeated applications of the gate can be used. The gate parameters may be optimized using additional or different techniques.

At 2816, benchmarking is performed. In some implementations, measurements such as quantum state and process tomography of entangled states (e.g. GHZ) or entangling processes are performed, and verification routines such as randomized benchmarking or gate set tomography to benchmark the fidelity and performance of the parametrically activated quantum logic gate.

Figure 29D:
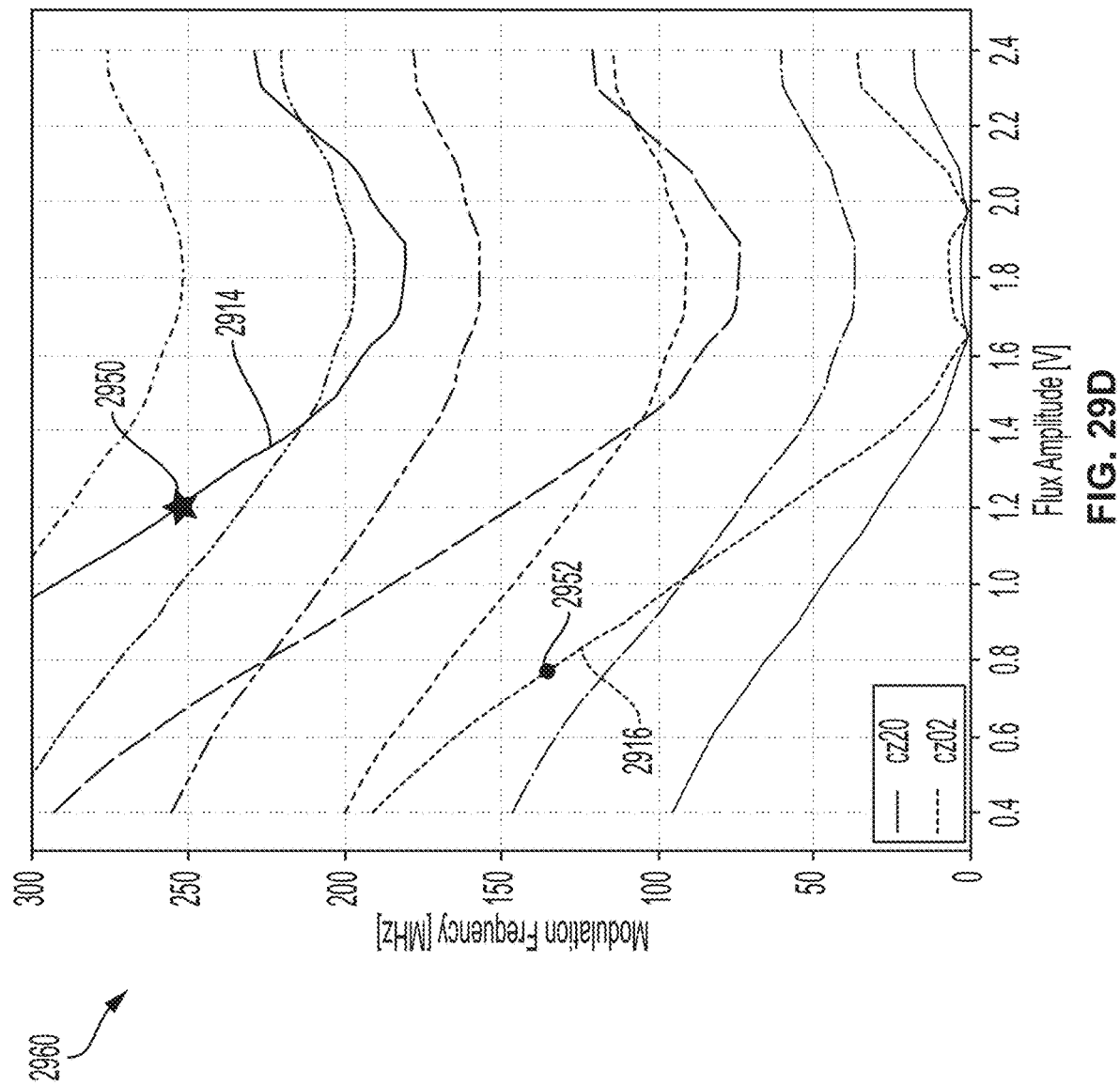

FIGS. 29A, 29B, 29C and 29D are plots showing example data that can be used for determining gate parameters for parametrically-activated quantum logic gates. The plot shown in FIG. 29D is a zoomed-in view of the indicated region 2960 in the middle pane 2904C shown in FIG. 29C.

In the plots shown in FIGS. 29A, 29B, 29C and 29D, the horizontal axis represents the flux amplitude control (units of Volts) of a flux modulation pulse for a tunable qubit device. The plotted values can be obtained based on the tunable qubit device and one or more fixed-frequency qubit devices coupled to the tunable qubit device (e.g., obtained by measurement, computation, or simulation of a quantum processor circuit that includes such qubit devices). The data shown in the plots can be used to select a particular value of flux amplitude control (and other parameters) of a parametrically activated quantum logic gate configured for a pair of qubits defined by the tunable qubit and one of the fixed-frequency qubit devices.

In FIGS. 29A, 29B, and 29C, the top pane 2902 represents the modulation detuning of the tunable qubit device under flux modulation, which can be obtained from measurements of the tunable qubit device. For instance, the modulation detuning can be obtained as described with respect to FIGS. 24A and 24B or in another manner. The curve 2912 plotted in the upper pane 2902 indicates the modulation detuning (units of MegaHertz) over a range of flux amplitude control.

The respective middle panes 2904A, 2904B, 2904C and lower pane 2906 represent gate conditions for parametrically activated quantum logic gates. The gate conditions can be computed, for example, using numerical or analytical calculations executed by a computer system. For example, the equations above can be used to compute the gate conditions for a parametrically activated quantum logic gate, given the qubit device parameters and a flux modulation amplitude value.

A first curve 2914 plotted in each of the middle panes 2904A, 2904B, 2904C indicates the modulation frequency (units of MegaHertz) specified by the gate condition for a CZ20 controlled-Z gate over a range of flux amplitude control; a second curve 2916 plotted in each of the middle panes 2904A, 2904B, 2904C indicates the modulation frequency (units of MegaHertz) specified by the gate condition for a CZ02 controlled-Z gate over a range of flux amplitude control. The dashed lines middle panes 2904A, 2904B, 2904C represent resonant conditions for neighboring qubits and/or higher order resonant harmonics.

A first curve 2918 plotted in the lower pane 2906 indicates the gate time (units of nanoseconds) specified by the gate condition for a CZ20 controlled-Z gate over a range of flux amplitude control; a second curve 2920 plotted in the lower pane 2906 indicates the gate time (units of nanoseconds) specified by the gate condition for a CZ02 controlled-Z gate over a range of flux amplitude control.

The points plotted in the middle pane 2904A, 2904B, 2904C represent examples of particular gate conditions that may be selected, for instance, based on various operating criterion, for applying a two-qubit quantum logic gate (e.g., a parametrically-activated quantum logic gate). In this example, the two-qubit quantum logic gate is either the CZ20 controlled-Z gate or the CZ02 controlled-Z gate configured for a pair of qubits defined by the tunable qubit device and one of the fixed-frequency qubit devices coupled to it.

FIG. 29A shows an example where the operating criterion for the two-qubit quantum logic gate is to minimize the gate time. In the middle pane 2904A shown in FIG. 29A, the point 2930 on the first curve 2914 shows the gate condition for the CZ20 Controlled-Z gate that would be selected to minimize the gate time for the CZ20 gate. For instance, the point 2930 is located at the flux amplitude control value where the CZ20 Controlled-Z gate time (shown by curve 2918) is minimal.

Also in the middle pane 2904A shown in FIG. 29A, the point 2932 on the second curve 2916 shows the gate condition for the CZ02 Controlled-Z gate that would be selected to minimize gate time for the CZ02 gate. For instance, the point 2932 is located at the flux amplitude control value where the CZ02 Controlled-Z gate time (shown by curve 2920) is minimal. In the example shown in FIG. 29A, the point 2932 may represent the optimal gate condition because in this example the minimal gate time for the CZ02 gate is less than the minimal gate time for the CZ20 gate, and so the gate condition represented by point 2932 represents the overall minimum gate time.

FIG. 29B shows an example where the operating criterion for the two-qubit quantum logic gate is to minimize the gradient of the tunable qubit frequency versus magnetic flux amplitude. In the middle pane 2904B shown in FIG. 29B, the point 2940 on the first curve 2914 shows the gate condition for the CZ20 Controlled-Z gate that would be selected to minimize the gradient of the modulation detuning versus flux amplitude control. For instance, the point 2940 is located at the flux amplitude control value where the modulation detuning (shown by curve 2912) is flat (substantially zero or otherwise minimized derivative). This point 2940 may correspond to the "sweet spot" (the flux insensitive point) for parametrically activated quantum logic gates.

FIG. 29C (and the region 2960 in FIG. 29D) shows an example where the operating criterion for the two-qubit quantum logic gate includes avoiding resonant conditions for unwanted transitions (e.g., transitions to be suppressed in the quantum processor circuit during application of the parametrically activated quantum logic gate). In the middle pane 2904C shown in FIG. 29C, the point 2950 on the first curve 2914 shows the gate condition for the CZ20 Controlled-Z gate that would be selected to minimize the gate time for the CZ20 gate and operate at a minimum of 20 MHz away from other nearby resonances (all dashed lines) and/or 0 MHz.

Also in the middle pane 2904C shown in FIG. 29C, the point 2952 on the second curve 2916 shows the gate condition for the CZ02 Controlled-Z gate that would be selected to minimize gate time for the CZ02 gate and operate at a minimum of 20 MHz away from other nearby resonances (all dashed lines) and/or 0 MHz. In the example shown in FIG. 29C, the point 2950 may represent the optimal gate condition because that gate time associated point 2950 (approximately 200 nanoseconds, according to the lower pane 2906) is less than the gate time associated with the point 2952 (approximately 300 nanoseconds, according to the lower pane 2906).

In some cases, operating points can be constrained to be at a minimum threshold distance (e.g., 20 MHz) in the modulation frequency dimension away from other nearby resonances and/or 0 MHz. This can be accomplished, for example, by taking the modulation frequency of the gate to be enacted, and checking above and below by the threshold (20 MHz in this example) for each flux amplitude point. If there is no unwanted transition within that threshold, that flux amplitude point may be considered valid. After eliminating points based on these thresholds, an optimal operating point can be chosen according to another operating criterion (e.g., where the gate time is at a minimum). The minimum threshold that is used in this operating criterion can be set to a value that is larger than the maximum effective coupling of the pair of qubits. For the example given in FIG. 29C, the maximum effective coupling is 5 MHz. In this example, operating points are available for both gates. However, the selected operating point would be point 2950 for the CZ20 gate (at 1.2 V) because point 2950 is associated with a lower gate time than point 2952 for the CZ02 gate. Both points (2950 and 2952) are examples of a gate condition that are at least a minimum distance (at least 20 MHz in this example) in the modulation frequency and modulation amplitude domain from resonant conditions of transitions to be suppressed (represented by dashed lines in the plot 2904C) in the quantum processor circuit during application of the two-qubit quantum logic gate.

In a general aspect, parametrically-activated quantum logic gates are described.

In a first example, a quantum information control method includes: generating a control signal configured to modulate, at a modulation frequency, a transition frequency of a tunable qubit device in a quantum processor, the modulation frequency being determined based on a transition frequency of a fixed-frequency qubit device in the quantum processor, the transition frequency of the fixed-frequency qubit device being independent of a magnetic flux experienced by the fixed-frequency qubit device; and applying a two-qubit quantum logic gate to a pair of qubits in the quantum processor by communicating the control signal to a control line coupled to the tunable qubit device, the pair of qubits comprising a first qubit defined by the fixed-frequency qubit device and a second qubit defined by the tunable qubit device.

Implementations of the first example may include one or more of the following features. The method may include determining the modulation frequency based on the sum or the difference of: the transition frequency of the tunable qubit device, and the transition frequency of the fixed-frequency qubit device. The modulation frequency may be determined based on the transition frequency of the fixed-frequency qubit device and the transition frequency of the tunable qubit device.

Implementations of the first example may include one or more of the following features. The modulation frequency may be determined based on the transition frequency of the fixed-frequency qubit device and the anharmonicity of the tunable qubit device. The modulation frequency may be determined based on the transition frequency between the ground state and first excited state of the fixed-frequency qubit device. The modulation frequency may be determined based on the transition frequency between the first excited state and second excited state of the fixed-frequency qubit device.

Implementations of the first example may include one or more of the following features. The modulation frequency may be determined based on the transition frequency of the tunable qubit device and the anharmonicity of the fixed-frequency qubit device. The modulation frequency may be determined based on the transition frequency between the ground state and first excited state of the tunable qubit device. The modulation frequency may be determined based on the transition frequency between the first excited state and second excited state of the tunable qubit device.

Implementations of the first example may include one or more of the following features. Applying the two-qubit quantum logic gate to the pair of qubits may include applying an iSWAP gate to the pair of qubits. Applying the two-qubit quantum logic gate to the pair of qubits may include applying a square-root-of-iSWAP gate to the pair of qubits. The method may include generating the control signal to modulate the transition frequency of the tunable qubit device about a reference frequency $\bar{\omega}_{T_{01}}$ at the modulation frequency $\omega_m = |\bar{\omega}_{T_{01}} - \omega_{F_{01}}|$, where $\omega_{F_{01}}$ represents the transition frequency of the fixed-frequency qubit device. The control signal may be configured to modulate the transition frequency of the tunable qubit device at the modulation frequency with a modulation amplitude $\delta\omega$, and the control signal may be configured to produce an interaction between the tunable qubit device and the fixed-frequency qubit device for a total interaction time $$t^{(1)}_{iSWAP} = \frac{\pi}{2} \frac{1}{g|J_1(\delta\omega/\omega_m)|},$$

where g represents a capacitive coupling strength between the tunable qubit device and the fixed-frequency qubit device, $J_1$ represents a first-order Bessel function of the first kind, and $\omega_m$ represents the modulation frequency. The control signal may be configured to modulate the transition frequency of the tunable qubit device at the modulation frequency with a modulation amplitude $\delta\omega$, and the control signal may be configured to produce an interaction between the tunable qubit device and the fixed-frequency qubit device for a total interaction time $$t^{(1)}_{\sqrt{iSWAP}} = \frac{\pi}{4} \frac{1}{g|J_1(\delta\omega/\omega_m)|},$$

where g represents a capacitive coupling strength between the tunable qubit device and the fixed-frequency qubit device, $J_1$ represents a first-order Bessel function of the first kind, and $\omega_m$ represents the modulation frequency. The tunable qubit device may include a superconducting circuit loop that defines a flux quantum $\Phi_0$ and receives a first magnetic flux that tunes the transition frequency of the tunable qubit device. The control signal may be configured to modulate the first magnetic flux with a magnetic flux modulation amplitude less than $\Phi_0/2$. The control signal may be configured to modulate the first magnetic flux (e.g., with a magnetic flux modulation amplitude less than, equal to, or greater than $\Phi_0/2$) so as to modulate the transition frequency of the tunable qubit device at a single frequency $\omega_m$ with an amplitude $\delta\omega$ around a reference frequency $\bar{\omega}_{T_{01}}$.

Implementations of the first example may include one or more of the following features. Applying the two-qubit quantum logic gate to the pair of qubits may include applying a controlled-Z gate to the pair of qubits. The method may include generating the control signal to modulate the transition frequency of the tunable qubit device about a reference frequency $\bar{\omega}_{T_{01}}$ at the modulation frequency $\omega_m = |\bar{\omega}_{T_{01}} - \omega_{F_{01}} - \bar{\eta}_T|$, where $\omega_{F_{01}}$ represents the transition frequency of the fixed-frequency qubit device and $\bar{\eta}_T$ represents an average anharmonicity of the tunable qubit device. The method may include generating the control signal to modulate the transition frequency of the tunable qubit device about a reference frequency $\bar{\omega}_{T_{01}}$ at the modulation frequency $\omega_m = |\bar{\omega}_{T_{01}} - \omega_{F_{01}} + \eta_T|$, where $\omega_{F_{01}}$ represents the transition frequency of the fixed-frequency qubit device and $\eta_F$ represents the anharmonicity of the fixed-frequency qubit device. The control signal may be configured to modulate the transition frequency of the tunable qubit device at the modulation frequency with a modulation amplitude $\delta\omega$, and the control signal may be configured to produce an interaction between the tunable qubit device and the fixed-frequency qubit device for a total interaction time $$t^{(1)}_{CZ} = \frac{\pi}{\sqrt{2}} \frac{1}{g|J_1(\delta\omega/\omega_m)|},$$

where g represents a capacitive coupling strength between the tunable qubit device and the fixed-frequency qubit device, $J_1$ represents a first-order Bessel function of the first kind, and $\omega_m$ represents the modulation frequency. The tunable qubit device may include a superconducting circuit loop that defines a flux quantum $\Phi_0$ and receives a first magnetic flux that tunes the transition frequency of the tunable qubit device. The control signal may be configured to modulate the first magnetic flux with a magnetic flux modulation amplitude less than $\Phi_0/2$. The control signal may be configured to modulate the first magnetic flux (e.g., with a magnetic flux modulation amplitude less than, equal to, or greater than $\Phi_0/2$) so as to modulate the transition frequency of the tunable qubit device at a single frequency $\omega_m$ with an amplitude $\delta\omega$ around a reference frequency $\bar{\omega}_{T_{01}}$.

Implementations of the first example may include one or more of the following features. Applying the two-qubit quantum logic gate to the pair of qubits may include applying a Bell-Rabi gate to the pair of qubits. The method may include generating the control signal to modulate the transition frequency of the tunable qubit device about a reference frequency $\bar{\omega}_{T_{01}}$ at the modulation frequency $\omega_m = \bar{\omega}_{T_{01}} + \omega_{F_{01}}$, where $\omega_{F_{01}}$ represents the transition frequency of the fixed-frequency qubit device. The control signal may be configured to produce an interaction between the tunable qubit device and the fixed-frequency qubit device for a total interaction time $$t^{(1)}_{BR} = \frac{\pi}{g|J_1(\delta\omega/\omega_m)|},$$

where g represents a capacitive coupling strength between the tunable qubit device and the fixed-frequency qubit device, $J_1$ represents a first-order Bessel function of the first kind, and $\omega_m$ represents the modulation frequency. The tunable qubit device may include a superconducting circuit loop that defines a flux quantum $\Phi_0$ and receives a first magnetic flux that tunes the transition frequency of the tunable qubit device. The control signal may be configured to modulate the first magnetic flux with a magnetic flux modulation amplitude less than $\Phi_0/2$. The control signal may be configured to modulate the first magnetic flux (e.g., with a magnetic flux modulation amplitude less than, equal to, or greater than $\Phi_0/2$) so as to modulate the transition frequency of the tunable qubit device at a single frequency $\omega_m$ with an amplitude $\delta\omega$ around a reference frequency $\bar{\omega}_{T_{01}}$.

Implementations of the first example may include one or more of the following features. Communicating the control signal to the control line may produce, between the tunable qubit device and the fixed-frequency qubit device, an interaction having an effective coupling strength that is based on the modulation frequency. The control signal may be configured to modulate the transition frequency of the tunable qubit device at the modulation frequency about a reference frequency $\bar{\omega}_{T_{01}}$ with a modulation amplitude $\delta\omega$, and communicating the control signal to the control line may produce, between the tunable qubit device and the fixed-frequency qubit device, an interaction having an effective coupling strength $$g_{10\leftrightarrow 01}^{(n)} = g\left|J_n\!\left(\frac{n\delta\omega}{\Delta}\right)\right|$$

where g represents a capacitive coupling strength between the tunable qubit device and the fixed-frequency qubit device, $J_n$ represents a Bessel function of the first kind, n represents a non-zero integer, and $\Delta$ represents the difference between the reference frequency $\bar{\omega}_{T_{01}}$ and the transition frequency of the fixed-frequency qubit device. The control signal may be configured to modulate the transition frequency of the tunable qubit device at the modulation frequency about a reference frequency $\bar{\omega}_{T_{01}}$ with a modulation amplitude $\delta\omega$, and communicating the control signal to the control line may produce, between the tunable qubit device and the fixed-frequency qubit device, an interaction having an effective coupling strength $$g_{11\leftrightarrow 02}^{(n)} = \sqrt{2}\,g\left|J_n\!\left(\frac{n\delta\omega}{\Delta - \bar{\eta}_T}\right)\right|$$

where $\bar{\eta}_T$ represents the average anharmonicity of the tunable qubit device, $J_n$ represents a Bessel function of the first kind, n represents a non-zero integer, and $\Delta$ represents the difference between the reference frequency $\bar{\omega}_{T_{01}}$ and the transition frequency of the fixed-frequency qubit device. The control signal may be configured to modulate the transition frequency of the tunable qubit device at the modulation frequency about a reference frequency $\bar{\omega}_{T_{01}}$ with a modulation amplitude $\delta\omega$, and communicating the control signal to the control line may produce, between the tunable qubit device and the fixed-frequency qubit device, an interaction having an effective coupling strength $$g_{11\leftrightarrow 20}^{(n)} = \sqrt{2}\,g\left|J_n\!\left(\frac{n\delta\omega}{\Delta - \eta_F}\right)\right|$$

where $\eta_1$ represents the anharmonicity of the fixed-frequency qubit device, $J_n$ represents a Bessel function of the first kind, n represents a non-zero integer, and $\Delta$ represents the difference between the reference frequency $\bar{\omega}_{T_{01}}$ and the transition frequency of the fixed-frequency qubit device. The tunable qubit device may include a superconducting circuit loop that defines a flux quantum $\Phi_0$ and receives a first magnetic flux that tunes the transition frequency of the tunable qubit device. The control signal may be configured to modulate the first magnetic flux with a magnetic flux modulation amplitude less than $\Phi_0/2$. The control signal may be configured to modulate the first magnetic flux (e.g., with a magnetic flux modulation amplitude less than, equal to, or greater than $\Phi_0/2$) so as to modulate the transition frequency of the tunable qubit device at a single frequency $\omega_m$ with an amplitude $\delta\omega$ around a reference frequency $\bar{\omega}_{T_{01}}$.

Implementations of the first example may include one or more of the following features. The control signal may be configured to produce an interaction between the tunable qubit device and the fixed-frequency qubit device for a total interaction time $$t_{iSWAP}^{(n)} = \frac{\pi}{2}\frac{1}{|g_{10\leftrightarrow 01}^{(n)}|},$$

where n represents a non-zero integer, and $g_{10\leftrightarrow 01}^{(n)}$ represents the effective coupling between the $|10\rangle$ and $|01\rangle$ states of the tunable qubit device and the fixed-frequency qubit device during the interaction time activated by the n-th harmonics. The control signal may be configured to produce an interaction between the tunable qubit device and the fixed-frequency qubit device for a total interaction time $$t_{\sqrt{iSWAP}}^{(n)} = \frac{\pi}{4}\frac{1}{|g_{10\leftrightarrow 01}^{(n)}|},$$

where n represents a non-zero integer, and $g_{10\leftrightarrow 01}^{(n)}$ represent the effective coupling between the $|10\rangle$ and $|01\rangle$ states of the tunable qubit device and the fixed-frequency qubit device during the interaction time activated by the n-th harmonics. The control signal may be configured to produce an interaction between the tunable qubit device and the fixed-frequency qubit device for a total interaction time $$t_{CZ20}^{(n)} = \pi\frac{1}{|g_{11\leftrightarrow 20}^{(n)}|},$$

where n represents a non-zero integer, and $g_{11\leftrightarrow 20}^{(n)}$ represents the effective coupling between the $|11\rangle$ and $|20\rangle$ states of the tunable qubit device and the fixed-frequency qubit device during the interaction time activated by the n-th harmonics. The control signal may be configured to produce an interaction between the tunable qubit device and the fixed-frequency qubit device for a total interaction time $$t_{CZ02}^{(n)} = \pi\frac{1}{|g_{11\leftrightarrow 02}^{(n)}|},$$

where n represents a non-zero integer, and $g_{11\leftrightarrow 20}^{(n)}$ represents the effective coupling between $|11\rangle$ and $|02\rangle$ states of the tunable qubit device and the fixed-frequency qubit device during the interaction time activated by the n-th harmonics. The control signal may be configured to produce an interaction between the tunable qubit device and the fixed-frequency qubit device for a total interaction time $$t_{BR}^{(n)} = \pi\frac{1}{|g_{00\leftrightarrow 11}^{(n)}|},$$

where n represents a non-zero integer, and $g_{00\leftrightarrow 11}^{(n)}$ represents the effective coupling between $|00\rangle$ and $|11\rangle$ states of the tunable qubit device and the fixed-frequency qubit device during the interaction time activated by the n-th harmonics.

Implementations of the first example may include one or more of the following features. Communicating the control signal to the control line produces, between the tunable qubit device and the fixed-frequency qubit device, an interaction having an effective coupling strength $$g^{(n)}_{10\leftrightarrow01} = \bar{g}_{11} \left| \sum_{\substack{\{l_k \in Z\} \\ \sum_{k=1}^{\infty} kl_k = n}} \prod_{k=1}^{\infty} J_{l_k}\left[\frac{n\omega_{T_{01}}^{(2k)}}{k}\right] \right|$$

where $\bar{g}_{11}$ represents an average value of a capacitive coupling strength between the tunable qubit device and the fixed-frequency qubit device during a time period of the interaction, $J_{l_k}$ represents an $l_k$-th order Bessel function of the first kind, r and k represent non-zero integers, $l_k$ represents integers, $\omega_{T_{02}}^{(2k)}$ represents a Fourier series expansion of the $|0\rangle_T \rightarrow |1\rangle_T$ transition frequency of the tunable qubit device, and $\Delta$ represents the difference between a reference frequency and the transition frequency of the fixed-frequency qubit device. Communicating the control signal to the control line produces, between the tunable qubit device and the fixed-frequency qubit device, an interaction having an effective coupling strength $$g^{(n)}_{11\leftrightarrow02} = \bar{g}_{12} \left| \sum_{\substack{\{l_k \in Z\} \\ \sum_{k=1}^{\infty} kl_k = n}} \prod_{k=1}^{\infty} J_{l_k}\left[\frac{n\omega_{T_{12}}^{(2k)}}{k(\Delta - \bar{\eta}_T)}\right] \right|$$

where $\bar{\eta}_T$ represents an average anharmonicity of the tunable qubit device, $\bar{g}_{12}$ represents an average value of a capacitive coupling strength between the tunable qubit device and the fixed-frequency qubit device during a time period of the interaction, $J_{l_k}$ represents an $l_k$-th order Bessel function of the first kind, n and k represent non-zero integers, $l_k$ represents integers, $\omega_{T_{02}}^{(2k)}$ represents a Fourier series expansion of the $|1\rangle_T \rightarrow |2\rangle_T$ transition frequency of the tunable qubit device, and $\Delta$ represents the difference between a reference frequency and the transition frequency of the fixed-frequency qubit device. Communicating the control signal to the control line produces, between the tunable qubit device and the fixed-frequency qubit device, an interaction having an effective coupling strength $$g^{(n)}_{11\leftrightarrow20} = \bar{g}_{21} \left| \sum_{\substack{\{l_k \in Z\} \\ \sum_{k=1}^{\infty} kl_k = n}} \prod_{k=1}^{\infty} J_{l_k}\left[\frac{n\omega_{T_{01}}^{(2k)}}{k(\Delta + \eta_F)}\right] \right|$$

where $\eta_F$ represents the anharmonicity of the fixed-frequency qubit device, $\bar{g}_{21}$ represents an average value of a capacitive coupling strength between the tunable qubit device and the fixed-frequency qubit device during a time period of the interaction, $J_{l_k}$ represents an $l_k$-th order Bessel function of the first kind, n and k represent non-zero integers, $l_k$ represents integers, $\omega_{T_{01}}^{(2k)}$ represents a Fourier series expansion of the $|0\rangle_T \rightarrow |1\rangle_T$ transition frequency of the tunable qubit device, and $\Delta$ represents the difference between a reference frequency and the transition frequency of the fixed-frequency qubit device. Communicating the control signal to the control line produces, between the tunable qubit device and the fixed-frequency qubit device, an interaction having an effective coupling strength $$g^{(n)}_{00\leftrightarrow11} = \bar{g}_{11} \left| \sum_{\substack{\{l_k \in Z\} \\ \sum_{k=1}^{\infty} kl_k = n}} \prod_{k=1}^{\infty} J_{l_k}\left[\frac{n\omega_{T_{01}}^{(2k)}}{k\Sigma}\right] \right|$$

where $\bar{g}_{11}$ represents an average value of a capacitive coupling strength between the tunable qubit device and the fixed-frequency qubit device during a time period of the interaction, $J_{l_k}$ represents an $l_k$-th order Bessel function of the first kind, n and k represent non-zero integers, $l_k$ represents integers, $\omega_{T_{01}}^{(2k)}$ represents a Fourier series expansion of the $|0\rangle_T \rightarrow |1\rangle_T$ transition frequency of the tunable qubit device, and $\Sigma$ represents the sum of a reference frequency and the transition frequency of the fixed-frequency qubit device.

Implementations of the first example may include one or more of the following features. The tunable qubit device may include a superconducting circuit loop that receives a first magnetic flux that tunes the transition frequency of the tunable qubit device, and the control line may include a flux-bias device that is inductively coupled to the superconducting circuit loop to control the first magnetic flux. The control signal may cause the flux-bias device to modulate the first magnetic flux at a flux modulation frequency. The superconducting circuit loop may include two Josephson junctions, and the tunable qubit device may include a capacitor structure in parallel with each of the two Josephson junctions. The transition frequency of the tunable qubit device may be defined at least in part by Josephson energies of the two Josephson junctions and a capacitance of the capacitor structure. Generating the control signal to modulate the transition frequency of the tunable qubit device at the modulation frequency may include generating the control signal to modulate the first magnetic flux at half the modulation frequency. Generating the control signal to modulate the transition frequency of the tunable qubit device at the modulation frequency may include generating the control signal to modulate the first magnetic flux at the modulation frequency. The fixed-frequency qubit device may include a single Josephson junction, and the transition frequency of the fixed-frequency qubit device may be defined at least in part by a Josephson energy of the Josephson junction.

Implementations of the first example may include one or more of the following features. The method may include determining the modulation frequency based on an average transition frequency of the tunable qubit device under the modulation produced by communicating the control signal to the control line. The transition frequency of the tunable qubit device may correspond to the energy difference between the ground state $|0\rangle_T$ of the tunable qubit device and the first excited state $|1\rangle_T$ of the tunable qubit device. The transition frequency of the fixed-frequency qubit device may correspond to the energy difference between the ground state $|0\rangle_F$ of the fixed-frequency qubit device and the first excited state $|1\rangle_F$ of the fixed-frequency qubit device. The transition frequency of the fixed-frequency qubit device may correspond to the energy difference between the first excited state $|1\rangle_F$ of the fixed-frequency qubit device and the second excited state $|2\rangle_F$ of the fixed-frequency qubit device. The tunable qubit device may be implemented as tunable transmon qubit device, a flux qubit device, a flatsonium qubit device, or a fluxonium qubit device. The fixed-frequency qubit device may include a fixed-frequency transmon device.

Implementations of the first example may include one or more of the following features. The control signal can be a first control signal, the modulation frequency can be a first modulation frequency, the fixed-frequency qubit device can be a first fixed-frequency qubit device, the two-qubit quantum logic gate can be a first two-qubit quantum logic gate, the pair of qubits can be a first pair of qubits, and the method may include: generating a second control signal configured to modulate the transition frequency of the tunable qubit device at a second modulation frequency, the second modulation frequency being determined based on a transition frequency of a second fixed-frequency qubit device in the quantum processor, the transition frequency of the second fixed-frequency qubit device being independent of a magnetic flux experienced by the second fixed-frequency qubit device; and applying a second two-qubit quantum logic gate to a second pair of qubits in the quantum processor by communicating the second control signal to the control line coupled to the tunable qubit device, the second pair of qubits including the second qubit defined by the tunable qubit device and a third qubit defined by the second fixed-frequency qubit device.

In a second example, a quantum information control method for performing quantum logic gates in a quantum computing system includes: generating a first control signal configured to modulate, at a first modulation frequency, a transition frequency of a tunable qubit device in a quantum processor, the first modulation frequency being determined based on a transition frequency of a first qubit device in the quantum processor; applying a first two-qubit quantum logic gate to a first pair of qubits in the quantum processor by communicating the first control signal to a control line coupled to the tunable qubit device, the first pair of qubits comprising a first qubit defined by the first qubit device and a second qubit defined by the tunable qubit device; generating a second control signal configured to modulate, at a second modulation frequency, the transition frequency of the tunable qubit device, the second modulation frequency being determined based on a transition frequency of a second qubit device in the quantum processor; and applying a second two-qubit quantum logic gate to a second pair of qubits in the quantum processor by communicating the second control signal to a control line coupled to the second qubit device, the first pair of qubits comprising a first qubit defined by the first qubit device and a second qubit defined by the second qubit device.

In a third example, a quantum computing method includes: identifying a two-qubit quantum logic gate to be applied to a pair of qubits defined in a qubit device array, the pair of qubits comprising: a first qubit defined by a first qubit device in the qubit device array; and a second qubit defined by a tunable qubit device in the qubit device array, wherein the tunable qubit device neighbors the first qubit device and a third qubit device in the qubit device array; and applying the two-qubit quantum logic gate to the pair of qubits by communicating a control signal to a control line coupled to the tunable qubit device, the control signal configured to modulate a transition frequency of the tunable qubit device at a modulation frequency, the modulation frequency being determined based on a transition frequency of the first qubit device.

Implementations of the third example may include one or more of the following features. The first qubit device may be a tunable qubit device. The first qubit device may be a fixed-frequency qubit device. The third qubit device may be a tunable qubit device. The third qubit device may be a fixed-frequency qubit device. The two-qubit quantum logic gate can be a first two-qubit quantum logic gate, the pair of qubits can be a first pair of qubits, the control signal can be a first control signal, the modulation frequency can be a first modulation frequency, and the method may include: identifying a second two-qubit quantum logic gate to be applied to a second pair of qubits defined in the qubit device array, the second pair of qubits being the second qubit and a third qubit defined by the third qubit device; and applying the second two-qubit quantum logic gate to the second pair of qubits by communicating a second control signal to the control line coupled to the tunable qubit device, the second control signal configured to modulate the transition frequency of the tunable qubit device at a second modulation frequency, the second modulation frequency being determined based on a transition frequency of the third qubit device.

In a fourth example, a method of performing a quantum logic gate in a quantum computing system includes identifying a pair of qubits defined in a quantum processor, the pair of qubits being a first qubit defined by a first qubit device in the quantum processor and a second qubit defined by a tunable qubit device in the quantum processor; and applying a quantum logic gate to the pair of qubits by communicating a control signal to a control line coupled to the tunable qubit device, the control signal configured to modulate a transition frequency of the tunable qubit device at a modulation frequency, the modulation frequency being determined based on a transition frequency of the first qubit device, wherein the quantum logic gate includes at least one of a single-photon gate or a two-photon gate.

Implementations of the fourth example may include one or more of the following features. The quantum logic gate may include at least one of an iSWAP gate, a square-root-of-iSWAP gate or a controlled-Z gate. The quantum logic gate may include a Bell-Rabi gate. The first qubit device may be a tunable qubit device. The first qubit device may be a fixed-frequency qubit device.

In a fifth example, a quantum computing system includes: a quantum processor that includes a tunable qubit device and another qubit device; and a control system communicably coupled to the quantum processor and configured to perform one or more of the operations of any of the methods of the first, second, third, or fourth examples.

In a sixth example, a quantum computing system includes a quantum processor comprising a qubit device array, the qubit device array comprising a tunable qubit device and a plurality of other qubit devices that neighbor the tunable qubit device in the qubit device array; and a control system communicably coupled to the quantum processor and configured to perform operations comprising: identifying a quantum logic gate to be applied to a pair of qubits, the pair of qubits comprising a first qubit defined by a first qubit device that neighbors the tunable qubit device in the qubit device array and a second qubit defined by the tunable qubit device; and applying the quantum logic gate to the pair of qubits in the qubit device array by communicating a control signal to a control line coupled to the tunable qubit device, the control signal configured to modulate a transition frequency of the tunable qubit device at a modulation frequency.

Implementations of the fifth and sixth examples may include one or more of the following features. The system may include a filter between the quantum processor and the control system, wherein the filter may be configured to suppress at least one range of frequencies in the control signal communicated to the control line.

In a seventh example, a method includes obtaining qubit device design parameters for a plurality of qubit devices, the plurality of qubit devices comprising a fixed-frequency qubit device and a tunable qubit device; obtaining a quantum processor circuit design criterion associated with a two-qubit quantum logic gate; determining, based on the qubit device design parameters and by operation of one or more processors, an operating parameter for at least one of the plurality of qubit devices under an operating condition, the operating condition comprising a flux modulation applied to the tunable qubit device; determining that the operating parameter meets the quantum processor circuit design criterion associated with the two-qubit quantum logic gate; and providing the qubit device design parameters for a quantum processor circuit specification.

Implementations of the seventh example may include one or more of the following features. The tunable qubit device may include a superconducting circuit loop that defines a flux quantum $\Phi_0$ and receives a first magnetic flux that tunes a transition frequency of the tunable qubit device, and the flux modulation may include a modulation of the first magnetic flux at a modulation frequency. The fixed-frequency qubit device can be a first fixed-frequency qubit device, and the plurality of qubit devices may include: the tunable qubit device; and a plurality of fixed-frequency qubit devices capacitively coupled to the tunable qubit device, wherein the plurality of fixed-frequency qubit devices includes the first fixed-frequency qubit device. Obtaining the qubit device design parameters may include specifying the qubit device design parameters such that each of the fixed-frequency qubit devices has a distinct qubit frequency. Obtaining the qubit device design parameters may include specifying the qubit device design parameters such that a specified qubit frequency of the tunable qubit device is distinct from the qubit frequencies of the respective fixed-frequency qubit devices. The specified qubit frequency of the tunable qubit device can be the maximum qubit frequency of the tunable qubit device, the minimum qubit frequency of the tunable qubit device, or an intermediate frequency between the maximum and minimum. Obtaining the qubit device design parameters may include specifying the qubit device design parameters such that the qubit frequencies of the fixed-frequency qubit devices are separated from each other by at least a first minimum frequency difference. Obtaining the qubit device design parameters may include specifying the qubit device design parameters such that the qubit frequencies of the fixed-frequency qubit devices are separated from a qubit frequency of the tunable qubit device by at least a second minimum frequency difference. The qubit device design parameters may include: one or more qubit frequencies and an anharmonicity for the tunable qubit device; qubit frequencies for the respective fixed-frequency qubit devices; and anharmonicities for the respective fixed-frequency qubit devices.

Implementations of the seventh example may include one or more of the following features. Determining the operating parameter may include computing an effective coupling strength between the fixed-frequency qubit device and the tunable qubit device under the operating condition; and determining that the operating parameter meets the quantum processor circuit design criterion includes determining that the computed effective coupling strength is greater than a minimum effective coupling strength. The quantum processor circuit design criterion can be a first quantum processor circuit design criterion, and the method may include: obtaining a second quantum processor circuit design criterion associated with the two-qubit quantum logic gate; determining, for a range of flux modulation amplitude, a maximum gradient of tunable qubit frequency versus flux modulation amplitude for the tunable qubit device; and determining that the maximum gradient meets the second quantum processor circuit design criterion. The second quantum processor design criterion may include a minimum gradient of tunable qubit frequency versus magnetic flux, and the minimum gradient can be equivalent to 0.9 GigaHertz per flux quantum. The quantum processor circuit design criterion can be a first quantum processor circuit design criterion, and the method may include: obtaining a second quantum processor circuit design criterion associated with the two-qubit quantum logic gate; determining dispersive shifts for the tunable qubit device and respective fixed-frequency qubit devices; determining a sum of the dispersive shifts; and determining that the sum meets the second quantum processor circuit design criterion.

Implementations of the seventh example may include one or more of the following features. The method may include an iterative process, and each iteration of the iterative process may include: obtaining a current set of qubit device design parameters for the plurality of qubit devices; determining, based on the current set of qubit device design parameters and by operation of one or more processors, a current operating parameter for at least one of the plurality of qubit devices under the operating condition; and evaluating whether the current operating parameter meets the quantum processor circuit design criterion associated with the two-qubit quantum logic gate. Each iteration may include: if the current operating parameter does not meet the quantum processor circuit design criterion, determining an updated set of qubit device design parameters for the next iteration of the iterative process; and if the current operating parameter does meet the quantum processor circuit design criterion and one or more other quantum processor circuit design criteria, providing the qubit device design parameters for the quantum processor circuit specification. The fixed-frequency qubit device can be a first fixed-frequency qubit device, and the plurality of qubit devices may include: the tunable qubit device; and a plurality of fixed-frequency qubit devices coupled to the tunable qubit device, wherein the plurality of fixed-frequency qubit devices includes the first fixed-frequency qubit device. Each iteration of the iterative process may include computing detunings between a qubit frequency of the tunable qubit device and respective qubit frequencies of the fixed-frequency qubit devices; and evaluating whether the detunings are distinct from one another. Each iteration of the iterative process may include: computing the difference between the detunings for the first fixed-frequency qubit device and a second fixed-frequency qubit device; obtaining a first target effective coupling strength for an interaction between the first fixed-frequency qubit device and the tunable qubit device; obtaining a second target effective coupling strength for an interaction between the second fixed-frequency qubit device and the tunable qubit device; and evaluating whether the difference between the detunings is greater than the first and second target effective coupling strengths.

In an eighth example, a computer system includes: one or more processors; and memory storing instructions that are operable when executed by the one or more processors to perform one or more operations of any of the methods of the seventh example.

In a ninth example, a method includes obtaining qubit device parameters for a plurality of qubit devices in a quantum processor circuit, the plurality of qubit devices comprising a fixed-frequency qubit device and a tunable qubit device; and based on the qubit device parameters, selecting gate parameters of a two-qubit quantum logic gate for application to a pair of qubits defined by the fixed-frequency qubit device and the tunable qubit device, wherein selecting the gate parameters includes selecting parameters of a control signal for delivery to a control line coupled to the tunable qubit device, and the gate parameters correspond to: a modulation amplitude of a flux modulation produced by the control signal; and a modulation frequency of the flux modulation produced by the control signal.

Implementations of the ninth example may include one or more of the following features. The method may include determining the modulation frequency based on the sum or the difference of: the transition frequency of the tunable qubit device, and the transition frequency of the fixed-frequency qubit device. The modulation frequency may be determined based on the transition frequency of the fixed-frequency qubit device and the transition frequency of the tunable qubit device.

Implementations of the ninth example may include one or more of the following features. The modulation frequency may be determined based on the transition frequency of the fixed-frequency qubit device and the anharmonicity of the tunable qubit device. The modulation frequency may be determined based on the transition frequency between the ground state and first excited state of the fixed-frequency qubit device. The modulation frequency may be determined based on the transition frequency between the first excited state and second excited state of the fixed-frequency qubit device.

Implementations of the ninth example may include one or more of the following features. The modulation frequency may be determined based on the transition frequency of the tunable qubit device and the anharmonicity of the fixed-frequency qubit device. The modulation frequency may be determined based on the transition frequency between the ground state and first excited state of the tunable qubit device. The modulation frequency may be determined based on the transition frequency between the first excited state and second excited state of the tunable qubit device.

Implementations of the ninth example may include one or more of the following features. The fixed-frequency qubit device is a first fixed-frequency qubit device, and the plurality of qubit devices may include: the tunable qubit device; and a plurality of fixed-frequency qubit devices capacitively coupled to the tunable qubit device, wherein the plurality of fixed-frequency qubit devices includes the first fixed-frequency qubit device. The qubit device parameters include: one or more qubit frequencies and an anharmonicity for the tunable qubit device; qubit frequencies for the respective fixed-frequency qubit devices; and anharmonicities for the respective fixed-frequency qubit devices.

In a tenth example, a method includes: obtaining operating parameters for one or more of a plurality of qubit devices in a quantum processor circuit, the plurality of qubit devices comprising a fixed-frequency qubit device and a tunable qubit device, the operating parameters based on measurements of the quantum processor circuit under an operating condition, the operating condition comprising a flux modulation applied to the tunable qubit device; and based on the operating parameters, selecting gate parameters of a two-qubit quantum logic gate for application to a pair of qubits defined by the fixed-frequency qubit device and the tunable qubit device.

Implementations of the tenth example may include one or more of the following features. The operating parameters may include an effective coupling strength between the qubit devices during the flux modulation. The operating parameters may include a transition frequency shift of the tunable qubit device under the flux modulation. The operating parameters can be obtained for a range of modulation amplitude of the flux modulation.

Implementations of the tenth example may include one or more of the following features. Selecting gate parameters may include selecting initial gate parameters, and the method may include generating refined gate parameters from the initial gate parameters. The refined gate parameters can be generated based on spectroscopic measurements of the two-qubit quantum logic gate applied to the quantum processor circuit.

Implementations of the tenth example may include one or more of the following features. The gate parameters may include a flux modulation amplitude and a flux modulation frequency. The method may include selecting a filter for a flux modulation control line based on the flux modulation frequency.

In an eleventh example, a method includes: obtaining measurements of a coherence time of a qubit defined by a tunable qubit device in a quantum processor circuit comprising a plurality of qubit devices, the plurality of qubit devices comprising a fixed-frequency qubit device coupled to the tunable qubit device, the measurements representing values of the coherence time during a flux modulation applied to the tunable qubit device, the measurements corresponding to a range of modulation amplitudes of the flux modulation; based on the measurements, identifying a modulation amplitude control value associated with a maximum coherence time of the qubit; and based on the identified modulation amplitude control value, selecting a gate parameter of a two-qubit quantum logic gate for the fixed-frequency qubit device and the tunable qubit device.

Implementations of the eleventh example may include one or more of the following features. The tunable qubit device may include a superconducting circuit loop that defines a flux quantum $\Phi_0$ and receives a first magnetic flux that tunes a transition frequency of the tunable qubit device, and the flux modulation may include a modulation of the first magnetic flux at a modulation frequency. The modulation amplitude control value may represent a voltage amplitude of a control signal that produces the modulation of the first magnetic flux. The modulation amplitude control value may correspond to a flux modulation amplitude between $0.45\Phi_0$ and $0.65\Phi_0$. The fixed-frequency qubit device can be a first fixed-frequency qubit device, and the plurality of qubit devices may include: the tunable qubit device; and a plurality of fixed-frequency qubit devices each capacitively coupled to the tunable qubit device, wherein the plurality of fixed-frequency qubit devices includes the first fixed-frequency qubit device.

Implementations of the eleventh example may include one or more of the following features. Identifying the modulation amplitude control value may include identifying a first modulation amplitude control value corresponding to the maximum measurement of the coherence time. The gate parameters may include the first modulation amplitude control value. The tunable qubit device may include a superconducting circuit loop that defines a flux quantum; the first modulation amplitude control value may correspond to a first flux modulation amplitude; and the gate parameters may include a second modulation amplitude control value that corresponds to a second flux modulation amplitude, wherein the magnitude of difference between the first flux modulation amplitude and the second flux modulation amplitude is less than 0.1 of the flux quantum. The method may include: after identifying the first modulation amplitude, obtaining spectroscopic measurements of the two-qubit quantum logic gate applied to a pair of qubits defined by the fixed-frequency qubit device and the tunable qubit device; and identifying the second modulation amplitude control value based on the spectroscopic measurements.

Implementations of the eleventh example may include one or more of the following features. The coherence time can be a transverse coherence time $T_2$. The method may include obtaining measurements of a transition frequency shift of the tunable qubit device during a flux modulation applied to the tunable qubit device, the measurements corresponding to a range of modulation amplitudes of the flux modulation, wherein the gate parameters are selected based in part on the measurements of the transition frequency shift.

Implementations of the ninth, tenth, and eleventh examples may include one or more of the following features. Selecting gate parameters of a two-qubit quantum logic gate may include selecting parameters of a control signal for delivery to a control line coupled to the tunable qubit device. The gate parameters may correspond to: a modulation amplitude of a flux modulation produced by the control signal; a modulation frequency of a flux modulation produced by the control signal; and a duration of the control signal. The method may include identifying single-qubit phase corrections for the two-qubit quantum logic gate. Selecting gate parameters of a two-qubit quantum logic gate may include selecting gate parameters of a Bell-Rabi gate, a controlled-Z gate, an iSWAP gate or a square-root-of-iSWAP gate. The method may include benchmarking the two-qubit quantum logic gate based on the selected gate parameters.

In a twelfth example, a method includes: obtaining measurements of a quantum processor circuit comprising a plurality of qubit devices, the plurality of qubit devices comprising a fixed-frequency qubit device and a tunable qubit device; based on the measurements and by operation of one or more processors, computing multiple distinct gate conditions for applying a two-qubit quantum logic gate to a pair of qubits defined by the fixed-frequency qubit device and the tunable qubit device; identifying one or more of the distinct gate conditions that satisfy an operating criterion associated with the two-qubit quantum logic gate; and based on the one or more gate conditions that satisfy the operating criterion, selecting gate parameters for the two-qubit quantum logic gate.

Implementations of the twelfth example may include one or more of the following features. The method may include identifying resonant conditions for a plurality of transitions to be suppressed in the quantum processor circuit during application of the two-qubit quantum logic gate, wherein the one or more gate conditions that satisfy the operating criterion are identified based on avoiding the resonant conditions. Identifying one or more of the distinct gate conditions that satisfy the operating criterion may include identifying a gate condition that is at least a minimum distance, in a modulation frequency and modulation amplitude domain, from resonant conditions of transitions to be suppressed in the quantum processor circuit during application of the two-qubit quantum logic gate. The tunable qubit device may include a superconducting circuit loop that defines a flux quantum 4, and receives a first magnetic flux that tunes a transition frequency of the tunable qubit device, and applying the two-qubit quantum logic gate may include modulating the first magnetic flux at a modulation frequency. Obtaining measurements of the quantum processor circuit may include obtaining measurements of a mean transition frequency of the tunable qubit device during a flux modulation applied to the tunable qubit device, the measurements of the mean transition frequency corresponding to a range of modulation amplitudes of the flux modulation. The gate parameters may be selected based in part on the measurements of the mean transition frequency.

Implementations of the twelfth example may include one or more of the following features. The multiple distinct gate conditions are computed for a range of modulation amplitudes, and each distinct gate condition includes: a modulation amplitude of a flux modulation; a modulation frequency of the flux modulation; and a duration of the flux modulation. Identifying one or more of the distinct gate conditions that satisfy an operating criterion associated with the two-qubit quantum logic gate may include identifying the gate condition that includes the minimum duration.

Implementations of the twelfth example may include one or more of the following features. The method may include: based on the measurements and by operation of one or more processors, computing a first plurality of distinct gate conditions for applying a first type of two-qubit quantum logic gate to the pair of qubits; identifying one or more of the first plurality of distinct gate conditions that satisfy an operating criterion associated with the first type of two-qubit quantum logic gate; and based on the measurements and by operation of one or more processors, computing a second plurality of distinct gate conditions for applying a second type of two-qubit quantum logic gate to the pair of qubits; identifying one or more of the second plurality of distinct gate conditions that satisfy an operating criterion associated with the second type of two-qubit quantum logic gate; selecting either the first type of two-qubit quantum logic gate or the second type of two-qubit quantum logic gate; and selecting gate parameters for the selected type of two-qubit quantum logic gate.

Implementations of the twelfth example may include one or more of the following features. The method may include identifying one or more of the distinct gate conditions that satisfy multiple operating criteria associated with the two-qubit quantum logic gate. Each of distinct gate conditions may include a modulation frequency that is based on: a transition frequency of the tunable qubit device; and a transition frequency of the fixed-frequency qubit device. Each of the distinct gate conditions may include a modulation amplitude, and the modulation frequency in each gate condition may be based on a transition frequency shift of the tunable qubit device under the modulation amplitude included in the gate condition.

Implementations of the twelfth example may include one or more of the following features. Selecting gate parameters of a two-qubit quantum logic gate may include selecting parameters of a control signal for delivery to a control line coupled to the tunable qubit device, and the gate parameters correspond to: a modulation amplitude of a flux modulation produced by the control signal; a modulation frequency of the flux modulation produced by the control signal; and a duration of the control signal. The method may include identifying single-qubit phase corrections for the two-qubit quantum logic gate.

Implementations of the twelfth example may include one or more of the following features. Selecting gate parameters of a two-qubit quantum logic gate may include selecting gate parameters of a Bell-Rabi gate, a controlled-Z gate, an iSWAP gate or a square-root-of-iSWAP gate. The method may include benchmarking the two-qubit quantum logic gate based on the selected gate parameters.

In a thirteenth example, a quantum computing system includes: a quantum processor circuit comprising a plurality of qubit devices, the plurality of qubit devices comprising a fixed-frequency qubit device coupled to a tunable qubit device; and a control system communicably coupled to the processor circuit and operable to perform one or more operations of any of the methods of the ninth, tenth, eleventh or twelfth examples.

In a fourteenth example, a computer system includes: one or more processors; and memory storing instructions that are operable when executed by the one or more processors to perform one or more operations of any of the methods of the ninth, tenth, eleventh or twelfth examples.

Some of the subject matter and operations described in this specification can be implemented in digital electronic circuitry or quantum processor circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media.

Some of the operations described in this specification can be implemented as operations performed by a data processing apparatus on data stored on one or more computer-readable storage devices or received from other sources.

The term "data-processing apparatus" encompasses all kinds of apparatus, devices, and machines for processing data, including by way of example a programmable processor, a classical or quantum computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit), quantum information processing circuitry, or other types of systems.

Processors suitable for the execution of a computer program include, by way of example, both general and special purpose microprocessors, quantum information processors, and processors of any kind of digital or quantum computer. Elements of a computer can include a processor that performs actions in accordance with instructions, and one or more memory devices that store the instructions and data. A computer may also include, or be operatively coupled to receive data from or transfer data to, or both, one or more mass storage devices for storing data, e.g., magnetic disks, magneto optical disks, or optical disks. However, a computer need not have such devices. Moreover, a computer can be embedded in another device. Devices suitable for storing computer program instructions and data include all forms of non-volatile memory, media and memory devices, including by way of example quantum memory systems, semiconductor memory devices (e.g., EPROM, EEPROM, flash memory devices, and others), etc. In some cases, the processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending data to and receiving data from a device that is used by the user; for example, by exchanging network packets with the device.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of embodiments have been described. Nevertheless, it will be understood that various modifications can be made. Accordingly, other embodiments are within the scope of the following claims.

LIST OF VARIABLES $\omega_{T_{01}}(t)$ the $|1\rangle_T \to |1\rangle_T$ transition frequency of a frequency-tunable qubit $\eta_T(t)$ the anharmonicity of a frequency-tunable qubit $\bar{\omega}_{T_{01}}$ the average value of the $|0\rangle_T \to |1\rangle_T$ transition frequency of a frequency-tunable qubit $\bar{\eta}_T(t)$ the average anharmonicity of a frequency-tunable qubit $\omega_{T_{01}}^{(2k)}$ the Fourier series of the $|0\rangle_T \to |1\rangle_T$ transition frequency of a frequency-tunable qubit $\omega_{T_{12}}^{(2k)}$ a Fourier series expansion of the $|1\rangle_T \to |2\rangle_T$, transition frequency of the tunable-frequency qubit device $\omega_{F_{01}}$ the $|0\rangle_F \to |1\rangle_F$ transition frequency of a fixed-frequency qubit $\omega_3$ the $|0\rangle \to |1\rangle$ transition frequency of a fixed-frequency qubit $\eta_F$ the anharmonicity of a fixed-frequency qubit $\eta_3$ the anharmonicity of a fixed-frequency qubit $\Phi$ the total flux threading through the SQUID loop of the frequency-tunable qubit $\Phi_p = \Phi_{dc}$ the parking magnetic flux (DC) threading the SQUID loop $\Phi_m = \Phi_{ac}$ the modulation flux amplitude (AC) threading the SQUID loop $\phi_m$ the phase of the flux modulation signal threading the SQUID loop $\varphi_m$ the phase of the qubit frequency modulation $\omega_m$ the modulation frequency of the frequency-tunable qubit $\omega_{fl}$ the modulation frequency of AC flux applied to the SQUID loop $\delta\omega_m$ the modulation amplitude of the frequency-tunable qubit $f_m = \omega_{fl}/(2\pi)$ the modulation frequency of AC flux applied to the SQUID loop, in Hertz $\Phi_0$ the magnetic flux quantum $\Delta = \bar{\omega}_{T_{01}} - \omega_{F_{01}}$
the frequency difference between the average value of the $|0\rangle_T \to |1\rangle_T$ transition frequency of a frequency-tunable qubit and the $|0\rangle_F \to |1\rangle_F$ transition frequency of a fixed-frequency qubit $\Sigma = \bar{\omega}_{T_{01}} + \omega_{F_{01}}$
the sum of the average value of the $|0\rangle_T \to |1\rangle_T$ transition frequency of a frequency-tunable qubit and the $|0\rangle_F \to |1\rangle_F$ transition frequency of a fixed-frequency qubit $\delta\omega$ frequency shift of the frequency-tunable qubit from its parking frequency as a result of modulation in the small modulation amplitude regime $\omega^{(0)} = \bar{\omega}_{T_{01}}$
the average value of the $|0\rangle_T \to |1\rangle_T$ transition frequency of a frequency-tunable qubit $\omega^{(2)} = \delta\omega_m$
the modulation amplitude of the frequency-tunable qubit, which is the same as the frequency shift $\delta\omega$ due to modulation for small flux modulation amplitude ($\Phi_m \lesssim \Phi_0/2$)

g the coupling strength between a tunable qubit the $|0\rangle_F \to |1\rangle_F$ transition energy of the fixed frequency qubit and $|0\rangle_T \to |1\rangle_T$ transition energy of the frequency-tunable qubit $g_{ij}(t)\{i,j=1,2\}$
coupling between the transitions of the frequency-tunable and fixed-frequency qubits $\bar{g}_{ij}(t)\{i,j=1,2\}$
the average coupling between the transitions of the frequency-tunable and fixed-frequency qubits $g_{10 \leftrightarrow 01}$ effective coupling between 10 and 01 states of the two-qubit system as a result of flux (AC) modulation $g_{11 \leftrightarrow 02}$ effective coupling between 11 and 02 states the two-qubit system as a result of flux (AC) modulation $g_{11 \leftrightarrow 20}$ effective coupling between $|11\rangle$ and $|20\rangle$ states the two-qubit system as a result of flux (AC) modulation $g_{00 \leftrightarrow 11}$ effective coupling between $|00\rangle$ and $|11\rangle$ states the two-qubit system as a result of flux (AC) modulation $g_{12 \leftrightarrow 21}$ effective coupling between $|12\rangle$ and $|21\rangle$ states the two-qubit system as a result of flux (AC) modulation $g_{11 \leftrightarrow 22}$ effective coupling between $|11\rangle$ and $|22\rangle$ states the two-qubit system as a result of flux (AC) modulation $g_{10 \leftrightarrow 01}^{(n)}$ effective coupling between $|10\rangle$ and $|01\rangle$ states of the two-qubit system activated by the nth harmonic, with n being positive integers $g_{11 \leftrightarrow 02}^{(n)}$ effective coupling between $|11\rangle$ and $|02\rangle$ states of the two-qubit system activated by the nth harmonic, with n being positive integers $g_{11 \leftrightarrow 20}^{(n)}$ effective coupling between $|11\rangle$ and $|20\rangle$ states of the two-qubit system activated by the nth harmonic, with n being positive integers $g_{00 \leftrightarrow 11}^{(n)}$ effective coupling between $|00\rangle$ and $|11\rangle$ states of the two-qubit system activated by the nth harmonic, with n being positive integers $t_{iSWAP}^{(n)}$ iSWAP gate time activated by the nth harmonic $t_{\sqrt{iSWAP}}^{(n)}$ $\sqrt{iSWAP}$ gate time activated by the nth harmonic $t_{CZ02}^{(n)}$ Controlled-Z gate (CZ02) time activated by the nth harmonic $t_{CZ20}^{(n)}$ Controlled-Z gate (CZ02) time activated by the nth harmonic $t_{BE}^{(n)}$ Bell-Rabi gate time activated by the nth harmonic U a unitary operator $U_{\sqrt{iSWAP}}$ a unitary operator for $\sqrt{iSWAP}$ gate $U_{iSWAP}$ a unitary operator for iSWAP gate $U_{CZ}$ a unitary operator for CZ gate $|0\rangle_T$ the ground state of the frequency-tunable qubit $|1\rangle_T$ the first excited state of the frequency-tunable qubit $|2\rangle_T$ the second excited state of the frequency-tunable qubit $|0\rangle_F$ the ground state of the fixed-frequency qubit $|1\rangle_F$ the first excited state of the fixed-frequency qubit $|2\rangle_F$ the second excited state of the fixed-frequency qubit $E_{J_1}$ Josephson energy of the first (small) junction of the SQUID making the frequency-tunable qubit $E_{J_2}$ Josephson energy of the second (large) junction of the SQUID making the frequency-tunable qubit $E_J = E_{J_1} + E_{J_2}$
total junction energy of the SQUID $E_{J_f}$ Josephson energy of the first junction making the fixed-frequency qubit $E_{J_{eff}}$ effective Josephson energy of a frequency-tunable qubit $E_C$ charging energy of a qubit $C_{J_t}$ intrinsic capacitance of the frequency-tunable qubit $C_{J_f}$ intrinsic capacitance of the fixed-frequency qubit $C_C$ coupling capacitance between the two-qubits r ratio of the junction energies the SQUID junctions $J_n(x)$ the nth Bessel function of the first kind fl floor function $_2F_1$ hypergeometric function $\delta_{ij}$ Dirac delta function $\sigma_i$ lowering operator of a qubit $\sigma_i^\dagger$ raising operator of a qubit

What is claimed is:

1. A method comprising:
    obtaining qubit device design parameters for a plurality of qubit devices, the plurality of qubit devices comprising a fixed-frequency qubit device and a tunable qubit device;

obtaining a quantum processor circuit design criterion associated with a two-qubit quantum logic gate;

determining, based on the qubit device design parameters and by operation of one or more processors, an operating parameter for at least one of the plurality of qubit devices under an operating condition, the operating condition comprising a flux modulation applied to the tunable qubit device, wherein the flux modulation varies the amplitude of a magnetic flux applied to the tunable qubit device over time;

determining that the operating parameter meets the quantum processor circuit design criterion associated with the two-qubit quantum logic gate; and providing the qubit device design parameters for a quantum processor circuit specification.

2. The method of claim 1, wherein the tunable qubit device comprises a superconducting circuit loop that defines a flux quantum $\Phi_0$ and receives a first magnetic flux that tunes a transition frequency of the tunable qubit device, and the flux modulation comprises a modulation of the first magnetic flux at a modulation frequency.

3. The method of claim 1, wherein the fixed-frequency qubit device is a first fixed-frequency qubit device, and the plurality of qubit devices comprises:
the tunable qubit device; and
a plurality of fixed-frequency qubit devices capacitively coupled to the tunable qubit device, wherein the plurality of fixed-frequency qubit devices includes the first fixed-frequency qubit device.

4. The method of claim 3, wherein obtaining the qubit device design parameters comprises specifying the qubit device design parameters such that each of the fixed-frequency qubit devices has a distinct qubit frequency.

5. The method of claim 4, wherein obtaining the qubit device design parameters comprises specifying the qubit device design parameters such that a specified qubit frequency of the tunable qubit device is distinct from the qubit frequencies of the respective fixed-frequency qubit devices.

6. The method of claim 5, wherein the specified qubit frequency of the tunable qubit device is the maximum qubit frequency of the tunable qubit device.

7. The method of claim 5, wherein obtaining the qubit device design parameters comprises specifying the qubit device design parameters such that the qubit frequencies of the fixed-frequency qubit devices are separated from each other by at least a first minimum frequency difference.

8. The method of claim 7, wherein obtaining the qubit device design parameters comprises specifying the qubit device design parameters such that the qubit frequencies of the fixed-frequency qubit devices are separated from a qubit frequency of the tunable qubit device by at least a second minimum frequency difference.

9. The method of claim 3, wherein the qubit device design parameters include:
one or more qubit frequencies and an anharmonicity for the tunable qubit device;
qubit frequencies for the respective fixed-frequency qubit devices; and
anharmonicities for the respective fixed-frequency qubit devices.

10. The method of claim 1, wherein:
determining the operating parameter comprises computing an effective coupling strength between the fixed-frequency qubit device and the tunable qubit device under the operating condition; and
determining that the operating parameter meets the quantum processor circuit design criterion includes determining that the computed effective coupling strength is greater than a minimum effective coupling strength.

11. The method of claim 1, wherein the quantum processor circuit design criterion is a first quantum processor circuit design criterion, and the method comprises:
obtaining a second quantum processor circuit design criterion associated with the two-qubit quantum logic gate;
determining, for a range of flux modulation amplitude, a maximum gradient of tunable qubit frequency versus flux modulation amplitude for the tunable qubit device; and
determining that the maximum gradient meets the second quantum processor circuit design criterion.

12. The method of claim 11, wherein the second quantum processor circuit design criterion includes a minimum gradient of tunable qubit frequency versus magnetic flux, and the minimum gradient is equivalent to 0.9 GigaHertz per flux quantum.

13. The method of claim 1, wherein the quantum processor circuit design criterion is a first quantum processor circuit design criterion, and the method comprises:
obtaining a second quantum processor circuit design criterion associated with the two-qubit quantum logic gate;
determining dispersive shifts for the tunable qubit device and respective fixed-frequency qubit devices;
determining a sum of the dispersive shifts; and
determining that the sum meets the second quantum processor circuit design criterion.

14. The method of claim 1, comprising an iterative process, wherein each iteration of the iterative process comprises:
obtaining a current set of qubit device design parameters for the plurality of qubit devices;
determining, based on the current set of qubit device design parameters and by operation of the one or more processors, a current operating parameter for at least one of the plurality of qubit devices under the operating condition; and
evaluating whether the current operating parameter meets the quantum processor circuit design criterion associated with the two-qubit quantum logic gate.

15. The method of claim 14, wherein each iteration comprises:
if the current operating parameter does not meet the quantum processor circuit design criterion, determining an updated set of qubit device design parameters for the next iteration of the iterative process; and
if the current operating parameter does meet the quantum processor circuit design criterion and one or more other quantum processor circuit design criteria, providing the qubit device design parameters for the quantum processor circuit specification.

16. The method of claim 14, wherein
the fixed-frequency qubit device is a first fixed-frequency qubit device, and the plurality of qubit devices comprises:
the tunable qubit device; and
a plurality of fixed-frequency qubit devices coupled to the tunable qubit device, wherein the plurality of fixed-frequency qubit devices includes the first fixed-frequency qubit device; and
each iteration of the iterative process includes:
computing detunings between a qubit frequency of the tunable qubit device and respective qubit frequencies of the fixed-frequency qubit devices; and evaluating whether the detunings are distinct from one another.

17. The method of claim 16, wherein each iteration of the iterative process further includes:
computing the difference between the detunings for the first fixed-frequency qubit device and a second fixed-frequency qubit device;
obtaining a first target effective coupling strength for an interaction between the first fixed-frequency qubit device and the tunable qubit device;
obtaining a second target effective coupling strength for an interaction between the second fixed-frequency qubit device and the tunable qubit device; and
evaluating whether the difference between the detunings is greater than the first and second target effective coupling strengths.

18. A computer system comprising:
one or more processors; and
memory storing instructions that are operable when executed by the one or more processors to perform operations comprising:
obtaining qubit device design parameters for a plurality of qubit devices, the plurality of qubit devices comprising a fixed-frequency qubit device and a tunable qubit device;
obtaining a quantum processor circuit design criterion associated with a two-qubit quantum logic gate;
determining, based on the qubit device design parameters and by operation of one or more processors, an operating parameter for at least one of the plurality of qubit devices under an operating condition, the operating condition comprising a flux modulation applied to the tunable qubit device, wherein the flux modulation varies the amplitude of a magnetic flux applied to the tunable qubit device over time;
determining that the operating parameter meets the quantum processor circuit design criterion associated with the two-qubit quantum logic gate; and
providing the qubit device design parameters for a quantum processor circuit specification.

19. A method comprising:
obtaining qubit device parameters for a plurality of qubit devices in a quantum processor circuit, the plurality of qubit devices comprising a fixed-frequency qubit device and a tunable qubit device; and
based on the qubit device parameters, selecting gate parameters of a two-qubit quantum logic gate for application to a pair of qubits defined by the fixed-frequency qubit device and the tunable qubit device,
wherein selecting the gate parameters comprises selecting parameters of a control signal for delivery to a control line coupled to the tunable qubit device, and the gate parameters correspond to:
a modulation amplitude of a flux modulation produced by the control signal; and
a modulation frequency of the flux modulation produced by the control signal, wherein the flux modulation varies the amplitude of a magnetic flux applied to the tunable qubit device over time.

20. The method of claim 19, comprising determining the modulation frequency based on the sum or the difference of:
a transition frequency of the tunable qubit device, and
a transition frequency of the fixed-frequency qubit device.

21. The method of claim 20, wherein the modulation frequency is determined based on the transition frequency of the fixed-frequency qubit device and the transition frequency of the tunable qubit device.

22. The method of claim 20, wherein the modulation frequency is determined based on the transition frequency of the fixed-frequency qubit device and an anharmonicity of the tunable qubit device.

23. The method of claim 20, wherein the modulation frequency is determined based on the transition frequency between the ground state and first excited state of the fixed-frequency qubit device.

24. The method of claim 20, wherein the modulation frequency is determined based on the transition frequency between the first excited state and second excited state of the fixed-frequency qubit device.

25. The method of claim 20, wherein the modulation frequency is determined based on the transition frequency of the tunable qubit device and an anharmonicity of the fixed-frequency qubit device.

26. The method of claim 19, wherein the fixed-frequency qubit device is a first fixed-frequency qubit device, and the plurality of qubit devices comprises:
the tunable qubit device; and
a plurality of fixed-frequency qubit devices capacitively coupled to the tunable qubit device, wherein the plurality of fixed-frequency qubit devices includes the first fixed-frequency qubit device.

27. The method of claim 26, wherein the qubit device parameters include:
one or more qubit frequencies and an anharmonicity for the tunable qubit device;
qubit frequencies for the respective fixed-frequency qubit devices; and
anharmonicities for the respective fixed-frequency qubit devices.

* * * * *

UNITED STATES PATENT AND TRADEMARK OFFICE
CERTIFICATE OF CORRECTION

PATENT NO. : 11,108,398 B2  
APPLICATION NO. : 16/663809  
DATED : August 31, 2021  
INVENTOR(S) : Sete et al.

Page 1 of 8

It is certified that error appears in the above-identified patent and that said Letters Patent is hereby corrected as shown below:

On the Title Page

Page 2, Column 1, Line 2, Item (60) delete "62/637,446," and insert -- 62/573,446, -- therefor.

Page 5, Column 2, Line 11, Item (56) delete "Lognitudinal" and insert -- Longitudinal -- therefor.

Page 5, Column 2, Line 14, Item (56) delete "Lognitudinal" and insert -- Longitudinal -- therefor.

Page 5, Column 2, Line 21, Item (56) delete "Logitudinal" and insert -- Longitudinal -- therefor.

In the Specification

Column 4, Lines 9-10, delete "|10) and |01)" and insert -- $|10\rangle$ and $|01\rangle$ -- therefor.

Column 4, Line 12, delete "|10) and |01)" and insert -- $|10\rangle$ and $|01\rangle$ -- therefor.

Column 4, Line 17, delete "|1 >→ |2 >" and insert -- $|1\rangle \rightarrow |2\rangle$ -- therefor.

Column 4, Line 19, delete "|0 >→ |1 >" and insert -- $|0\rangle \rightarrow |1\rangle$ -- therefor.

Column 4, Line 21, delete "|0 >→ |1 >" and insert -- $|0\rangle \rightarrow |1\rangle$ -- therefor.

Column 4, Line 22, delete "|1 >→ |2 >" and insert -- $|1\rangle \rightarrow |2\rangle$ -- therefor.

Column 4, Line 26, delete "|0 >→ |1 >" and insert -- $|0\rangle \rightarrow |1\rangle$ -- therefor.

Signed and Sealed this  
Twenty-third Day of November, 2021

Drew Hirshfeld  
*Performing the Functions and Duties of the*  
*Under Secretary of Commerce for Intellectual Property and*  
*Director of the United States Patent and Trademark Office*

CERTIFICATE OF CORRECTION (continued)  Page 2 of 8
U.S. Pat. No. 11,108,398 B2

Column 7, Line 7, delete "$E_{J_1}, E_{J_s}$," and insert --$E_{J_1}, E_{J_2}$-- therefor.

Column 9, Line 61, delete "$\omega = E/\hbar$)." and insert -- $\omega = E/\hbar$). -- therefor.

Column 12, Line 21, delete "$(\omega_{F_{02}})$," and insert --$(\omega_{F_{01}})$ -- therefor.

Column 12, Line 39, delete "$((\omega_{F_{02}})$," and insert -- $((\omega_{F_{01}})$ -- therefor.

Column 12, Line 41, delete "$((\bar\omega_{F_{02}})$ or $(\bar\omega_{F_{01}} - \bar\eta_T))$.," and insert --$((\bar\omega_{T_{01}})$ or $(\bar\omega_{T_{01}} - \bar\eta_T))$. -- therefor.

Column 13, Line 14, delete "$\omega_{T_{02}}$" and insert -- $\bar\omega_{T_{01}}$ -- therefor.

Column 13, Line 15, delete "$\omega_m = |\bar\omega_{T_{01}} - \omega_{F_{02}}|$.," and insert -- $\omega_m = |\bar\omega_{T_{01}} - \omega_{F_{01}}|$. -- therefor.

Column 13, Line 16, delete "$\omega_m = |\bar\omega_{T_{01}} - \omega_{F_{02}}| = |\Delta|$,," and insert -- $\omega_m = |\bar\omega_{T_{01}} - \omega_{F_{01}}| = |\Delta|$, -- therefor.

Column 13, Line 16, delete "$\bar\omega_{T_{01}} = \omega_{F_{01}}(\Phi_p) + \delta\omega$," and insert -- $\bar\omega_{T_{01}} = \omega_{T_{01}}(\Phi_p) + \delta\omega$ -- therefor.

Column 13, Line 52, delete "$\omega_m = |\bar\omega_{T_{01}} - \omega_{F_{02}} - \bar\eta_T|$," and insert -- $\omega_m = |\bar\omega_{T_{01}} - \omega_{F_{01}} - \bar\eta_T|$, -- therefor.

Column 13, Line 58, delete "$\omega_m = |\bar\omega_{T_{01}} - \omega_{F_{02}} + \eta_F|$," and insert -- $\omega_m = |\bar\omega_{T_{01}} - \omega_{F_{01}} + \eta_F|$ -- therefor.

Column 14, Line 14, delete "$\bar\omega_{R_{01}}$" and insert --$\bar\omega_{T_{01}}$-- therefor.

CERTIFICATE OF CORRECTION (continued)

U.S. Pat. No. 11,108,398 B2

Column 14, Line 14, after "$\omega_m = \bar{\omega}_{T_{01}} + \omega_{F_{01}}$" insert -- . --.

Column 18, Line 22, delete "$\omega_{T_{02}}(t)$" and insert -- $\omega_{T_{01}}(t)$ -- therefor.

Column 19, Lines 3-4, delete "$H = \omega_{F_{01}}|1\rangle\langle 1|\otimes I + (2\omega_{F_{01}} - \eta_1)|2\rangle\langle 2|\otimes I + \omega_{T_{01}}(t) I \otimes |1\rangle\langle 1| + [2\omega_{T_{01}}(t) - \eta_2(t)] I \otimes |2\rangle 2 |$," and insert -- $H = \omega_{F_{01}}|1\rangle\langle 1|\otimes I + (2\omega_{F_{01}} - \eta_1)|2\rangle\langle 2|\otimes I + \omega_{T_{01}}(t) I \otimes |1\rangle\langle 1| + [2\omega_{T_{01}}(t) - \eta_2(t)] I \otimes |2\rangle\langle 2|$ -- therefor.

Column 19, Line 7, delete "$+g\,(\sigma_1 \sigma_2^t + \sigma_1^t \sigma_2 + \sigma_1 \sigma_2 + \sigma_1^t \sigma_2^t)$," and insert -- $+g\,(\sigma_1 \sigma_2^\dagger + \sigma_1^\dagger \sigma_2 + \sigma_1 \sigma_2 + \sigma_1^\dagger \sigma_2^\dagger)$ -- therefor.

Column 19, Line 31, after "form", delete "$\rangle$".

Column 19, Line 36, delete "$U = \exp[-1 \int_0^t dt' H_0(t')]$," and insert

-- $U = \exp[-i \int_0^t dt' H_0(t')]$ -- therefor.

Column 19, Line 37, delete "$g(\sigma_1 \sigma_2 + \sigma_1^t \sigma_2^t))$," and insert -- $g(\sigma_1 \sigma_2 + \sigma_1^\dagger \sigma_2^\dagger))$ -- therefor.

Column 21, Line 33, delete "$|0\rangle \rightarrow |10\rangle$," and insert -- $|01\rangle \rightarrow |10\rangle$ -- therefor.

Column 21, Line 55, delete "$\Delta = \bar{\omega}_{T_{01}} - \omega_{T_{01}}$" and insert -- $\Delta = \bar{\omega}_{T_{01}} - \omega_{F_{01}}$ -- therefor.

Column 23, Line 3, delete "$g(\sigma_1 \sigma_2 + \sigma_1^t \sigma_2^t)$," and insert -- $g(\sigma_1 \sigma_2 + \sigma_1^\dagger \sigma_2^\dagger)$ -- therefor.

Column 23, Lines 6-8, delete

"$H_I = g_{00 \leftrightarrow 11}|00\rangle\langle 11| + g_{01 \leftrightarrow 12}|01\rangle\langle 12| + g_{10 \leftrightarrow 21}|10\rangle\langle| + g_{11 \leftrightarrow 22}|11\rangle\langle 22| + H.c$" and insert

CERTIFICATE OF CORRECTION (continued)

$$H_I = g_{00\leftrightarrow11}|00\rangle\langle11| + g_{01\leftrightarrow12}|01\rangle\langle12| + g_{10\leftrightarrow21}|10\rangle\langle21| + g_{11\leftrightarrow22}|11\rangle\langle22| + H.c.$$

-- therefor.

Column 23, Lines 13-14, delete "$\Sigma = \omega_{T_{01}} + \omega_{F_{02}}$," and insert -- $\Sigma = \bar{\omega}_{T_{01}} + \omega_{F_{01}}$ -- therefor.

Column 23, Lines 25-26, delete "$g^{(n)}_{00\leftrightarrow12} = \sqrt{2}\,g\left|J_n\left(n\dfrac{\delta\omega}{\Sigma - \eta_F}\right)\right|$" and insert -- $g^{(n)}_{01\leftrightarrow12} = \sqrt{2}g\left|J_n\left(n\dfrac{\delta\omega}{\Sigma - \eta_F}\right)\right|$ -- therefor.

Column 24, Line 64, delete "$\bar{\lambda} = \lambda(c_0),\ \lambda = \xi_T^{-4}$" and insert -- $\bar{\lambda} = \lambda(\bar{c}_0),\ \lambda = \xi_T^{-4}$ -- therefor.

Column 25, Lines 2-3, delete "$E_{Jeff} = \sqrt{\dfrac{E_J}{1+r}\sqrt{1 + r^2 + 2r\cos(2\pi(\Phi + \delta\Phi)/\Phi_0)}}$" and insert -- $E_{Jeff} = \sqrt{\dfrac{E_J}{1+r}\sqrt{1 + r^2 + 2r\cos(2\pi(\Phi + \delta\Phi)/\Phi_0)}}$ -- therefor.

Column 25, Line 21, delete "$\omega_{T_{01}}(t) \approx \omega_{T_{01}} + \omega^{(2)}\cos(2\omega_{fl}t + 2\phi_m),$" and insert -- $\omega_{T_{01}}(t) \approx \bar{\omega}_{T_{01}} + \omega^{(2)}\cos(2\omega_{fl}t + 2\phi_m),$ -- therefor.

Column 25, Line 51, delete "$\omega_{T_{1-2j}}^{(2k)}$" and insert -- $\omega_{T_{j-1,j}}^{(2k)}$ -- therefor.

Column 26, Line 34, delete "$g^{(n)}_{11\leftrightarrow20}$" and insert -- $g^{(n)}_{11\leftrightarrow02}$ -- therefor.

CERTIFICATE OF CORRECTION (continued)
U.S. Pat. No. 11,108,398 B2

Column 26, Line 44, delete "$|0\rangle_T \rightarrow |1\rangle^T$" and insert -- $|0\rangle_T \rightarrow |1\rangle_T$ -- therefor.

Column 26, Line 49, delete "$\omega_{T_{01}}^{(2k)}$" and insert -- $\omega_{T_{12}}^{(2k)}$ -- therefor.

Column 37, Line 47, delete "A)" and insert -- $\Delta$) -- therefor.

Column 38, Line 25, delete "A)" and insert -- $\Delta$) -- therefor.

Column 39, Line 4, delete "A)" and insert -- $\Delta$) -- therefor.

Column 42, Lines 52-54, delete "$H=\omega_{T_{01}}(t)|1\rangle\langle 1|+(2\omega_{T_{01}}(t)-\eta_T(t)|2\rangle\langle 2|+\omega_{F_{01}}|1\rangle\langle 1|+(2\omega_{F_{01}}-\eta^F)|2\rangle\langle 2|+g(\Gamma_T^I\sigma_F+\sigma_T\sigma_F'+\sigma_T\sigma_D+\sigma_T'\sigma_F')$" and insert -- $H = \omega_{T_{01}}(t)|1\rangle\langle 1| + (2\omega_{T_{01}}(t) - \eta_T(t)|2\rangle\langle 2|+\omega_{F_{01}}|1\rangle\langle 1|+(2\omega_{F_{01}} - \eta_F)|2\rangle\langle 2|$ $+g(\sigma_T^\dagger \sigma_F + \sigma_T \sigma_F^\dagger + \sigma_T \sigma_F + \sigma_T^\dagger \sigma_F^\dagger)$ -- therefor.

Column 43, Line 12, delete "$\omega_{F_{02}}$" and insert -- $\omega_{F_{01}}$ -- therefor.

Column 43, Line 14, delete "$\sigma_T=(|0\rangle\langle 1|+\sqrt{2}|1\rangle\langle 2|)\oplus I$" and insert -- $\sigma_T = (|0\rangle\langle 1|+\sqrt{2}|1\rangle\langle 2|) \otimes \mathbb{I}$ -- therefor.

Column 43, Lines 15-16, delete "$\sigma_F=I\oplus(|0\rangle\langle 1|+\sqrt{2}|1\rangle\langle 2|)$" and insert -- $\sigma_F = I \otimes (|0\rangle\langle 1|+\sqrt{2}|1\rangle\langle 2|)$ -- therefor.

Column 48, Line 5, delete "$|d\omega_{T_{01}}/d(\phi/\phi_0)$" and insert -- $|d\omega_{T_{01}}/d(\Phi/\Phi_0)|$ -- therefor.

Column 48, Lines 58-59, delete "$|d\omega_{T_{01}}/d(\phi/\phi_0)|<\beta^{targ}$." and insert

CERTIFICATE OF CORRECTION (continued)
U.S. Pat. No. 11,108,398 B2

-- $|d\omega_{T_{01}}/d(\Phi/\Phi_0)| < \beta_{targ.}$ -- therefor.

Column 54, Line 40, delete "$V_{\tau_2,max}$" and insert -- $V_{T_2,max}$ -- therefor.

Column 54, Line 41, delete "$V_{\tau_2,max}$" and insert -- $V_{T_2,max}$ -- therefor.

Column 54, Line 57, delete "$V_{\tau_2,max}$" and insert -- $V_{T_2,max}$ -- therefor.

Column 54, Line 58, delete "$\delta\omega(V_{\tau_2,max})$" and insert -- $\delta\omega(V_{T_2,max})$ -- therefor.

Column 54, Line 60, delete "$\delta\omega(V_{\tau_2,max})$" and insert -- $\delta\omega(V_{T_2,max})$ -- therefor.

Column 55, Line 31, delete "$V_{\tau_2,max}$" and insert -- $V_{T_2,max}$ -- therefor.

Column 56, Line 1, delete "$V_{\tau_2,max}$," and insert -- $V_{T_2,max}$, -- therefor.

Column 58, Line 1, delete "$V_{\tau_2,max}$" and insert -- $V_{T_2,max}$ -- therefor.

Column 60, Line 38, delete "$\overline{\omega}_{T_{01}}$," and insert -- $\overline{\omega}_{T_{01}}$ -- therefor.

Column 60, Line 40, delete "$\overline{\omega}_m$," and insert -- $\overline{\omega}_m$ -- therefor.

Column 67, Line 65, delete "$\omega_m = |\overline{\omega}_{T_{01}} - \omega_{F_{01}} + \eta_T|$," and insert -- $\omega_m = |\overline{\omega}_{T_{01}} - \omega_{F_{01}} + \eta_F|$, -- therefor.

CERTIFICATE OF CORRECTION (continued)

Column 69, Lines 43-44, delete " $g^{(n)}_{11\leftrightarrow 20} = \sqrt{2}\, g \left| J_n\left(\frac{n\delta\omega}{\Delta - \eta_F}\right) \right|$ " and insert -- $g^{(n)}_{11\leftrightarrow 20} = \sqrt{2}\, g \left| J_n\left(\frac{n\delta\omega}{\Delta + \eta_F}\right) \right|$ -- therefor.

Column 71, Line 12, delete " $\omega_{T_{02}}^{(2k)}$ " and insert -- $\omega_{T_{01}}^{(2k)}$ -- therefor.

Column 71, Lines 21-24, delete " $g^{(n)}_{11\leftrightarrow 02} = \bar{g}_{12} \left| \sum_{\substack{\{l_k \in \mathbb{Z}\} \\ \sum_{k=1}^{\infty} k l_k = n}} \prod_{k=1}^{\infty} J_{l_k}\left[\frac{n\omega_{T_{12}}^{(2k)}}{k(\Delta - \bar{\eta}_T)}\right] \right|$ "

and insert

-- $g^{(n)}_{11\leftrightarrow 02} = \bar{g}_{12} \left| \sum_{\substack{\{l_k \in \mathbb{Z}\} \\ \sum_{k=1}^{\infty} k l_k = n}} \prod_{k=1}^{\infty} J_{l_k}\left[\frac{n\, \omega_{T_{12}}^{(2k)}}{k(\Delta - \bar{\eta}_T)}\right] \right|$ -- therefor.

Column 71, Line 32, delete " $\omega_{T_{02}}^{(2k)}$ " and insert -- $\omega_{T_{12}}^{(2k)}$ -- therefor.

Column 79, Line 54, delete "4," and insert -- $\phi_0$ -- therefor.

Column 83, Line 3, delete " $|1\rangle_T \rightarrow |1\rangle_T$ " and insert -- $|0\rangle_T \rightarrow |1\rangle_T$ -- therefor.

Column 83, Line 12, delete " $|1\rangle_T \rightarrow |2\rangle_T$, " and insert -- $|1\rangle_T \rightarrow |2\rangle_T$ -- therefor.

Column 83, Line 39, delete " $|0\rangle \rightarrow |1\rangle_T$, " and insert -- $|0\rangle_T \rightarrow |1\rangle_T$ -- therefor.

Column 83, Line 65, delete " $g_{ij}(t)\{i,j=1,2\}$, " and insert -- $\bar{g}_{ij}(t)\{i,j = 1,2\}$ -- therefor.

CERTIFICATE OF CORRECTION (continued)
U.S. Pat. No. 11,108,398 B2

Column 84, Line 31, delete "$t_{BE}^{(n)}$" and insert -- $t_{BR}^{(n)}$ -- therefor.

Column 84, Line 61, delete "$\sigma_i^t$" and insert -- $\sigma_i^\dagger$ -- therefor.